US012760041B2

(12) United States Patent
He et al.

(10) Patent No.: US 12,760,041 B2
(45) Date of Patent: Oct. 13, 2026

(54) BORON-CONTAINING ORGANIC COMPOUND AND APPLICATIONS THEREOF

(71) Applicant: SHENZHEN CHINA STAR OPTOELECTRONICS SEMICONDUCTOR DISPLAY TECHNOLOGY CO., LTD., District Shenzhen (CN)

(72) Inventors: Ruifeng He, District Shenzhen (CN); Canjie Wu, District Shenzhen (CN); Yan Li, District Shenzhen (CN); Jingyao Song, District Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 972 days.

(21) Appl. No.: 18/082,028

(22) Filed: Dec. 15, 2022

(65) Prior Publication Data

US 2024/0228514 A1 Jul. 11, 2024

(30) Foreign Application Priority Data

Nov. 23, 2022 (CN) ......................... 202211478702.1

(51) Int. Cl.
*H10K 85/30* (2023.01)
*C07F 5/02* (2006.01)
*H10K 85/60* (2023.01)

(52) U.S. Cl.
CPC .......... *C07F 5/027* (2013.01); *H10K 85/322* (2023.02); *H10K 85/636* (2023.02);
(Continued)

(58) Field of Classification Search
CPC ............... H10K 85/654; H10K 85/657; H10K 85/6572; H10K 85/6574; H10K 85/6576;
(Continued)

(56) References Cited

U.S. PATENT DOCUMENTS 11,800,785 B2 * 10/2023 Hatakeyama ........ H10K 85/657

FOREIGN PATENT DOCUMENTS

CN 110981899 A 4/2020
CN 111647010 A 9/2020
(Continued)

OTHER PUBLICATIONS

Chinese Office Action issued in corresponding Chinese Patent Application No. 202211478702.1 dated May 25, 2024, pp. 15.

*Primary Examiner* — James D Sells
(74) *Attorney, Agent, or Firm* — PV IP PC; Peter Stecher; Wei Te Chung

(57) ABSTRACT

Embodiments of the present application disclose a boron-containing organic compound and applications thereof. The
(Continued)

boron-containing organic compound is shown in the general formula (I):

(I)

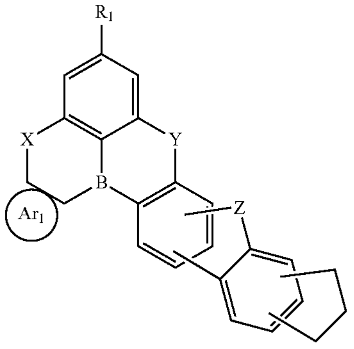

The hole-transporting group of the pentyl group is beneficial to improve the hole-transporting performance of the compound on the one hand, and on the other hand, it can enhance the resonance performance of the molecule, so that when the boron-containing organic compound is applied to an organic light-emitting device, it can effectively improve its light extraction efficiency. Meanwhile, the cyclopentyl group can effectively increase the distance between molecules, and can inhibit the exciton quenching caused by the accumulation between molecules. When this boron-containing organic compound is applied to blue light materials, it can effectively improve the stability and life of the device.

10 Claims, 1 Drawing Sheet

(52) U.S. Cl.
CPC ....... *H10K 85/654* (2023.02); *H10K 85/6572* (2023.02); *H10K 85/6574* (2023.02); *H10K 85/6576* (2023.02); *H10K 85/658* (2023.02); *C07B 2200/05* (2013.01)

(58) Field of Classification Search
CPC ... H10K 85/658; H10K 85/322; H10K 85/636
USPC .......................................................... 428/690
See application file for complete search history.

(56) References Cited

FOREIGN PATENT DOCUMENTS

| | | |
|---|---|---|
| CN | 113416206 A | 9/2021 |
| CN | 113924307 A | 1/2022 |

* cited by examiner

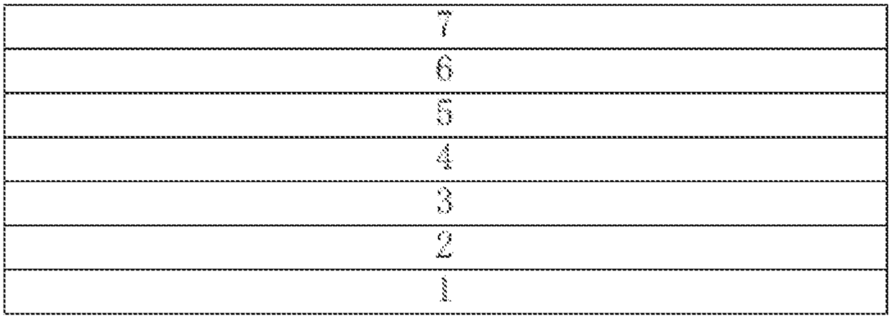
7
6
5
4
3
2
1

BORON-CONTAINING ORGANIC COMPOUND AND APPLICATIONS THEREOF

CROSS REFERENCE TO RELATED APPLICATION SECTION

This application claims priority to China Patent Application S/N 202211478702.1 filed on Nov. 23, 2022, the entire contents of which are hereby incorporated by reference in their entirety.

BACKGROUND OF INVENTION

Field of Invention

The present application relates to the technical field of organic electroluminescence, in particular to a boron-containing organic compound and applications thereof.

Description of Prior Art

Organic light-emitting diodes (OLEDs) have great potential for applications in optoelectronic devices such as flat panel displays and lighting due to the synthetic versatility, relatively low fabrication costs, and excellent optical and electrical properties of organic semiconductor materials.

The organic electroluminescence phenomenon refers to the phenomenon of converting electrical energy into light energy by using organic materials. An organic electroluminescence element utilizing the organic electroluminescence phenomenon generally has a positive electrode, a negative electrode, and a structure including an organic material layer therebetween. In order to improve the efficiency and service life of the organic electroluminescence element, the organic layer has a multilayer structure, in which each layer contains different organic materials. Specifically, it may include a hole injection layer, a hole transport layer, a light-emitting layer, an electron transport layer, an electron injection layer, and the like. In the above-mentioned organic electroluminescent element, by applying a voltage between two electrodes, the positive electrode injects holes into the organic layer, and the negative electrode injects electrons into the organic layer. When the injected holes and electrons meet, excitons are formed, and the excitons transit back to the ground state to emit light. This organic electroluminescent element has characteristics of self-luminescence, high brightness, high efficiency, low driving voltage, wide viewing angles, high contrast, high responsiveness, and the like. In order to improve the light-emitting efficiency of organic electroluminescent devices, material systems with various energy transfer and conversion mechanisms have been developed, but the development of efficient and stable blue light materials is still a huge challenge, and the device performance of most blue light materials is low at present, which is not conducive to high-end display, and the stability and service life of OLEDs made of blue materials need to be further improved.

Therefore, there is an urgent need to provide a blue material with high light-emitting efficiency and long service life, so that an overall performance of a display device can be effectively improved.

SUMMARY OF INVENTION

Embodiments of the present application provide a boron-containing organic compound and applications thereof. The boron-containing organic compound can be used in blue-light materials to effectively improve the light-emitting efficiency of organic electroluminescent devices and prolong the service life of blue-light materials.

An embodiment of the present application provides a boron-containing organic compound as shown in general formula (I):

(I)

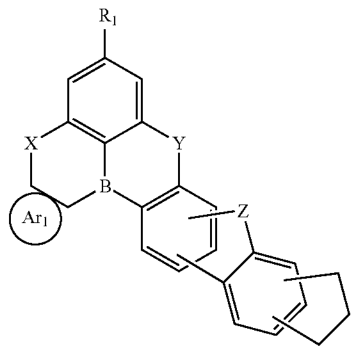

wherein $R_1$ is selected from H, D, a substituted or unsubstituted $C_{1-20}$ alkyl group, a substituted or unsubstituted amino group, a substituted or unsubstituted $C_{6-30}$ aromatic group, or a substituted or unsubstituted $C_{5-30}$ heteroaromatic group;

Z is independently selected from $CR_2R_3$, $NR_4$, O, or S;

X and Y are independently selected from O or $NR_5$;

$R_2$, $R_3$, $R_4$, and $R_5$ are each independently selected from a substituted or unsubstituted $C_{1-20}$ alkyl group, a substituted or unsubstituted $C_{6-30}$ aromatic group, or a substituted or unsubstituted $C_{5-30}$ heteroaromatic group; or $R_2$ and $R_3$, together with carbon atoms connecting $R_2$ and $R_3$ form a ring consisting of 3-12 atoms; and $Ar_1$ is independently selected from a substituted or unsubstituted $C_{6-30}$ aromatic group, or a substituted or unsubstituted $C_{5-30}$ heteroaromatic or non-aromatic group.

In one embodiment, $R_1$ is selected from H, D, a substituted or unsubstituted $C_{1-12}$ alkyl group, a substituted or unsubstituted amino group, a substituted or unsubstituted $C_{6-20}$ aromatic group, or a substituted or unsubstituted $C_{5-20}$ heteroaromatic group.

In one embodiment, $R_1$ is selected from H, D, a substituted or unsubstituted $C_{1-8}$ alkyl group, a substituted or unsubstituted amino group, a substituted or unsubstituted $C_{6-15}$ aromatic group, or a substituted or unsubstituted $C_{5-15}$ heteroaromatic group.

In one embodiment, $R_1$ is selected from H, D, methyl, isopropyl, tert-butyl, tert-amyl, substituted or unsubstituted phenyl, naphthalene, dibenzofuran, dibenzothiophene, fluorenyl, carbazolyl, or an N-aryl substituted amino group.

In one embodiment, Z is selected from O or S.

In one embodiment, at least one of X and Y is selected from $NR_5$.

In one embodiment, when one of X and Y is O, the other one of X and Y is $NR_5$.

In one embodiment, $R_2$, $R_3$, $R_4$, and $R_5$ are each independently selected from a substituted or unsubstituted $C_{1-12}$ alkyl group, a substituted or unsubstituted $C_{6-20}$ aromatic group, or a substituted or unsubstituted $C_{5-20}$ heteroaromatic group; or $R_2$ and $R_3$, together with carbon atoms connecting $R_2$ and $R_3$ form a ring consisting of 3-8 atoms.

In one embodiment, $R_2$, $R_3$, $R_4$, and $R_5$ independently represent a substituted or unsubstituted $C_{1-8}$ alkyl group, a substituted or unsubstituted $C_{6-15}$ aromatic group, or a substituted or unsubstituted $C_{5-15}$ heteroaromatic group; or $R_2$ and $R_3$, together with carbon atoms connecting $R_2$ and $R_3$ form a ring consisting of 3-6 atoms.

In one embodiment, $R_2$ and $R_3$ are each independently selected from methyl, or substituted or unsubstituted phenyl.

In one embodiment, $R_5$ is independently selected from substituted or unsubstituted phenyl, naphthyl, dibenzofuran, dibenzothiophene, fluorenyl, or carbazolyl.

In one embodiment, the boron-containing organic compound includes one of 1-1

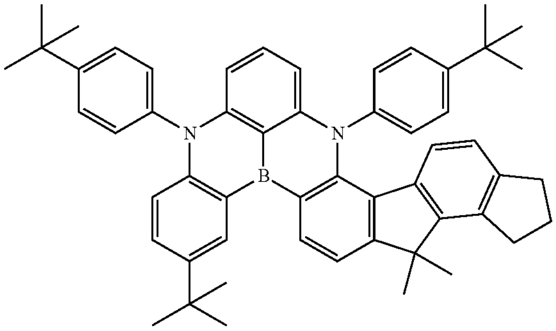

1-2

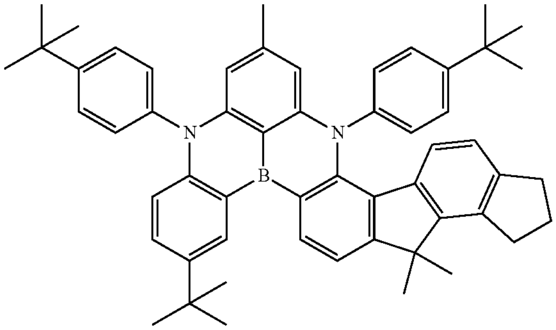

1-3

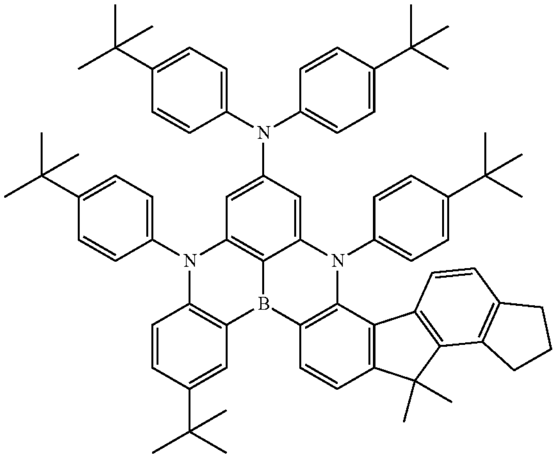

-continued 1-4

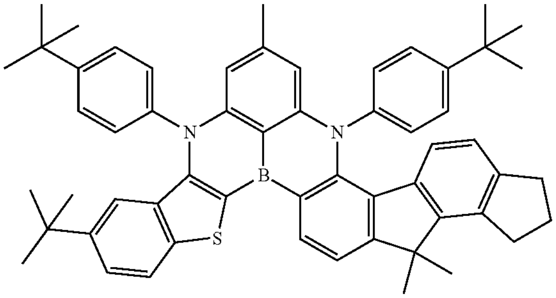

1-5

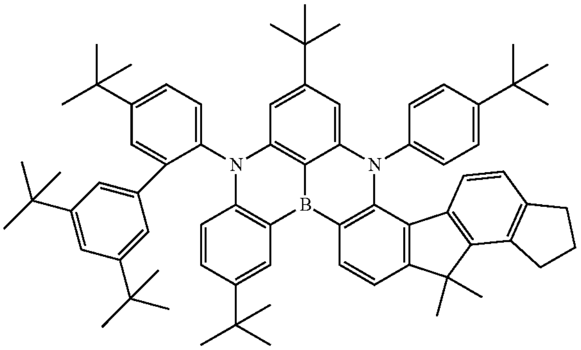

1-6

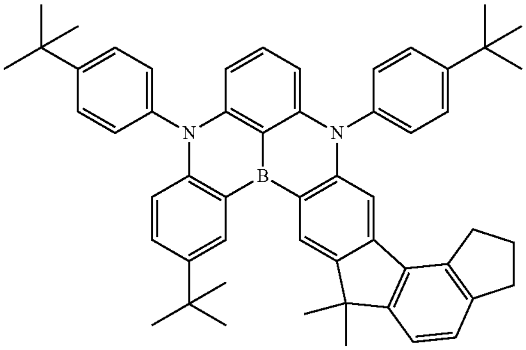

1-7

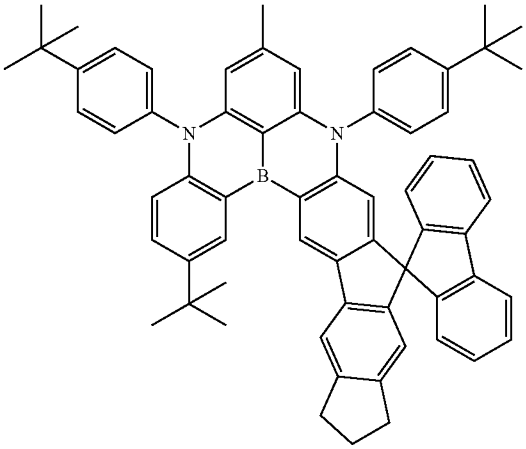

-continued
1-8
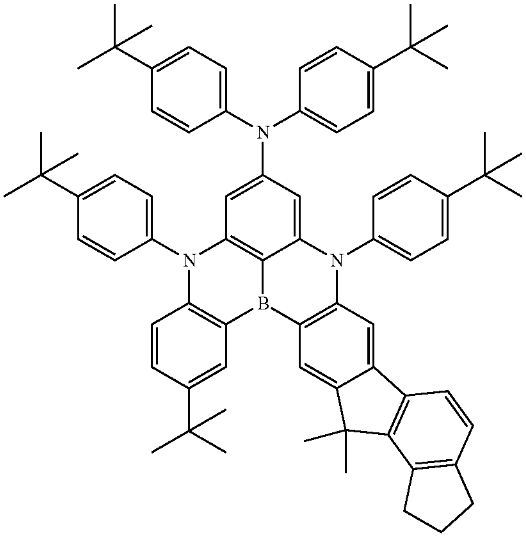
1-9
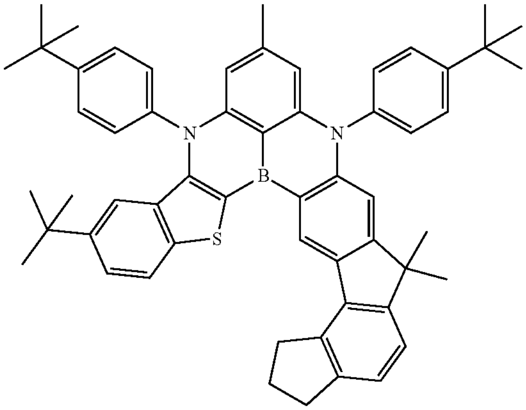
1-10
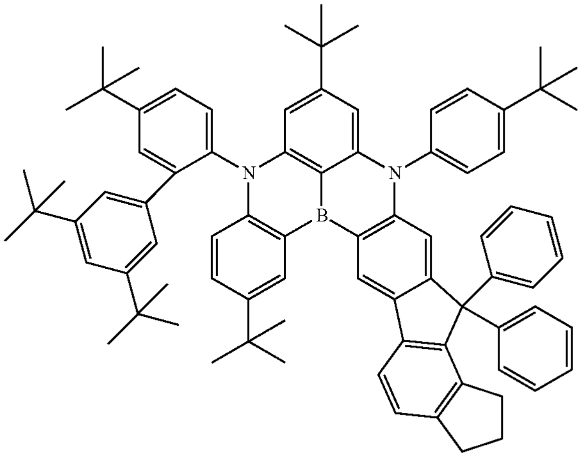
-continued
1-11
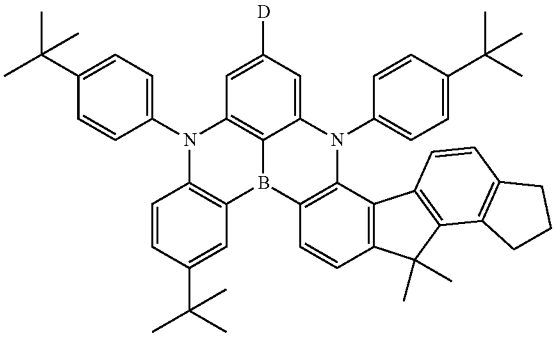
1-12
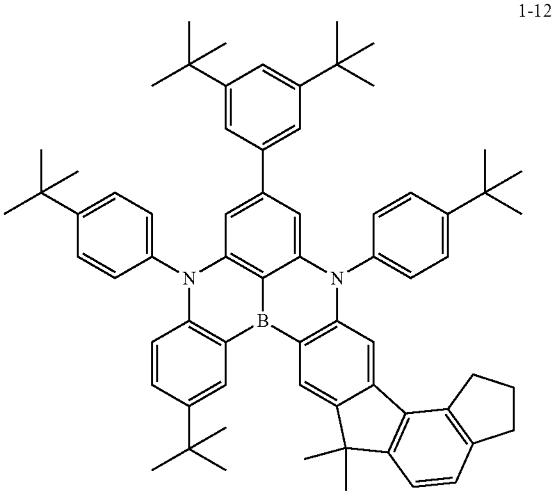
1-13
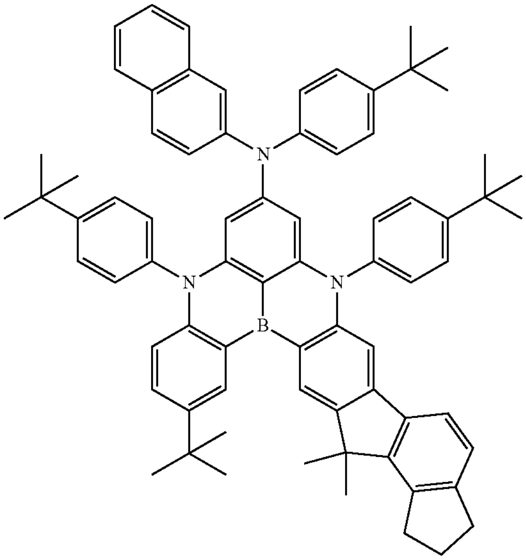

-continued
1-14
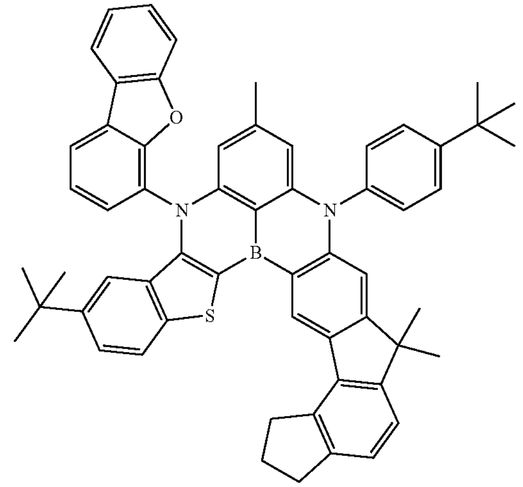
1-15
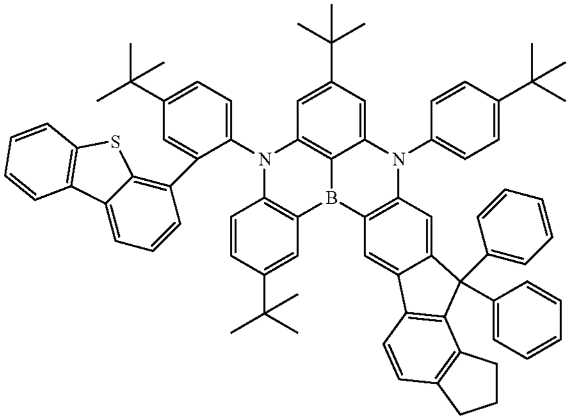
1-16
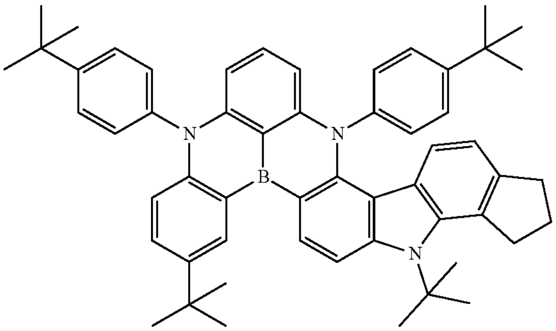
1-17
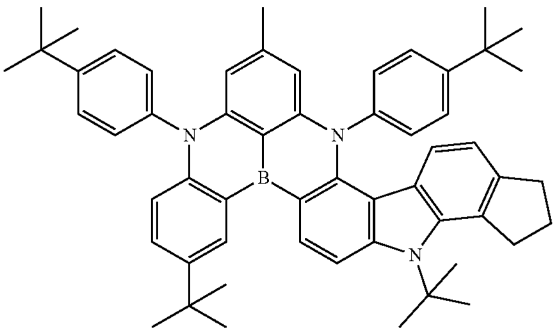
-continued
1-18
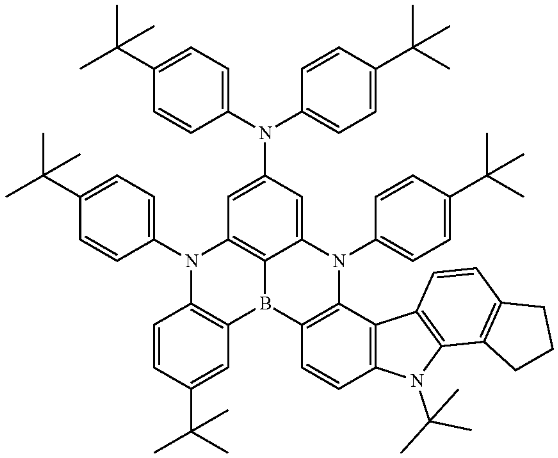
1-19
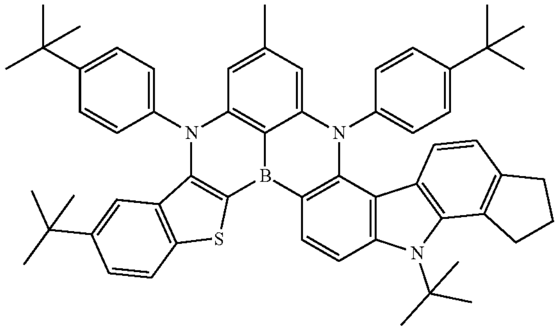
1-20
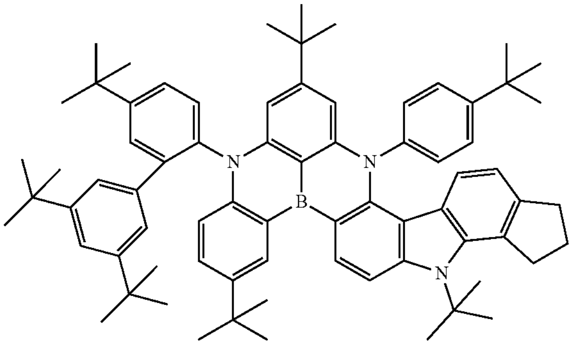
1-21
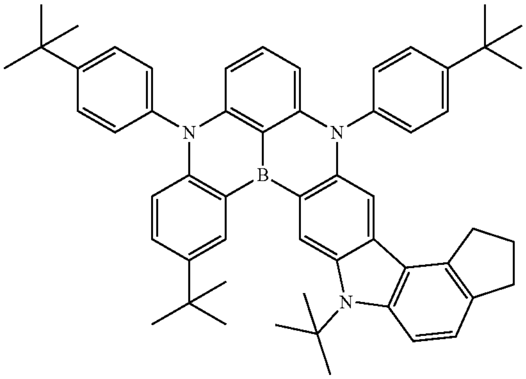

-continued
1-22
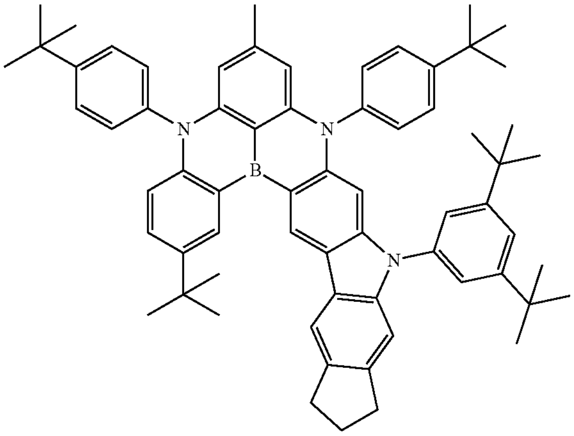
1-23
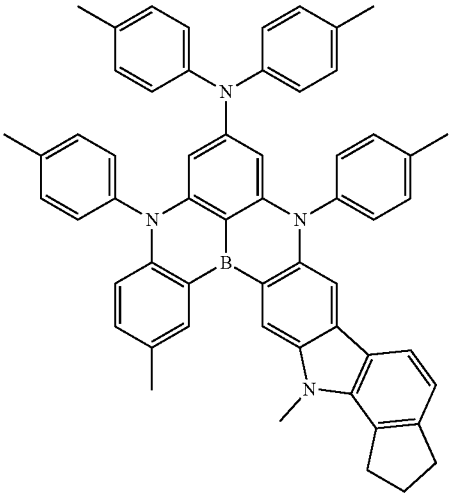
1-24
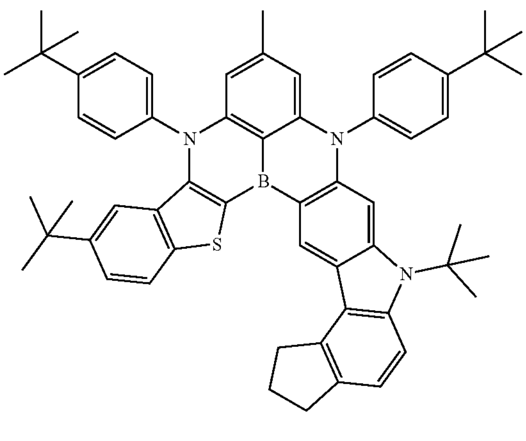
-continued
1-25
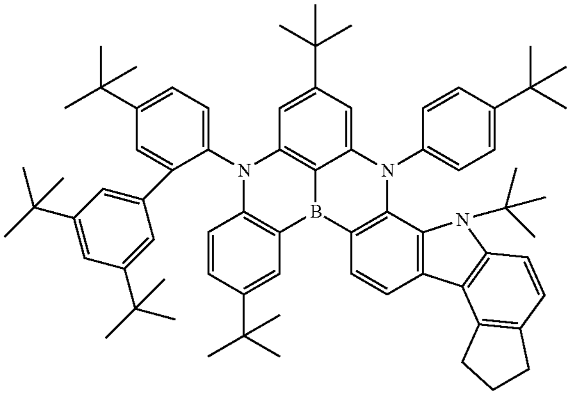
1-26
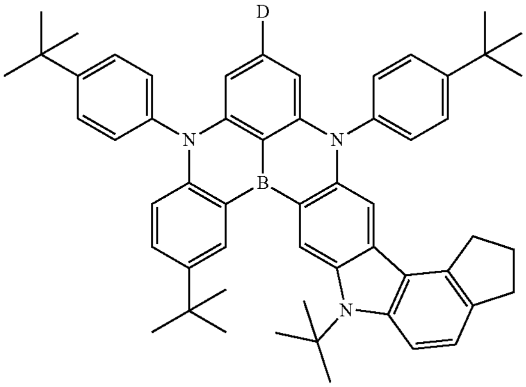
1-27
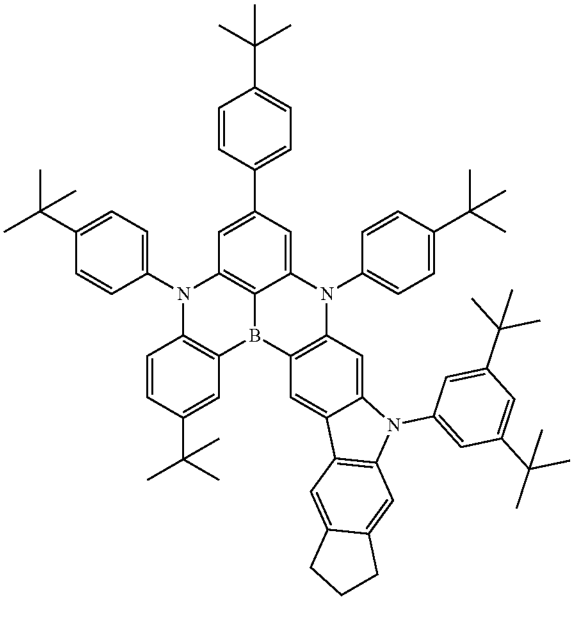

-continued
1-28
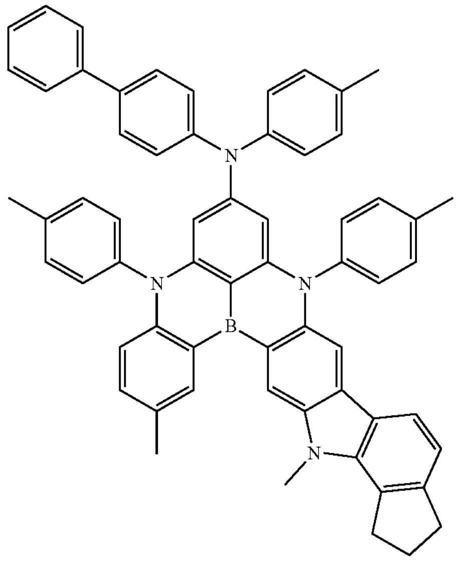
1-29
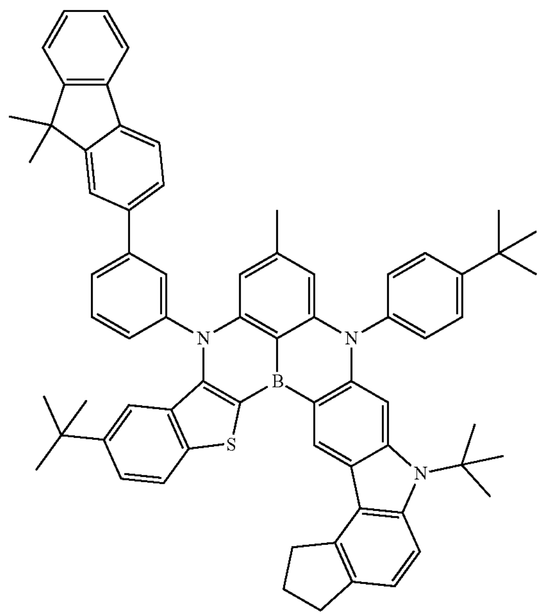
1-30
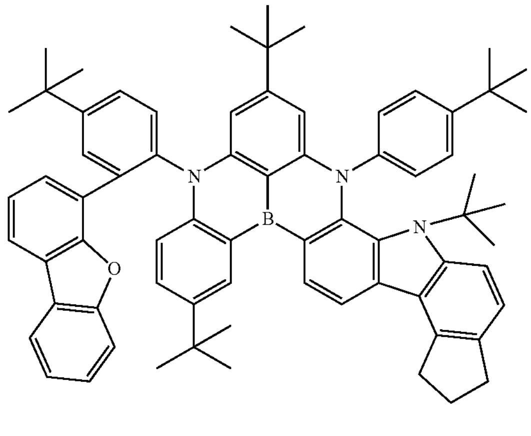
-continued
1-31
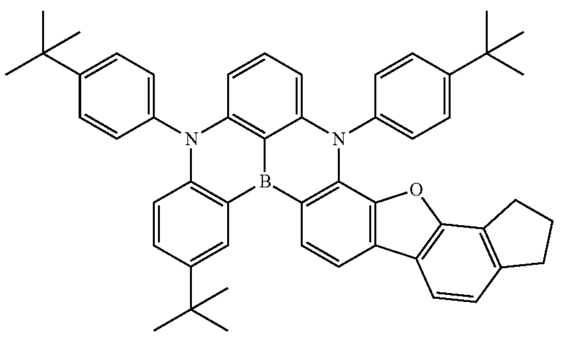
1-32
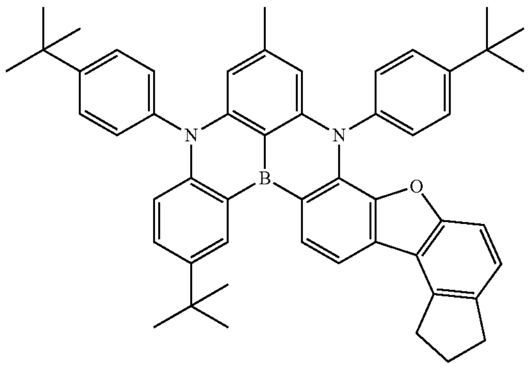
1-33
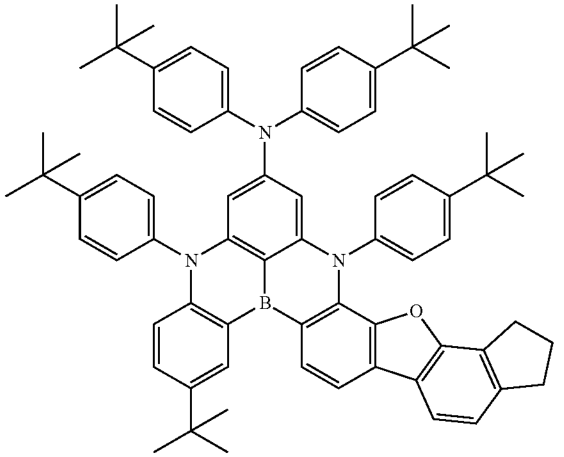
1-34
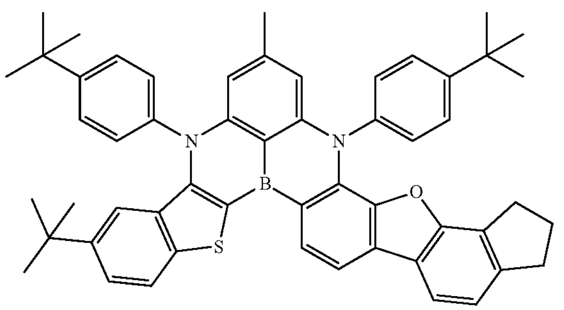

-continued
1-35
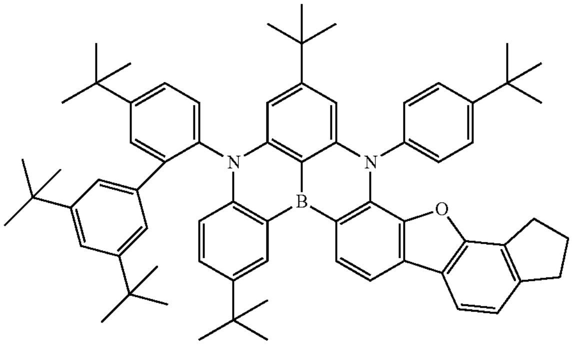
1-36
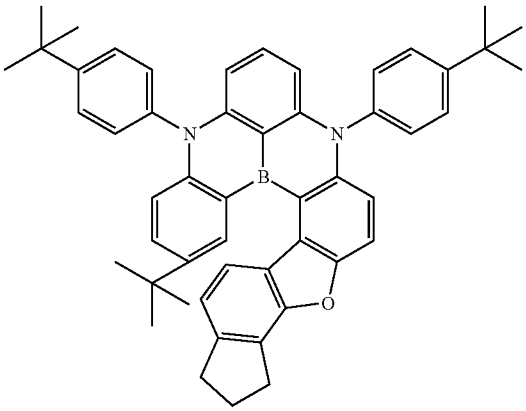
1-37
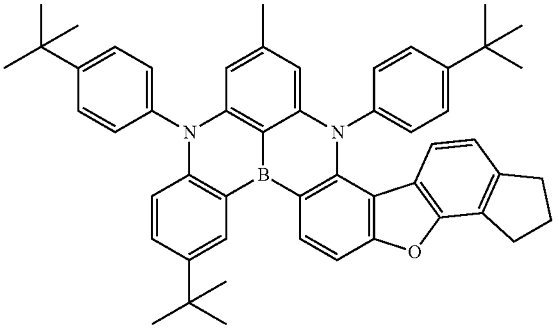
1-38
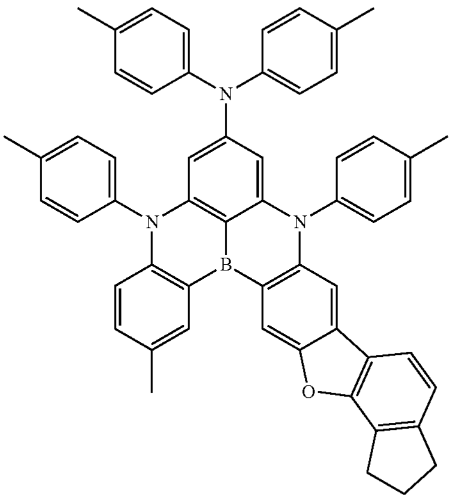
-continued
1-39
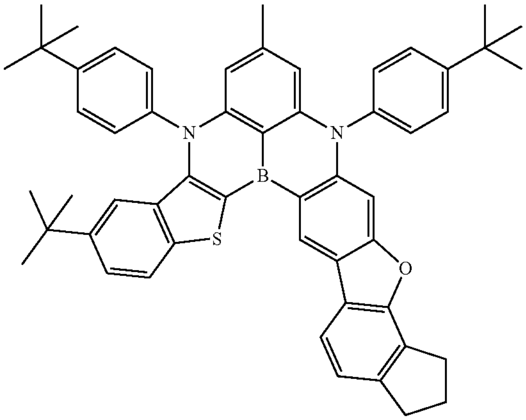
1-40
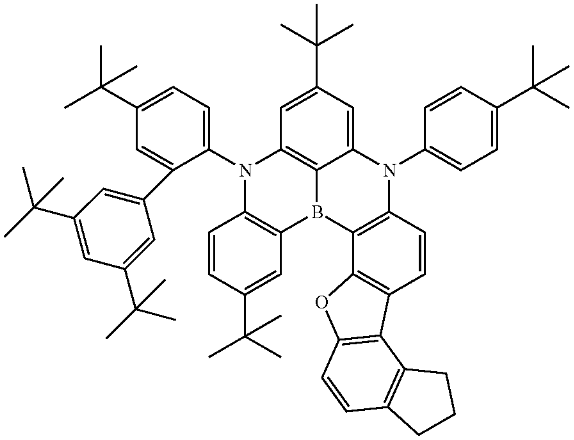
1-41
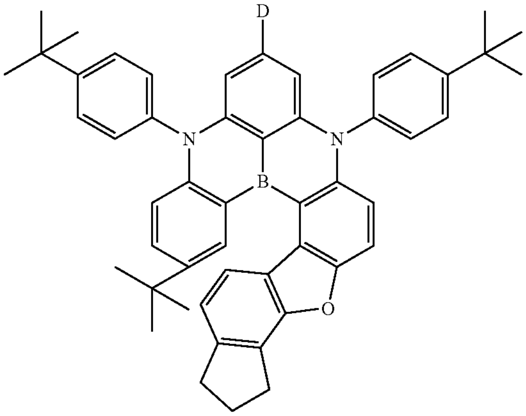

-continued
1-42
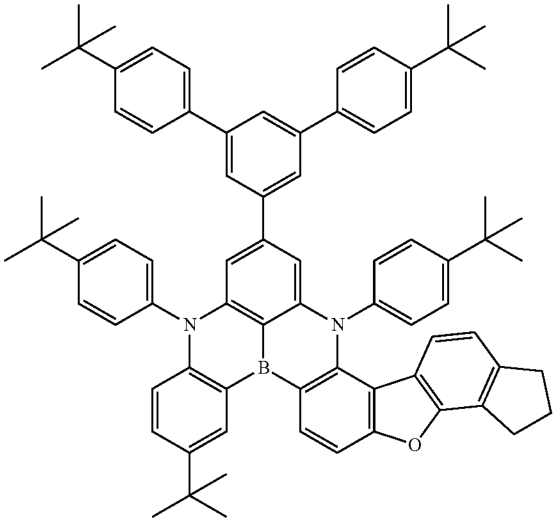
1-43
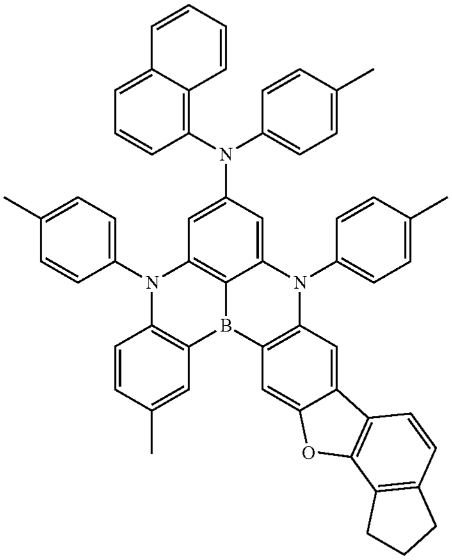
1-44
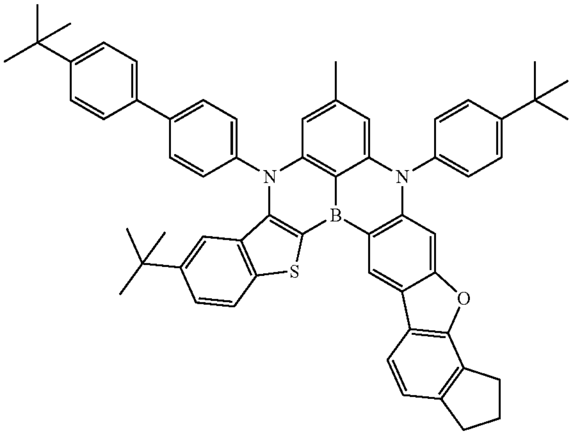
-continued
1-45
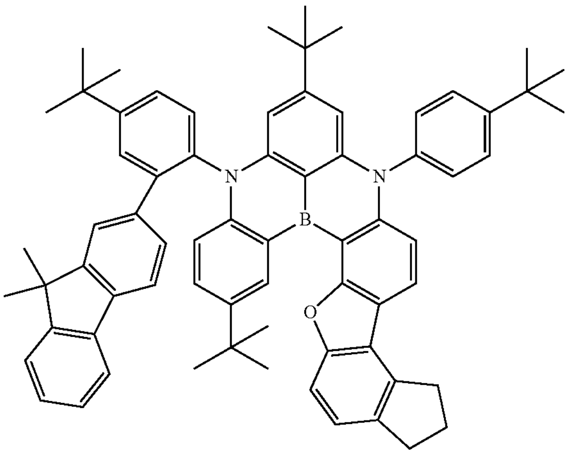
1-46
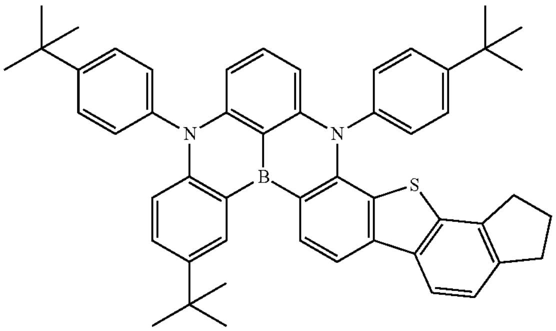
1-47
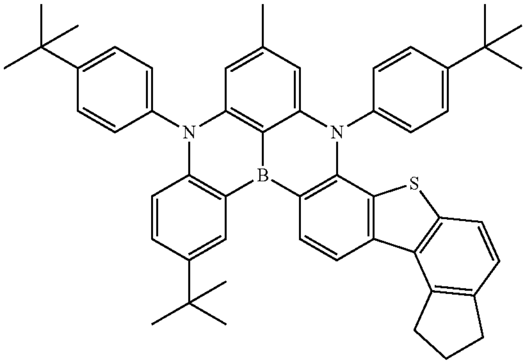
1-48
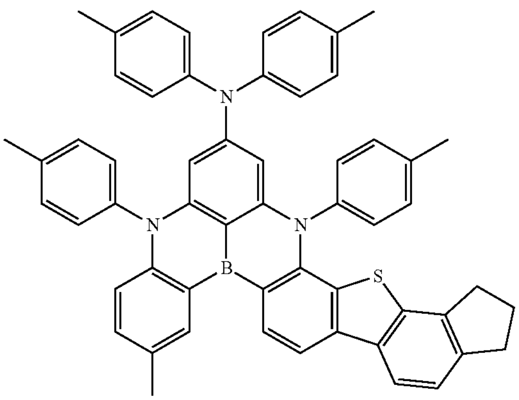

-continued
1-49
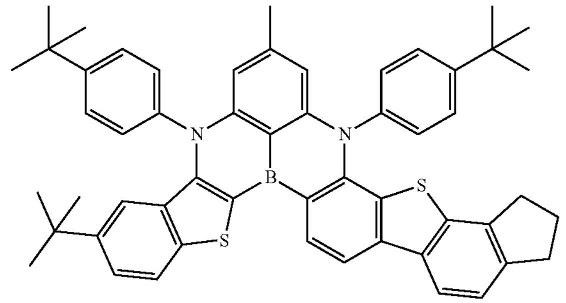
1-50
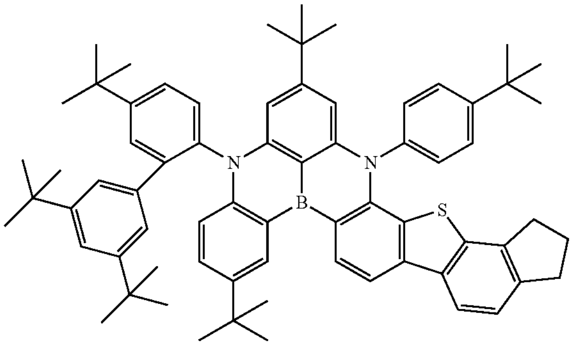
1-51
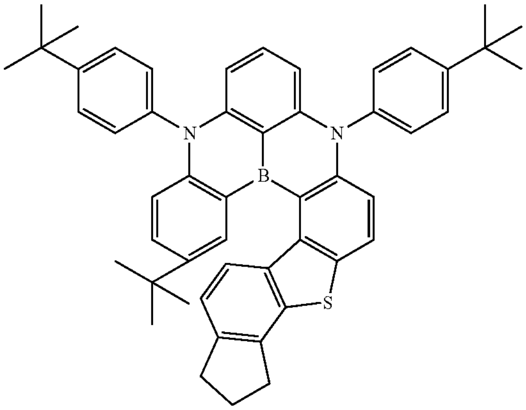
1-52
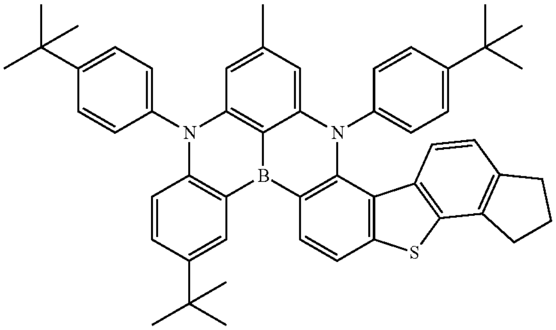
-continued
1-53
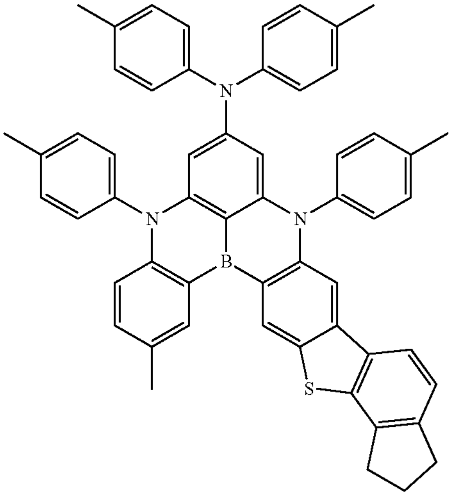
1-54
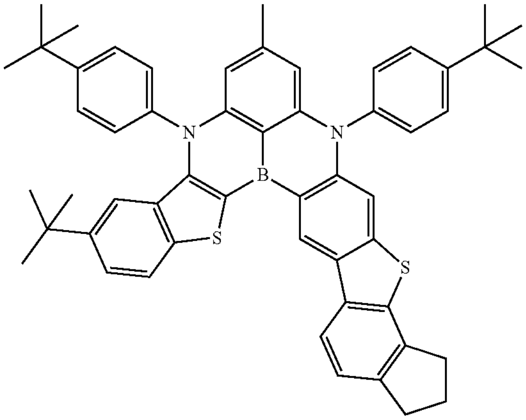
1-55
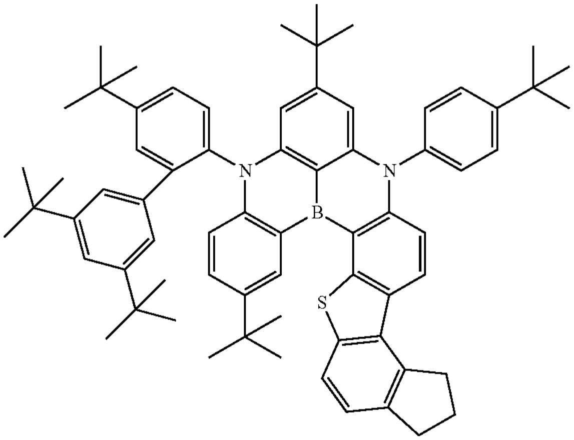

-continued
1-56
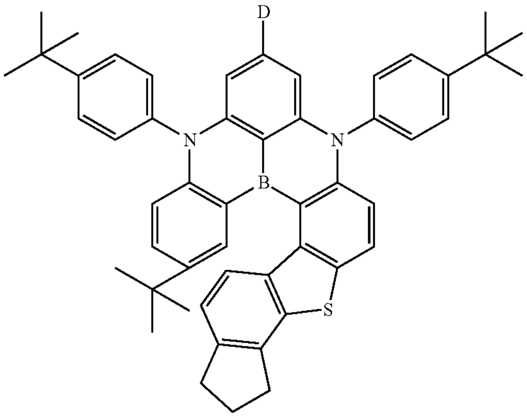
1-57
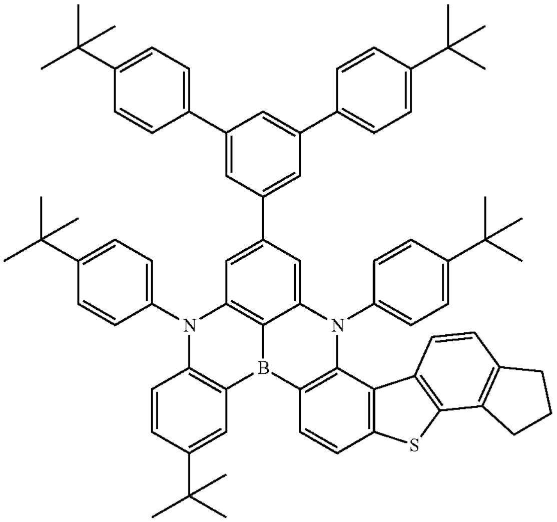
1-58
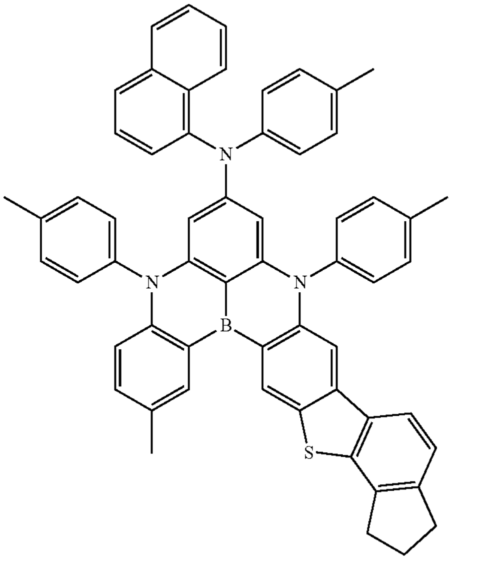
-continued
1-59
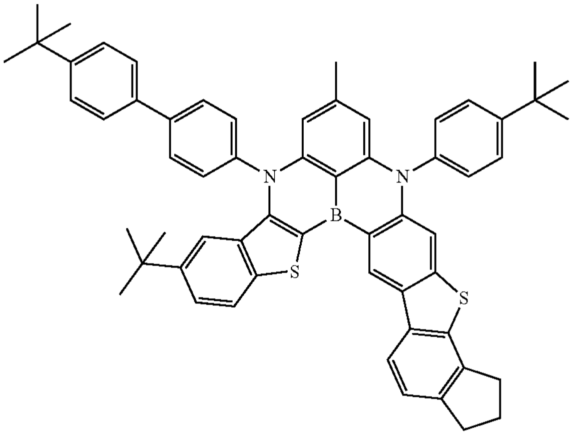
1-60
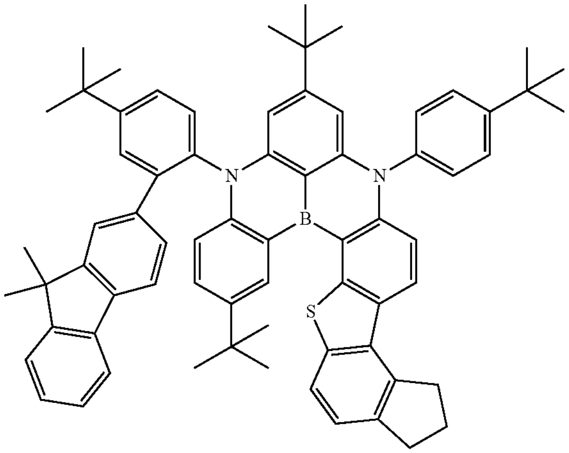
1-61
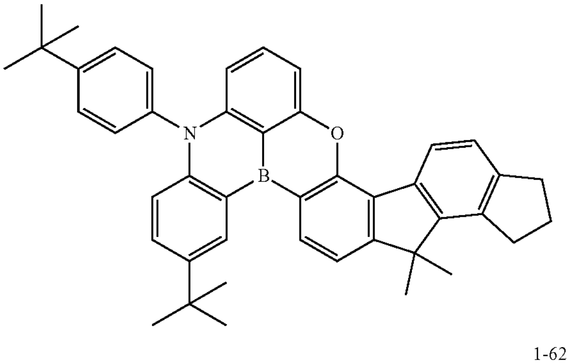
1-62
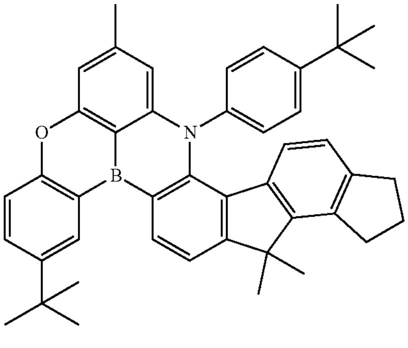

-continued
1-63
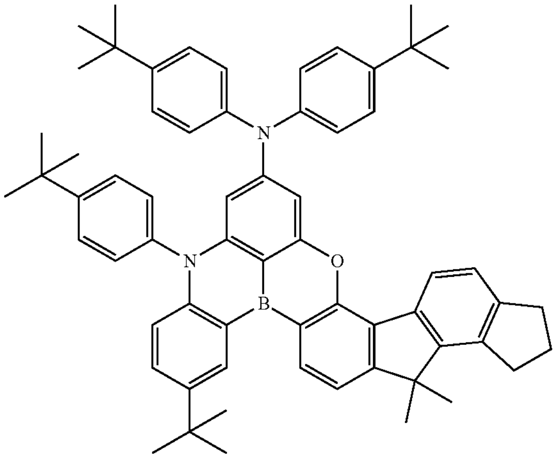
1-64
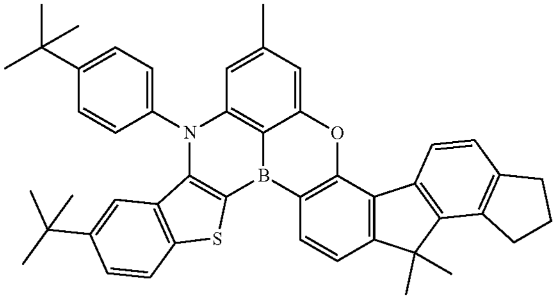
1-65
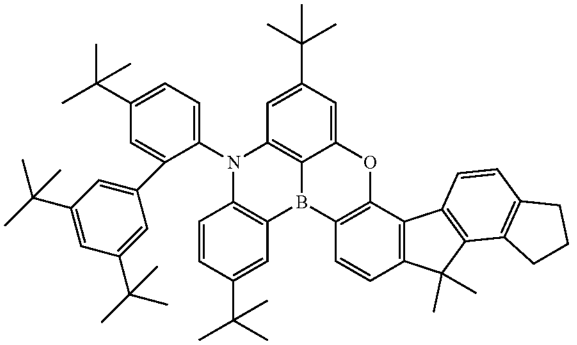
1-66
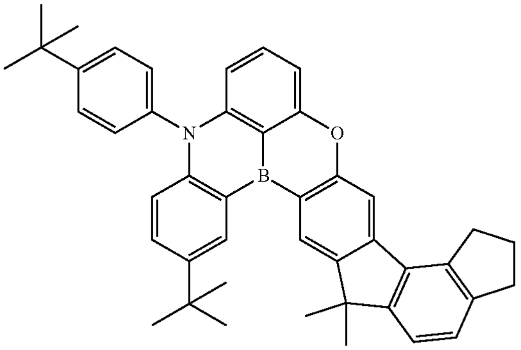
-continued
1-67
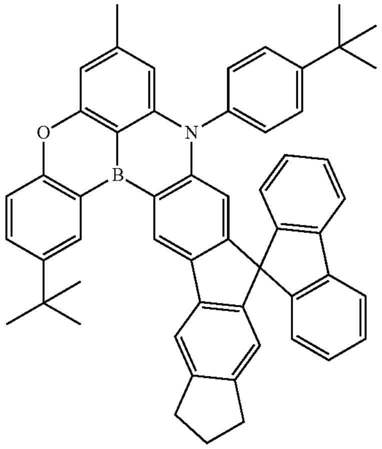
1-68
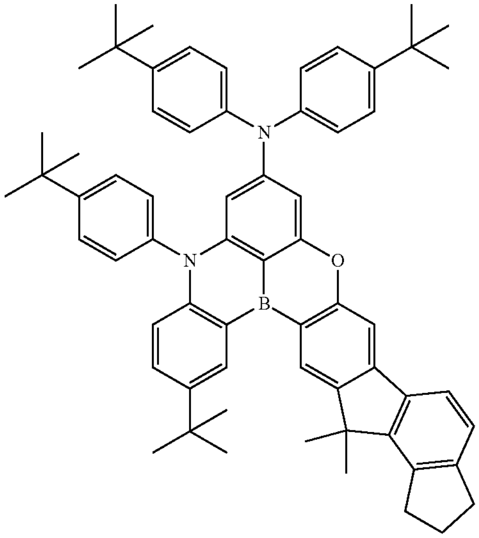
1-69
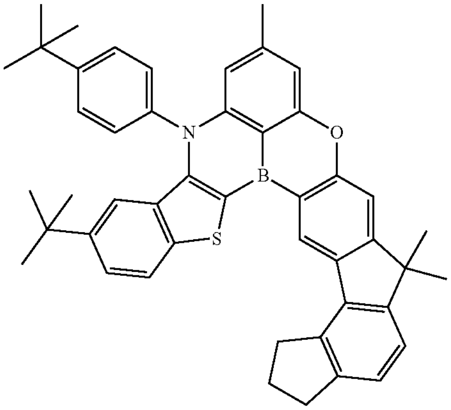

-continued
1-70
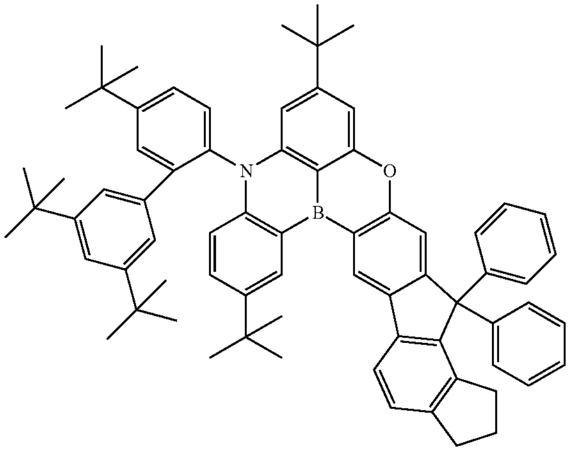
1-71
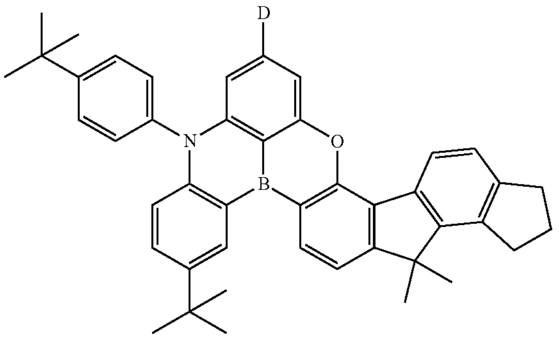
1-72
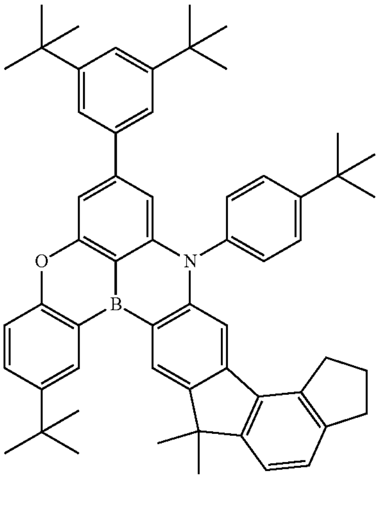
-continued
1-73
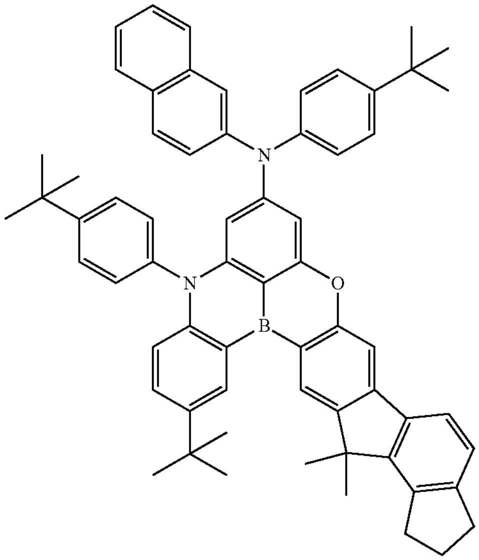
1-74
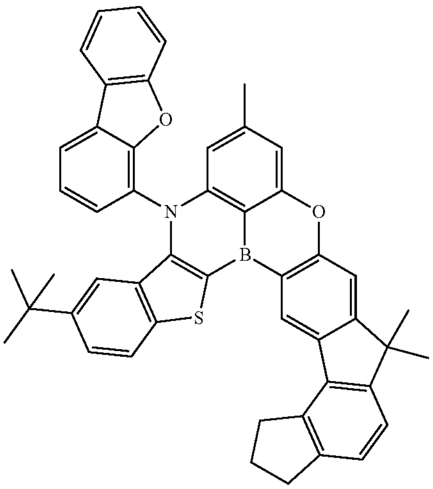
1-75
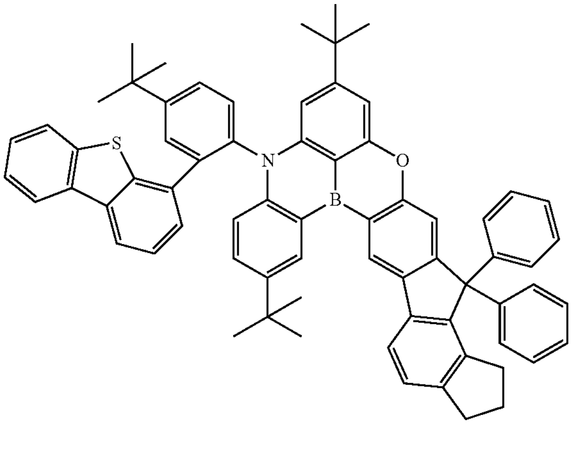

-continued
1-76
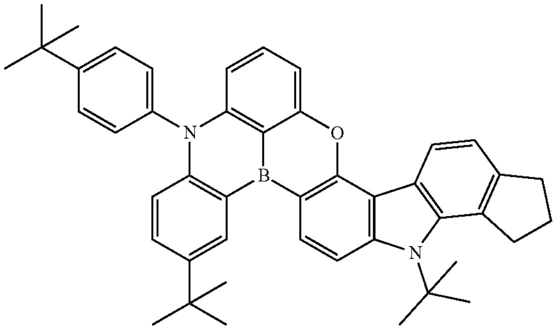
1-77
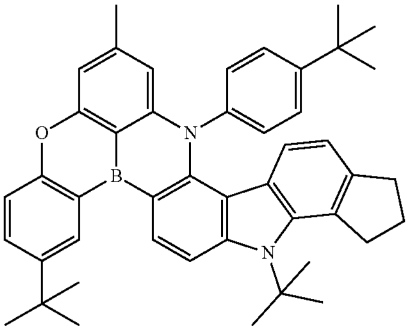
1-78
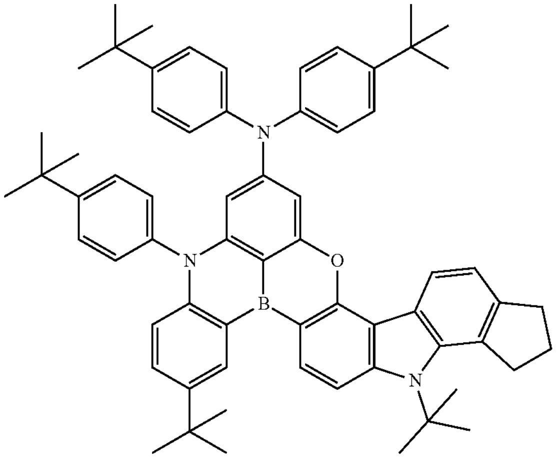
1-79
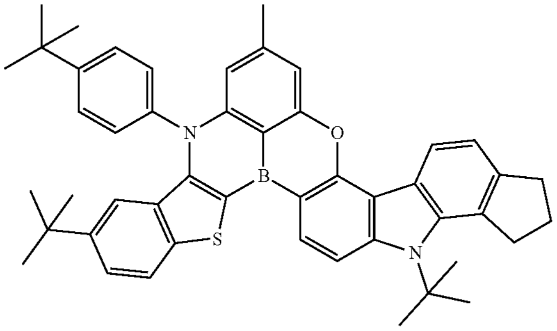
-continued
1-80
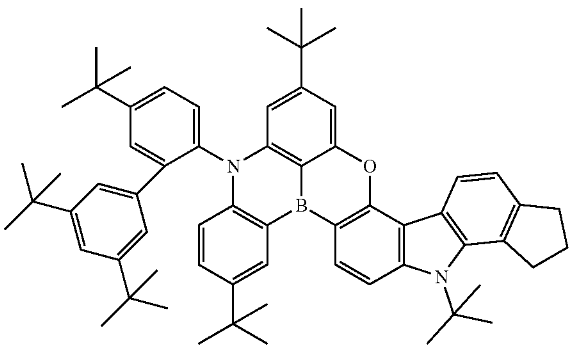
1-81
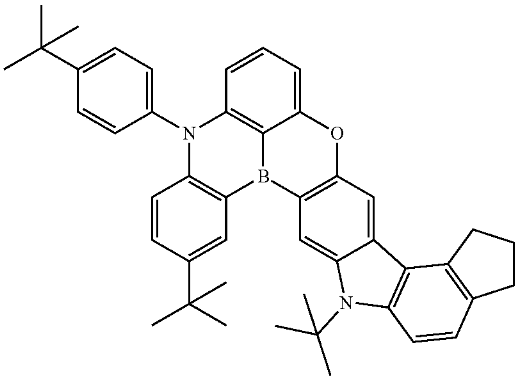
1-82
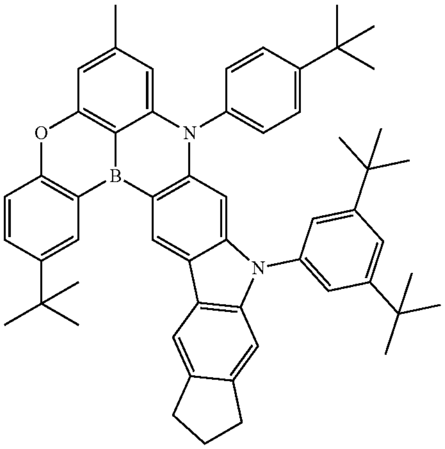

1-83
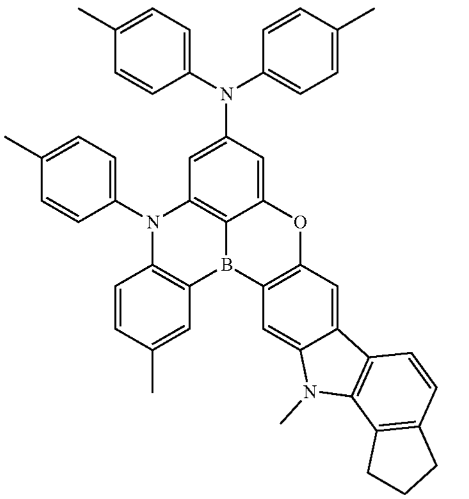
1-84
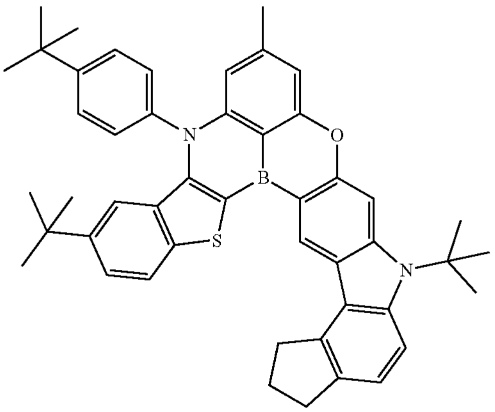
1-85
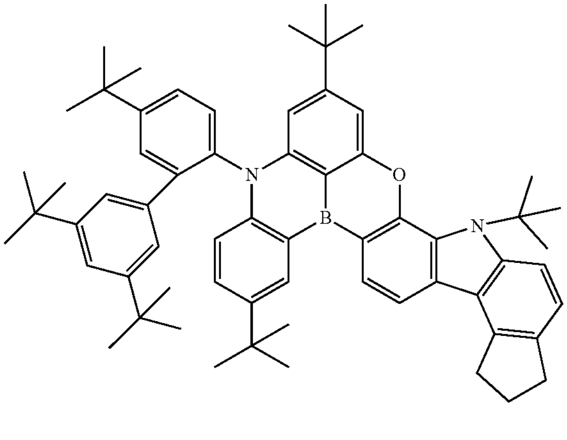
1-86
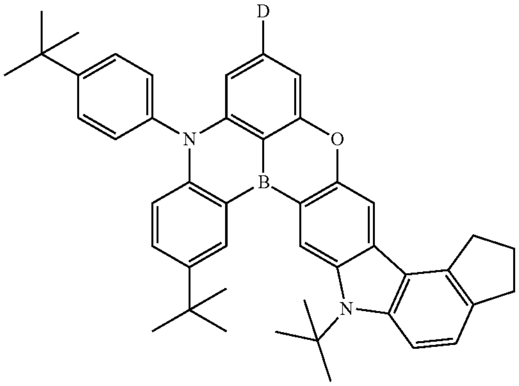
1-87
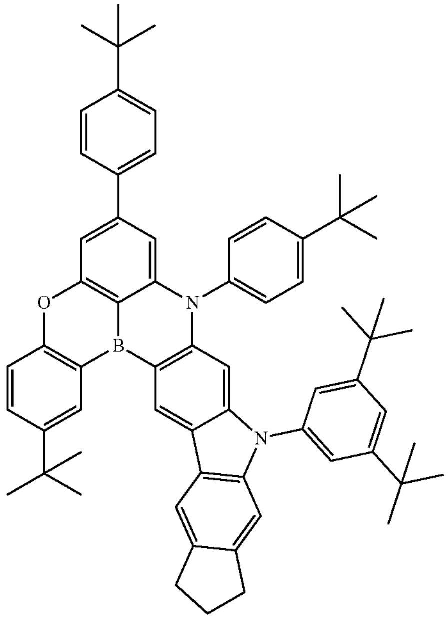
1-88
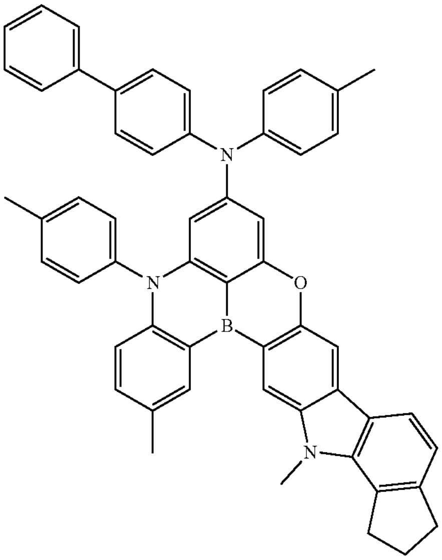

-continued
1-89
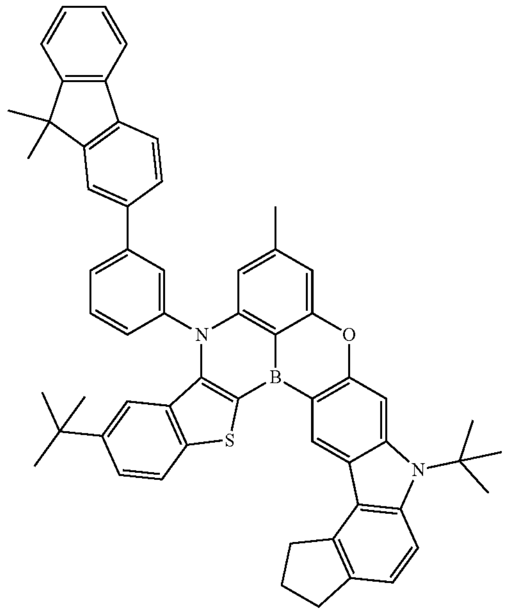
1-90
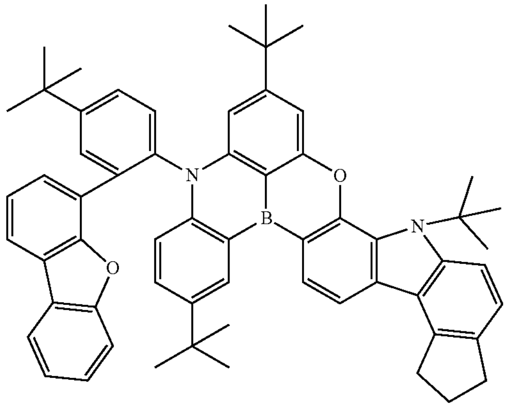
1-91
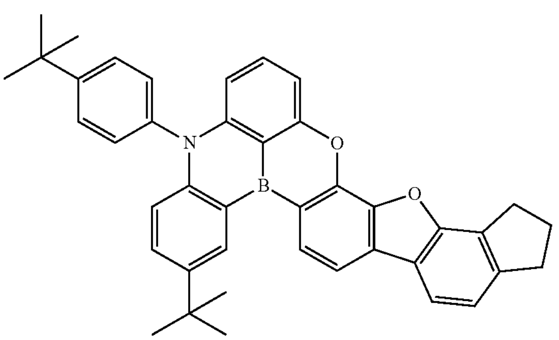
1-92
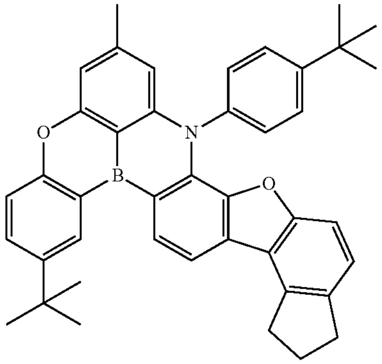
1-93
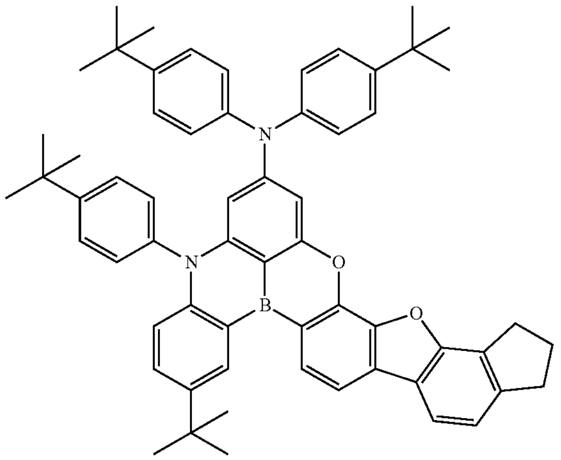
1-94
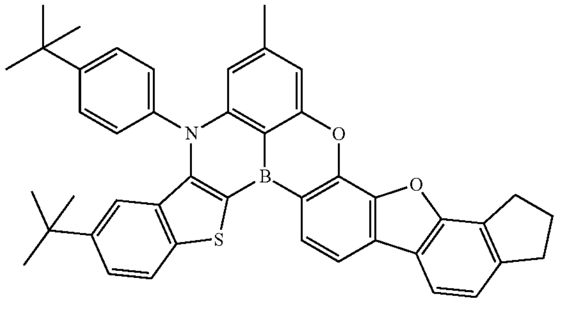
1-95
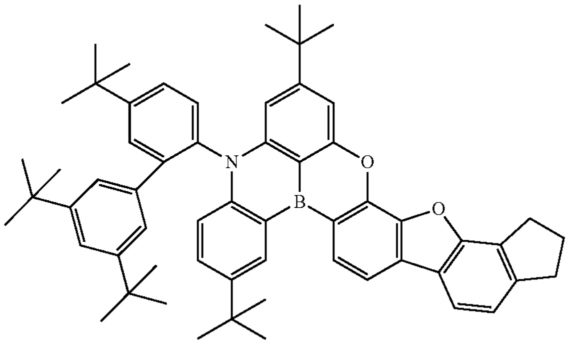

-continued
1-96
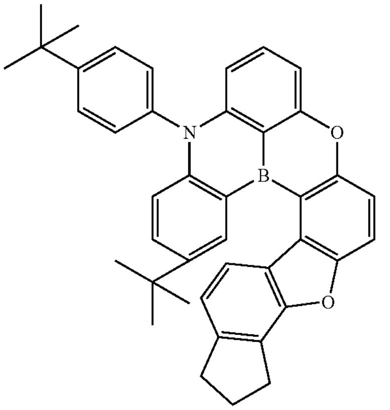
1-97
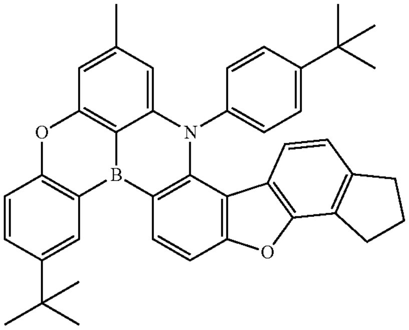
1-98
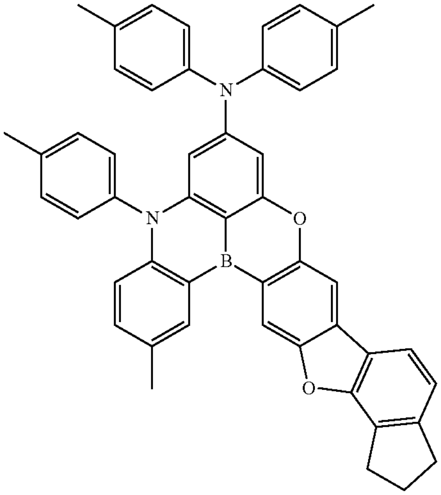
-continued
1-99
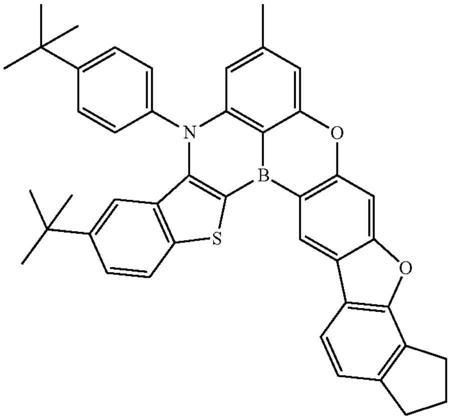
1-100
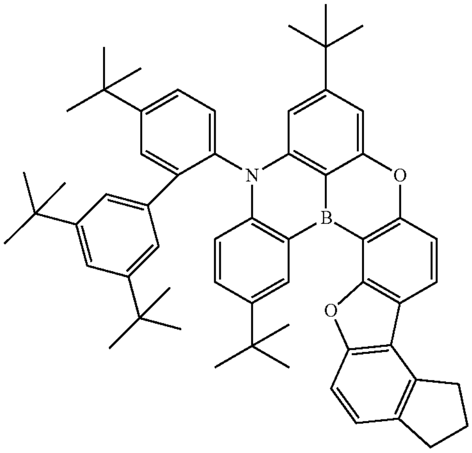
1-101
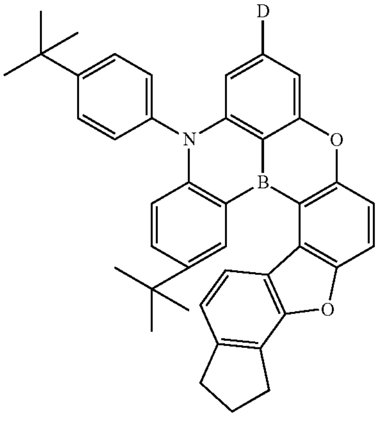

-continued
1-102
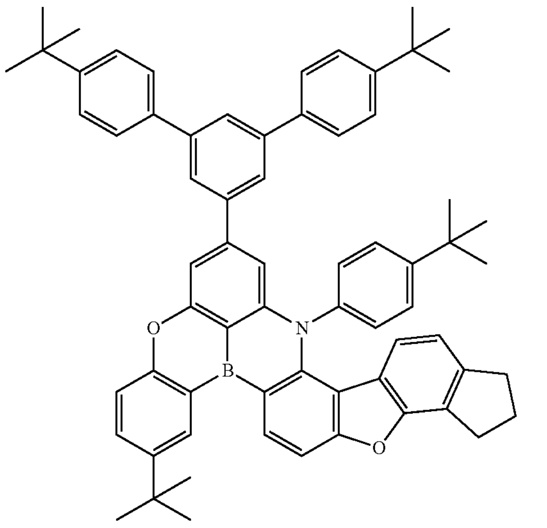
1-103
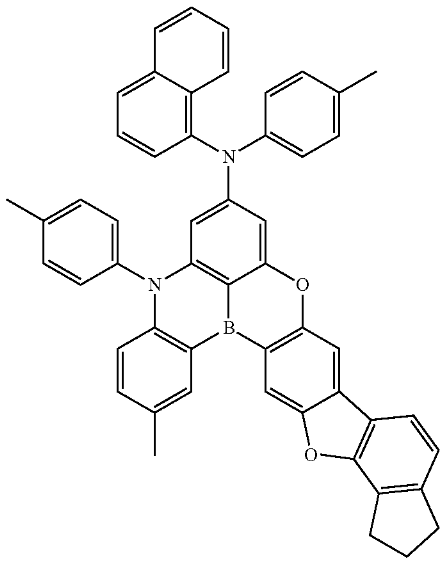
1-104
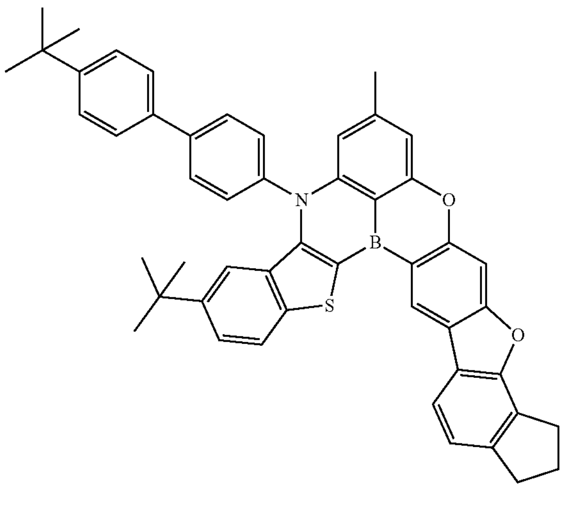
-continued
1-105
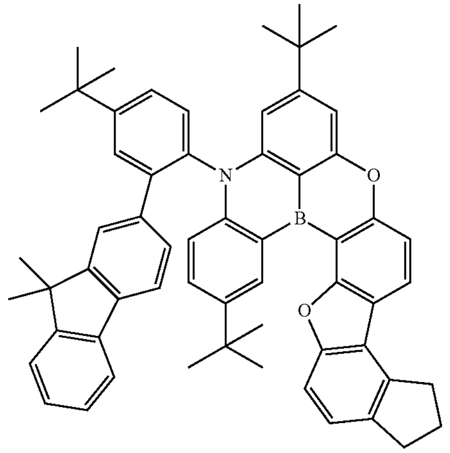
1-106
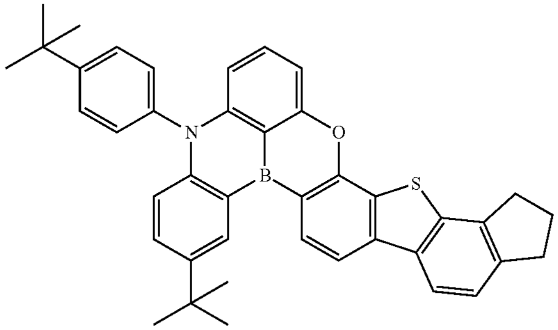
1-107
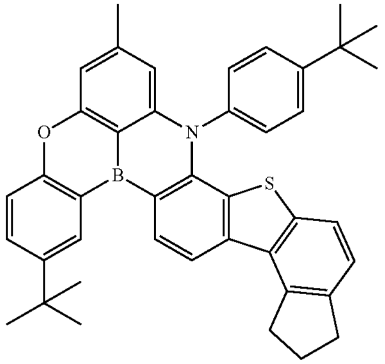
1-108
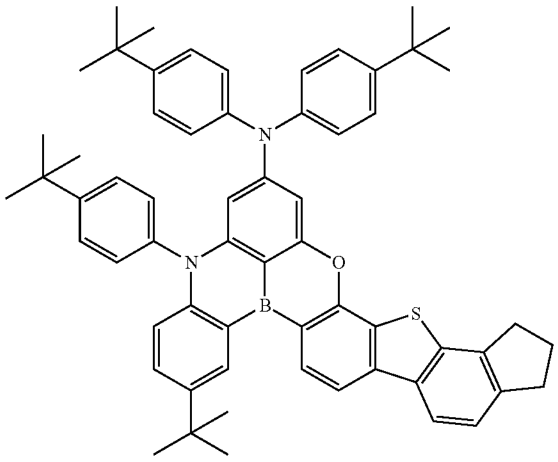

-continued
1-109
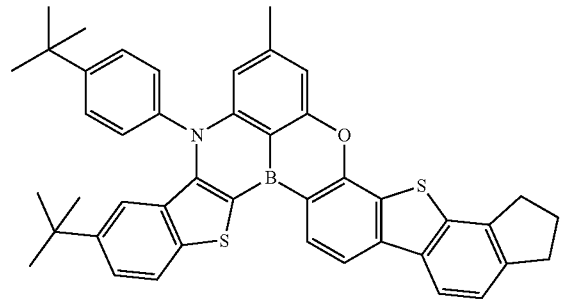
1-110
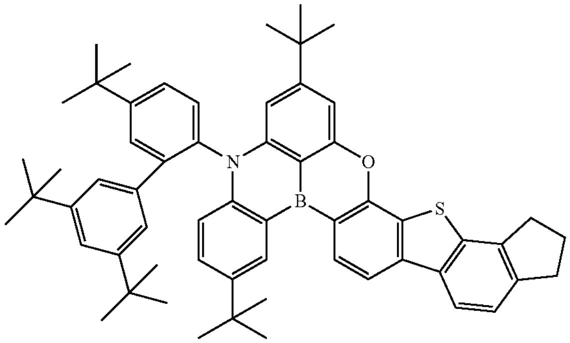
1-111
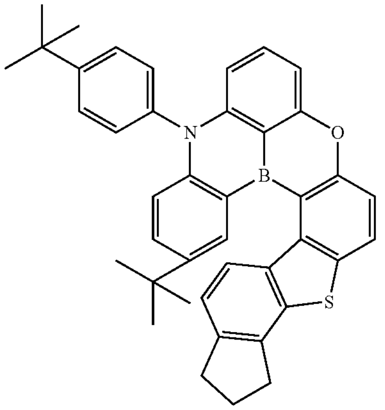
1-112
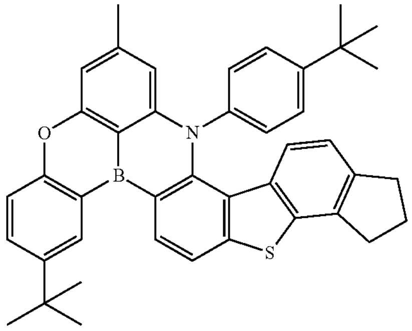
-continued
1-113
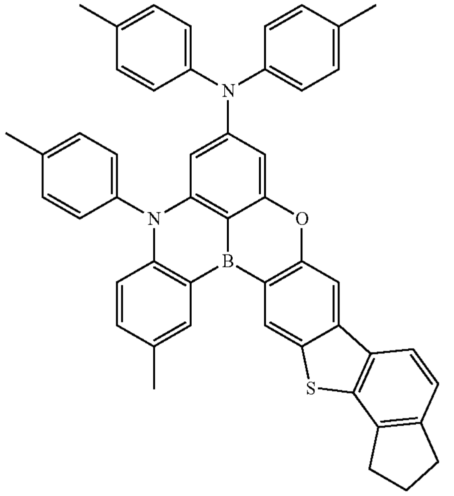
1-114
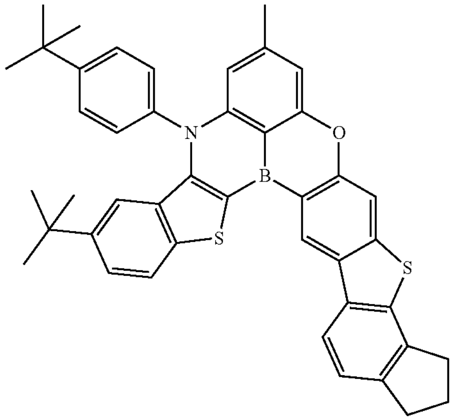
1-115
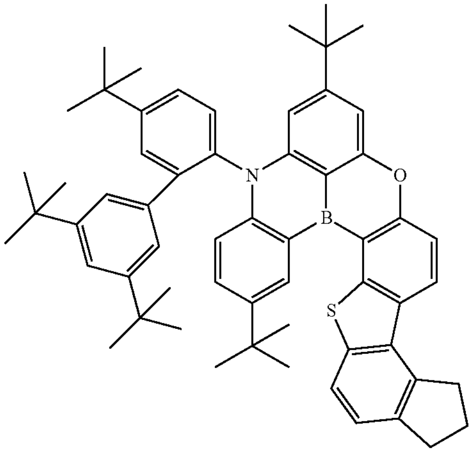

-continued
1-116
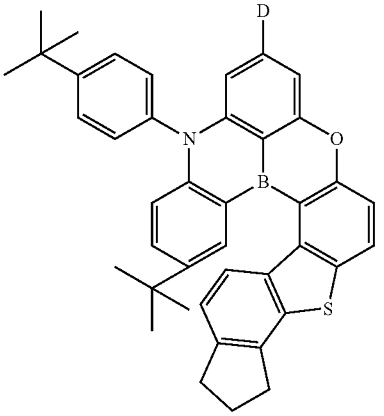
1-117
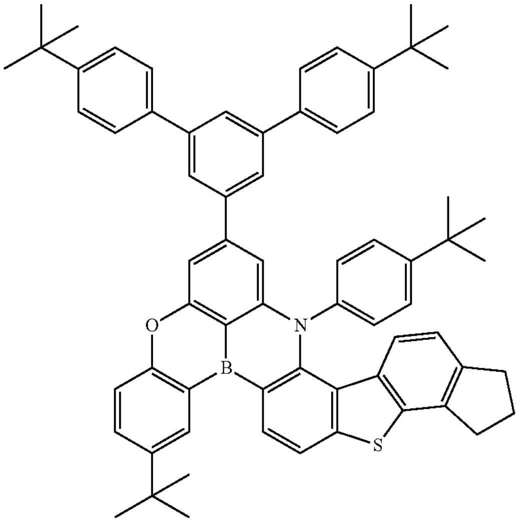
1-118
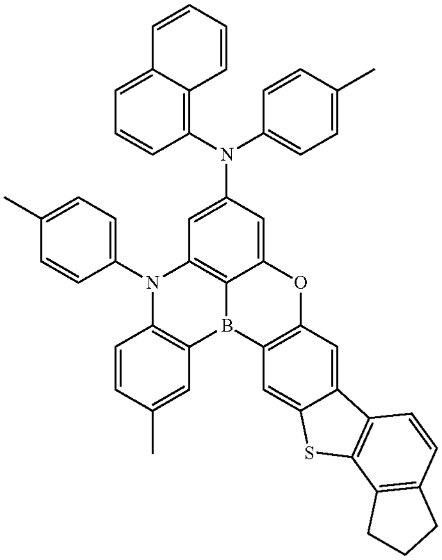
-continued
1-119
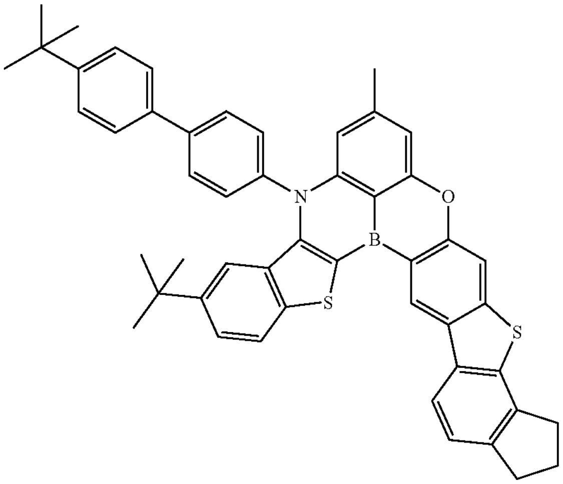
1-120
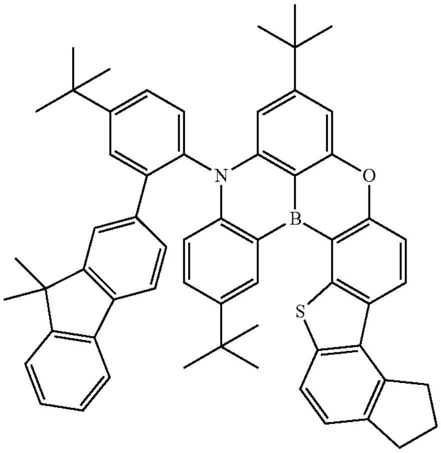
1-121
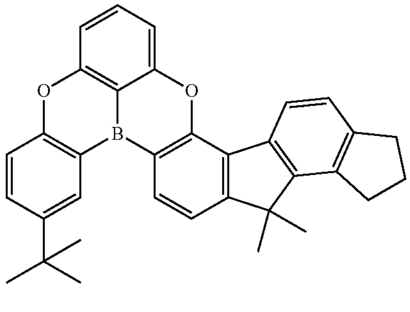
1-122
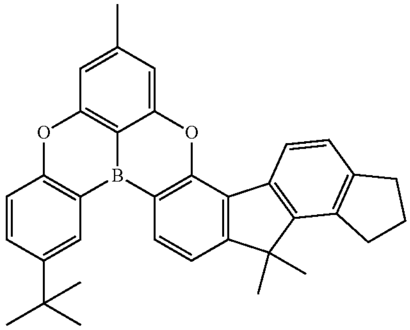

-continued
1-123
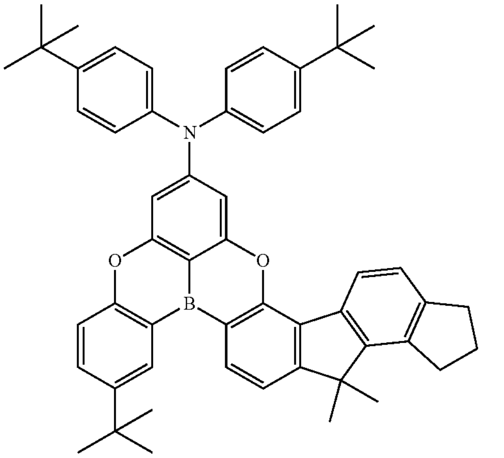
1-124
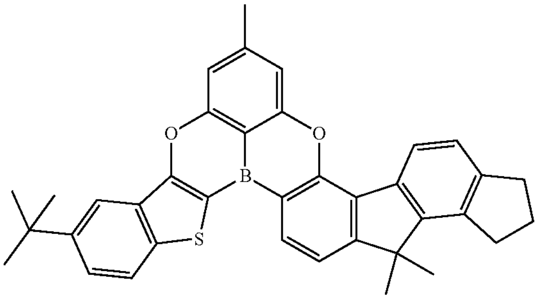
1-125
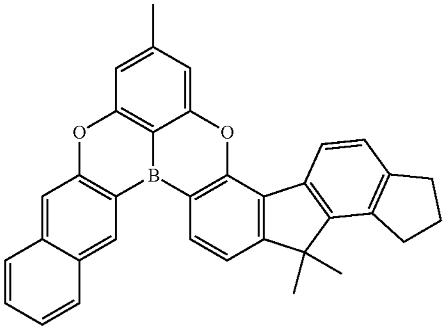
1-126
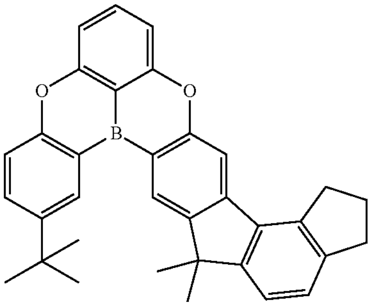
-continued
1-127
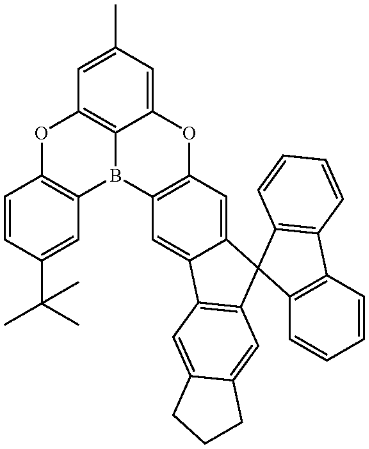
1-128
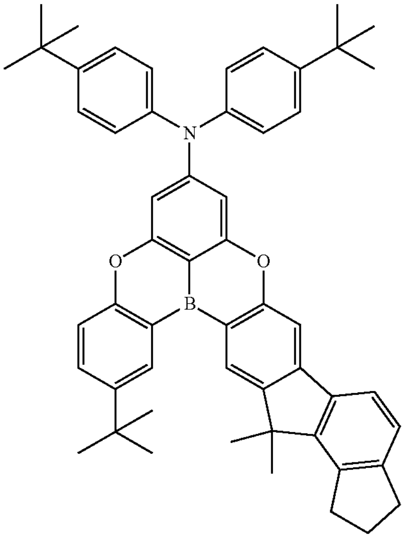
1-129
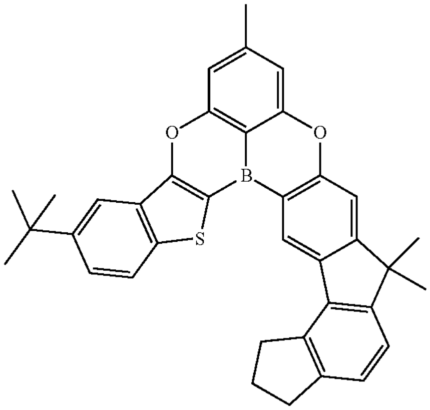

-continued
1-130
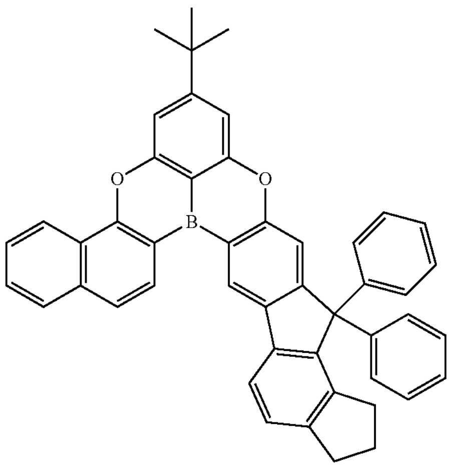
1-131
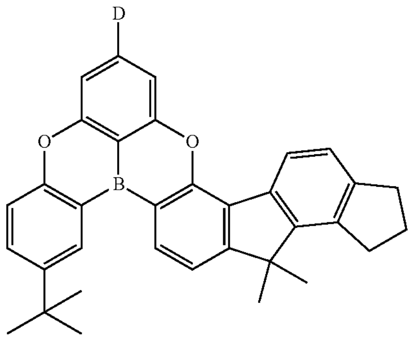
1-132
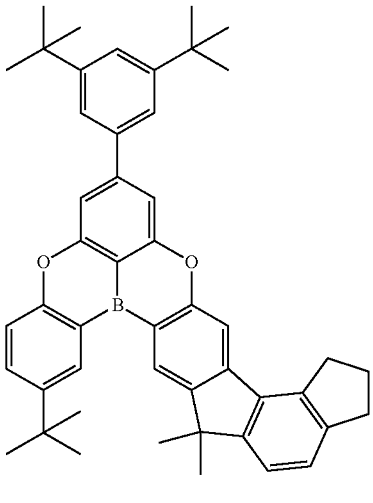
-continued
1-133
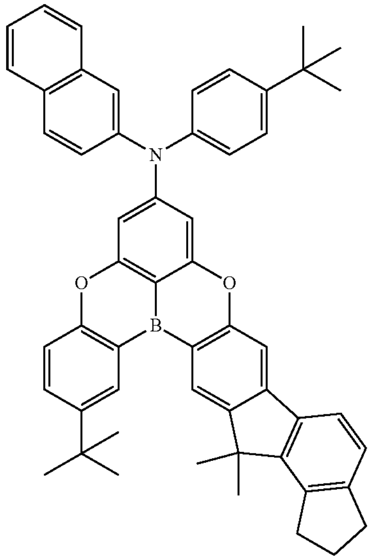
1-134
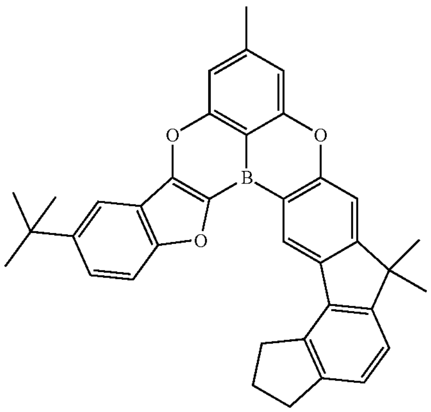
1-135
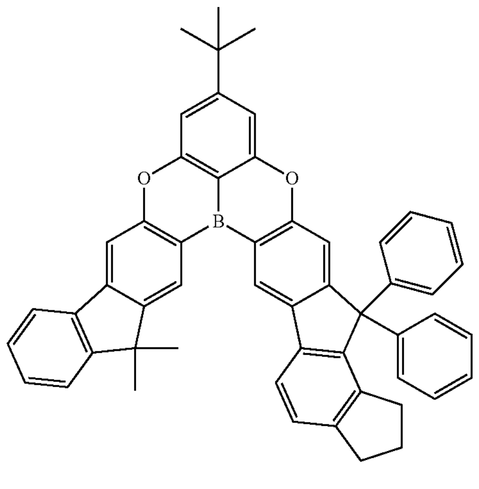

-continued
1-136
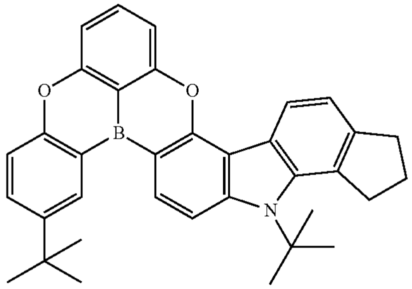
1-137
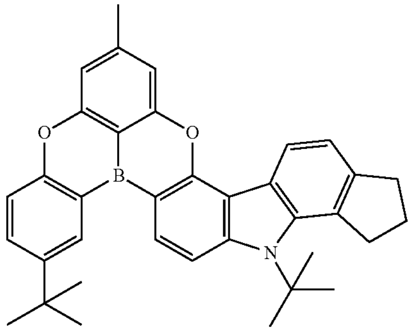
1-138
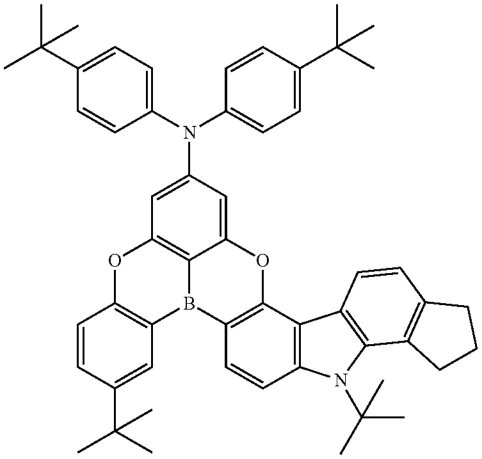
1-139
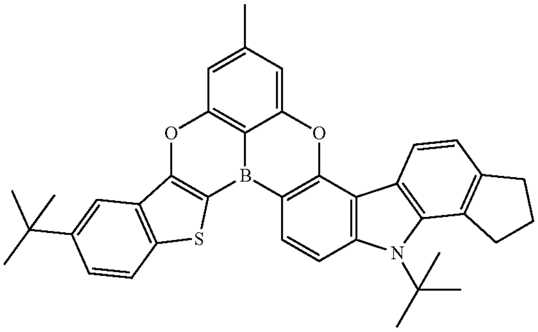
-continued
1-140
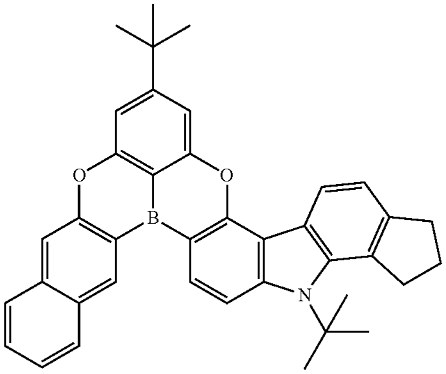
1-141
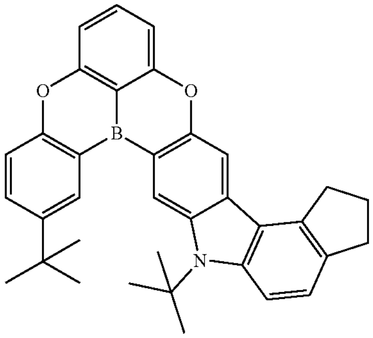
1-142
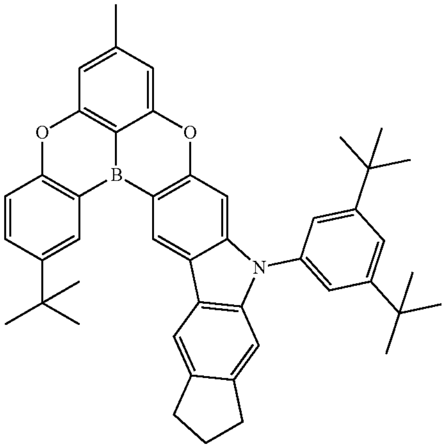

-continued
1-143
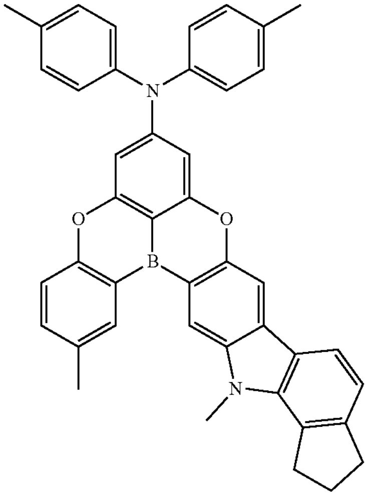
1-144
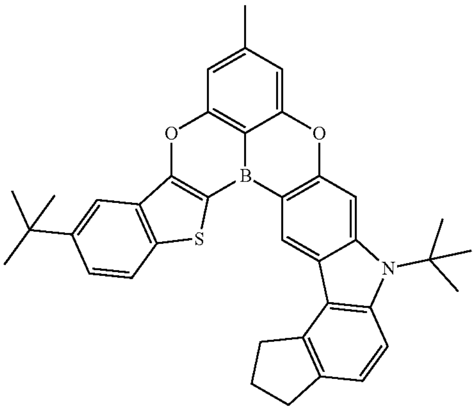
1-145
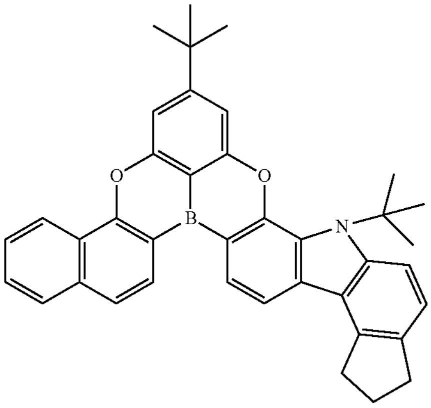
-continued
1-146
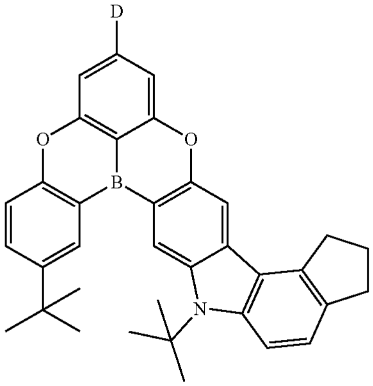
1-147
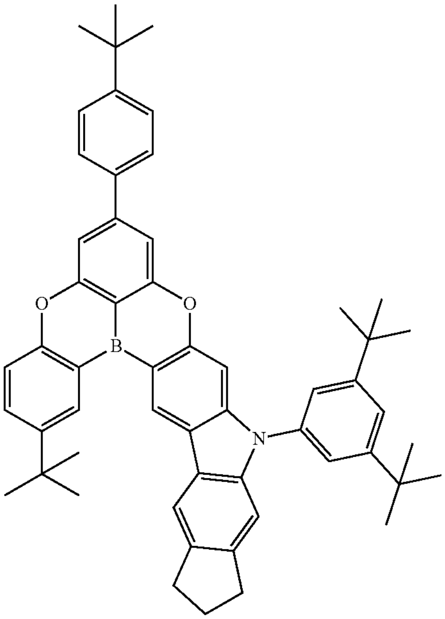
1-148
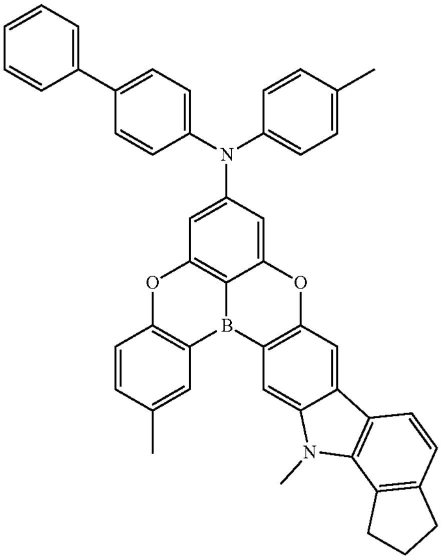

-continued
1-149
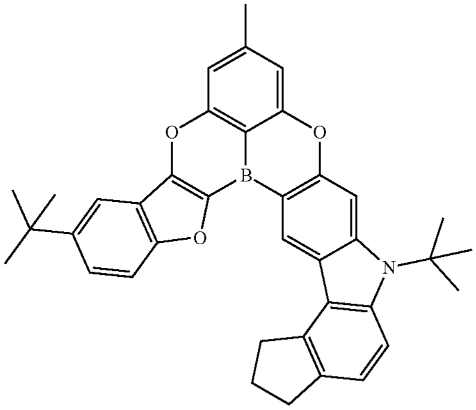
1-150
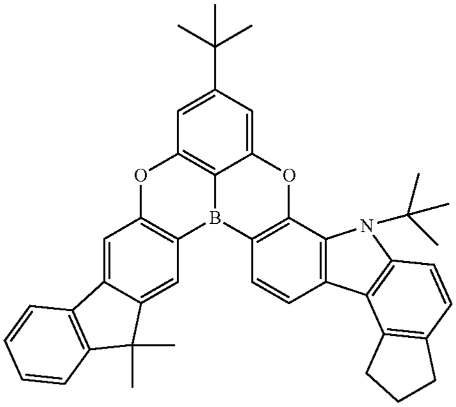
1-151
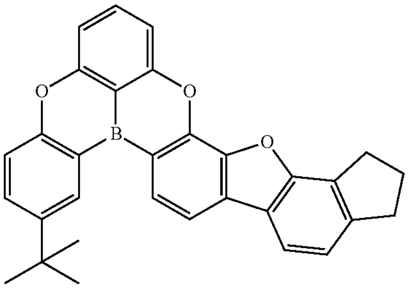
1-152
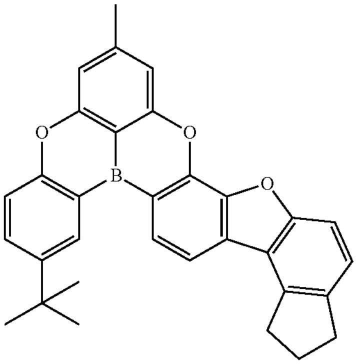
-continued
1-153
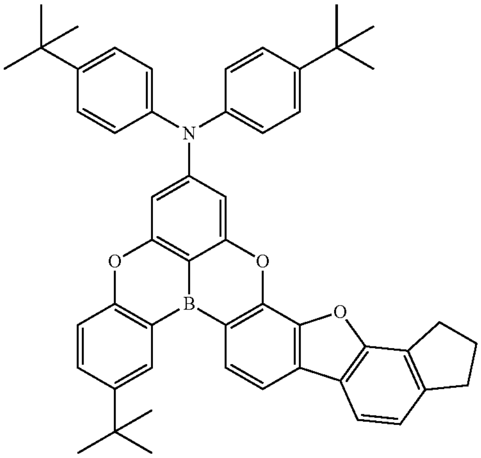
1-154
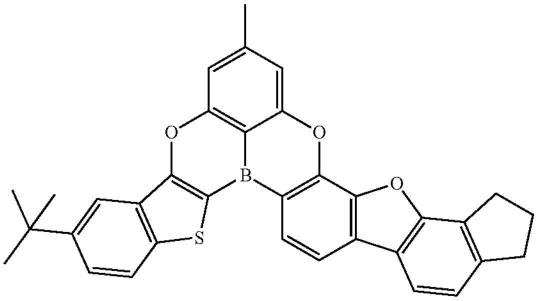
1-155
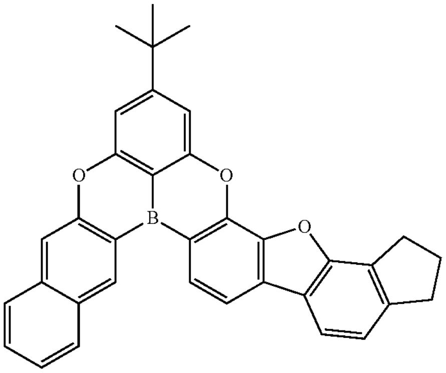
1-156
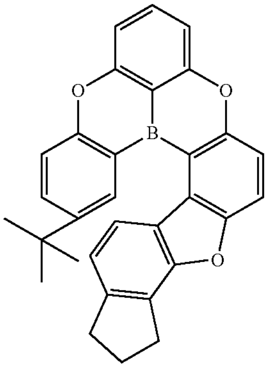

-continued
1-157
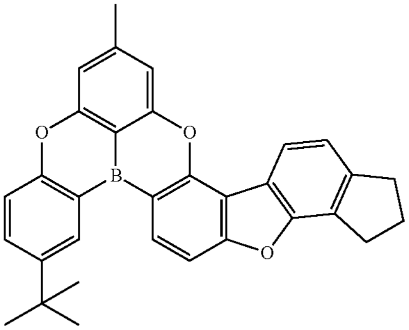
1-158
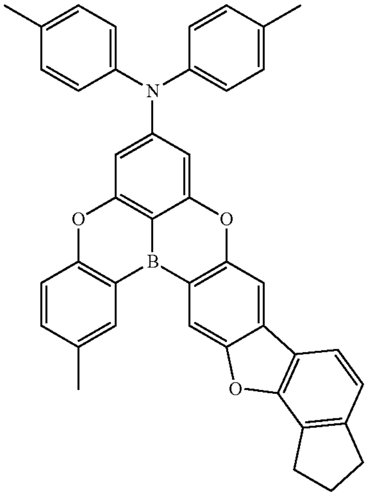
1-159
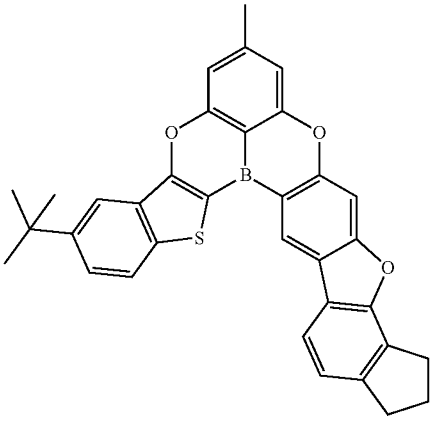
-continued
1-160
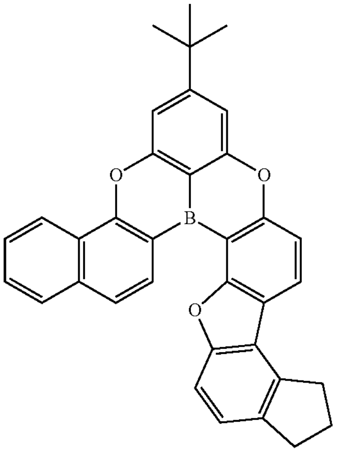
1-161
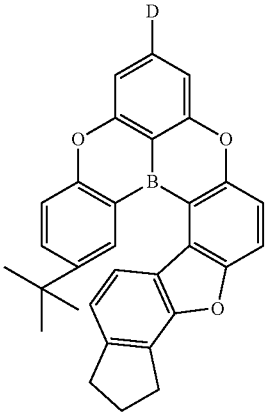
1-162
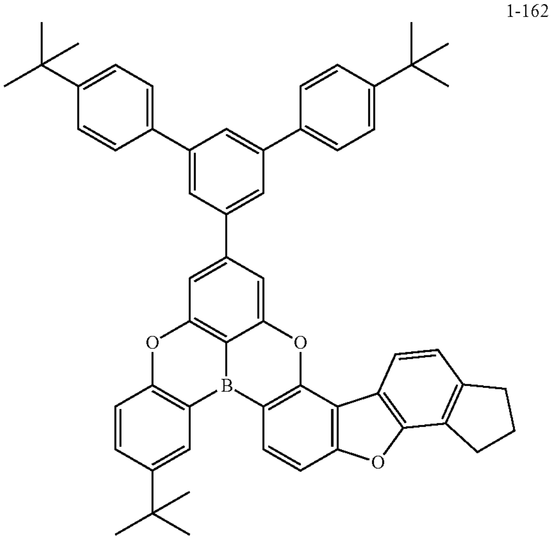

-continued
1-163
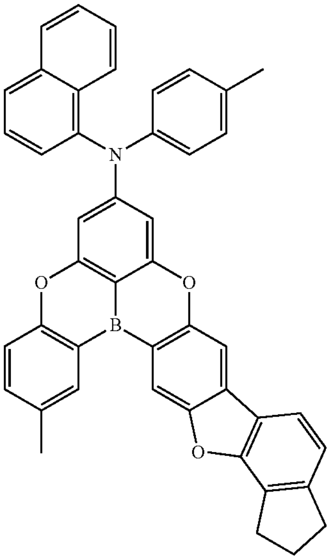
1-164
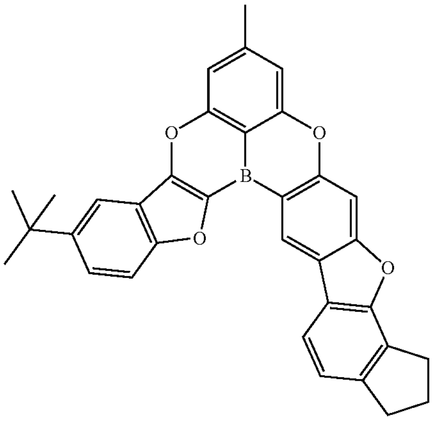
1-165
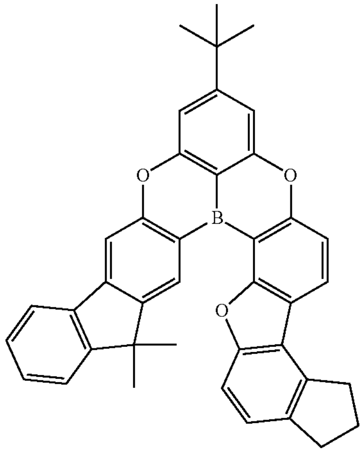
-continued
1-166
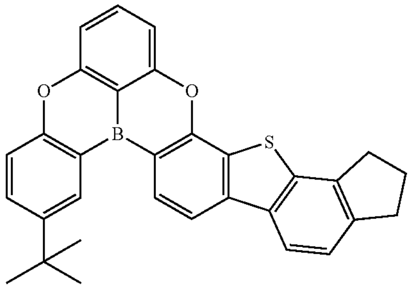
1-167
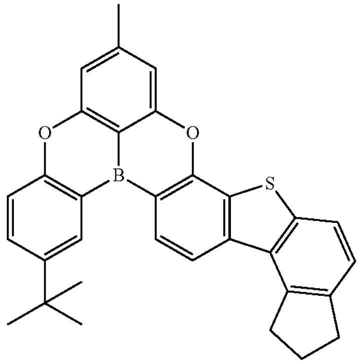
1-168
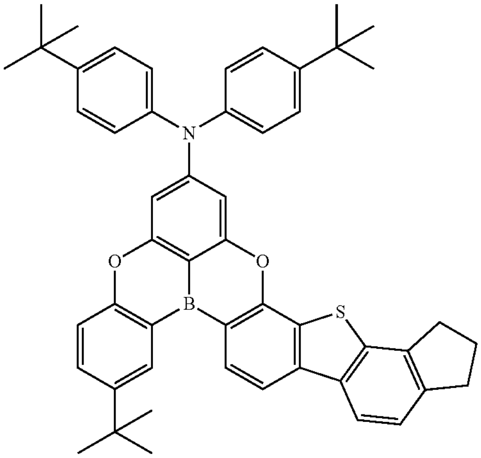
1-169
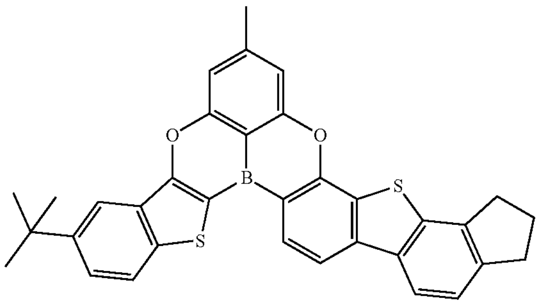

-continued
1-170
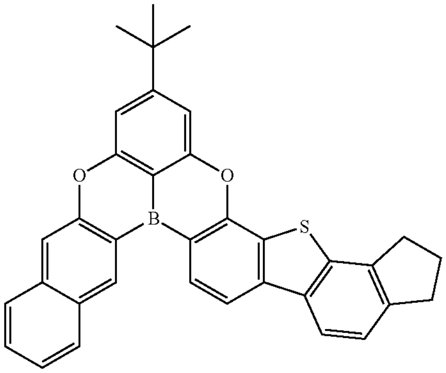
1-171
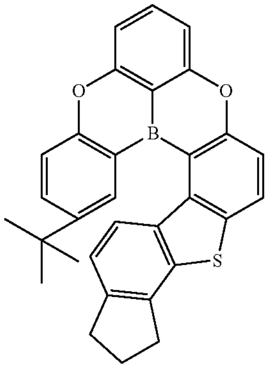
1-172
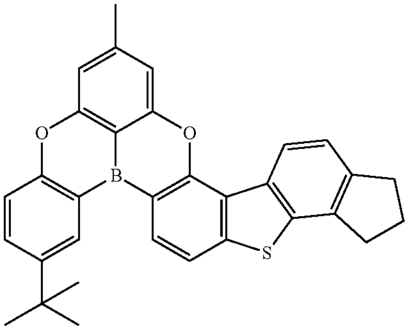
1-173
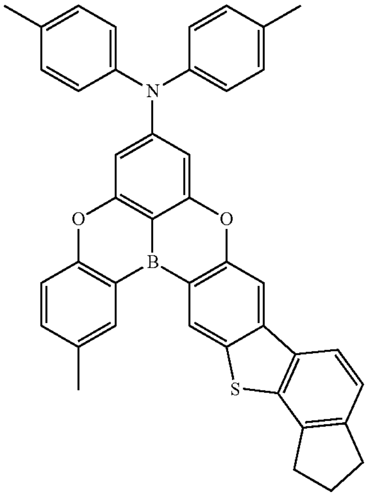
-continued
1-174
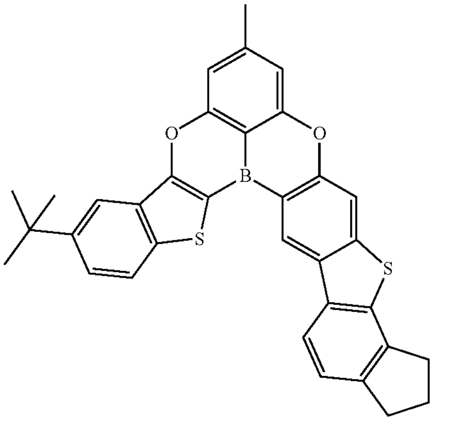
1-175
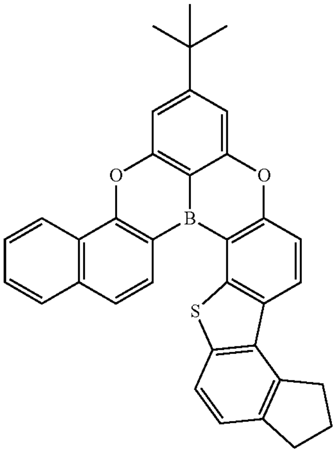
1-176
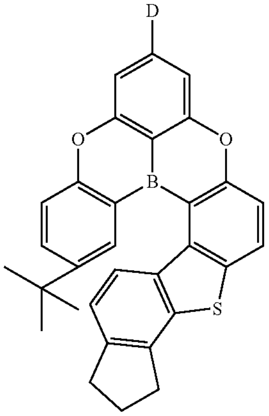

-continued
1-177
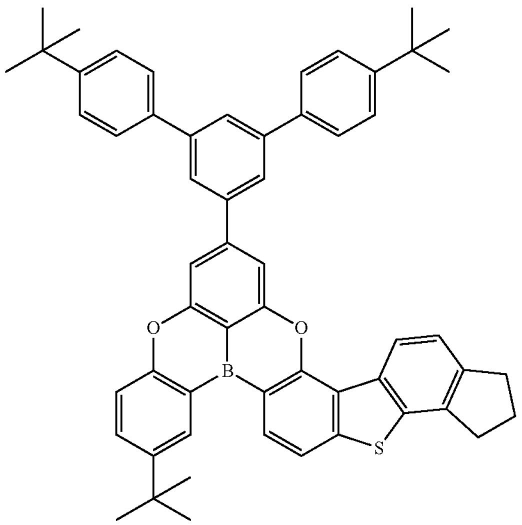
1-178
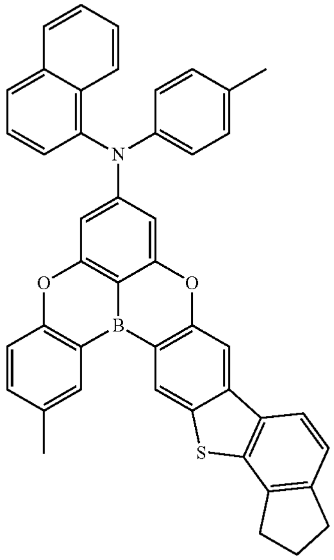
1-179
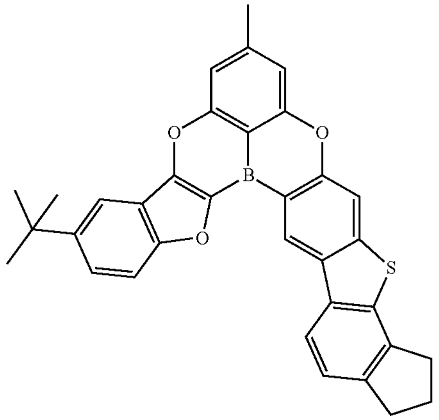
-continued
1-180
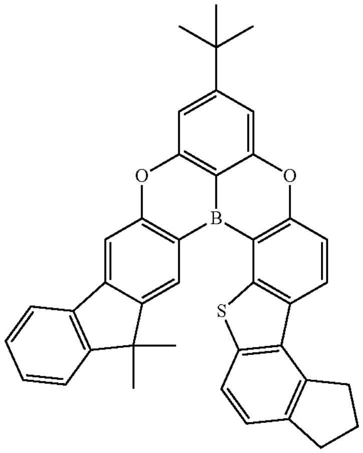
1-181
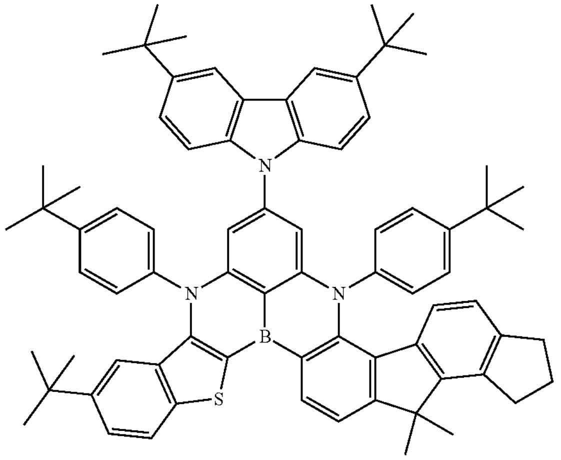
1-182
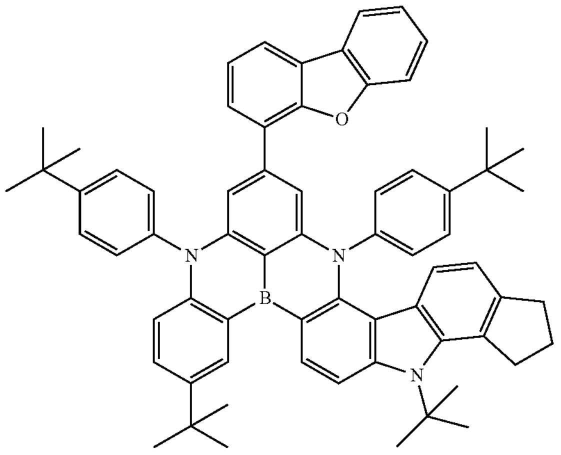

-continued
1-183
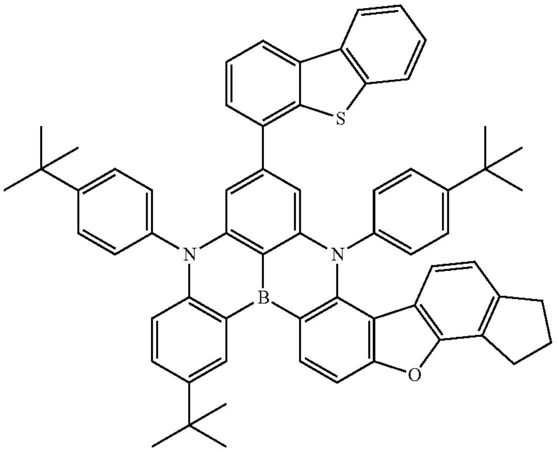
1-184
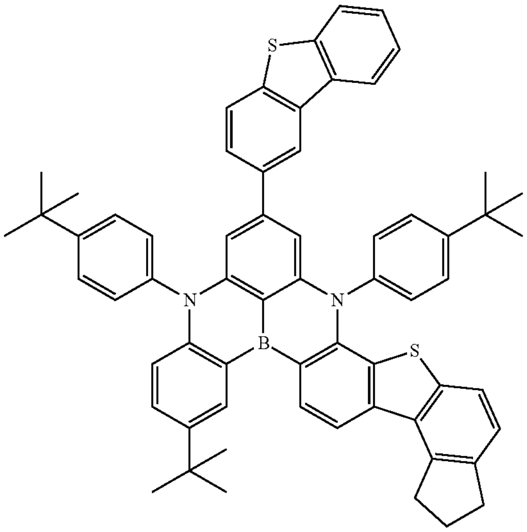
1-185
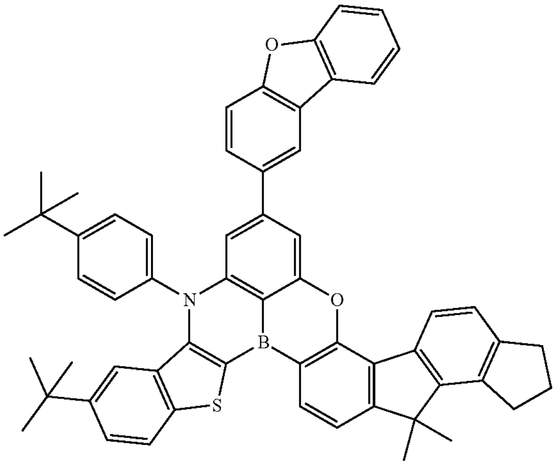
-continued
1-186
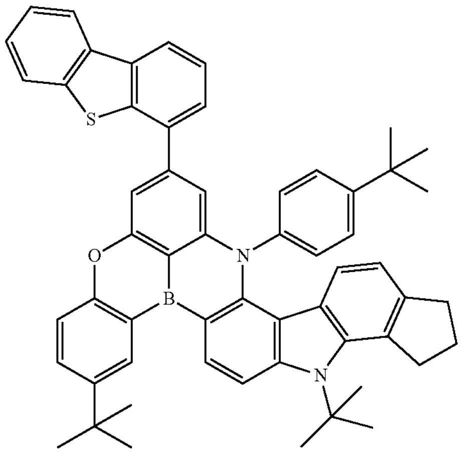
1-187
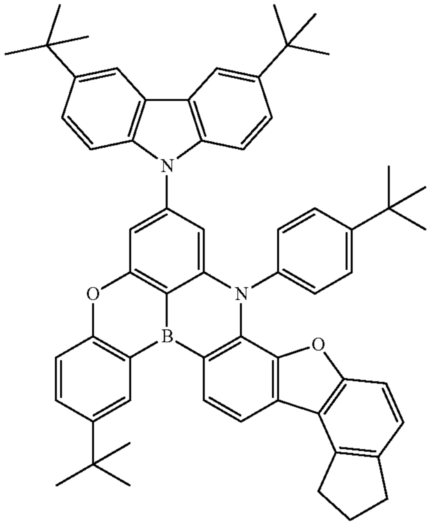
1-188
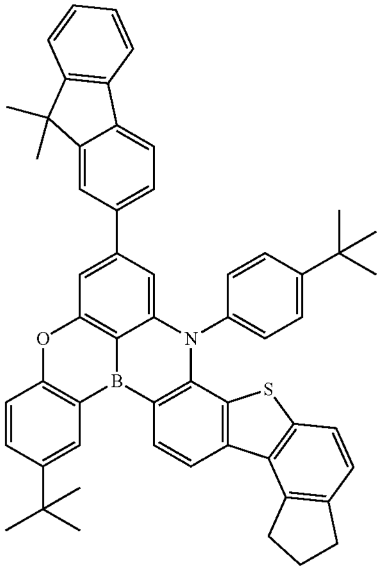

-continued
1-189
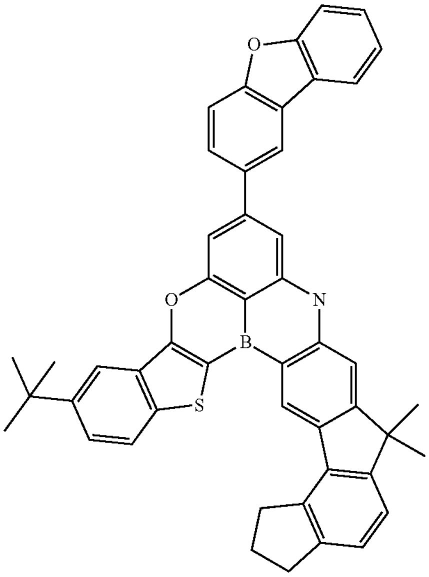
1-190
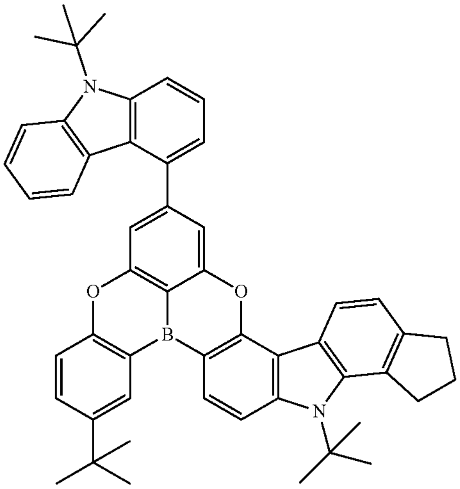
1-191
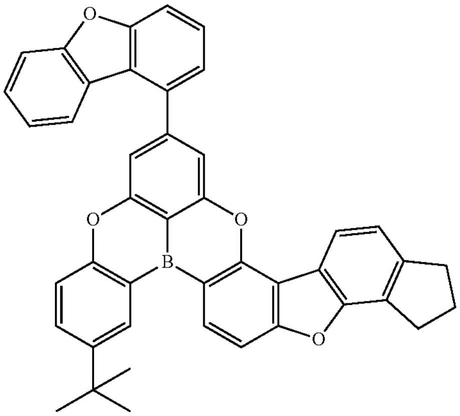
-continued
1-192
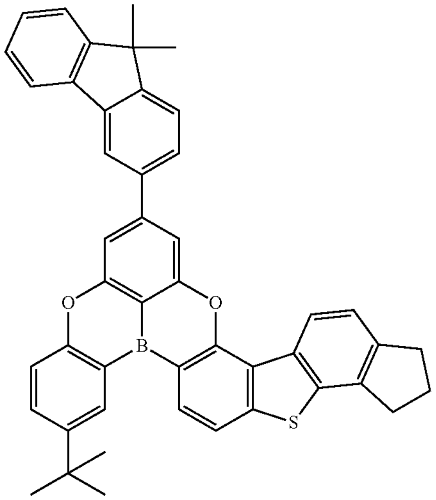
1-193
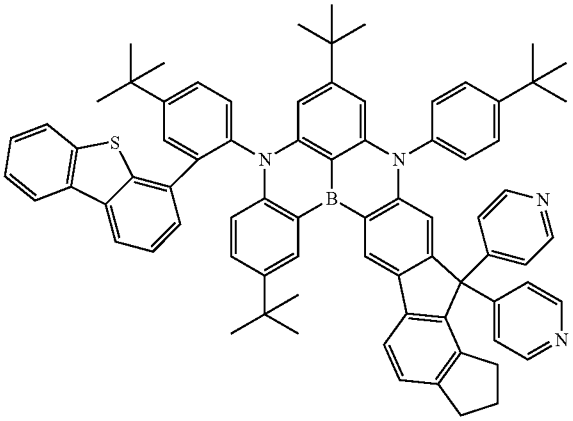
1-194
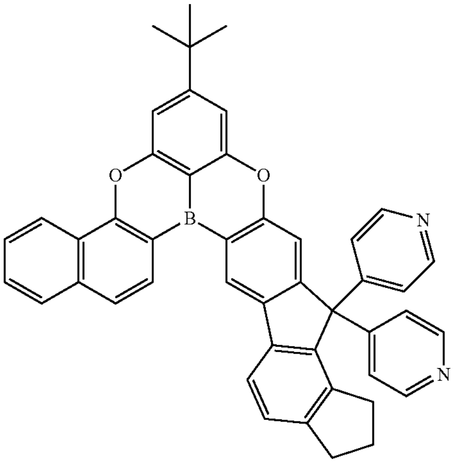

-continued 1-195

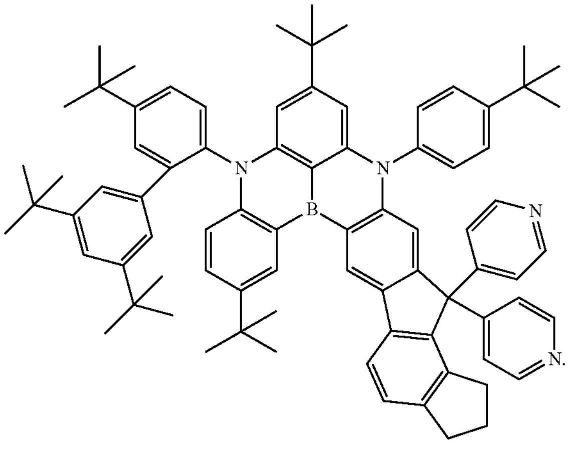

In one embodiment, $R_1$ is selected from H, D, methyl, tert-butyl, or a substituted phenyl group or an N-aryl substituted amino group;

Z is independently selected from $CR_2R_3$, $NR_4$, O, or S;

X and Y are each independently selected from O or $NR_5$;

$R_2$ and $R_3$ are methyl; or $R_2$ and $R_3$, together with carbon atoms connecting $R_2$ and $R_3$ form a ring consisting of 5 atoms;

$R_4$ is selected from methyl, t-butyl, or a substituted phenyl group;

$R_5$ is independently selected from substituted or unsubstituted phenyl or biphenyl;

$Ar_1$ is independently selected from substituted or unsubstituted phenyl, benzothiophene, naphthalene, or fluorenyl.

A mixture including an organic compound H1 and an organic compound H2, and the mass ratio of the organic compound H1 to the organic compound H2 is in the range of 99:1-70:30, and the organic compound H1 is selected from any of the above The boron-containing organic compound described in the embodiment, the organic compound H2 includes at least one organic functional material, and the organic functional material is selected from hole injection materials, hole transport materials, electron transport materials, electron injection materials, electron blocking materials, hole blocking materials, luminescent guest materials, luminescent host materials, and organic dyes.

A composition including the boron-containing organic compound described in any one of the above embodiments, and an organic solvent.

An organic electronic device, including the boron-containing organic compound described in any one of the above embodiments, or the mixture described in the above embodiments.

The beneficial effects of the present invention at least include:

The invention provides a boron-containing organic compound as a new type of material. By introducing a cyclopentyl-containing hole transport group into the boron-containing compound, on the one hand, it is beneficial to improve the hole transport performance of the compound, and on the other hand, it can enhance The resonance performance of the molecule enables the application of boron-containing organic compounds to organic light-emitting devices, which can effectively improve the light extraction efficiency. At the same time, the cyclopentyl group can effectively increase the distance between molecules and inhibit the exciton quenching caused by the accumulation between molecules, when the boron-containing organic compound is applied to the blue light material, the stability and life of the device can be effectively improved.

BRIEF DESCRIPTION OF DRAWINGS

In order to more clearly illustrate the technical solutions in the embodiments of the present application, the drawings that need to be used in the description of the embodiments will be briefly introduced below. Obviously, the drawings in the following description are only some embodiments of the present application. For those skilled in the art, other drawings can also be obtained based on these drawings without any creative effort.

FIG. 1 is a schematic structural diagram of an organic electroluminescent device provided in an embodiment of the present application.

Elements in the drawings are designated by reference numerals listed below.

1, substrate; 2, anode; 3, hole injection layer; 4, hole transport layer; 5, light-emitting layer; 6, electron transport layer; 7, cathode.

DETAILED DESCRIPTION OF PREFERRED EMBODIMENTS

The technical solutions in the embodiments of the present application will be clearly and completely described below. Obviously, the described embodiments are only a part of the embodiments of the present application, but not all of the embodiments. Based on the embodiments in the present application, all other embodiments obtained by a person of ordinary skill in the art without creative efforts shall fall within the protection scope of the present application.

Embodiment of the present application provides a boron-containing organic compound and applications thereof, which will be described in detail below. It should be noted that the description sequence of the following embodiments is not intended to limit the preferred sequence of the embodiments. In addition, in the description of the present application, the term “including” means “including but not limited to”. Various embodiments of the present invention may exist in a range format; it should be understood that the description in a range format is only for convenience and brevity, and should not be construed as a rigid limitation on the scope of the present invention. Accordingly, the stated range description should be considered to have specifically disclosed all the possible subranges as well as individual values within that range. For example, a description of a range from 1 to 6 should be considered to have specifically disclosed subranges, such as from 1 to 3, from 1 to 4, from 1 to 5, from 2 to 4, from 2 to 6, from 3 to 6, etc., and a single number within this range, such as 1, 2, 3, 4, 5, and 6, and such a principle applies regardless of the ranges. Additionally, whenever a numerical range is indicated herein, it is meant to include any cited numeral (fractional or integral) within the indicated range.

The boron-containing organic compound of the present invention has a chemical structure shown in the following general formula (I):

1. A boron-containing organic compound as shown in general formula (I):

(I)

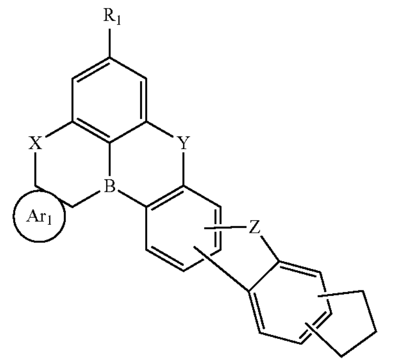

wherein $R_1$ is selected from H, D, a substituted or unsubstituted $C_{1-20}$ alkyl group, a substituted or unsubstituted amino group, a substituted or unsubstituted $C_{6-30}$ aromatic group, or a substituted or unsubstituted $C_{5-30}$ heteroaromatic group;

Z is independently selected from $CR_2R_3$, $NR_4$, O, or S;

X and Y are independently selected from O or $NR_5$;

$R_2$, $R_3$, $R_4$, and $R_5$ are each independently selected from a substituted or unsubstituted $C_{1-20}$ alkyl group, a substituted or unsubstituted $C_{6-30}$ aromatic group, or a substituted or unsubstituted $C_{5-30}$ heteroaromatic group; or $R_2$ and $R_3$, together with carbon atoms connecting $R_2$ and $R_3$ form a ring consisting of 3-12 atoms; and $Ar_1$ is independently selected from a substituted or unsubstituted $C_{6-30}$ aromatic group, or a substituted or unsubstituted $C_{5-30}$ heteroaromatic or non-aromatic group.

Terms and Definitions

In the present invention, "substituted" means that a hydrogen atom in the group is replaced by a substituent.

In the present invention, when the same substituent appears multiple times, it can be independently selected from different groups. For example, the general formula may contain multiple numbers of R5, each R5 can be independently selected from different groups.

In the present invention, aromatic groups, aromatics, and aromatic ring system have the same meaning and can be interchanged.

In the present invention, heteroaromatic groups, heteroaromatics, and heteroaromatic ring system have the same meaning and can be interchanged.

In the present invention, "substituted or unsubstituted" means that the defined group may be substituted or unsubstituted. When the defined group is substituted, it should be understood that the defined group can be substituted by one or more substituents R, the substituent R is selected from but not limited to: a deuterium atom, a cyano group, an isocyano group, a nitro group, or halogen, alkyl containing 1-20 carbon atoms, a heterocyclic group containing 3-20 ring atoms, an aromatic group containing 6-20 ring atoms, a heteroaromatic group containing 5-20 ring atoms, —NR'R", silyl, carbonyl, alkoxycarbonyl, aryloxycarbonyl, carbamoyl, haloformyl, formyl, an isocyanate group, a thiocyanate group, an isothiocyanate group, a hydroxyl group, and a trifluoromethyl group. In addition, the above groups can also be further substituted by substituents acceptable in the art.

It can be understood that R' and R" in —NR'R" are independently selected from but not limited to: H, deuterium atom, a cyano group, an isocyano group, a nitro group, or halogen, an alkyl group containing 1-10 C atoms, a heterocyclic group containing 3-20 ring atoms, an aromatic group containing 6-20 ring atoms, and a heteroaromatic group containing 5-20 ring atoms.

Preferably, R is selected from but not limited to: a deuterium atom, a cyano group, an isocyano group, a nitro group, or halogen, an alkyl group containing 1-10 C atoms, a heterocyclic group containing 3-10 ring atoms, an aromatic group containing 6-20 ring atoms, a heteroaromatic groups containing 5-20 ring atoms, silyl, carbonyl, alkoxycarbonyl, aryloxycarbonyl, carbamoyl, haloformyl, formyl, an isocyanate group, a thiocyanate group, an isothiocyanate group, a hydroxyl group, and a trifluoromethyl group. In addition, the above groups can also be further substituted by substituents acceptable in the art.

In the present invention, "a ring consisting of 3 to 12 atoms" means a structural compound obtained by bonding atoms into a ring (for example, a monocyclic compound, a fused ring compound, a cross-linked compound, a carbocyclic compound, and a heterocyclic compound), and a number of atoms among the atoms constituting the ring itself is 3-12. When the ring is substituted by a substituent, the atoms included in the substituent are not included in the ring-forming atoms. The same applies to "a ring consisting of 3-8 atoms" and "a ring consisting of 3-6 atoms" described below unless otherwise specified. For example, a number of ring atoms in a benzene ring is 6, the number of ring atoms in a naphthalene ring is 10, and a number of ring atoms in a thienyl group is 5.

In the present invention, "an aryl or aromatic group" refers to an aromatic hydrocarbon group derived from an aromatic ring compound in which a hydrogen atom is removed, which can be a monocyclic aryl group, a fused-ring aryl group, or a polycyclic aryl group, wherein for the polycyclic ring species, at least one ring is an aromatic ring system. For example, a "substituted or unsubstituted aryl group having 6 to 40 ring atoms" refers to an aryl group containing 6 to 40 ring atoms, preferably a substituted or unsubstituted aryl group having 6 to 30 ring atoms, more preferably a substituted or unsubstituted aryl group with 6 to 18 ring atoms, and particularly a substituted or unsubstituted aryl group with 6 to 14 ring atoms, in which the aryl group is optionally further substituted. Suitable examples include, but are not limited to: phenyl, biphenyl, terphenyl, naphthyl, anthracenyl, phenanthrenyl, fluoranthenyl, triphenylene, pyrenyl, perylenyl, naphthacene, fluorenyl, perylene, acenaphthyl, and derivatives thereof.

It is appreciated that multiple aryl groups may also be interrupted by short non-aromatic units (e.g., including <10% of non-H atoms such as C, N or O atoms), such as acenaphthene, fluorene, or 9,9-diaryl diaryl fluorene, triarylamine, diaryl ether systems should also be included in the definition of aryl.

In the present invention, a "heteroaryl or heteroaromatic group" means a aryl in which at least one carbon atom is replaced by a non-carbon atom, and the non-carbon atom can be N atom, O atom, S atom, etc. For example, a "substituted or unsubstituted heteroaryl having 5 to 40 ring atoms" refers to a heteroaryl group having 5 to 40 ring atoms, preferably a substituted or unsubstituted heteroaryl group having 6 to 30 ring atoms, more preferably a substituted or unsubstituted heteroaryl group having 6 to 18 ring atoms, and particularly a substituted or unsubstituted heteroaryl group having 6 to 14 ring atoms, in which the heteroaryl group is optionally further substituted. Suitable examples include, but are not limited to: thienyl, furyl, pyrrolyl, diazolyl, triazolyl, imidazolyl, pyridyl, bipyridyl, pyrimidyl, triazinyl, acridinyl, pyridazinyl, pyrazinyl, quinolinyl, isoquinolinyl, quinazolinyl, quinoxalinyl, phthalazinyl, pyridopyrimidinyl, pyridopyrazinyl, benzothienyl, benzofuryl, indolyl, pyrroloimidazolyl, pyrrolopyrrolyl, thienopyrrolyl, thienothienyl, furopyrrolyl, furofuryl, thienofuryl, benzisoxazolyl, benzisothiazolyl, benzimidazolyl, o-diazinyl, phenanthridinyl, primidyl, quinazolinonyl, dibenzothienyl, dibenzofuranyl, carbazolyl, and derivatives thereof.

In the present invention, an "amino group" refers to a derivative of amines, which have the structural characteristics of formula —NR'R", and the definitions of R' and R" are the same as described above.

In the present invention, when a linking site is not specified in the group, it means that an arbitrary linkable site in the group can be used as the linking site.

In the present invention, when the same group contains multiple substituents indicated by the same reference numeral, each substituent may be the same or different from each other, for example, the six R groups on the benzene ring may be the same or different from each other.

In the present invention, a single bond connected to the substituent and penetrating through the corresponding ring refers a substituent which can be connected to any optional site of the ring, for example, R in

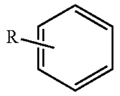

is connected to any substitutable site of the benzene ring.

The terms "combinations thereof", "any combination thereof", "any combining method thereof", "combinations", and the like used in the present invention include all suitable combinations of any two or more than two items in the listed groups.

In the present invention, "further", "furthermore", "particularly", and so on are used for the purpose of description, indicating differences in content, but should not be construed as limiting the protection scope of the present invention.

In the present invention, "optionally", "optional" and "an optiona" refer to dispensable, that is to say, any one selected from the two parallel schemes of "with" or "without". If there are multiple "optional" in a technical solution, unless otherwise specified, and there is no contradiction or mutual restriction relationship, each "optional" is independent.

In the present invention, the technical features described in an open form include closed technical solutions consisting of the enumerated features, as well as open technical solutions including the enumerated features.

In some embodiments of the present invention, in the boron-containing organic compound of the present invention, $R_1$ is selected from H, D, a substituted or unsubstituted $C_{1-12}$ alkyl group, a substituted or unsubstituted amino group, a substituted or unsubstituted $C_{6-20}$ aromatic group, or a substituted or unsubstituted $C_{5-20}$ heteroaromatic group.

Further, R1 is selected from H, D, a substituted or unsubstituted $C_{1-8}$ alkyl group, a substituted or unsubstituted amino group, a substituted or unsubstituted $C_{6-15}$ aromatic group, or a substituted or unsubstituted $C_{5-15}$ heteroaromatic group.

Further, R1 is selected from H, D, methyl, isopropyl, tert-butyl, tert-amyl, substituted or unsubstituted phenyl, naphthalene, dibenzofuran, dibenzothiophene, fluorenyl, carbazolyl, or an N-aryl substituted amino group.

In some embodiments of the present invention, Z is selected from O or S in the boron-containing organic compound of the present invention.

In some embodiments of the present invention, in the boron-containing organic compound of the present invention, at least one of X and Y is selected from $NR_5$.

Further, when one of X and Y is O, the other one of X and Y is $NR_5$.

In some embodiments of the present invention, $R_2$, $R_3$, $R_4$, and $R_5$ are each independently selected from a substituted or unsubstituted $C_{1-12}$ alkyl group, a substituted or unsubstituted $C_{6-20}$ aromatic group, or a substituted or unsubstituted $C_{5-20}$ heteroaromatic group; or $R_2$ and $R_3$, together with carbon atoms connecting $R_2$ and $R_3$ form a ring consisting of 3-8 atoms.

Further, $R_2$, $R_3$, $R_4$, and $R_5$ independently represent a substituted or unsubstituted $C_{1-8}$ alkyl group, a substituted or unsubstituted $C_{6-15}$ aromatic group, or a substituted or unsubstituted $C_{5-15}$ heteroaromatic group; or $R_2$ and $R_3$, together with carbon atoms connecting $R_2$ and $R_3$ form a ring consisting of 3-6 atoms.

In some embodiments of the present invention, in the boron-containing organic compound of the present invention, $R_2$ and $R_3$ are each independently selected from methyl, or substituted or unsubstituted phenyl.

In some embodiments of the present invention, in the boron-containing organic compound of the present invention, $R_5$ is independently selected from substituted or unsubstituted phenyl, naphthyl, dibenzofuran, dibenzothiophene, fluorenyl, or carbazolyl.

In some embodiments of the present invention, the boron-containing organic compound of the present invention is selected from the following compounds:

In one embodiment, $R_1$ is selected from H, D, methyl, tert-butyl, or a substituted phenyl group or an N-aryl substituted amino group;

Z is independently selected from $CR_2R_3$, $NR_4$, O, or S;

X and Y are each independently selected from O or $NR_5$;

$R_2$ and $R_3$ are methyl; or $R_2$ and $R_3$, together with carbon atoms connecting $R_2$ and $R_3$ form a ring consisting of 5 atoms;

$R_4$ is selected from methyl, t-butyl, or a substituted phenyl group;

$R_5$ is independently selected from substituted or unsubstituted phenyl or biphenyl;

$Ar_1$ is independently selected from substituted or unsubstituted phenyl, benzothiophene, naphthalene, or fluorenyl.

Wherein, the substituted phenyl group can include mono-tert-butyl substituted or multitert-butyl substituted phenyl; N-aryl substituted amino group can be N,N-p-tolyl substituted amino group; $R_2$ and $R_3$ are methyl; or $R_2$ and $R_3$, together with carbon atoms connecting $R_2$ and $R_3$ form a ring consisting of 5 atoms, specifically 9-fluorenyl; the substituted phenyl in $R_4$ can be 3,5-di-tert-butyl substituted phenyl; $R_5$ can be tert-butyl-substituted phenyl, tert-butyl-substituted biphenyl, or 9,9-dimethyl-fluorenyl-substituted phenyl; and Ar1 can be tert-butyl-substituted benzene ring, tert-butyl-substituted benzothiophene, methyl-substituted benzene ring, naphthalene, or 9,9-dimethylfluorene.

The present invention also provides a mixture including an organic compound H1 and an organic compound H2, wherein H1 is selected from the above boron-containing organic compounds, H2 is selected from another organic functional material, the organic compound H2 includes at least one organic functional material, the organic functional material can be selected from hole injection materials (HIM), hole transport materials (HTM), electron transport materials (ETM), electron injection materials (EIM), electron blocking materials (EBM), hole blocking materials (HBM), luminescent guest materials (Emitter), luminescent host materials (Host), and organic dyes.

In accordance with the above embodiments, a mass ratio of H1 to H2 in the mixture ranges from 99:1 to 70:30. Further, the mass ratio of H1 to H2 in the mixture ranges from 99:1 to 90:10, and specifically, it can be any one of 99:1, 99:2, 99:3, 99:4, 99:5, 99:6, 99:7, 99:8, 99:9, and 99:10.

The present invention also provides a composition, including at least one boron-containing organic compound or mixture described in the above embodiments, and at least one organic solvent.

The at least one organic solvent mentioned above is selected from aromatic or heteroaromatic, ester, aromatic ketone or aromatic ether, aliphatic ketone or aliphatic ether, alicyclic or olefinic compounds, or boric acid ester or phosphate ester compounds, or a mixture of two or more solvents.

Specifically, at least one organic solvent mentioned above is selected from aromatic or heteroaromatic based solvents, specifically including but not limited to: p-diisopropylbenzene, pentylbenzene, tetrahy dronaphthalene, cyclohexylbenzene, chloronaphthalene, 1,4-dimethylnaphthalene, 3-isopropylbiphenyl, p-methylcumene, pentapentylbenzene, tripentylbenzene, pentyltoluene, o-diethylbenzene, m-diethylbenzene, p-diethylbenzene, 1,2,3,4-tetramethylbenzene, 1,2,3,5-tetramethylbenzene, 1,2,4,5-tetramethylbenzene, butylbenzene, dodecylbenzene, dihexylbenzene, dibutylbenzene phenylbenzene, p-diisopropylbenzene, cyclohexylbenzene, benzylbutylbenzene, dimethylnaphthalene, 3-isopropylbiphenyl, p-methylcumene, 1-methylnaphthalene, 1,2,4-trichlorobenzene, 4,4-difluorodiphenylmethane, 1,2-dimethoxy-4-(1-propenyl)benzene, diphenylmethane, 2-phenylpyridine, 3-phenylpyridine, N-methyldiphenylamine, 4-isopropylbiphenyl, α,α-dichlorodiphenylmethane, 4-(3-phenylpropyl)pyridine, benzyl benzoate, 1,1-bis(3,4-dimethylphenyl)ethane, 2-isopropylnaphthalene, quinoline, isoquinoline, methyl 2-furanoate, and ethyl 2-furanoate.

Specifically, at least one organic solvent mentioned above can also be selected from aromatic ketone solvents, specifically including but not limited to: 1-tetralone, 2-tetralone, 2-(phenylepoxy)tetralone, 6-(methoxy)tetralone, acetophenone, propiophenone, benzophenone, and derivatives thereof, such as 4-methylacetophenone, 3-methylacetophenone, 2-methylacetophenone, 4-methylpropiophenone, 3-methylpropiophenone, and 2-methylpropiophenone.

Specifically, at least one organic solvent mentioned above can also be selected from aromatic ether solvents, specifically including but not limited to: 3-phenoxytoluene, butoxybenzene, p-anisaldehyde dimethyl acetal, tetrahydro-2-phenoxy-2h-pyran, 1,2-dimethoxy-4-(1-propenyl)benzene, 1,4-benzodioxane, 1,3-dipropylbenzene, 2,5-dimethoxytoluene, 4-ethyl ether, 1,3-dipropoxybenzene, 1,2,4-trimethoxybenzene, 4-(1-propenyl)-1, 2-dimethoxybenzene, 1,3-dimethoxybenzene, glycidyl phenyl ether, dibenzyl ether, 4-tert-butyl anisole, trans-p-propenyl anisole, 1,2-dimethoxybenzene, 1-methoxynaphthalene, diphenyl ether, 2-phenoxymethyl ether, 2-phenoxytetrahydrofuran, and ethyl-2-naphthyl ether.

Specifically, at least one organic solvent mentioned above can also be selected from aliphatic ketones, specifically including but not limited to: 2-nonanone, 3-nonanone, 5-nonanone, 2-decanone, 2,5-hexanedione, 2,6,8-trimethyl-4-nonanone, fenchone, phorone, isophorone, di-n-amyl ketone, etc.; or aliphatic ethers such as pentyl ether, hexane ether, dioctyl ether, ethylene glycol dibutyl ether, diethylene glycol diethyl ether, diethylene glycol butyl methyl ether, diethylene glycol dibutyl ether, triethylene glycol dimethyl ether, triethylene glycol ethyl methyl ether ether, triethylene glycol butyl methyl ether, tripropylene glycol dimethyl ether, and tetraethylene glycol dimethyl ether.

Specifically, at least one of the above-mentioned organic solvents can also be selected from ester-based solvents, specifically including but not limited to: alkyl octanoate, alkyl sebacate, alkyl stearate, alkyl benzoate, alkyl phenylacetate, alkyl cinnamate, alkyl oxalate, alkyl maleate, alkyl lactone, alkyl oleate, etc.; and particularly preferred are octyl caprylate, diethyl sebacate, diallyl phthalate, and isononyl isononanoate.

The above solvents can be used alone or as a mixture of two or more organic solvents.

In some preferred embodiments, a composition of the present invention includes at least one boron-containing organic compound or polymer or mixture as described above and at least one organic solvent, and may further include another organic solvent (that is, the solvent is a mixed solvent). The another organic solvent includes but is not limited to: methanol, ethanol, 2-methoxy ethanol, methylene chloride, chloroform, chlorobenzene, o-dichlorobenzene, tetrahydrofuran, anisole, morpholine, toluene, o-xylene, m-xylene, p-xylene, 1,4-dioxane, acetone, methyl ethyl ketone, 1,2-dichloroethane, 3-phenoxytoluene, 1,1,1-trichloroethane, 1,1,2,2-tetrachloroethane, ethyl acetate, butyl acetate, dimethylformamide, dimethylacetamide, dimethyl sulfone, tetralin, decalin, indene, and/or mixtures thereof.

In some preferred embodiments, solvents that are particularly suitable for the present invention are solvents with a Hansen solubility parameter in ranges of:

δd (dispersion force) is in a range of 17.0-23.2 MPa1/2, especially in the range of 18.5-21.0 MPa1/2;

δp (polar force) is in a range of 0.2-12.5 MPa1/2, especially in the range of 2.0-6.0 MPa1/2;

δh (hydrogen bonding force) is in a range of 0.9-14.2 MPa1/2, especially in the range of 2.0-6.0 MPa1/2.

According to the composition of the present invention, the organic solvent is selected by considering its boiling point parameter. In the present invention, the boiling point of the organic solvent is ≥150° C.; further, the boiling point of the organic solvent is preferably ≥180° C.; further, the boiling point of the organic solvent is preferably ≥200° C.; further, the boiling point of the organic solvent is preferably ≥250° C.; and further, the boiling point of the organic solvent is preferably ≥275° C. or ≥300° C.

Selecting the solvent in the above boiling point range can prevent nozzle clogging of the inkjet printing head, and the organic solvent can be evaporated from the solvent system to form a film containing the functional material.

In a preferred embodiment, the composition of the invention is a solution.

In another preferred embodiment, the composition according to the invention is a suspension.

The composition in the embodiment of the present invention may include 0.01 wt %-10 wt % of the compound or mixture according to the present invention, preferably 0.1 wt %-15 wt %, more preferably 0.2 wt %-5 wt %, and most preferably is 0.25 wt %-3 wt %.

The present invention also relates to the use of the composition as coating or printing ink in the preparation of organic electronic devices, particularly preferably the preparation method by printing or coating.

In the above, suitable printing or coating techniques include (but are not limited to) inkjet printing, nozzle printing, letterpress printing, screen printing, dip coating, spin coating, blade coating, roll printing, reverse roll printing, offset printing, flexographic printing, rotary printing, spraying, brushing or pad printing, slot coating, etc; and preferably gravure printing, jet printing, and inkjet printing. The solution or suspension may additionally include one or more components such as surface-active compounds, lubricants, wetting agents, dispersants, hydrophobic agents, binders, etc., for adjusting viscosity and film-forming properties, thereby improving adhesion, etc.

The present invention also provides an application of the boron-containing organic compound, mixture, or composition in the above-mentioned embodiments in an organic electronic device, and the specific scheme is as follows:

The present invention also provides an organic electronic device, which includes the boron-containing organic compound, the mixture, or the above composition.

The organic electronic device includes a first electrode, a second electrode, and one or more organic functional layers located between the first electrode and the second electrode. The organic functional layer includes the above-mentioned boron-containing organic compound, mixture, or composition is prepared.

Further, the organic electronic device includes a cathode, an anode, and one or more organic functional layers located between the cathode and the anode.

The organic electronic devices include, but are not limited to, organic light-emitting diodes (OLEDs), organic photovoltaic cells (OPV), organic light-emitting cells (OLEECs), organic field-effect transistors (OFETs), organic light-emitting field-effect transistors, organic lasers, organic spintronic devices, organic sensors, organic plasmon emitting diodes, etc., the embodiment of the present application takes organic electroluminescent devices as examples for illustration, such as OLEDs, OLEECs, and organic light-emitting field effect transistors.

The organic functional layer described in the present invention can be selected from a hole injection layer (HIL), a hole transport layer (HTL), a light-emitting layer (EML), an electron blocking layer (EBL), an electron injection layer (EIL), an electron transport layer (ETL), or a hole blocking layer (HBL).

In one embodiment, the organic functional layer includes at least one light-emitting layer, wherein the light-emitting layer includes the boron-containing organic compound or mixture described in any of the above embodiments, or is prepared from the composition in the above embodiments.

In one embodiment, the organic electronic device includes a cathode, an anode, and at least one light-emitting layer, wherein the light-emitting layer includes the boron-containing organic compound or mixture described in any one of the above embodiments.

In one embodiment, the organic electronic device includes a substrate; and an anode, a hole injection layer, a hole transport layer, an electron blocking layer, a light-emitting layer, an electron transport layer, an electron injection layer, and a cathode stacked on the substrate in sequence. Of course, the structure of the organic electronic device is not particularly limited thereto.

Specifically, the substrate may be transparent or opaque. A transparent substrate can be used to make a transparent light-emitting device. Details can be referred to Bulovic et al. Nature 1996, 380, p 29, and Gu et al., Appl. Phys. Lett. 1996, 68, p 2606.

The substrate can also be rigid or elastic. In some embodiments, the substrate is plastic, metal, semiconductor wafer, or glass. The substrate preferably has a smooth surface without surface defects. In a preferred embodiment, the substrate is flexible and can be selected from polymer film or plastic, which has a glass transition temperature Tg of above 150° C., preferably above 200° C., more preferably above 250° C., and most preferably above 300° C. Examples of suitable flexible substrates include poly(ethylene terephthalate) (PET) and polyethylene glycol (2,6-naphthalene) (PEN).

The anode is an electrode that injects holes, and the anode can easily inject holes into the hole injection layer, the hole transport layer, or the light-emitting layer. The anode may include a conductive metal, conductive metal oxide, or conductive polymer.

In one embodiment, an absolute value of a difference between the work function of the anode and the HOMO energy level or valence band energy level of the emitter in the light-emitting layer or p-type semiconductor material served as the HIL or HTL or electron blocking layer (EBL) is less than 0.5 eV, preferably less than 0.3 eV, and most preferably less than 0.2 eV. Anode materials include but are not limited to: Al, Cu, Au, Ag, Mg, Fe, Co, Ni, Mn, Pd, Pt, ITO, aluminum-doped zinc oxide (AZO), etc. Other suitable anode materials are known and can be readily selected for use by one of ordinary skill in the art. The anode material may be deposited using any suitable technique, such as a suitable physical vapor deposition method, including radio frequency magnetron sputtering, vacuum thermal evaporation, electron beam (e-beam), and the like. In certain embodiments, the anode is a patterned structure. Patterned ITO conductive substrates are commercially available and can be used to prepare devices according to the present application.

The cathode is an electrode that injects electrons, and the cathode can easily inject electrons into an electron injection layer, an electron transport layer, or a light-emitting layer. The cathode may include a conductive metal or a conductive metal oxide. In one embodiment, an absolute value of a difference between the work function of the cathode and the LUMO energy level or valence band energy level of the emitter in the light-emitting layer or n-type semiconductor material served as the an electron injection layer (EIL) or electron transport layer (ETL) or hole blocking layer (HBL) is less than 0.5 eV, preferably less than 0.3 eV, most preferably less than 0.2 eV. In principle, all materials that can be used as cathodes for organic electronic devices are suitable for use as cathode materials for devices of the present application. Examples of cathode materials include, but are not limited to: Al, Au, Ag, Ca, Ba, Mg, LiF/Al, a MgAg alloy, $BaF_2$/Al, Cu, Fe, Co, Ni, Mn, Pd, Pt, ITO, etc. The cathode material may be deposited using any suitable technique, such as a suitable physical vapor deposition method, including radio frequency magnetron sputtering, vacuum thermal evaporation, electron beam (e-beam), and the like.

The hole injection layer is used to promote the injection of holes from the anode to the light-emitting layer, and the hole injection material is a material that can skillfully receive holes injected from the positive electrode at a low voltage. Preferably, the highest occupied molecular orbital (HOMO) of the hole injection material is between the work function of the positive electrode material and the HOMO of the adjacent organic material layer. Specific materials for the hole injection materials include, but are not limited to, metalloporphyrins, oligothiophenes, arylamine-based organic materials, hexanitrile hexaazatriphenylene-based organic materials, quinacridone-based organic materials, perylene-based organic materials, and anthraquinones, polyaniline-based and polythiophene-based conductive polymers.

The hole transport layer may be configured to smoothly transport holes. The hole transport material known in the art for the hole transport layer is suitably a material having high hole mobility which can receive holes transported from the anode or the hole injection layer and transfer the holes to the light-emitting layer, and the materials of the hole transport include, but are not limited to, arylamine-based organic materials, conductive polymers, block copolymers with both conjugated and non-conjugated portions.

The electron transport layer may be configured to smoothly transport electrons. The electron transport material is suitably a material having high electron mobility that can skillfully receive electrons injected from the negative electrode and transfer the electrons to the light-emitting layer, and the specific examples of the electron transport layer may include, but are not limited to at least one of: Al complexes of 8-hydroxyquinoline, complexes containing Alq3, organic radical compounds, hydroxyflavone-metal complexes, lithium 8-hydroxyquinoline (LiQ), and benzimidazole-based compounds.

The electron injection layer can be configured to inject electrons smoothly. The electron injection material preferably has the ability to transport electrons, has the effect of injecting electrons from the negative electrode, and has an excellent effect of injecting electrons into the light-emitting layer or light-emitting material, preventing excitons generated from the light-emitting layer from moving to holes injection layer, and also has excellent ability to form films, and the specific examples of the electron injection layer include lithium 8-hydroxyquinolate (LiQ), fluorenone, anthraquinone dimethane, diphenoquinone, thiopyran dioxide, azole, diazole, triazole, imidazole, perylenetetracarboxylic acid, fluorenylmethane, anthrone, etc., and derivatives thereof, metal complex compounds, nitrogen-containing 5-membered ring derivatives, etc., but not particularly limited thereto.

The hole blocking layer is configured to block holes from reaching the negative electrode, and can generally be formed under the same conditions as the hole injection layer. Specific examples of the hole blocking layer include oxadiazole derivatives or triazole derivatives, phenanthroline derivatives, BCP, aluminum complexes, and the like, but are not particularly limited thereto.

The luminous wavelength of the organic electronic device is between 300 nm-1000 nm, preferably between 350 nm-900 nm, and more preferably between 400 nm-800 nm.

Preparation Method

In the present invention, preparation methods of some compounds as follows are selected for illustration: compounds 1-7, 1-12, 1-16, 1-29, 1-31, 1-40, 1-44, 1-48, 1-55, 1-56, 1-68, 1-82, 1-95, 1-113, 1-125, 1-143, 1-159, 1-180, and their preparation methods will be described in the order of compounds M1-M18.

The conventional reagents and starting materials in the following embodiments were purchased from commercial sources.

EMBODIMENT

Embodiment 1: Synthesis of Compound (M1)

(M1)

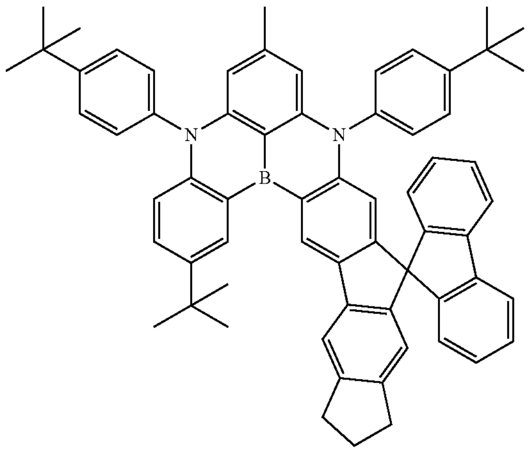

Synthetic Scheme

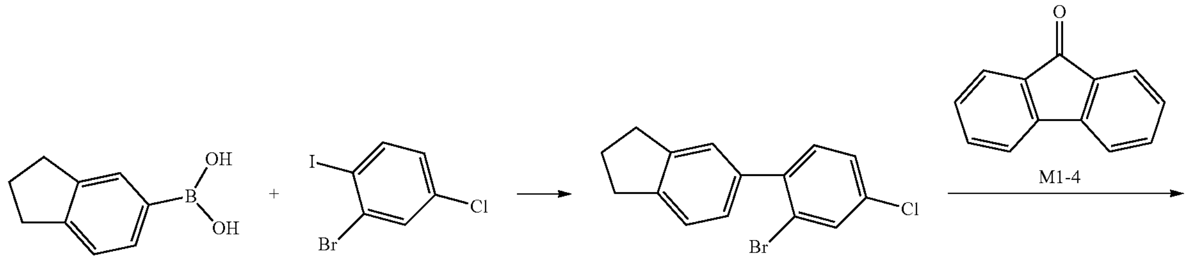

M1-1 M1-2 M1-3 M1-4

-continued
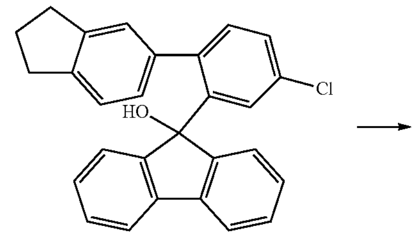
M1-5
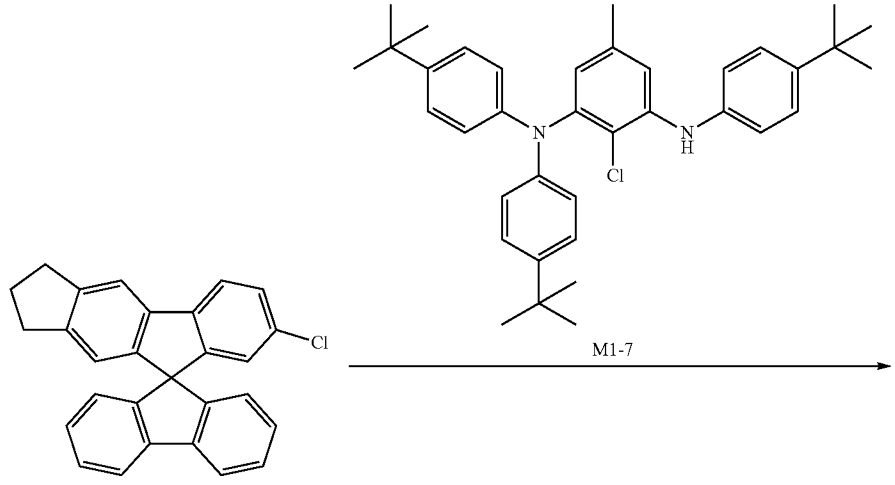
M1-7
M1-6
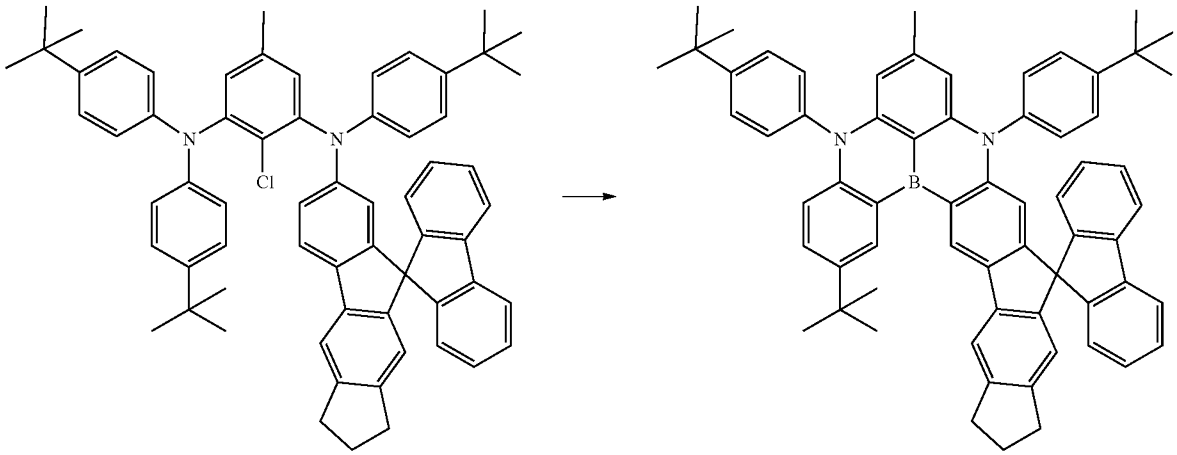
M1-8
M1

1. Synthesis of Intermediate M1-3: under nitrogen atmosphere, 40 mL solution of (16.2 g, 100 mmol) Compound M1-1, (31.7 g, 100 mmol) Compound M1-2, (3.3 g, 3 mmol) tetrakis(triphenylphosphine)palladium, (20.6 g, 150 mmol) potassium carbonate, and 200 mL toluene was added into a 500 mL three-necked flask, stirred and heated to 110° C. for 12 hours to complete the reaction, cooled to room temperature, and filtered by suction filtration. the filtrate was collected, subjected to rotary evaporation to evaporate most of the solvent, dissolved in dichloromethane and washed with water 3 times, and then the organic liquid was collected and purified by silica gel column chromatography, with a yield of 73%.
2. Synthesis of Intermediate M1-5: under nitrogen atmosphere, (18.5 g, 60 mmol) Compound M1-3 and 150 mL of anhydrous tetrahydrofuran were added into a 500 mL three-necked flask, cooled down to −78° C., followed by slowly dropping 65 mmol of n-butyllithium for reaction for 1 hour, and slowly adding the reaction solution into a 500 mL reaction bottle containing (10.8 g, 60 mmol) Compound M1-4 and 100 mL of anhydrous tetrahydrofuran, so that the reaction rose to room temperature naturally and the reaction was continuous for 6 hours. Dilute hydrochloric acid aqueous solution was added to the reaction solution, followed by continuous stirring for reaction for 0.5 hours. After that, the reaction solution was rotary evaporated to remove most of the solvent, extracted with dichloromethane and washed 3 times with water, to collect the organic phase, and after rotary evaporation to dryness, without further purification, it was directly used as the raw material for the next reaction.
3. Synthesis of Intermediate M1-6: Compound M1-5, (80 mmol) acetic acid and 15 mL hydrochloric acid obtained in the previous step were added into a 250 mL three-neck flask, heated and stirred to 110° C. for reaction for 5 hours to complete the reaction, and cooled to room temperature. After that, the reaction solution was poured into 500 mL of pure water, stirred to precipitate a product, filtered with suction, and washed with pure water and ethanol successively, to collect a filter residue and carry out recrystallization and purification, wherein the yield of the two steps is 65%.
4. Synthesis of Intermediate M1-8: under nitrogen atmosphere, (11.7 g, 30 mmol) of Compound M1-6, (16.6 g, 30 mmol) of Compound M1-7, (0.55 g, 0.6 mmol) of compound Pd2 (dba)3, (0.24 g, 1.2 mmol) of the compound tri-tert-butylphosphine, (4.1 g, 45 mmol) of the compound sodium tert-butoxide and 100 mL of anhydrous toluene solvent were added into a 300 mL two-necked flask, heated to 60° C., stirred and reacted for 6 hours, cooled to room temperature, quenched with water to evaporate most of the solvent from the reaction solution, and washed with dichloromethane dissolved water for 3 times. After that, the organic liquid was collected and purified by silica gel column chromatography, with a yield of 72%.
5. Synthesis of Compound M1: under nitrogen atmosphere, (18.2 g, 20 mmol) of Compound M1-8 and 100 mL of anhydrous tetrahydrofuran were added into a 500 mL three-necked flask, and cooled down to −30° C., followed by slowly adding 25 mmol of t-butyllithium solution. After the dropwise addition, the reaction was raised to 60° C. and stirred for 2 hours, then cooled down to −30° C., followed by adding 30 mmol of boron tribromide at one time, so that the reaction naturally rose to room temperature for reaction for 1 hour, adding 40 mmol of N,N-diisopropylethylamine, and slowly raising the temperature to 100° C. for 3 hours, and the reaction was completed, cooled to room temperature, quenched by adding sodium acetate aqueous solution to evaporate most of the solvent by rotary evaporation, dissolved by methyl chloride, and washed 3 times with water. Next, the organic liquid was collected, rotary evaporated, and purified by column chromatography, with a yield of 25%. MS(ASAP):933.

Embodiment 2: the Synthesis of Compound (M2)

(M2)

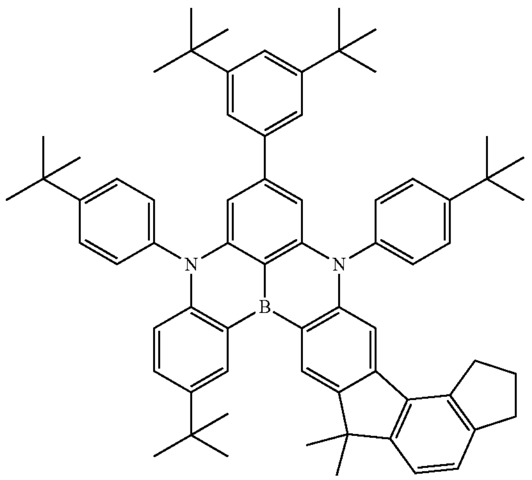

Synthetic Scheme

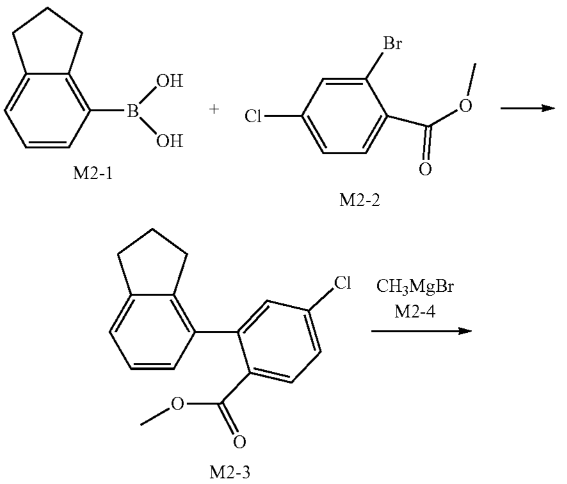

M2-1 M2-2 M2-3

-continued
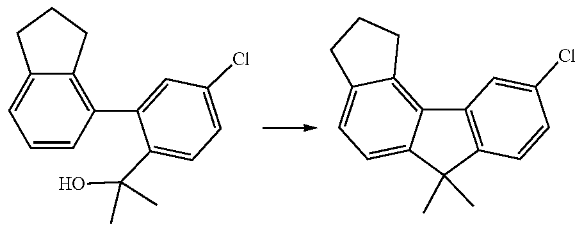
M2-5 M2-6
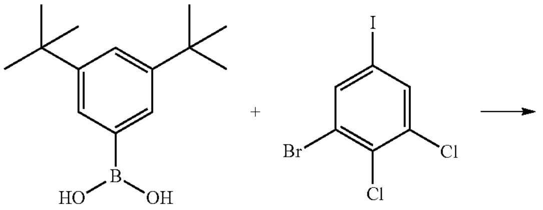
M2-7 M2-8
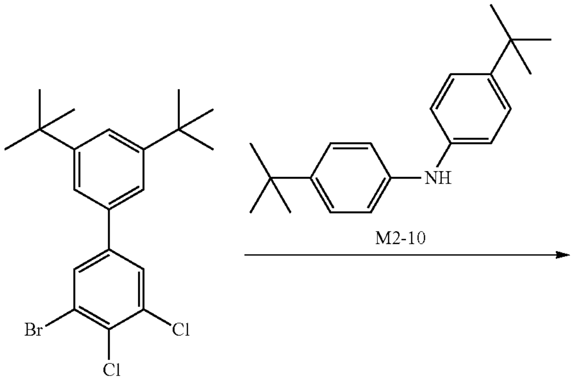
M2-9
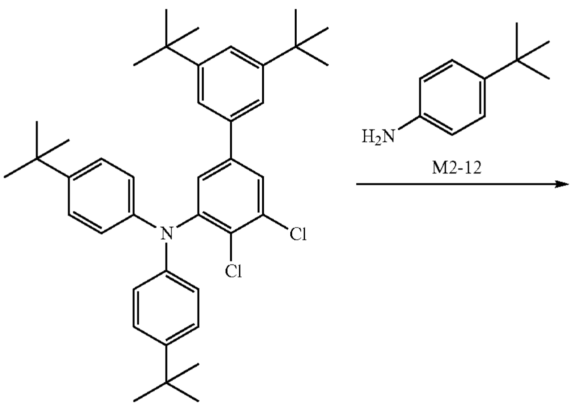
M2-11
-continued
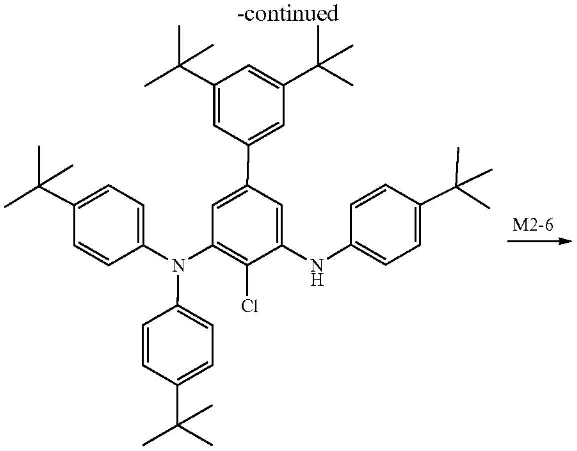
M2-13
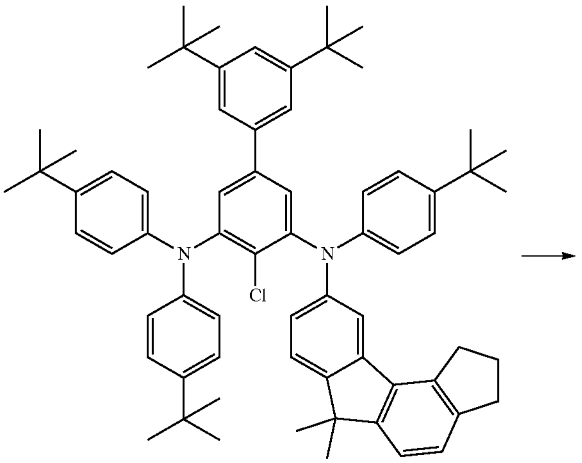
M2-14
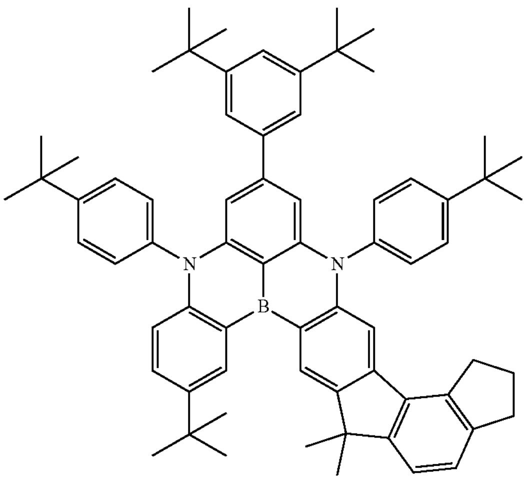
M2

1. Synthesis of Intermediate M2-3: according to the synthetic scheme of Compound M1-3, Compound M2-1 and Compound M2-2 were replaced with Compound M1-1 and Compound M1-2, respectively, with a yield of 77%.
2. Synthesis of Intermediate M2-5: under nitrogen atmosphere, (17.2 g, 60 mmol) of Compound M2-3 and 150 mL of anhydrous tetrahydrofuran were added into a 500 mL three-necked flask, followed by slowly dropwise adding 130 mmol of M2-4. After the addition, the reaction was raise to room temperature naturally, continued to react for 12 hours, and then hydrochloric acid aqueous solution was added into the reaction solution, followed by continuing to stir and react for 0.5 hours, rotating the reaction solution to evaporate most of the solvent, performing extraction with dichloromethane, and washing with water for 3 times, Next, the organic phase was collected and evaporated to dryness by rotary evaporation, and was directly used as the raw material for the next reaction without further purification.
3. Synthesis of Intermediate M2-6: according to the synthetic scheme of Compound M1-6, Compound M2-5 was replaced with Compound M1-5, and the total yield of the two steps was 63%.
4. Synthesis of Intermediate M2-9: according to the synthetic scheme of Compound M1-3, Compound M2-7 and Compound M2-8 were replaced with Compound M1-1 and Compound M1-2, respectively, with a yield of 72%.
5. Synthesis of Intermediate M2-11: under nitrogen atmosphere, (20.7 g, 50 mmol) of Intermediate M2-9, (14.1 g, 50 mmol) of Compound M2-10, (1.38 g, 1.5 mmol) of Compound $Pd_2(dba)_3$, (0.6 g, 3 mmol) of Compound tri-tert-butylphosphine, (9.1 g, 100 mmol) of Compound sodium tert-butoxide, and 150 mL of anhydrous toluene solvent were added into a 500 mL two-necked flask, heat 60° C., stirred and reacted for 6 hours, cooled to room temperature, quenched with water to evaporate most of the solvent of the reaction solution by rotary evaporation, dissolved by dichloromethane, and washed 3 times with water. Next, the organic liquid was collected and purified by silica gel column chromatography, with a yield of 74%.
6. Synthesis of Intermediate M2-13: under nitrogen atmosphere, (18.5 g, 30 mmol) of Intermediate M2-11, (4.5 g, 30 mmol) of Compound M2-12, (0.83 g, 0.9 mmol) of Compound $Pd_2(dba)_3$, (0.36 g, 1.8 mmol) of Compound tri-tert-butylphosphine, (5.5 g, 60 mmol) of Compound sodium tert-butoxide, and 150 mL of anhydrous toluene solvent were added into a 500 mL two-necked flask, heat 90° C., stirred and reacted for 6 hours, cooled to room temperature, quenched with water to evaporate most of the solvent of the reaction solution by rotary evaporation, dissolved by dichloromethane, dissolved by dichloromethane, and washed 3 times with water. Next, the organic liquid was collected and purified by silica gel column chromatography, with a yield of 70%.
7. Synthesis of Intermediate M2-14: according to the synthetic scheme of Compound M1-8, Compounds M2-6 and 2-13 were replaced with Compound M1-6 and Compound 1-7, and the yield was 72%.
8. Synthesis of Compound M2: according to the synthetic scheme of Compound M1, Compound M2-14 was replaced with Compound M1-8, and the yield was 26%. MS (ASAP):624.

Embodiment 3: the Synthesis of Compound (M3)

(M3)

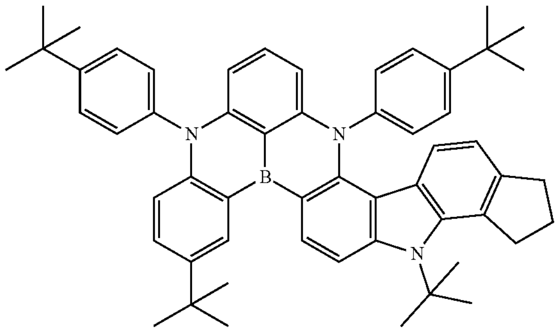

Synthetic Scheme

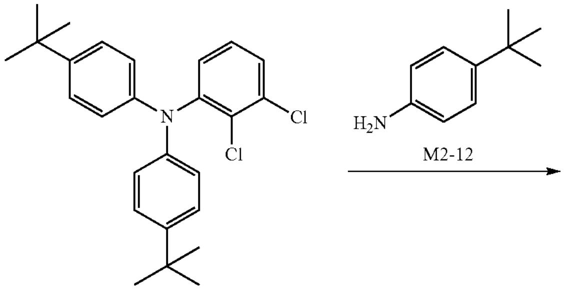

M3-1

M2-12

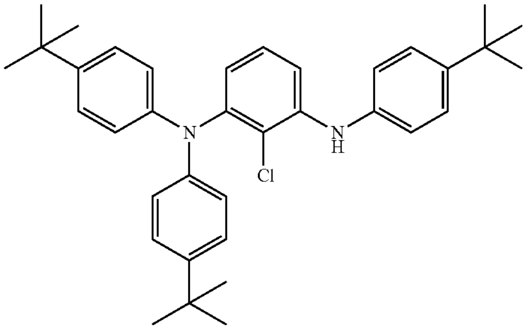

M3-2

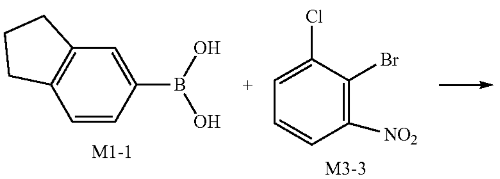

M1-1

M3-3

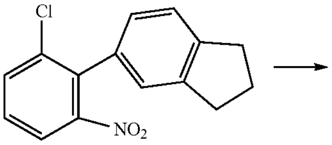

M3-4

-continued

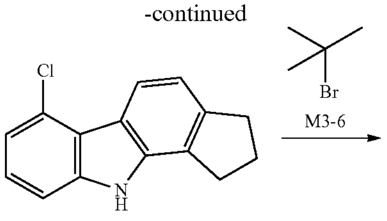

M3-5

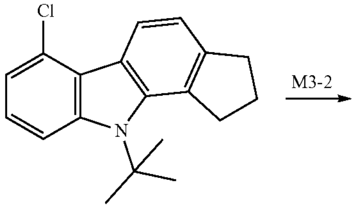

M3-7

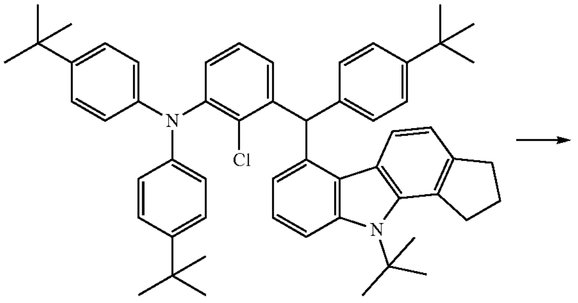

M3-8

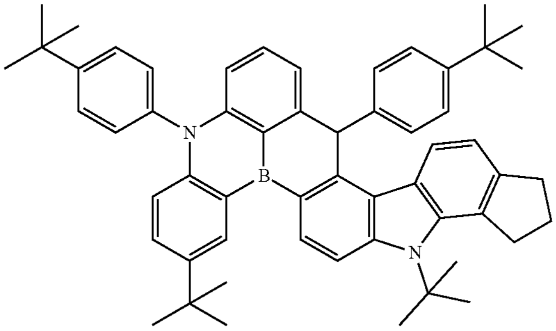

M3

1. Synthesis of Intermediate M3-2: according to the synthetic scheme of Compound M2-13, Compound M3-1 was replaced with Compound M2-11, and the yield was 70%.
2. Synthesis of Intermediate M3-4: according to the synthetic scheme of Compound M1-3, Compound M3-3 was replaced with Compound M1-2, and the yield was 72%.
3. Synthesis of Intermediate M3-5: under nitrogen atmosphere, (16.4 g, 60 mmol) of Compound M3-4 and (60.6 g, 150 mmol) of triethylphosphine were added into a 250 mL two-necked flask, heated at 190° C., and stirred for 12 hours. After the reaction was completed, most of the solvent was distilled off from the reaction solution under reduced pressure, dissolved by dichloromethane, and washed 3 times with water. Next, the organic liquid was collected and purified by silica gel column chromatography, with a yield of 75%.
4. Synthesis of Intermediate M3-7: (9.7 g, 40 mmol) of Compound M3-5, (3.2 g, 80 mmol) of NaOH, and 80 mL dimethylformamide were added into a 250 mL two-necked flask under nitrogen atmosphere, stirred and reacted for 1 hour, followed by adding (11 g, 40 mmol) of Compound M3-6 at one time, and stirred and reacted for 4 hours. After the reaction was completed, the reaction liquid was poured into 300 mL of pure water, stirred and filtered to obtain a solid, which was recrystallized and purified with a mixed solution of ethanol and dichloromethane, and the yield was 82%.

5. Synthesis of Intermediate M3-8: according to the synthetic scheme of Compound M1-8, Compound M3-2 and Compound M3-7 were replaced with Compound M1-7 and Compound M1-6, respectively, and the yield was 74%.
6. Synthesis of Compound M3: according to the synthetic scheme of Compound M1, Compound M3-8 was replaced with Compound M1-8, and the yield was 25%. MS(ASAP):774.

Embodiment 4: the Synthesis of Compound (M4)

(M4)

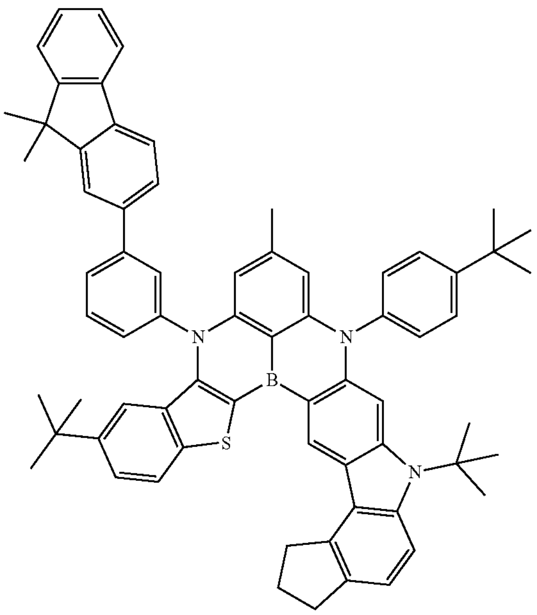

Synthetic Scheme

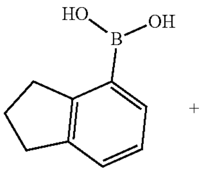

M2-1

-continued
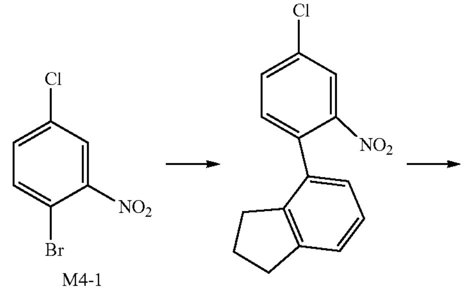
M4-1 M4-2
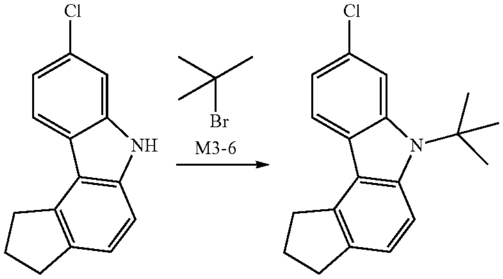
M4-3 M4-4
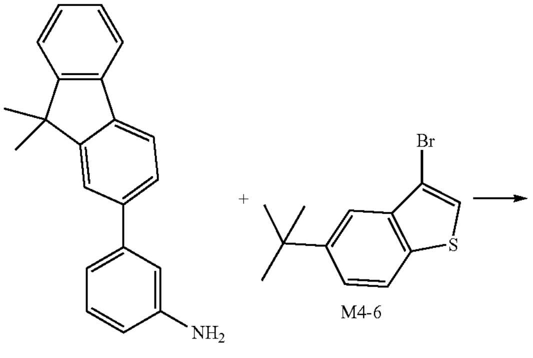
M4-5 M4-6
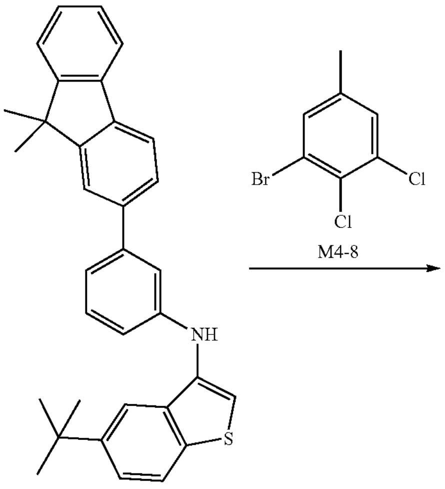
M4-7
-continued
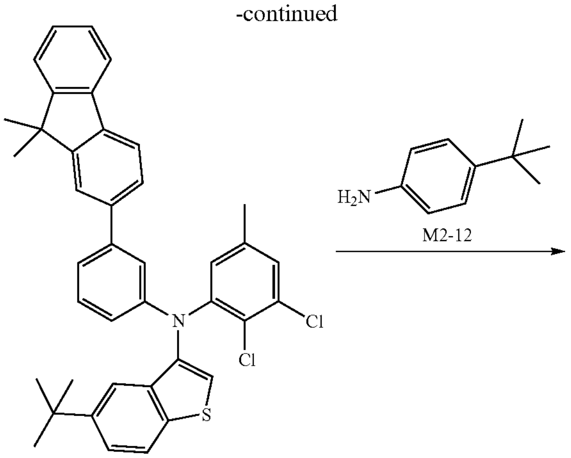
M4-9
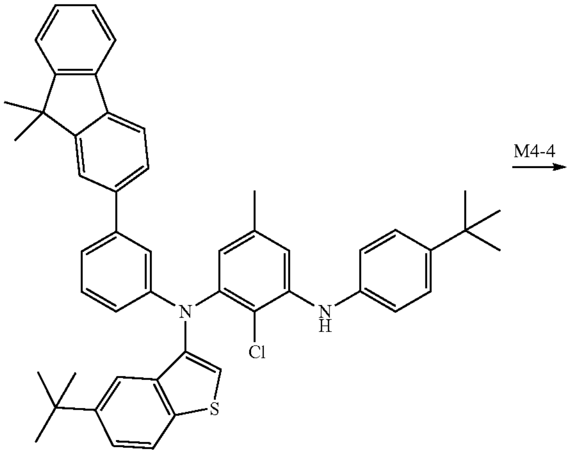
M4-10
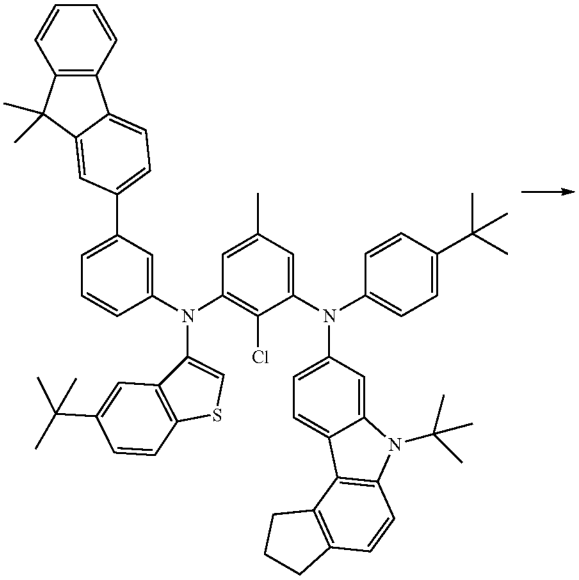
M4-11

-continued

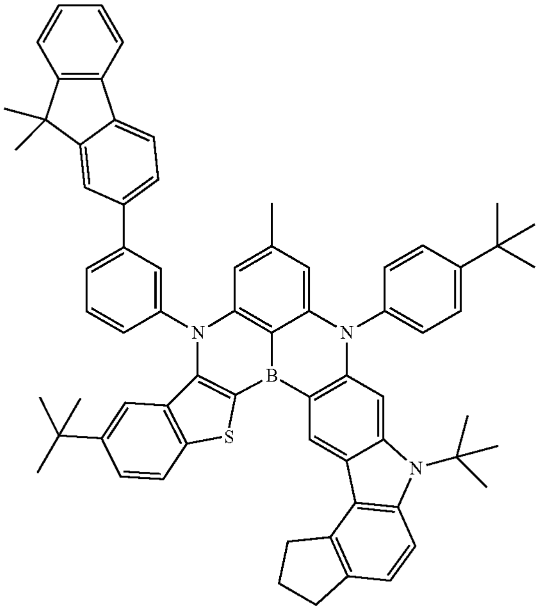

M4

1. Synthesis of Intermediate M4-2: according to the synthetic scheme of Compound M1-3, compounds M2-1 and Compound M4-1 were replaced with Compound M1-1 and Compound M1-2, respectively, and the yield was 71%.
2. Synthesis of Intermediate M4-3: according to the synthetic scheme of Compound M3-5, Compound M4-2 was replaced with Compound M3-4, and the yield was 76%.
3. Synthesis of Intermediate M4-4: according to the synthetic scheme of Compound M3-7, Compound M4-3 was replaced with Compound M3-5, and the yield was 80%.
4. Synthesis of Intermediate M4-7: according to the synthetic scheme of Compound M2-11, Compound M4-5 and Compound M4-6 were replaced with Compound M2-10 and Compound M2-9, respectively, with a yield of 78%.
5. Synthesis of Intermediate M4-9: according to the synthetic scheme of Compound M2-11, Compound M4-7 and Compound M4-8 were replaced with Compound M2-10 and Compound M2-9, respectively, with a yield of 75%.
6. Synthesis of Intermediate M4-10: according to the synthetic scheme of Compound M2-13, Compound M4-9 was replaced with Compound M2-11, and the yield was 75%.
7. Synthesis of Intermediate M4-11: according to the synthetic scheme of Compound M1-8, Compound M4-10 and Compound M4-4 were replaced with Compound M1-7 and Compound M1-6, respectively, and the yield was 73%.
8. Synthesis of Compound M4: according to the synthetic scheme of Compound M1, Compound M4-11 was replaced with Compound M1-8, and the yield was 26%. MS(ASAP):980.

Embodiment 5: the Synthesis of Compound (M5)

(M5)

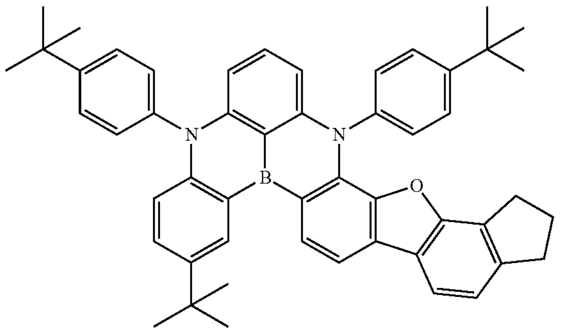

Synthetic Scheme

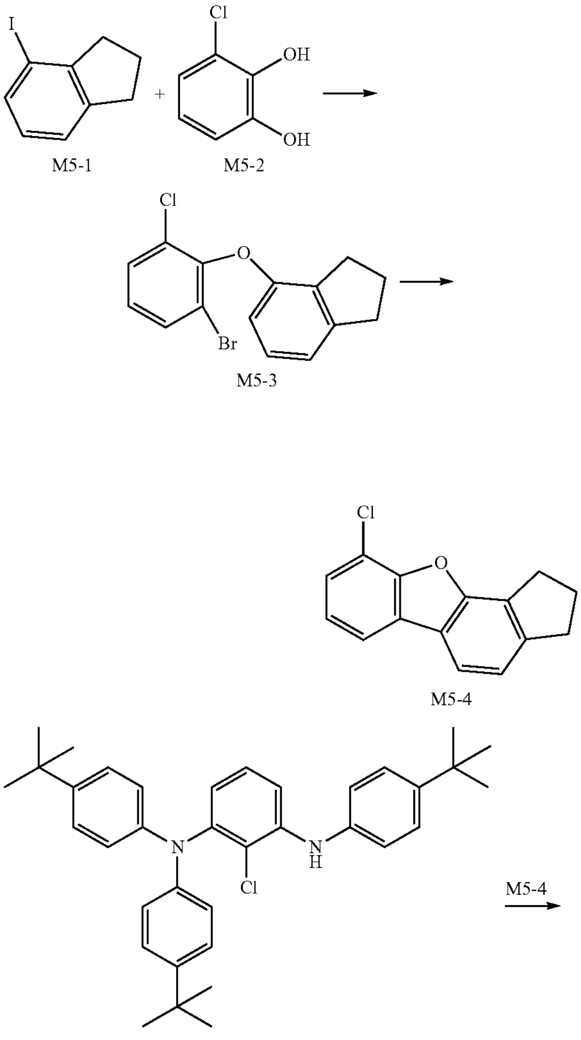

M3-2

-continued

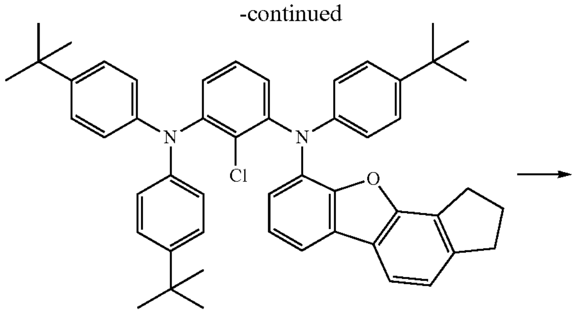

M5-5

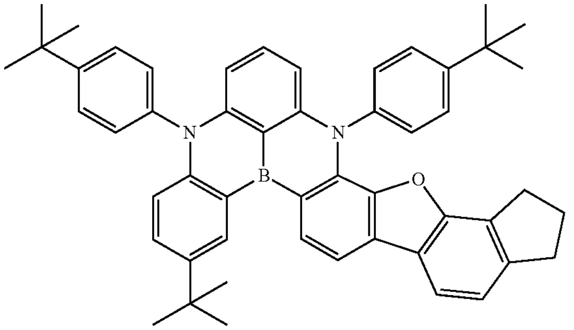

M5

1. Synthesis of Intermediate M5-3: under nitrogen atmosphere, (24.4 g, 100 mmol) of Compound M5-1, (20.8 g, 100 mmol) of Compound M5-2, (1.14 g, 6 mmol) of CuI, (13.8 g, 100 mmol) of potassium carbonate, and 250 mL of dimethylformamide were added into a 500 mL two-necked flask, heated to 110° C., stirred for 12 hours, cooled to room temperature to evaporate most of the solvent of the reaction solution by rotary evaporation, dissolved by dichloromethane, and washed 3 times with water, and the organic liquid was collected and purified by silica gel column chromatography, with a yield of 62%.
2. Synthesis of Intermediate M5-4: under nitrogen atmosphere, (19.4 g, 60 mmol) of Compound M5-3, (1.14 g, 3 mmol) of palladium acetate, (10.6 g, 60 mmol) of sodium carbonate, and 150 mL dimethylacetamide were added into a 500 mL two-necked bottle, heated at 170° C., stirred for 6 hours, cooled to room temperature to distill off most of the solvent from the reaction solution under reduced pressure, dissolved by dichloromethane, and washed 3 times with water. Next, the organic liquid was collected and purified by silica gel column chromatography, with a yield of 70%.
3. Synthesis of Intermediate M5-5: according to the synthetic scheme of Compound M1-8, Compound M3-2 and Compound M5-4 were replaced with Compound M1-7 and Compound M1-6, respectively, with a yield of 72%.
4. Synthesis of Compound M5: according to the synthetic scheme of Compound M1, Compound M5-5 was replaced with Compound M1-8, and the yield was 28%. MS(ASAP):718.

Embodiment 6: the Synthesis of Compound (M6)

(M6)

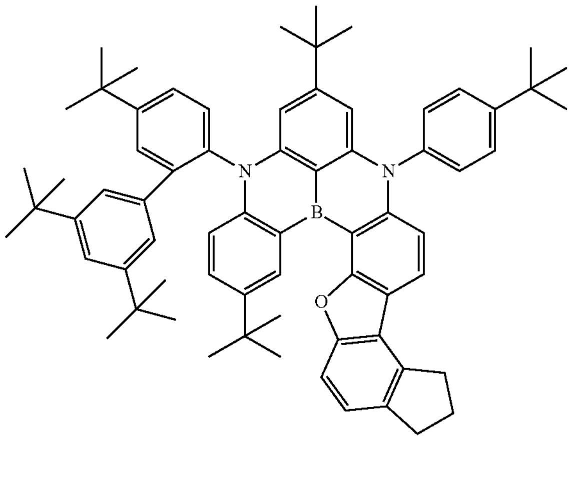

Synthetic Scheme

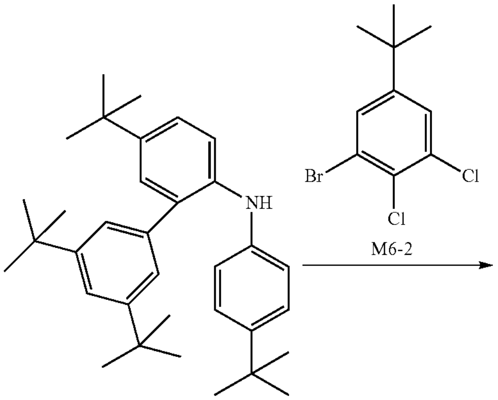

M6-1

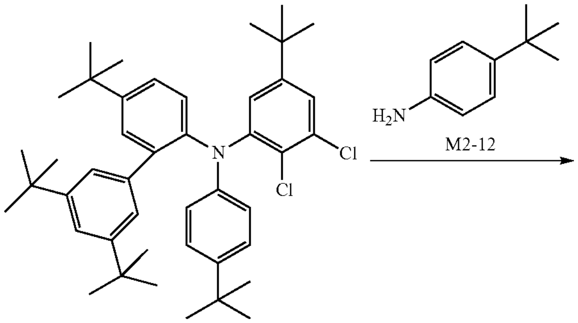

M6-3

-continued

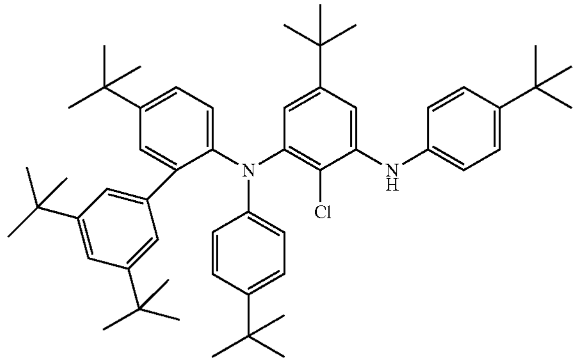

M6-4

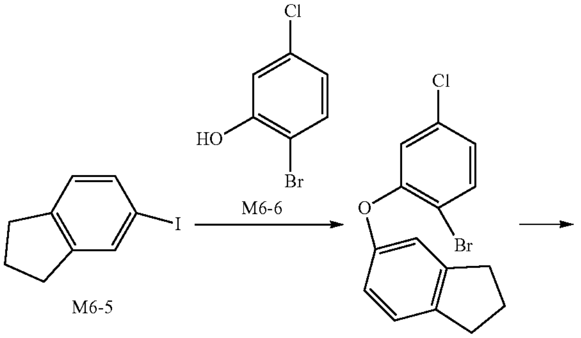

M6-5

M6-7

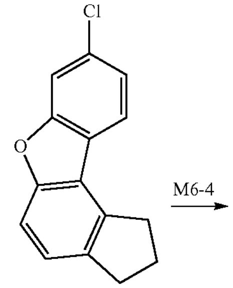

M6-8

-continued

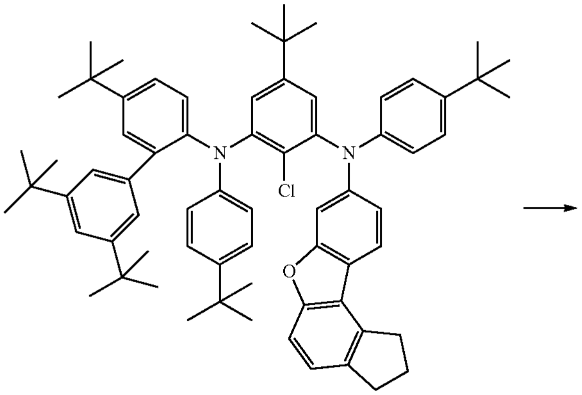

M6-9

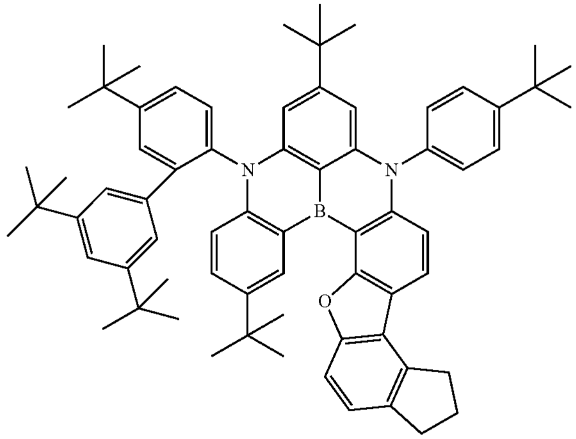

M6

1. Synthesis of Intermediate M6-3: according to the synthetic scheme of Compound M2-11, Compound M6-1 and Compound M6-2 were replaced with Compound M2-10 and Compound M2-9, respectively, with a yield of 72%.
2. Synthesis of Intermediate M6-4: according to the synthetic scheme of Compound M2-13, Compound M6-3 was replaced with Compound M2-11, and the yield was 68%.
3. Synthesis of Intermediate M6-7: according to the synthetic scheme of Compound M5-3, Compound M6-5 and Compound M6-6 were replaced with Compound M5-1 and Compound M5-2, respectively, with a yield of 64%.
4. Synthesis of Intermediate M6-8: according to the synthetic scheme of Compound M5-4, Compound M6-7 was replaced with Compound M5-3, and the yield was 71%.
5. Synthesis of Intermediate M6-9: according to the synthetic scheme of Compound M1-8, Compound M6-8 and Compound M6-4 were respectively replaced with Compound M1-6 and Compound M1-7, and the yield was 68%.
6. Synthesis of Compound M6: according to the synthetic scheme of Compound M1, Compound M6-9 was replaced with Compound M1-8, and the yield was 25%. MS(ASAP):963.

Embodiment 7: the Synthesis of Compound (M7)
(M7)
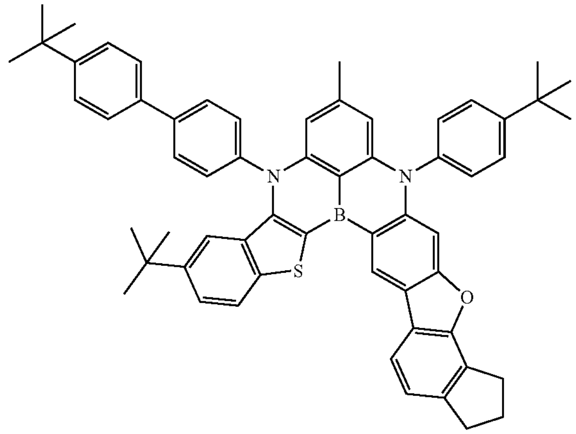
Synthetic Scheme
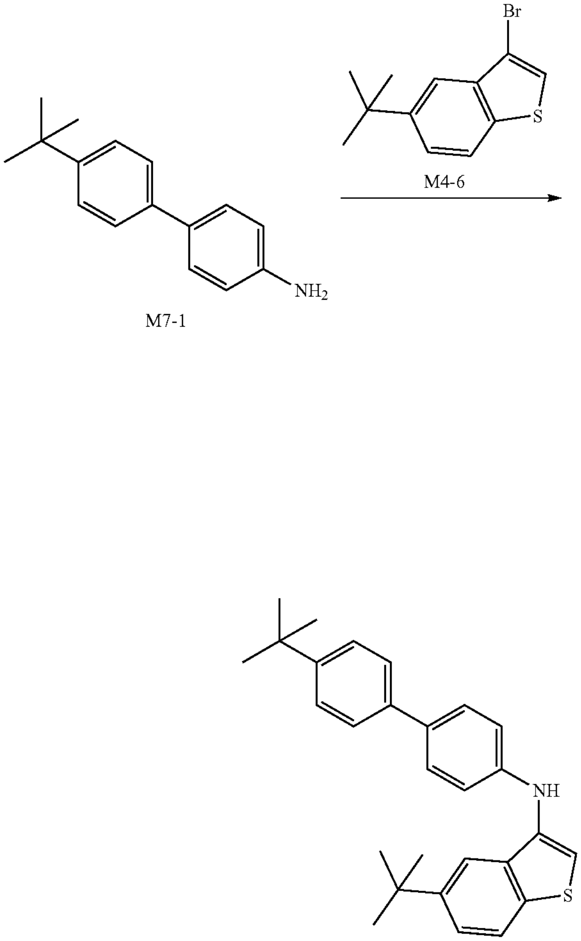
M7-1
M7-2
-continued
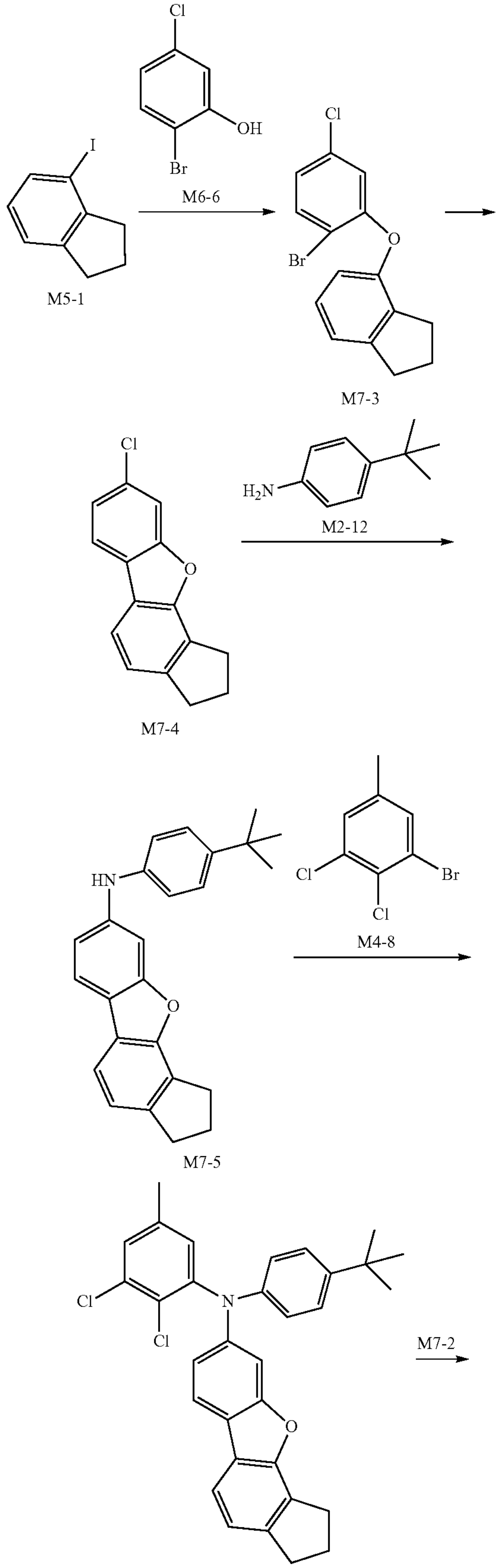
M5-1
M7-3
M7-4
M7-5
M7-6

-continued

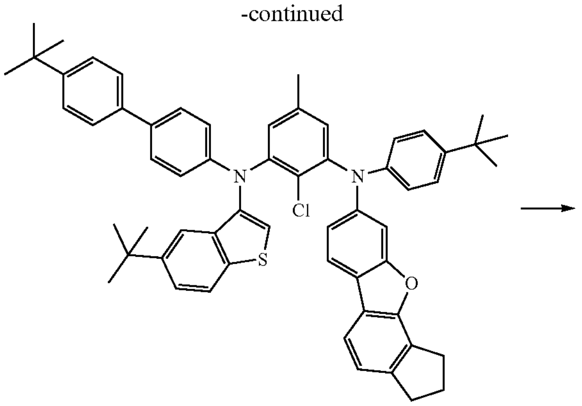

M7-7

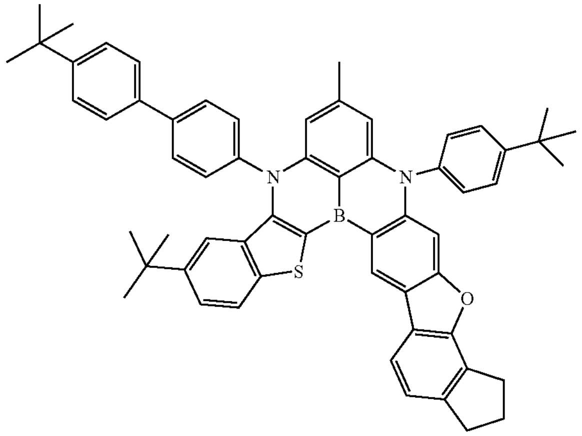

M7

1. Synthesis of Intermediate M7-2: according to the synthetic scheme of Compound M2-11, Compound M7-1 and Compound M4-6 were replaced with Compound M2-10 and Compound M2-9, respectively, with a yield of 75%.
2. Synthesis of Intermediate M7-3: according to the synthetic scheme of Compound M5-3, Compound M6-6 was replaced with Compound M5-2, and the yield was 62%.
3. Synthesis of Intermediate M7-4: according to the synthetic scheme of Compound M5-4, Compound M7-3 was replaced with Compound M5-3, and the yield was 74%.
4. Synthesis of Intermediate M7-5: according to the synthetic scheme of Compound M2-11, Compound M7-4 and Compound M2-12 were replaced with Compound M2-9 and 2-10, respectively, with a yield of 77%.
5. Synthesis of Intermediate M7-6: according to the synthetic scheme of Compound M2-11, Compound M7-5 and Compound M4-8 were replaced with Compound M2-10 and Compound M2-9, respectively, with a yield of 73%.

6

6. Synthesis of Intermediate M7-7: according to the synthetic scheme of Compound M1-8, Compound M7-6 and Compound M7-2 were respectively replaced with Compound M1-6 and Compound M1-7, and the yield was 65%.

7. Synthesis of Compound M7: according to the synthetic scheme of Compound M1, Compound M7-7 was replaced with Compound M1-8, and the yield was 27%. MS(ASAP):865.

Embodiment 8: Synthesis of Compound (M8)

(M8)

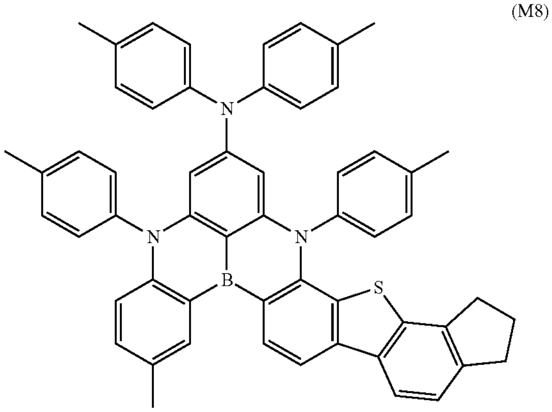 [SMILES: Cc1ccc(N(c2ccc(C)cc2)c2cc3c4c(c2)N(c2ccc(C)cc2)c2c(ccc5c2sc2c6c(ccc25)CCC6)B4c2cc(C)ccc2N3c2ccc(C)cc2)cc1]

Synthetic Scheme

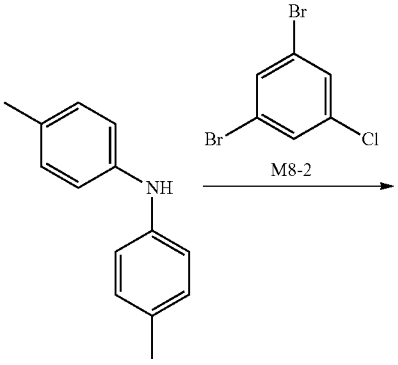

M8-2

M8-1

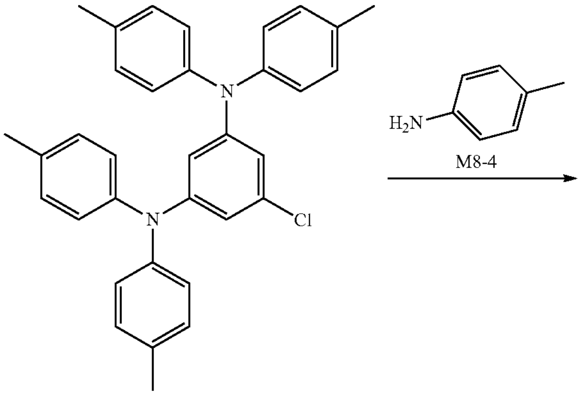

M8-4

M8-3

-continued

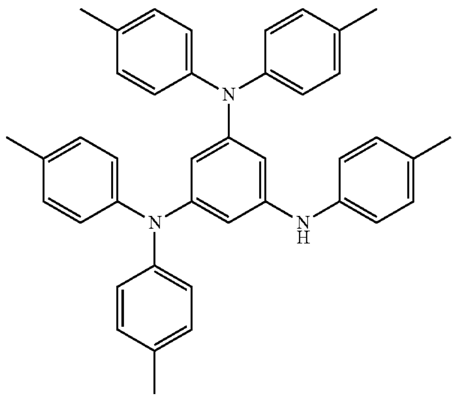

M8-5

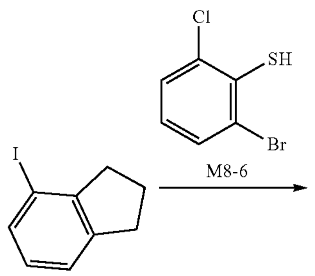

M5-1

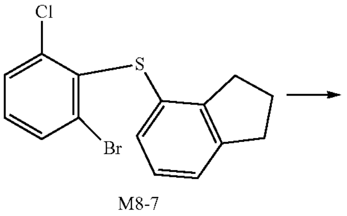

M8-7

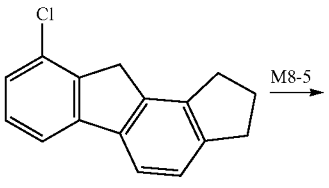

M8-8

-continued

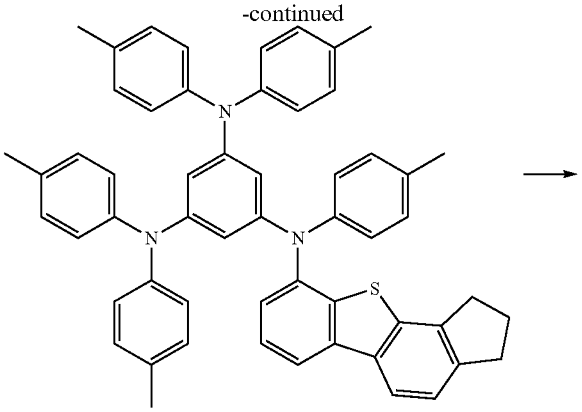

M8-9

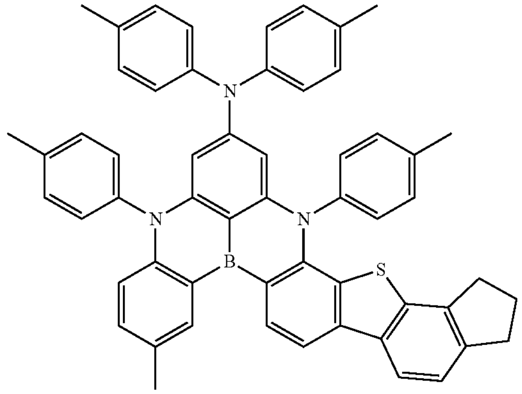

M8

1. Synthesis of Intermediate M8-3: according to the synthetic scheme of Compound M2-11, Compound M8-2 and twice the molar amount of M8-1 were respectively replaced with Compound M2-9 and Compound M2-10, with a yield of 70%.
2. Synthesis of Intermediate M8-5: according to the synthetic scheme of Compound M2-13, Compound M8-3 and 8-4 were replaced with Compound M2-11 and Compound M2-12, respectively, with a yield of 74%.
3. Synthesis of Intermediate M8-7: according to the synthetic scheme of Compound M5-3, Compound M8-6 was replaced with Compound M5-2, and the yield was 66%.
4. Synthesis of Intermediate M8-8: according to the synthetic scheme of Compound M5-4, Compound M8-7 was replaced with Compound M5-3, and the yield was 76%.
5. Synthesis of Intermediate M8-9: according to the synthetic scheme of Compound M1-8, Compound M8-8 and Compound M8-5 were respectively replaced with Compound M1-6 and Compound M1-7, and the yield was 62%.
6. Synthesis of Compound M8: (23.9 g, 30 mmol) of Compound M8-9 and 50 mL o-dichlorobenzene were added into a 150 mL three-neck flask under nitrogen atmosphere, followed by slowly adding 35 mmol of boron tribromide dropwise with stirring, raised to 180° C. and reacted for 12 hours, cooled down to room temperature, followed by adding 60 mmol diisopropylethylamine, reacted at room temperature for 1 hour, quenched by adding water, extracted with dichloromethane, and washed three times with water, Next, the organic liquid was collected and purified by silica gel column chromatography, with a yield of 28%. MS(ASAP):804.

Embodiment 9: Synthesis of Compound (M9)

(M9)

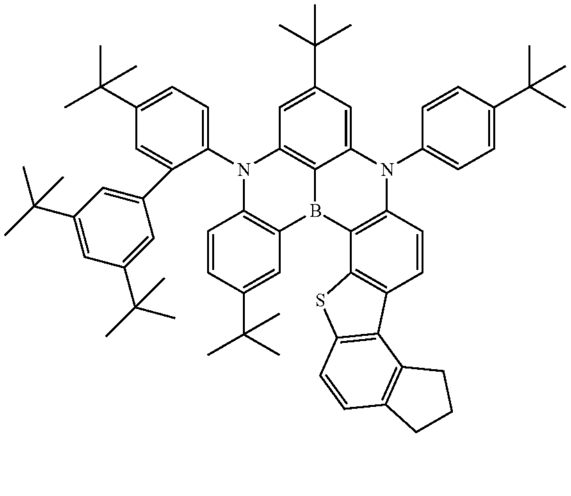

Synthetic Scheme

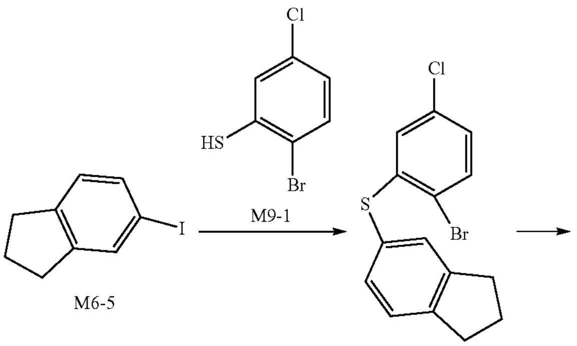

M6-5 M9-2

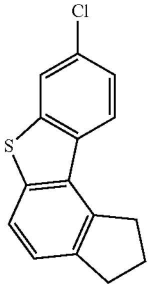

M9-3

-continued

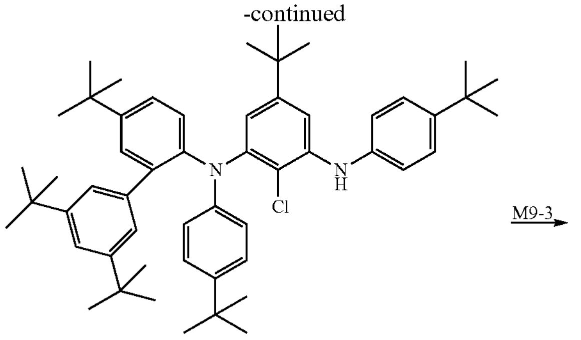

M6-4

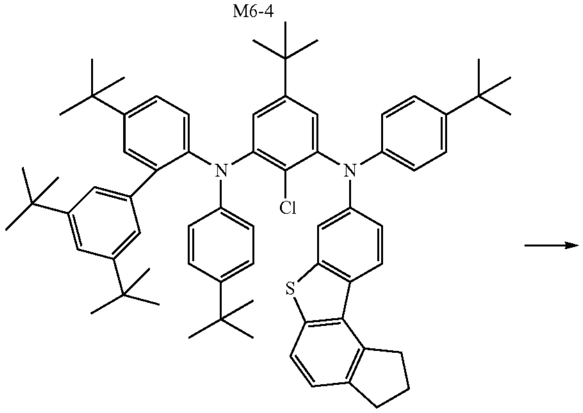

M9-4

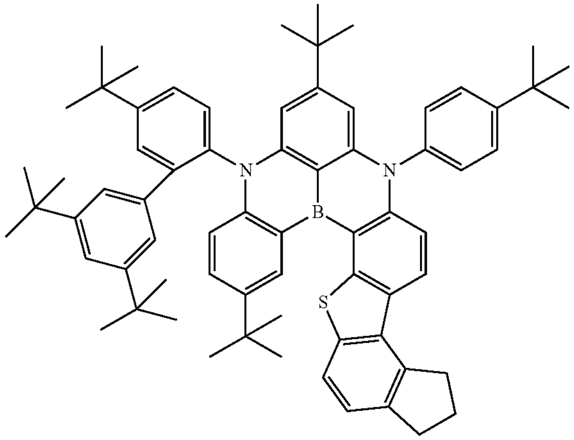

M9

1. Synthesis of Intermediate M9-2: according to the synthetic scheme of Compound M5-3, Compound M6-5 and Compound M9-1 were replaced with Compound M5-1 and Compound M5-2, respectively, with a yield of 64%.
2. Synthesis of Intermediate M9-3: according to the synthetic scheme of Compound M5-4, Compound M9-2 was replaced with Compound M5-3, and the yield was 73%.
3. Synthesis of Intermediate M9-4: according to the synthetic scheme of Compound M1-8, Compound M9-3 and Compound M6-4 were replaced with Compound M1-6 and Compound M1-7, respectively, with a yield of 65%.
4. Synthesis of Compound M9: according to the synthetic scheme of Compound M1, Compound M9-4 was replaced with Compound M1-8, and the yield was 25%. MS(ASAP):979.

Example 10: Synthesis of Compound (M10)
(M10)
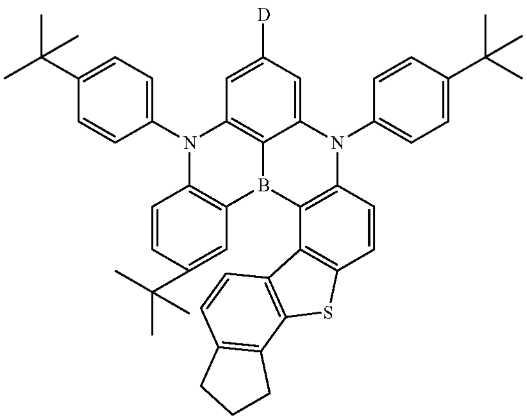
Synthetic Scheme
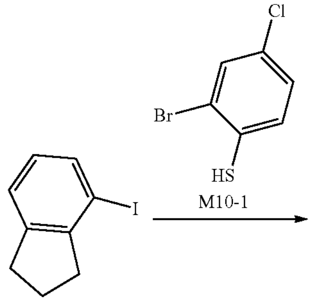
M5-1
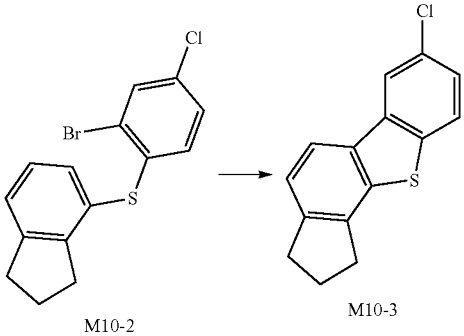
M10-2
M10-3
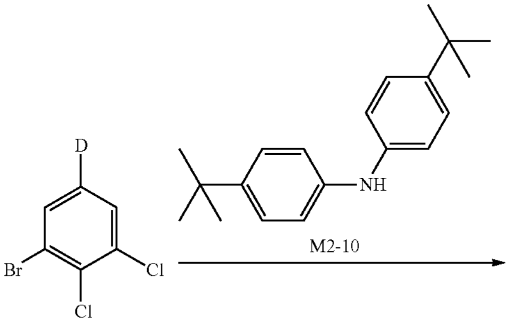
M10-4
-continued
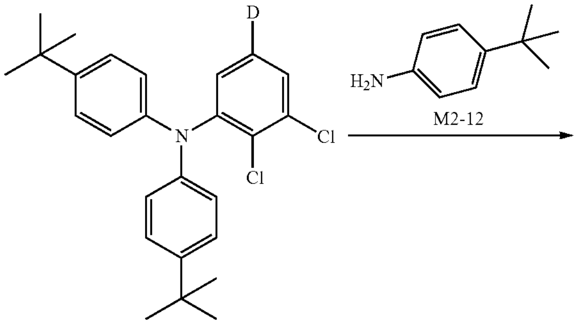
M10-5
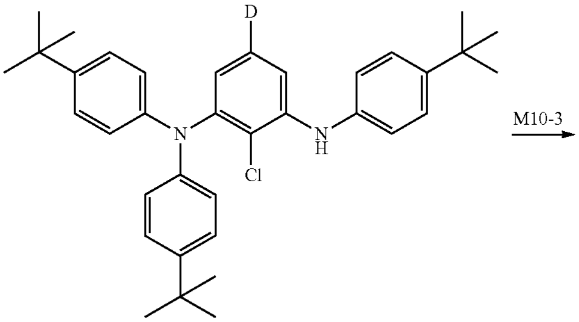
M10-6
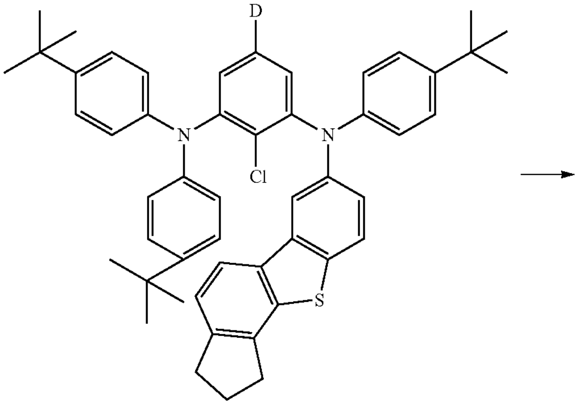
M10-7
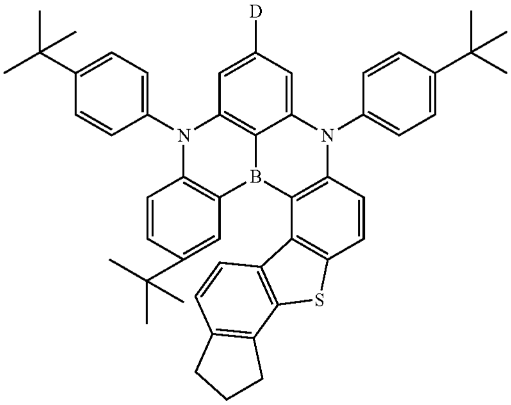
M10
1. Synthesis of Intermediate M10-2: according to the synthetic scheme of Compound M5-3, Compound M10-1 was replaced with Compound M5-2, and the yield was 62%.

2. Synthesis of Intermediate M10-3: according to the synthetic scheme of Compound M5-4, Compound M10-2 was replaced with Compound M5-3, and the yield was 75%.
3. Synthesis of Intermediate M10-5: according to the synthetic scheme of Compound M2-11, Compound M10-4 was replaced with Compound M2-9, and the yield was 75%.
4. Synthesis of Intermediate M10-6: according to the synthetic scheme of Compound M2-13, Compound M10-5 was replaced with Compound M2-11, and the yield was 70%.
5. Synthesis of Intermediate M10-7: according to the synthetic scheme of Compound M1-8, Compound M10-3 and Compound M10-6 were replaced with Compound M1-6 and Compound M1-7, respectively, with a yield of 66%.
6. Synthesis of Compound M10: according to the synthetic scheme of Compound M1, Compound M10-7 was replaced with Compound M1-8, and the yield was 23%. MS(ASAP):736.

Example 11: Synthesis of Compound (M11)

(M11)

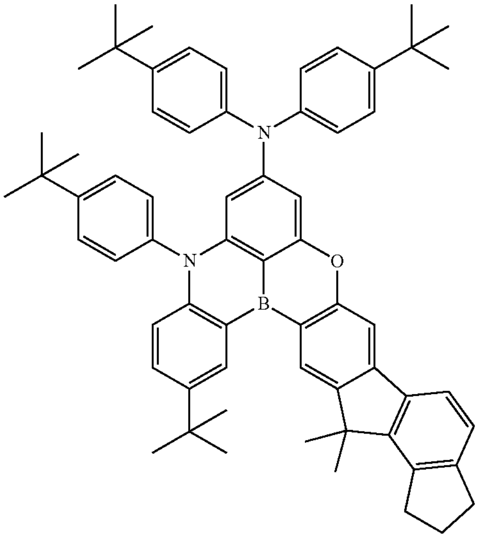

Synthetic Scheme

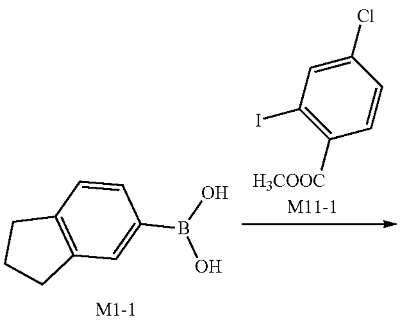

M11-1

M1-1

-continued

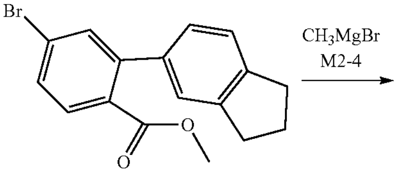

M11-2

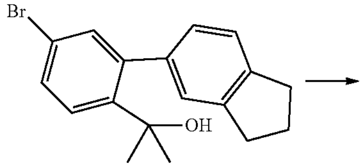

M11-3

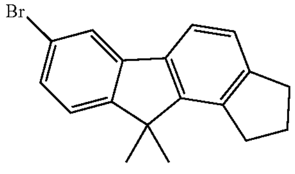

M11-4

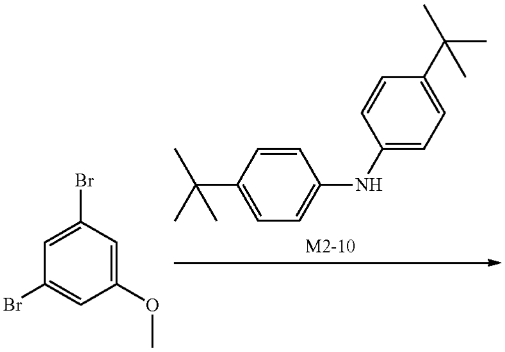

M11-5

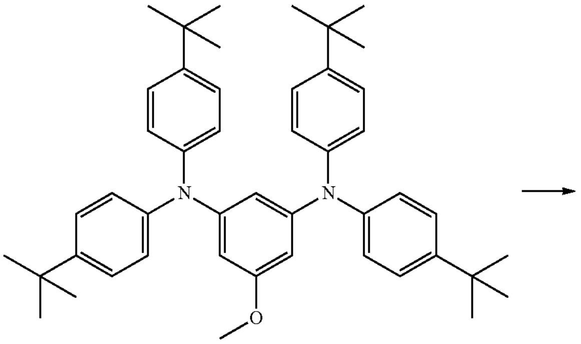

M11-6

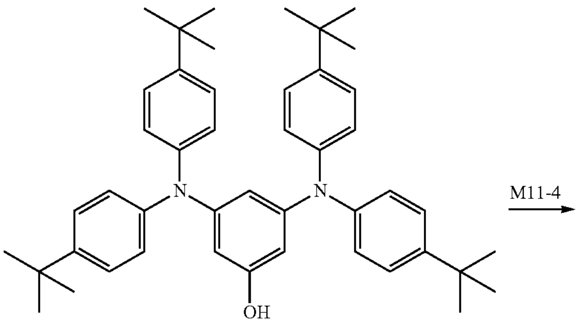

M11-7

-continued

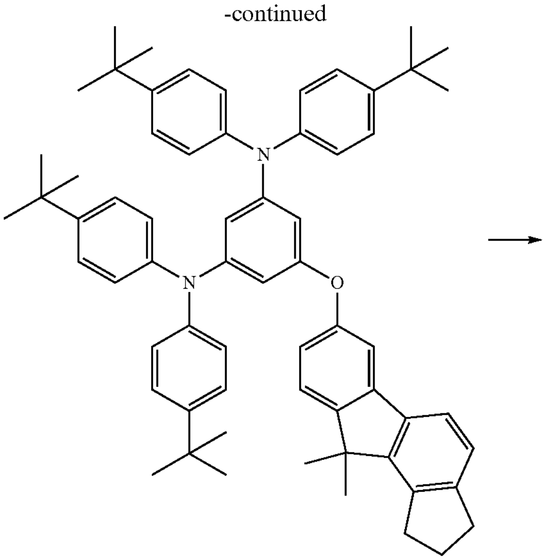

M11-8

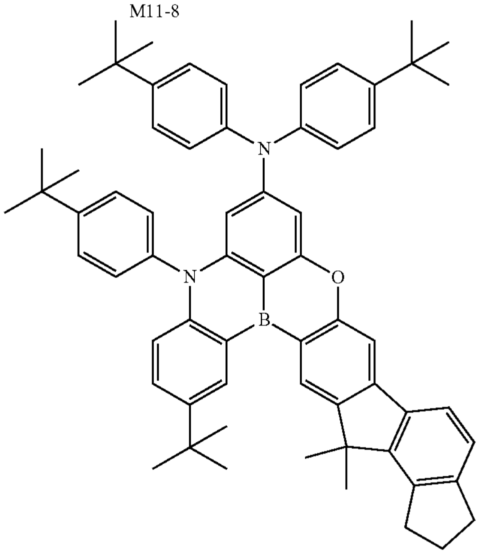

M11

1. Synthesis of Intermediate M11-2: according to the synthetic scheme of Compound M1-3, Compound M11-1 was replaced with Compound M1-2, and the yield was 70%.
2. Synthesis of Intermediate M11-3: according to the synthetic scheme of Compound M2-5, Compound M11-2 was replaced with Compound M2-3.
3. Synthesis of Intermediate M11-4: according to the synthetic scheme of Compound M1-6, Compound M11-3 was replaced with Compound M1-5, and the two-step yield was 61%.
4. Synthesis of Intermediate M11-6: according to the synthetic scheme of Compound M8-3, Compound M11-5 and Compound M2-10 were replaced with Compound M8-2 and Compound M8-1, respectively, with a yield of 75%.
5. Synthesis of Intermediate M11-7: (40 g, 60 mmol) of Compound M11-6 and 100 mL of dichloromethane were added into a 350 mL three-neck flask under nitrogen atmosphere, followed by slowly adding 100 mmol of dichloromethane solution with boron tribromide under ice bath, so that the reaction rose to room temperature slowly, followed by continue stirring at room temperature for 24 hours. After that, the reaction was quenched by adding water, extracted with dichloromethane, and washed three times with water, and the organic liquid was collected and purified by silica gel column chromatography with a yield of 85%.
6. Synthesis of Intermediate M11-8: according to the synthetic scheme of Compound M5-3, Compound M11-4 and Compound M11-7 were replaced with Compound M5-1 and Compound M5-2, respectively, with a yield of 55%.
7. Synthesis of Compound M11: according to the synthetic scheme of Compound M8, Compound M11-8 was replaced with Compound M8-9, and the yield was 24%. MS(ASAP):893.

Example 12: Synthesis of Compound (M12)

(M12)

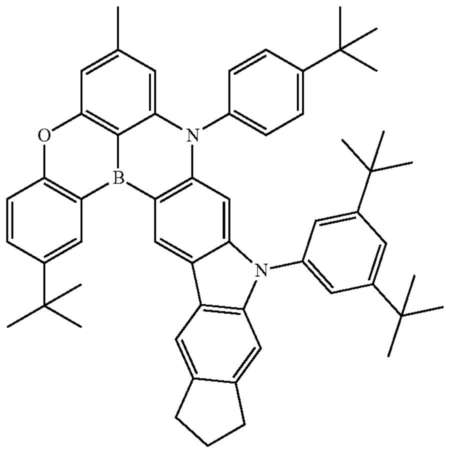

Synthetic Scheme

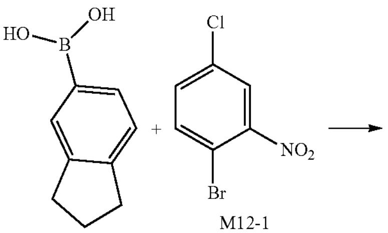

M1-1

M12-1

-continued

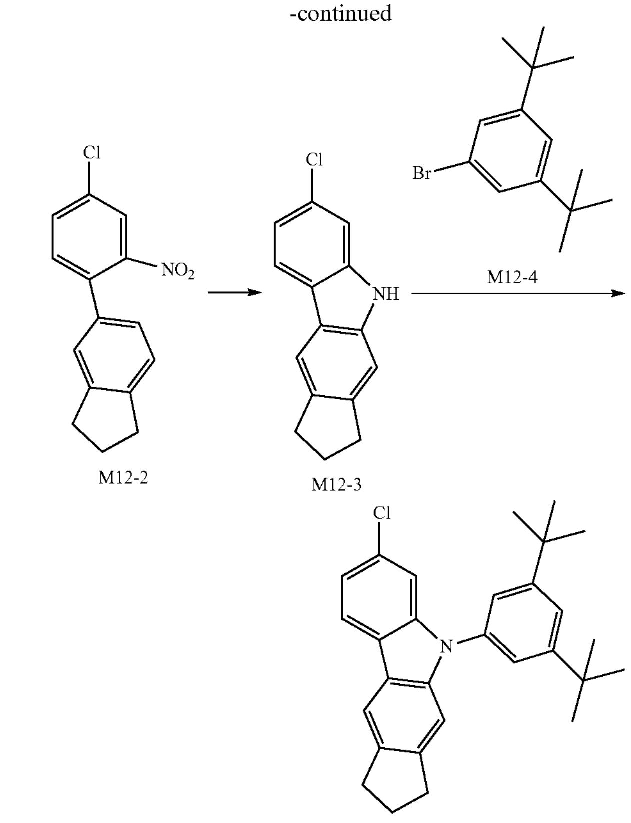

M12-2

M12-3

M12-5

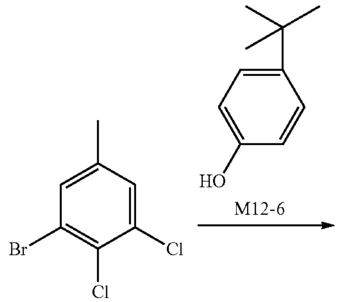

M4-8

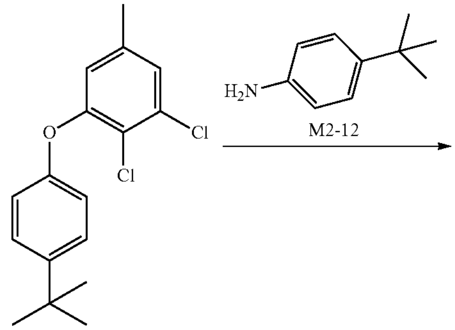

M12-7

-continued

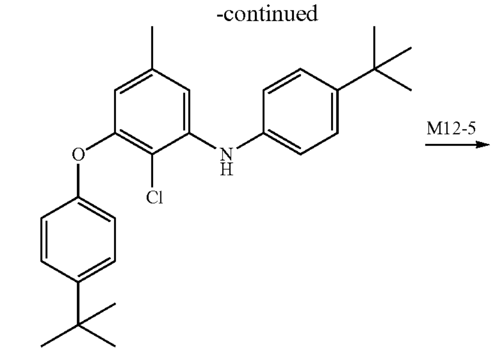

M12-8

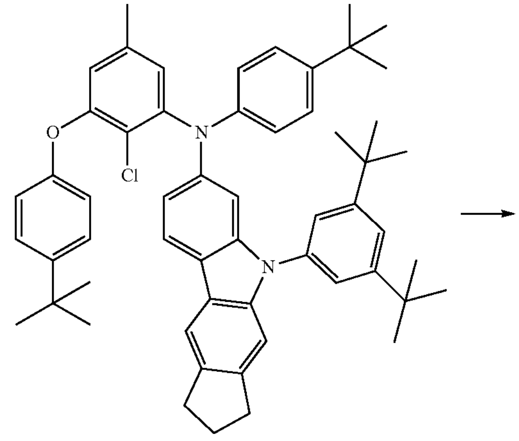

M12-9

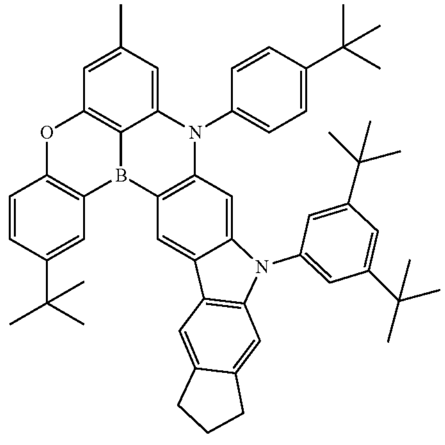

M12

1. Synthesis of Intermediate M12-2: according to the synthetic scheme of Compound M1-3, Compound M12-1 was replaced with Compound M1-2, and the yield was 65%.
2. Synthesis of Intermediate M12-3: according to the synthetic scheme of Compound M3-5, Compound M12-2 was replaced with Compound M3-4, and the yield was 67%.
3. Synthesis of Intermediate M12-5: under nitrogen atmosphere, (9.7 g, 40 mmol) of Compound M12-3, (10.8 g, 40 mmol) of Compound M12-3, (1.1 g, 2 mmol) of bis(dibenzylideneacetone) palladium, (0.8 g, 4 mmol) of tri-tert-butylphosphine, (7.7 g, 80 mmol) of sodium tert-butoxide, and 100 mL of toluene were added into a 250 mL three-necked flask, and refluxed for 12 hours.

After the reaction was completed, the reaction liquid was cooled down to room temperature to evaporate most of the solvent of the reaction solution by rotary evaporation, extracted with dichloromethane, and washed three times with water. Next, the organic liquid was collected and purified by silica gel column chromatography, with a yield of 82%.

4. Synthesis of Intermediate M12-7: according to the synthetic scheme of Compound M5-3, Compound M4-8 and Compound M12-5 were replaced with Compound M5-1 and Compound M5-2, respectively, with a yield of 58%.
5. Synthesis of Intermediate M12-8: according to the synthetic scheme of Compound M2-13, Compound M12-7 was replaced with Compound M2-11, and the yield was 72%.
6. Synthesis of Intermediate M12-9: according to the synthetic scheme of Compound M1-8, Compound M12-5 and Compound M12-8 were replaced with Compound M1-6 and Compound M1-7, respectively, with a yield of 67%.
7. Synthesis of Compound M12: according to the synthetic scheme of Compound M1, Compound M12-9 was replaced with Compound M1-8, and the yield was 27%. MS(ASAP):789.

Example 13: Synthesis of Compound (M13)

(M13)

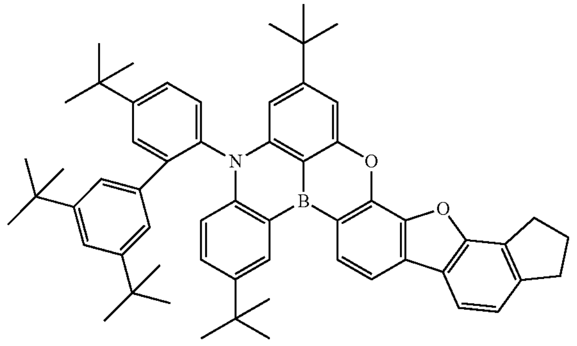

Synthetic Scheme

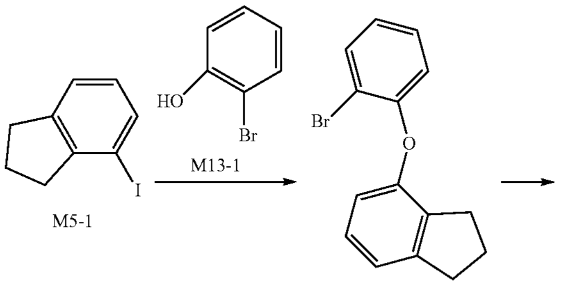

M5-1

M13-1

M13-2

-continued

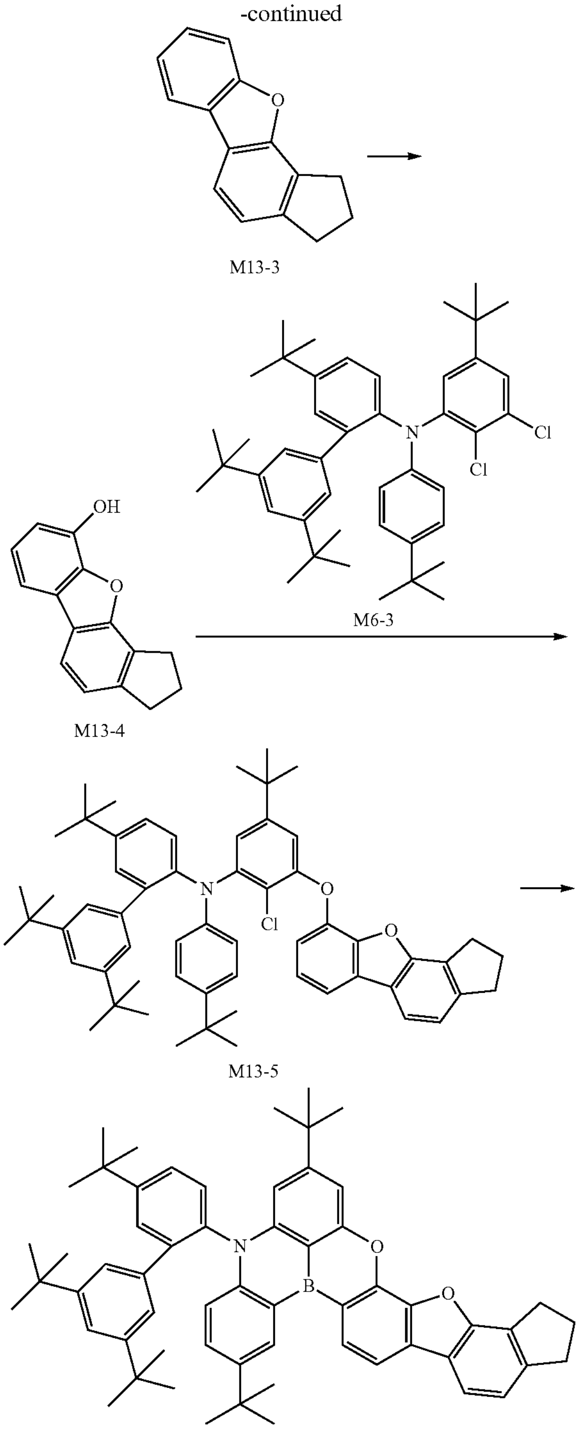

M13-3

M13-4

M6-3

M13-5

M13

1. Synthesis of Intermediate M13-2: according to the synthetic scheme of Compound M5-3, Compound M13-1 was replaced with Compound M5-2, and the yield was 68%.
2. Synthesis of Intermediate M13-3: according to the synthetic scheme of Compound M5-4, Compound M13-2 was replaced with Compound M5-3, and the yield was 74%.
3. Synthesis of Intermediate M13-4: under nitrogen atmosphere, (8.3 g, 40 mmol) of Compound M13-3 and 80 mL of anhydrous tetrahydrofuran were added into a 250 mL three-necked flask, cooled down to −78° C., followed by slowly adding 45 mmol of n-butyllithium solution drepwise, keeping the temperature and stirring the reaction for 2 hours, adding 50 mmol of trimethyl borate at one time, making the reaction rise to room temperature slowly, and continuing to stir the reaction for 4 hours, to complete the reaction. After that, the reaction was quenched to evaporate most of the solvent by rotary evaporation, extracted with dichloromethane, and washed three times with water. Next, the organic phase was collected and spun-dried. After the product was dissolved in 60 mL of dichloromethane, it was transferred to a 250 mL three-neck flask, followed by slowly adding 100 mmol of hydrogen peroxide solution under ice bath. After the addition was complete, the reaction was stirred at room temperature for 2 hours followed by slowly adding 10 mL of hydrochloric acid dropwise, stirred and reacted for 1 hour. After the reaction was completed, the reaction was quenched with water, neutralized with aqueous sodium bisulfite, extracted with dichloromethane, and washed three times with water. Next, the organic liquid was collected and purified by silica gel column chromatography, with a yield of 65%.

4. Synthesis of Intermediate M13-5: according to the synthetic scheme of Compound M5-3, Compound M6-3 and Compound M13-4 were replaced with Compound M5-1 and Compound M5-2, respectively, with a yield of 52%.

5. Synthesis of Compound M13: according to the synthetic scheme of Compound M1, Compound M13-5 was replaced with Compound M1-8, and the yield was 24%. MS(ASAP):832.

Example 14: Synthesis of Compound (M14)

(M14)

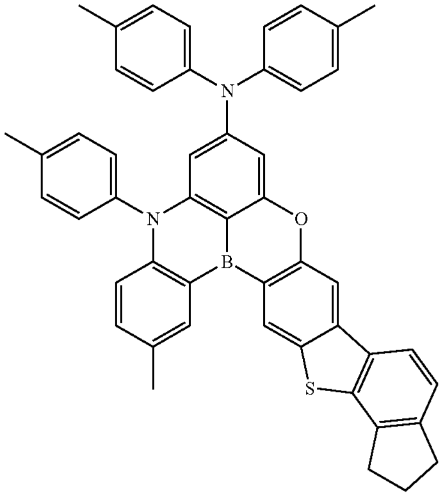

Synthetic Scheme

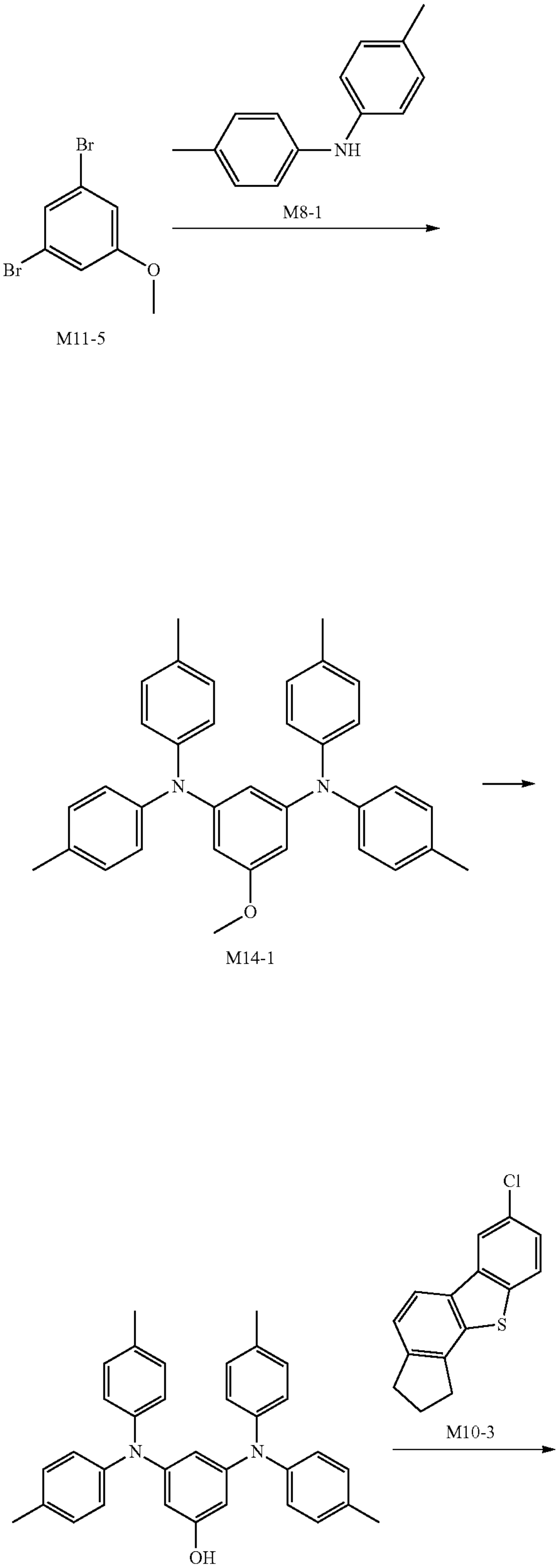

M11-5

M8-1

M14-1

M10-3

M14-2

-continued

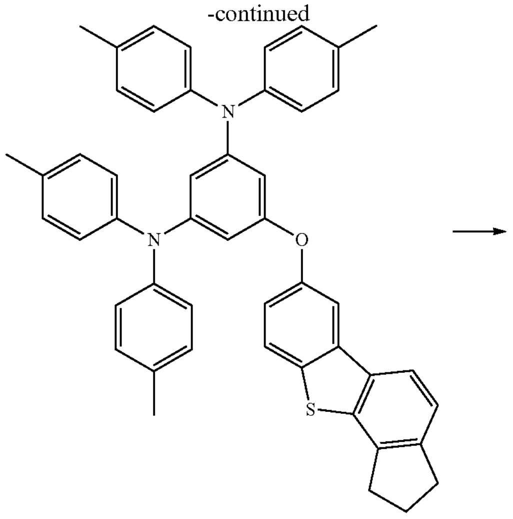

M14-3

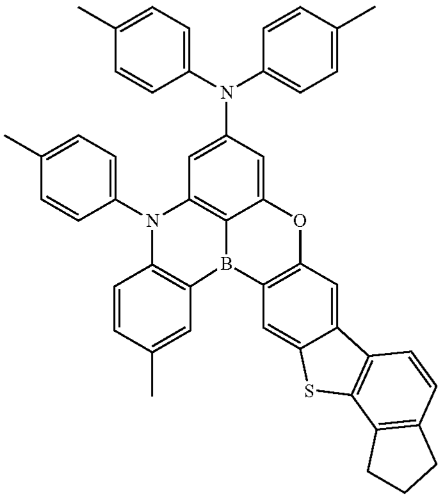

M14

1. Synthesis of Intermediate M14-1: according to the synthetic scheme of Compound M8-3, Compound M11-5 was replaced with Compound M8-2, and the yield was 78%.
2. Synthesis of Intermediate M14-2: according to the synthetic scheme of Compound M11-7, Compound M14-1 was replaced with Compound M11-6, and the yield was 82%.
3. Synthesis of Intermediate M14-3: according to the synthetic scheme of Compound M5-3, Compound M10-3 and Compound M14-2 were replaced with Compound M5-1 and Compound M5-2, respectively, with a yield of 57%.
4. Synthesis of Compound M14: according to the synthetic scheme of Compound M8, Compound M14-3 was replaced with Compound M8-9, and the yield was 26%. MS(ASAP):715.

Example 15: Synthesis of Compound (M15)

(M15)

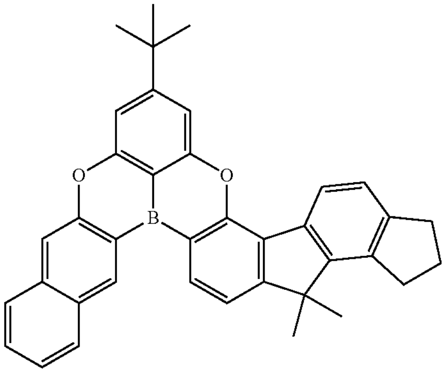

Synthetic Scheme

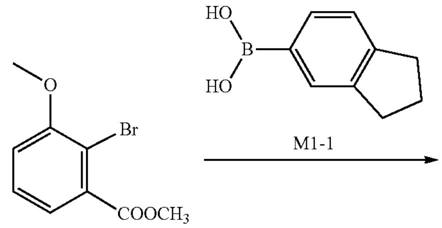

M15-1

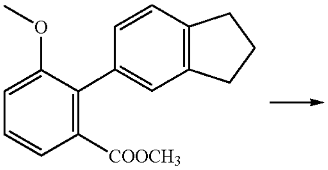

M15-2

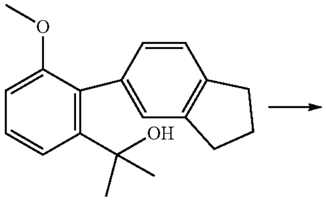

M15-3

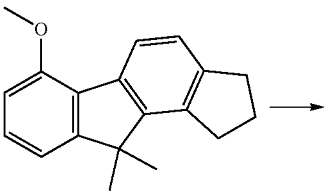

M15-4

-continued

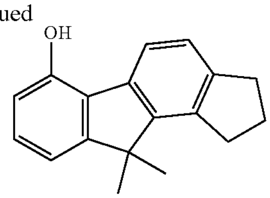

M15-5

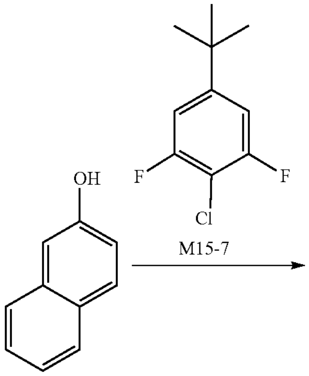

M15-6

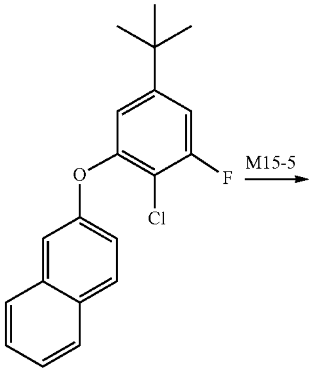

M15-8

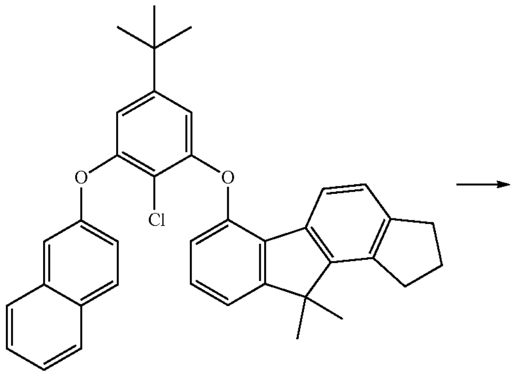

M15-9

-continued

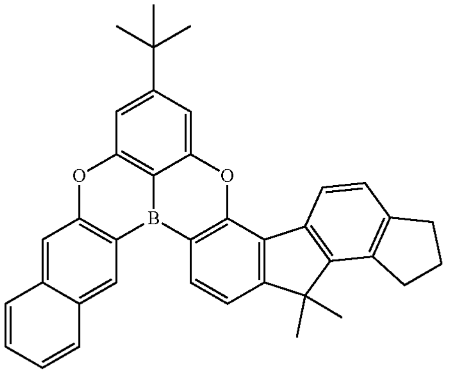

M15

1. Synthesis of Intermediate M15-2: according to the synthetic scheme of Compound M1-3, Compound M15-1 was replaced with Compound M1-2 respectively, with a yield of 72%.
2. Synthesis of Intermediate M15-3: according to the synthetic scheme of Compound M2-5, Compound M15-2 was replaced with Compound M2-3.
3. Synthesis of Intermediate M15-4: according to the synthetic scheme of Compound M1-6, Compound M15-3 was replaced with Compound M1-5, and the two-step yield was 56%.
4. Synthesis of Intermediate M15-5: according to the synthetic scheme of Compound M11-7, Compound M15-4 was replaced with Compound M11-6, and the yield was 80%.
5. Synthesis of Intermediate M15-8: under nitrogen atmosphere, (14.4 g, 100 mmol) of Compound M15-6, (20.5 g, 100 mmol) of Compound M15-7, (65.2 g, 200 mmol) of cesium carbonate, and 150 mL of dimethylformamide were added into a 500 mL three-necked flask, and refluxed for 12 hours. After the reaction was completed, the reaction was cooled down to room temperature to evaporate most of the solvent of the reaction solution by rotary evaporation, extracted with dichloromethane, and washed three times with water. Next, the organic liquid was collected and purified by silica gel column chromatography, and the yield was 64%.
6. Synthesis of Intermediate M15-9: according to the synthetic scheme of Compound M15-8, Compound M15-5 and Compound M15-8 were replaced with Compound M15-6 and Compound M15-7, respectively, with a yield of 69%.
7. Synthesis of Compound M15: according to the synthetic scheme of Compound M1, Compound M15-9 was replaced with Compound M1-8, and the yield was 36%. MS(ASAP):532.

Example 16: Synthesis of Compound (M16)
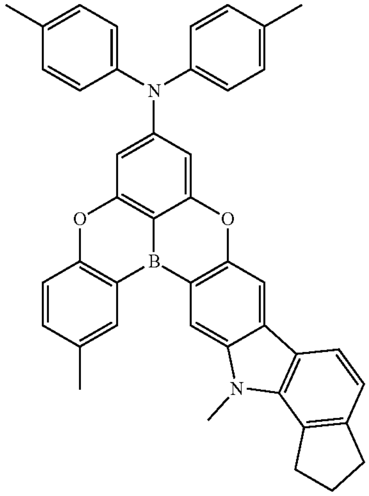
(M16)
Synthetic Scheme
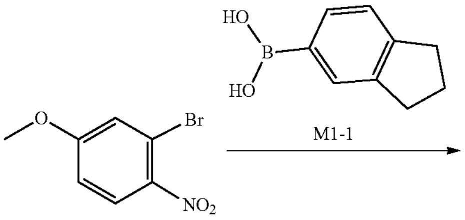
M16-1
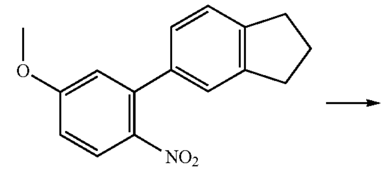
M16-2
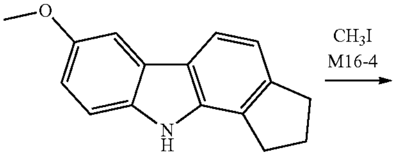
M16-3
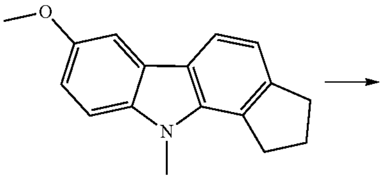
M16-5
-continued
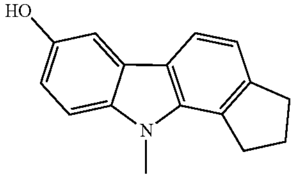
M16-6
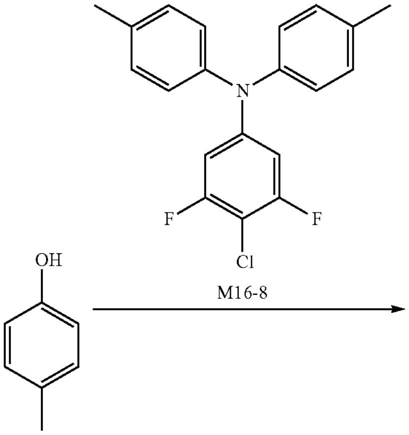
M16-7
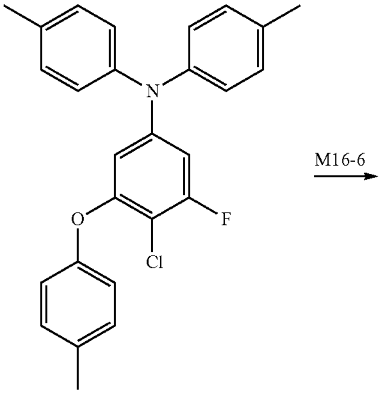
M16-9
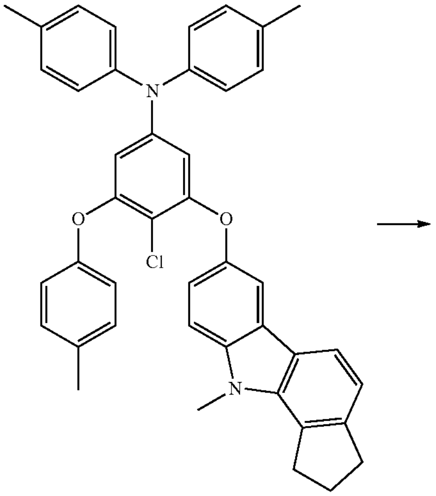
M16-10

-continued

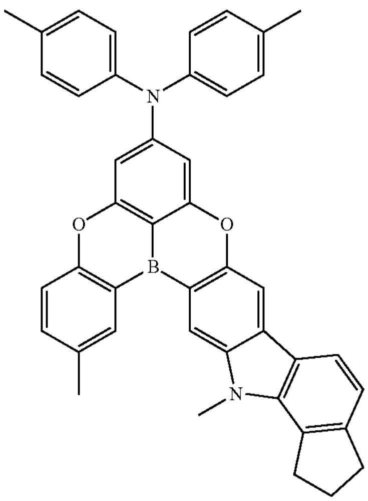

M16

1. Synthesis of Intermediate M16-2: according to the synthetic scheme of Compound M1-3, Compound M16-1 was replaced with Compound M1-2, and the two-step yield was 63%.
2. Synthesis of Intermediate M16-3: according to the synthetic scheme of Compound M3-5, Compound M16-2 was replaced with Compound M3-4, and the yield was 65%.
3. Synthesis of Intermediate M16-5: according to the synthetic scheme of Compound M3-7, Compound M16-3 and Compound M16-4 were replaced with Compound M3-5 and Compound M3-6, respectively, with a yield of 84%.
4. Synthesis of Intermediate M16-6: according to the synthetic scheme of Compound M11-7, Compound M16-5 was replaced with Compound M11-6, and the yield was 75%.
5. Synthesis of Intermediate M16-9: according to the synthetic scheme of Compound M15-8, Compound M16-7 and Compound M16-8 were replaced with Compound M15-6 and Compound M15-7, respectively, with a yield of 73%.
6. Synthesis of Intermediate M16-10: according to the synthetic scheme of Compound M15-8, Compound M16-6 and Compound M16-9 were replaced with Compound M15-6 and Compound M15-7, respectively, with a yield of 70%.
7. Synthesis of Compound M16: according to the synthetic scheme of Compound M1, Compound M16-10 was replaced with Compound M1-8, and the yield was 34%. MS(ASAP):623.

Example 17: Synthesis of Compound (M17)

(M17)

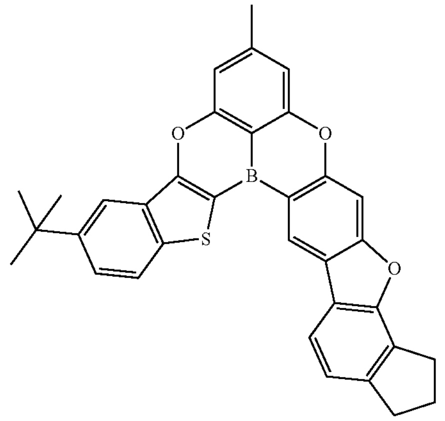

Synthetic Scheme

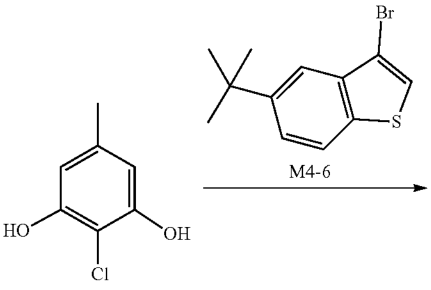

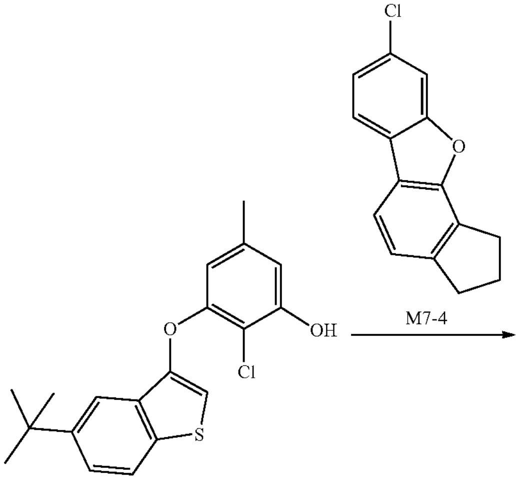

-continued

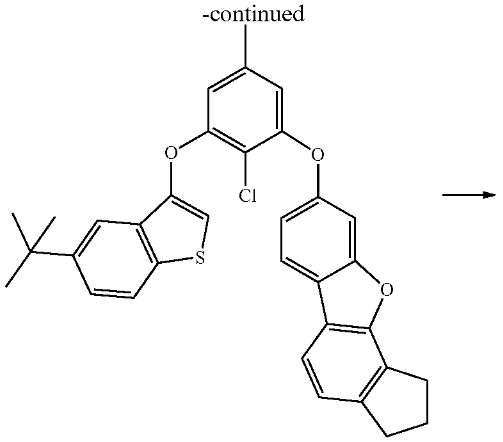

M17-3

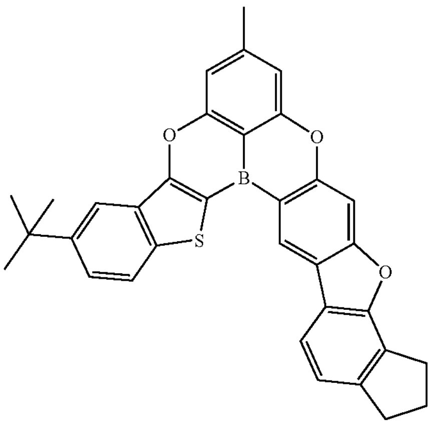

M17

1. Synthesis of Intermediate M17-2: according to the synthetic scheme of Compound M5-3, Compound M4-6 and Compound M17-1 were replaced with Compound M5-1 and Compound M5-2, respectively, with a yield of 63%.
2. Synthesis of Intermediate M17-3: according to the synthetic scheme of Compound M5-3, Compound M7-4 and Compound M17-2 were replaced with Compound M5-1 and Compound M5-2, respectively, with a yield of 53%.
3. Synthesis of Compound M17: according to the synthetic scheme of Compound M1, Compound M17-3 was replaced with Compound M1-8, and the yield was 36%. MS(ASAP):526.

Example 18: Synthesis of Compound (M18)

(M18)

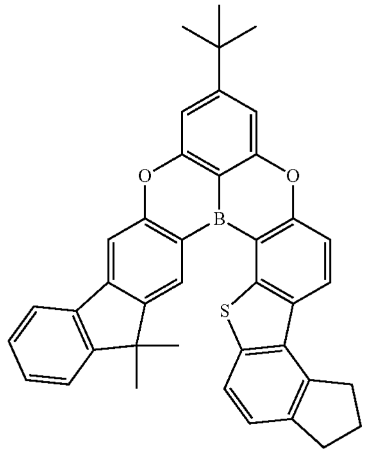

Synthetic Scheme

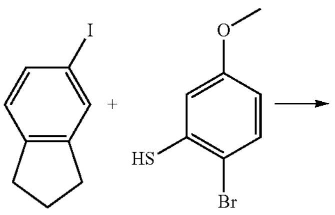

M6-5 M18-1

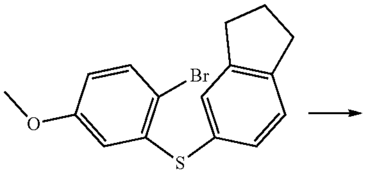

M18-2

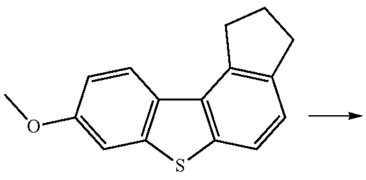

M18-3

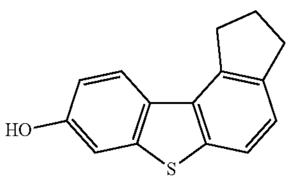

M18-4

-continued

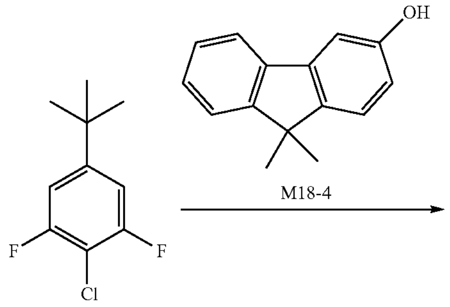

M15-7

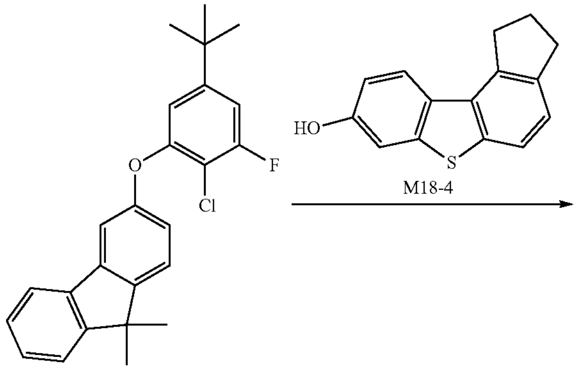

M18-6

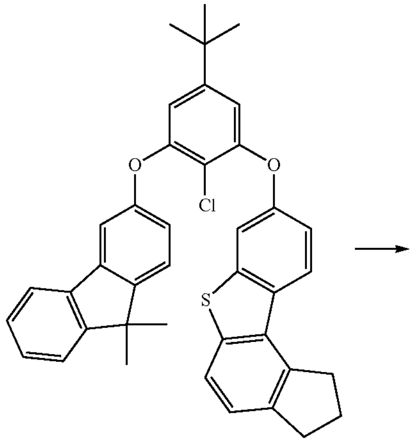

M18-7

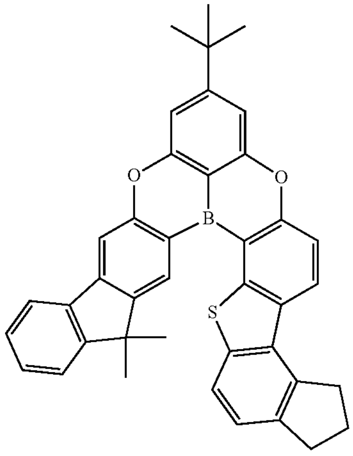

M18

1. Synthesis of Intermediate M18-2: according to the synthetic scheme of Compound M5-3, Compound M6-5 and Compound M18-1 were replaced with Compound M5-1 and Compound M5-2, respectively, with a yield of 60%.
2. Synthesis of Intermediate M18-3: according to the synthetic scheme of Compound M5-4, Compound M18-2 was replaced with Compound M5-3, and the yield was 78%.
3. Synthesis of Intermediate M18-4: according to the synthetic scheme of Compound M11-7, Compound M18-3 was replaced with Compound M11-6, and the yield was 72%.
4. Synthesis of Intermediate M18-6: according to the synthetic scheme of Compound M15-8, Compound M18-5 was replaced with Compound M15-6, and the yield was 68%.
5. Synthesis of Intermediate M18-7: according to the synthetic scheme of Compound M15-8, Compound M18-4 and Compound M18-6 were replaced with Compound M15-6 and Compound M15-7, respectively, with a yield of 75%.
6. Synthesis of Compound M18: according to the synthetic scheme of Compound M1, Compound M18-7 was replaced with Compound M1-8, and the yield was 32%. MS(ASAP):579.

Fabrication and Characterization of OLED Devices (1) Materials Used in Each Layer of OLED Devices:

HIL: a triarylamine derivative, shown as the following formula HIM;

HTL: a triarylamine derivative, shown as the following formula HTM;

Host: a kind of anthracene compound, shown as the following formula Host;

Dopant: Compound M1 to Compound M18, or Ref-1, respectively; and

ETL: shown as the following formula ET1.

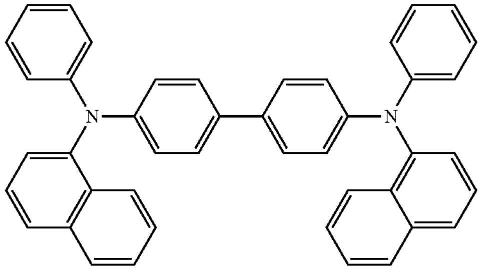

HIM

-continued

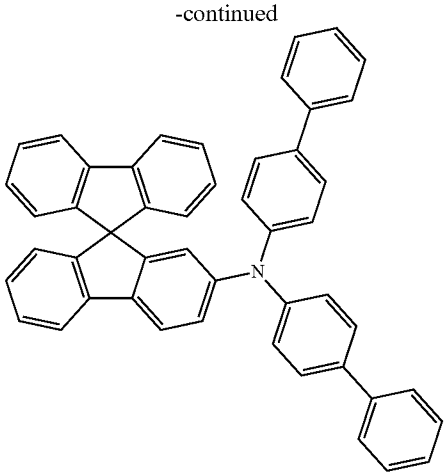

HTM

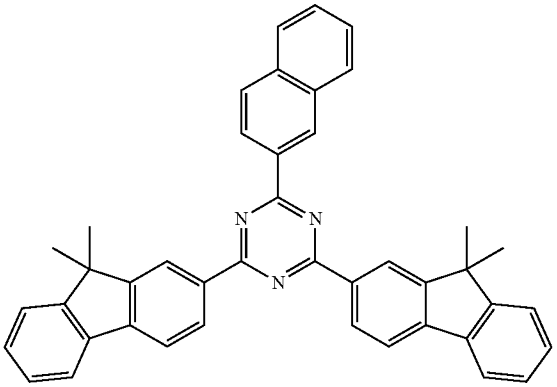

ET1

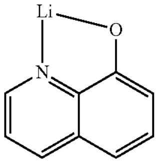

LiQ

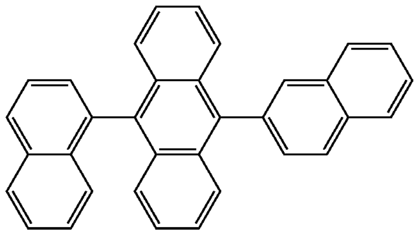

Host

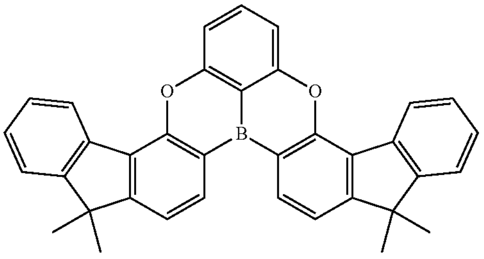

Ref-1

The relevant preparation methods, NMR, and mass spectrometry data of Ref-1 can be referred to the prior art, (2) Fabrication of Organic Electroluminescent Devices (Organic EL Devices)

A hole injection layer 3, a hole transport layer 4, a light-emitting layer 5, an electron transport layer 6, and a cathode 7 are sequentially formed on a transparent anode 2 preformed on a glass substrate 1 to prepare an organic electroluminescent device as shown in FIG. 1.

Steps of fabricating OLED devices with ITO (transparent anode)/HIL(40 nm)/HTL(100 nm)/Host: 3% Dopant (50 nm)/ETL(25 nm)/LiQ(1 nm)/Al (150 nm) are as follows:

a, cleaning of conductive glass substrate: when used for the first time, various solvents, such as chloroform, ketone, isopropanol, etc. can be used for cleaning, and then ultraviolet ozone plasma treatment was carried out;

Specifically, the glass substrate coated with an ITO transparent conductive layer with a thickness of 100 nm was ultrasonically treated in Decon 90 alkaline cleaning solution, rinsed in deionized water, washed three times in acetone and ethanol, and baked in a clean environment until water was completely removed, and cleaned with UV light and ozone, and the surface was bombarded with a beam of low-energy cations.

b. The HIL (40 nm), HTL (100 nm), EML (50 nm), and ETL (25 nm) were coated by thermal evaporation under high vacuum (1×10-6 mbar, mbar) in sequence;

c. Cathode: LiQ/Al (1 nm/150 nm) was formed by thermal evaporation under high vacuum (1×10-6 mbar);

d. Package: The device was packaged in a UV-curable resin in a nitrogen glove box.

Current-voltage (J-V) characteristics of the organic light-emitting diodes of each of the light-emitting devices (Examples 1-18 and Comparative Example Ref-1) were tested by characterization equipment, and important parameters such as efficiency, lifetime, and external quantum efficiency were recorded at the same time (see Table 1). In Table 1, all external quantum efficiencies and service life are relative values to the organic light-emitting diode of Comparative Example 1.

TABLE 1

| OLED device | Guest material | EQE | T90@1000 nits |
|---|---|---|---|
| Example 1 | M1 | 1.71 | 1.80 |
| Example 2 | M2 | 1.73 | 1.81 |
| Example 3 | M3 | 1.68 | 1.77 |
| Example 4 | M4 | 1.69 | 1.79 |
| Example 5 | M5 | 1.79 | 1.88 |
| Example 6 | M6 | 1.80 | 1.90 |
| Example 7 | M7 | 1.82 | 1.93 |
| Example 8 | M8 | 1.77 | 1.87 |
| Example 9 | M9 | 1.74 | 1.83 |
| Example 10 | M10 | 1.76 | 1.85 |
| Example 11 | M11 | 1.66 | 1.75 |
| Example 12 | M12 | 1.62 | 1.70 |
| Example 13 | M13 | 1.63 | 1.72 |
| Example 14 | M14 | 1.65 | 1.73 |
| Example 15 | M15 | 1.56 | 1.64 |
| Example 16 | M16 | 1.59 | 1.67 |
| Example 17 | M17 | 1.57 | 1.66 |
| Example 18 | M18 | 1.60 | 1.69 |
| Comparative example 1 | Ref-1 | 1 | 1 |

It should be noted that the external quantum efficiency of the device can be calculated by the method in the document Adv. Mater., 2003, 15:1043-1048. The service life of the devices refers to the time when the initial brightness of 10000 cd/$m^2$ decays to 9000 cd/$m^2$ (90%). All devices were packaged in a nitrogen atmosphere.

It can be seen from the data in Table 1 that the Compound of Example 1 to Example 18 of the present application have higher external quantum efficiency and longer service life than the prior art.

As can be seen from Table 1, the guest material based on the present invention is used in OLED, so that the efficiency and service life of the light-emitting device are greatly improved compared with the comparative examples. The key site of the guest molecule, namely, the boron-containing organic compound of the present application, is substituted with a saturated cycloalkyl group to increase the distance between molecules and prevent the luminescence quenching caused by the π-π stacking of molecules, thereby greatly improving the device performance.

In summary, the invention provides a boron-containing organic compound as a new type of material. By introducing a cyclopentyl-containing hole transport group into the boron-containing compound, on the one hand, it is beneficial to improve the hole transport performance of the compound, and on the other hand, it can enhance The resonance performance of the molecule enables the application of boron-containing organic compounds to organic light-emitting devices, which can effectively improve the light extraction efficiency. At the same time, the cyclopentyl group can effectively increase the distance between molecules and inhibit the exciton quenching caused by the accumulation between molecules, when the boron-containing organic compound is applied to the blue light material, the stability and life of the device can be effectively improved.

The boron-containing organic compound and applications thereof provided by the embodiments of the present application are described in detail above. Specific examples are used to explain the principle and implementation of the present application. The descriptions of the above embodiments are only used to help understand the present application. Also, for those skilled in the art, according to the ideas of the present application, there will be changes in the specific implementation and application scope. In summary, the content of this specification should not be construed as limiting the present application.

What is claimed is:

1. A boron-containing organic compound as shown in general formula (I):

(I)

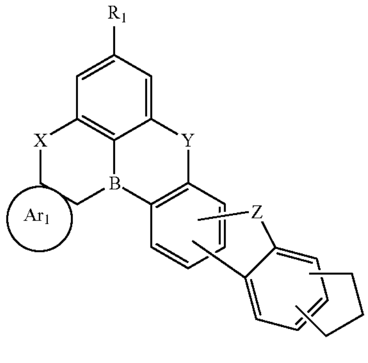

wherein $R_1$ is selected from H, D, $C_{1-4}$ alkyl group, an alkyl-substituted phenyl group, or an aryl-substituted amino group;

Z is independently selected from $CR_2R_3$, $NR_4$, O, or S;

X and Y are independently selected from O or $NR_5$, and at least one of X and Y is selected from O;

$R_2$ and $R_3$ are each independently selected from methyl, phenyl or $R_2$ and $R_3$, together with carbon atoms connecting $R_2$ and $R_3$ form a ring consisting of 3-6 atoms;

$R_4$ is selected from $C_{1-4}$ alkyl group or an alkyl-substituted phenyl group;

$R_5$ is selected from phenyl, an alkyl-substituted phenyl, an alkyl-substituted biphenyl, or an alkyl-substituted fluorenyl; and $Ar_1$ is independently selected from an alkyl-substituted phenyl, dibenzothiophene, naphthalene, or an alkyl-substituted fluorenyl.

2. The boron-containing organic compound according to claim 1, wherein Z is selected from O or S.

3. The boron-containing organic compound according to claim 1, wherein at least one of X and Y is selected from $NR_5$.

4. The boron-containing organic compound according to claim 3, wherein when one of X and Y is O, the other one of X and Y is $NR_5$.

5. The boron-containing organic compound according to claim 1, comprising: one of 1-1

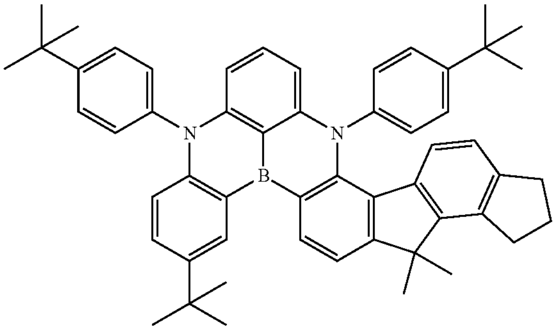

1-2

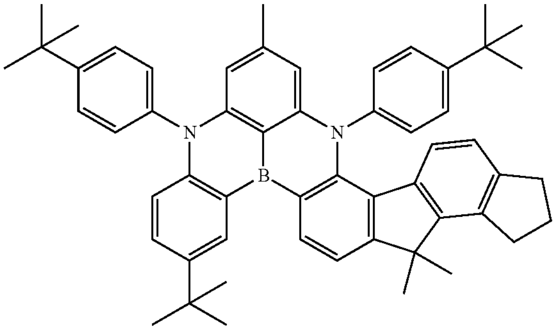

-continued
1-3
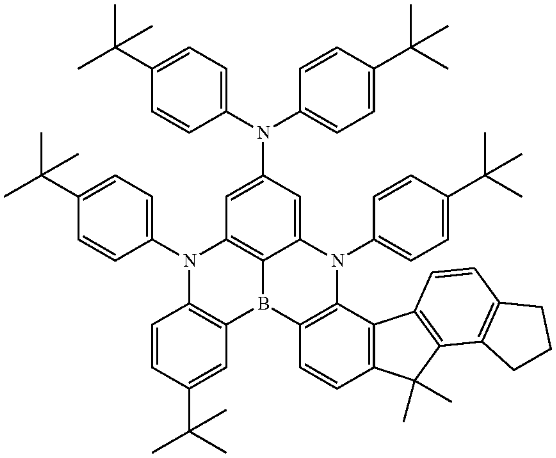
1-4
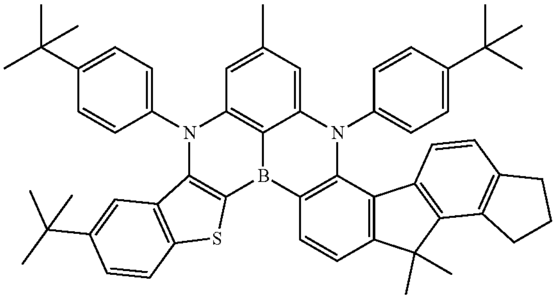
1-5
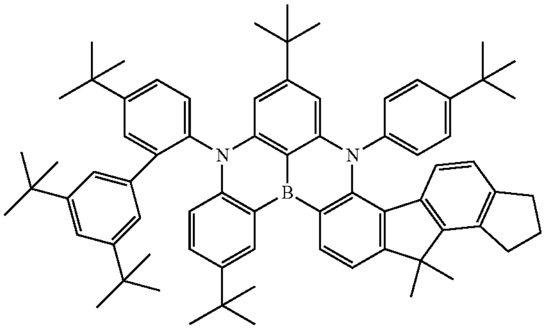
1-6
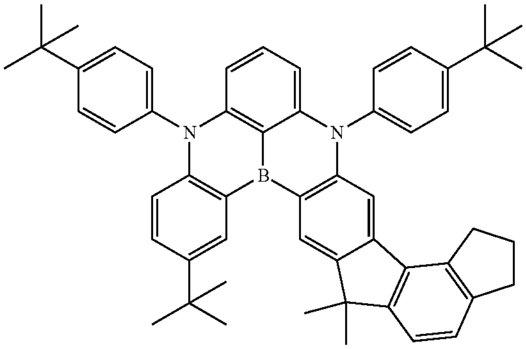
-continued
1-7
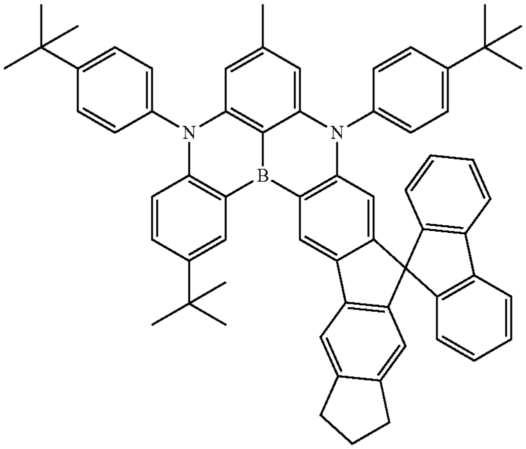
1-8
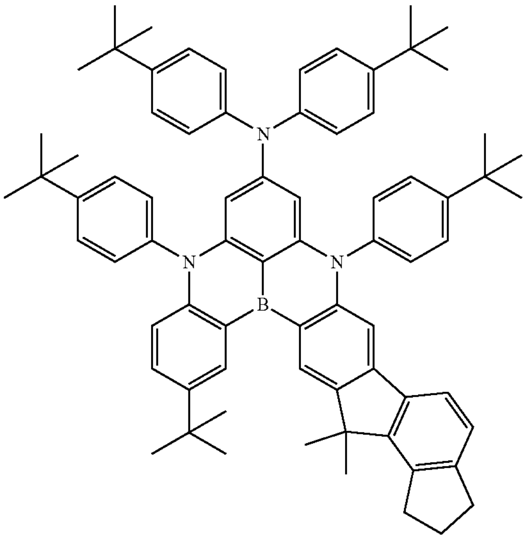
1-9
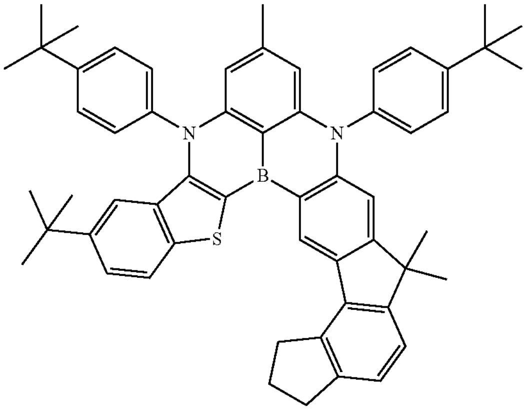

-continued
1-10
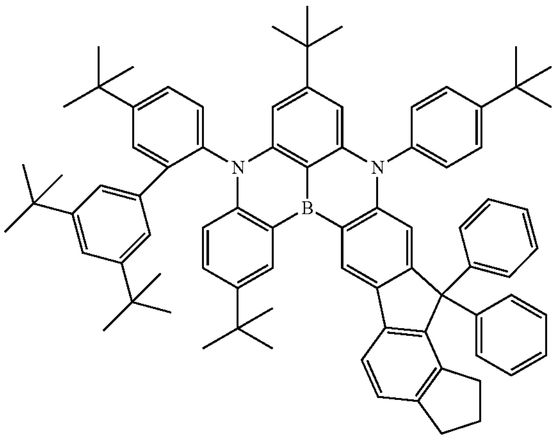
1-11
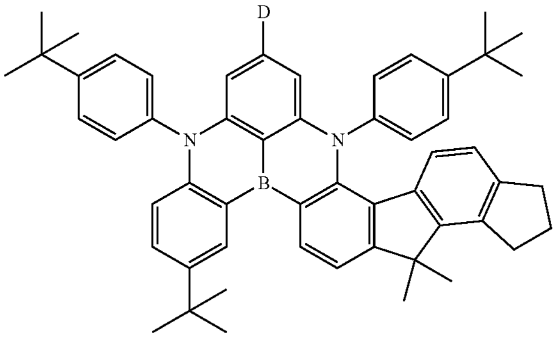
1-12
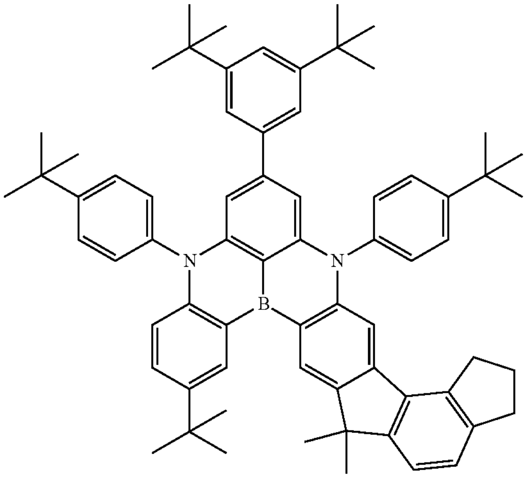
-continued
1-13
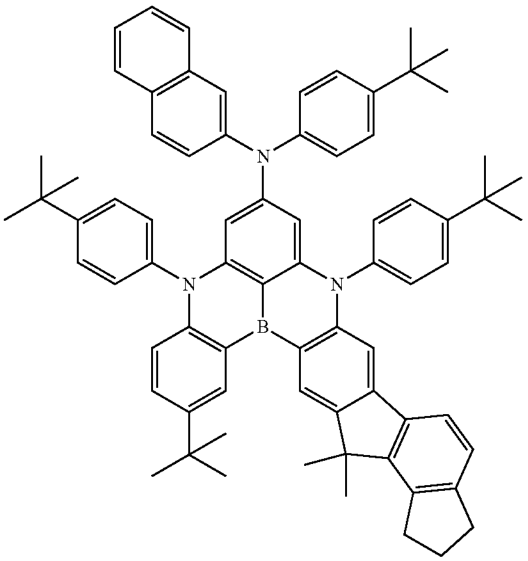
1-14
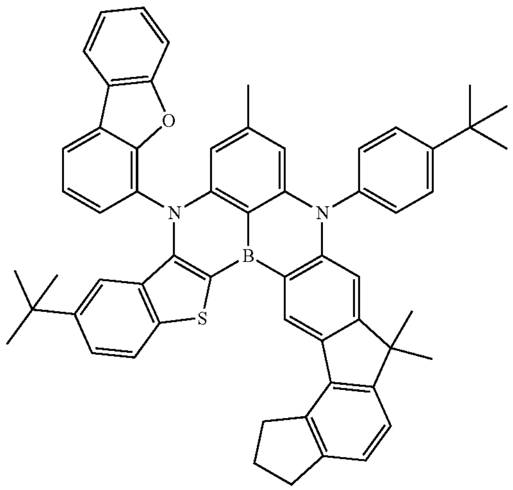
1-15
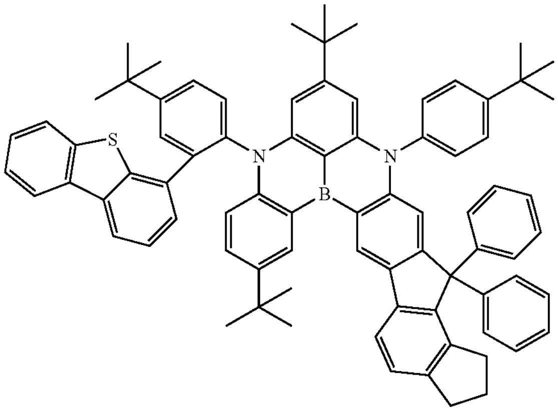

-continued
1-16
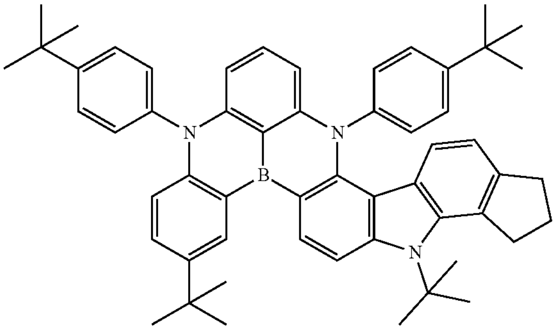
1-17
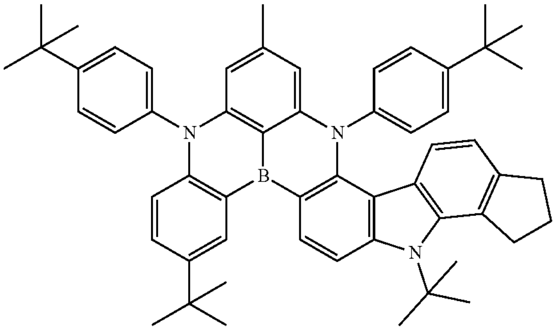
1-18
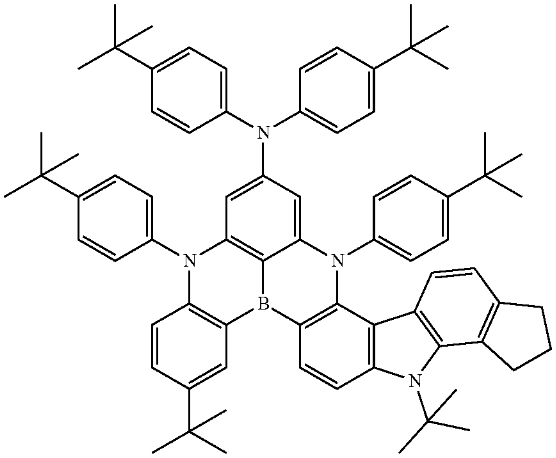
1-19
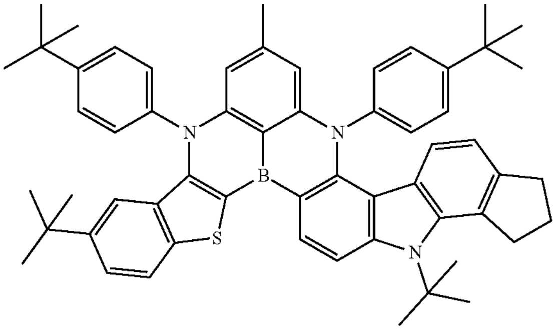
-continued
1-20
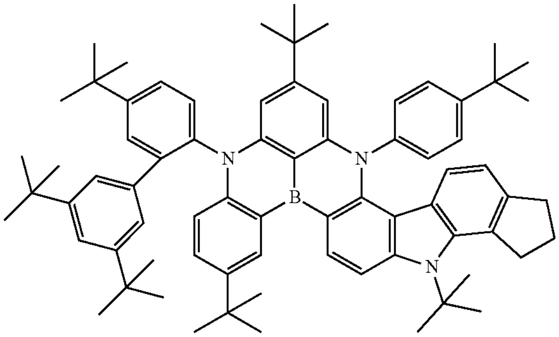
1-21
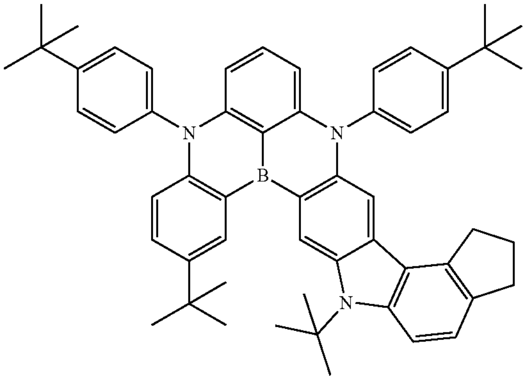
1-22
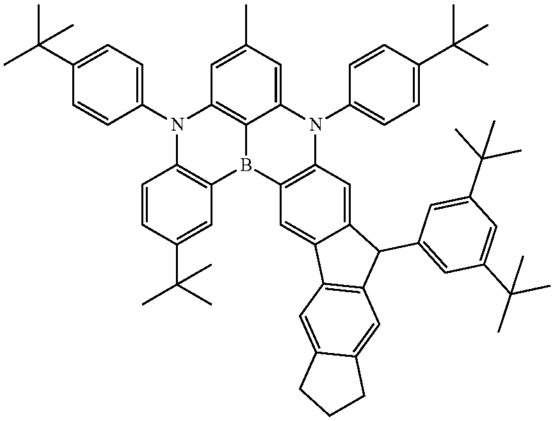

-continued
1-23
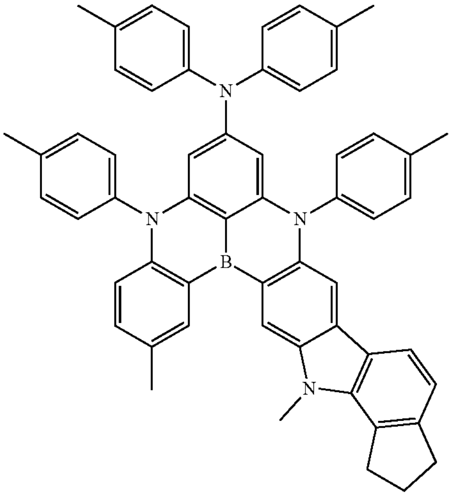
1-24
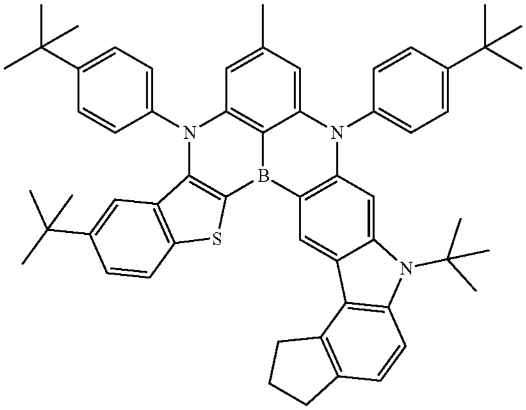
1-25
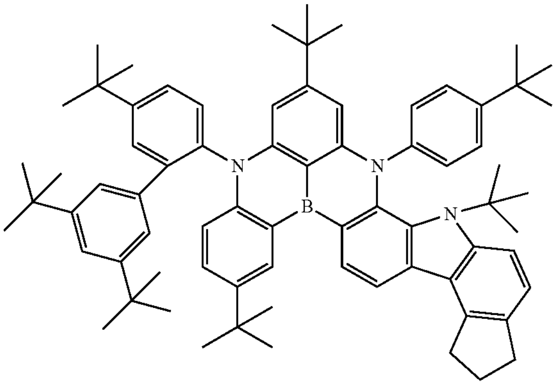
-continued
1-26
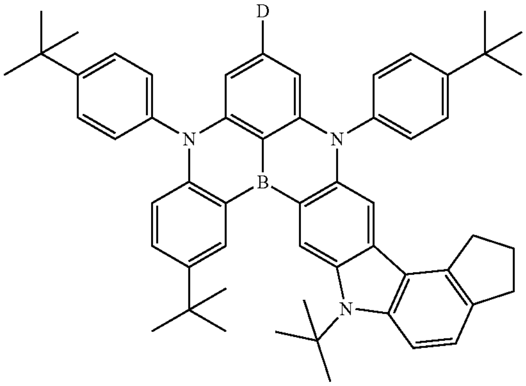
1-27
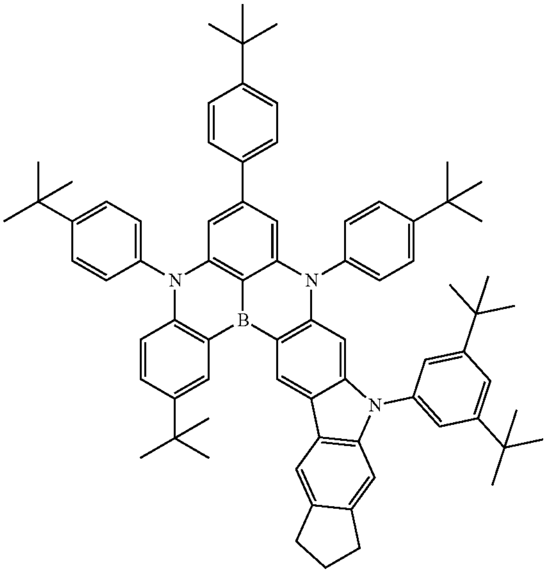
1-28
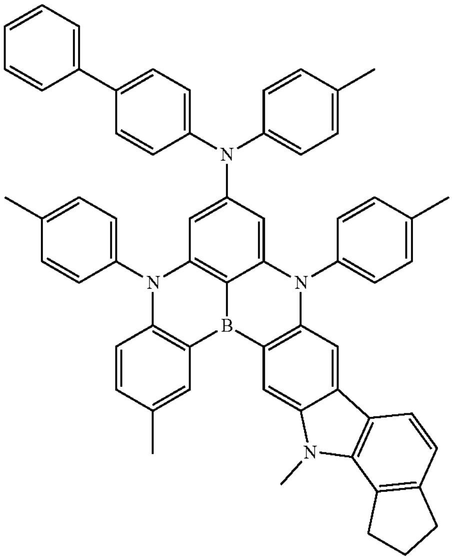

-continued
1-29
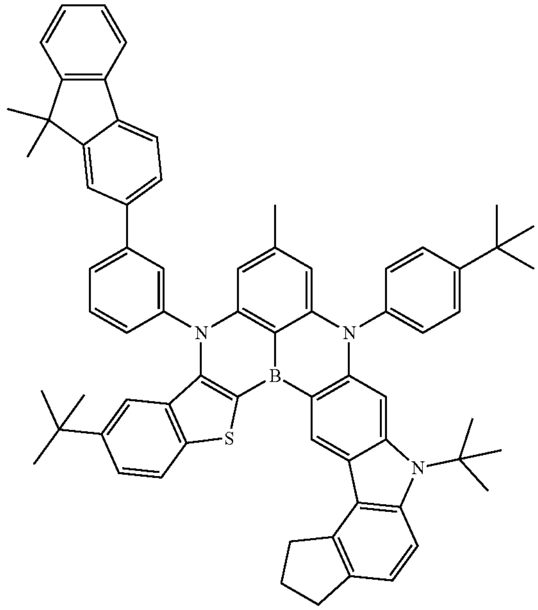
1-30
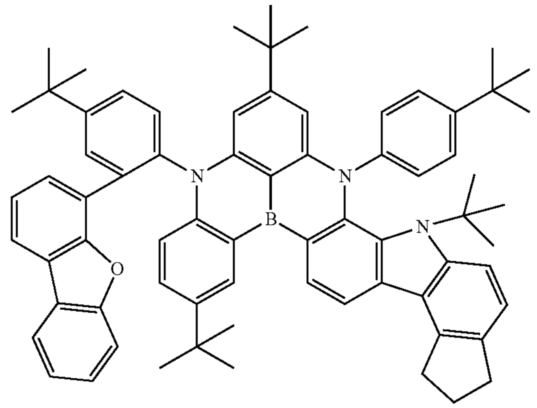
1-31
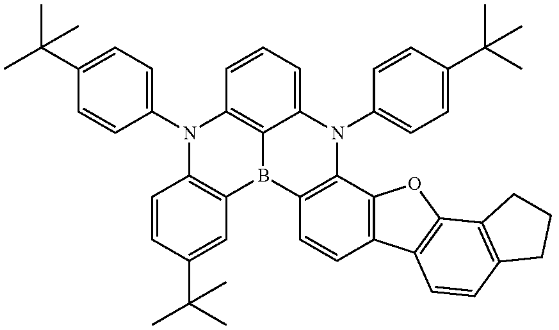
-continued
1-32
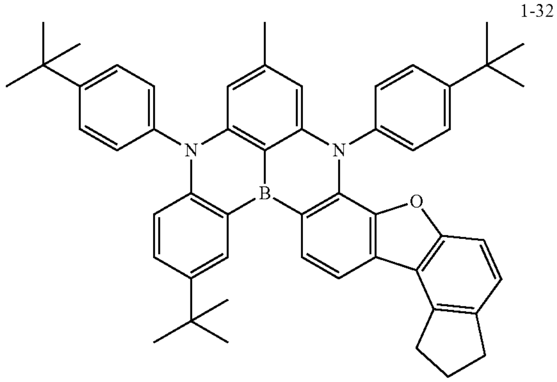
1-33
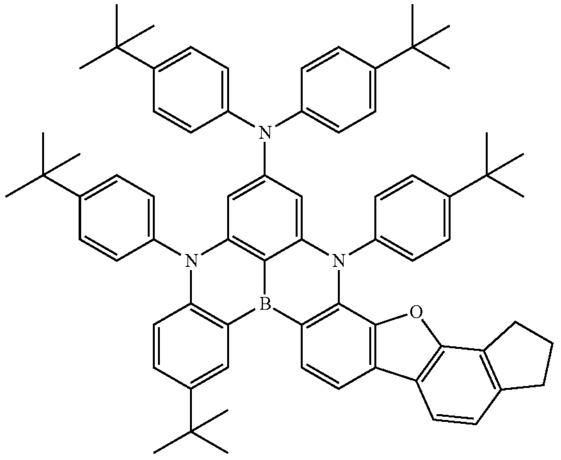
1-34
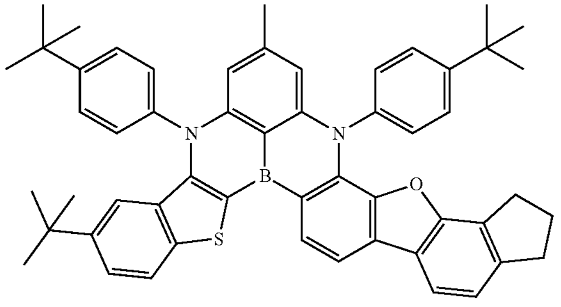
1-35
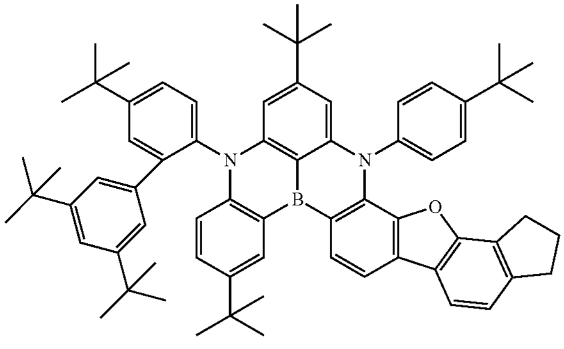

-continued
1-36
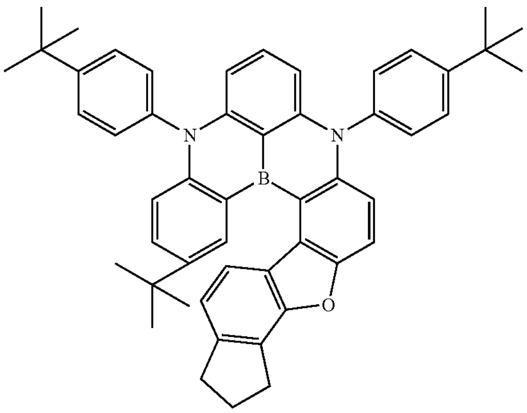
1-37
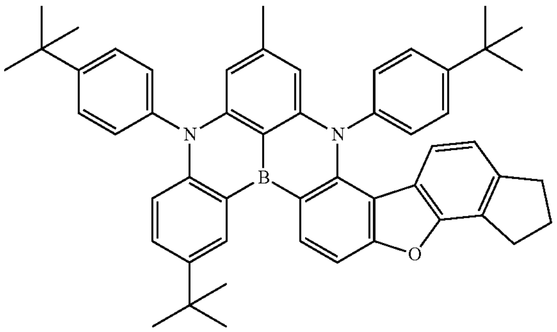
1-38
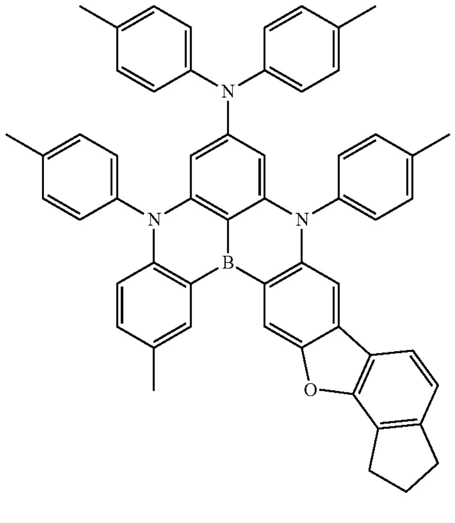
-continued
1-39
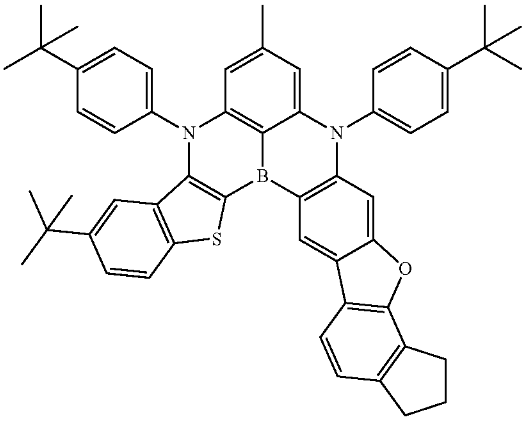
1-40
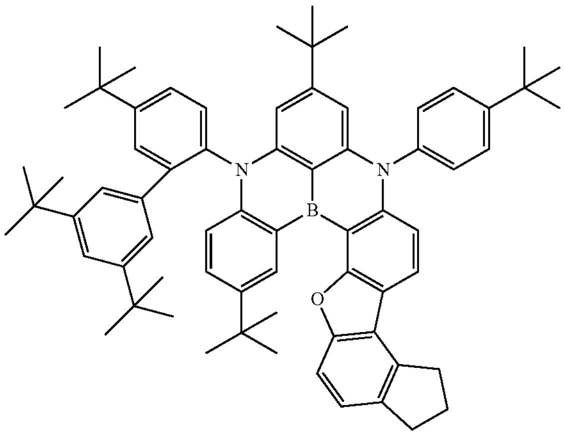
1-41
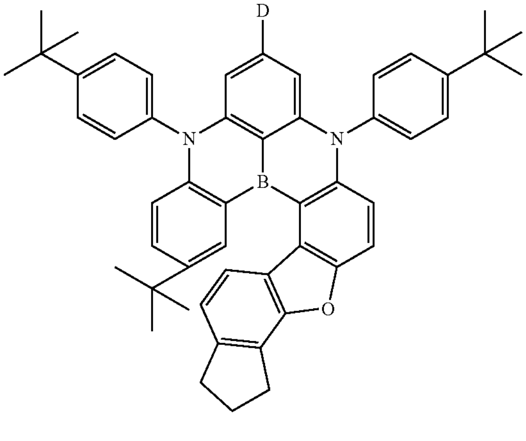

-continued
1-42
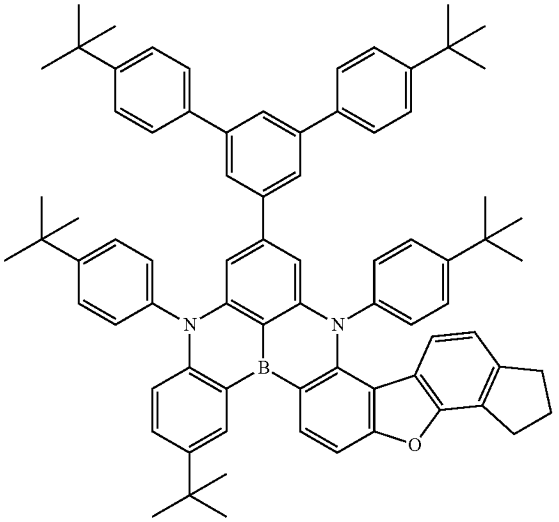
1-43
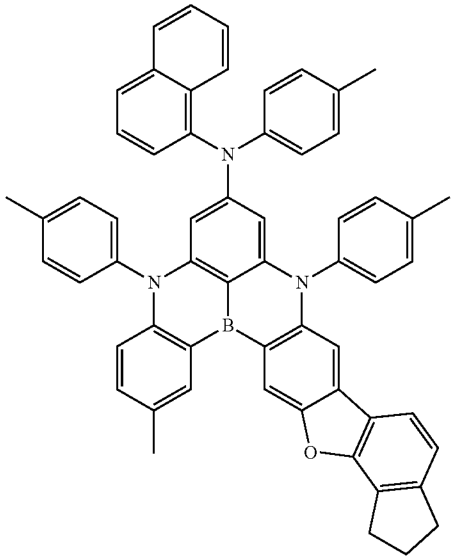
1-44
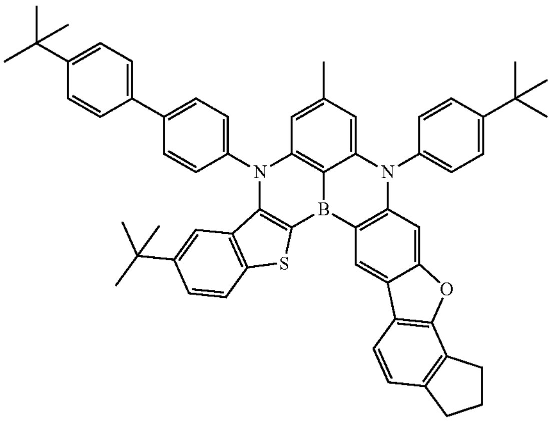
-continued
1-45
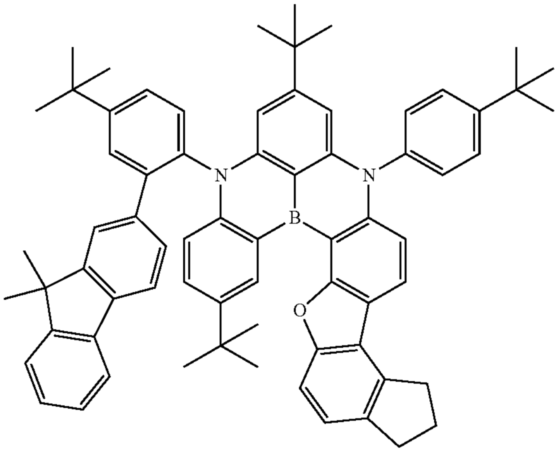
1-46
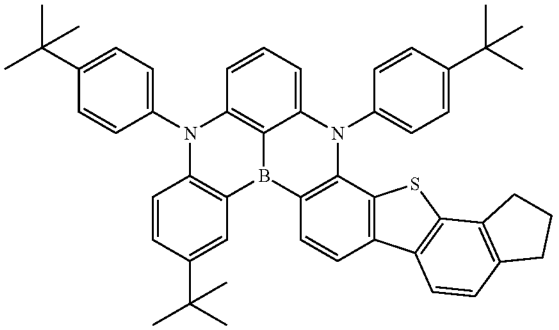
1-47
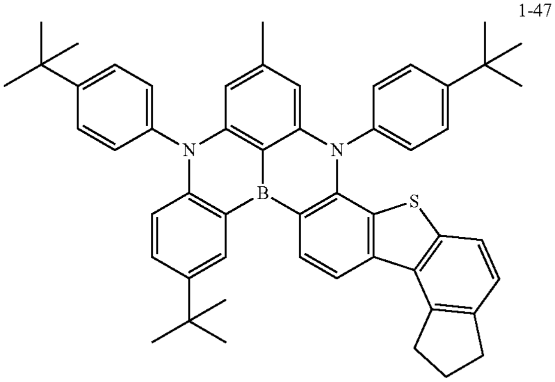
1-48
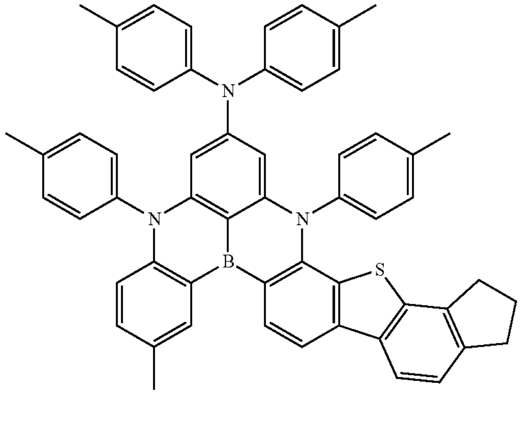

-continued
1-49
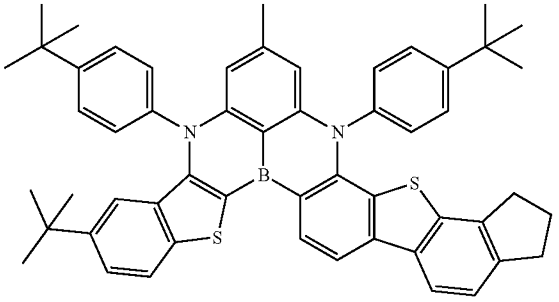
1-50
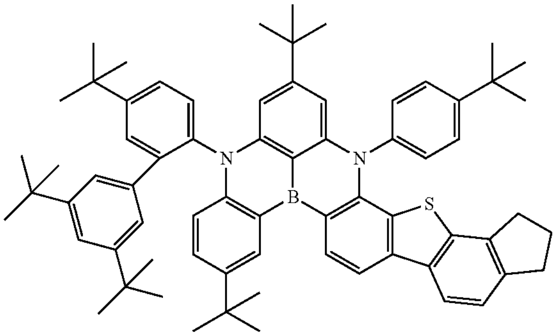
1-51
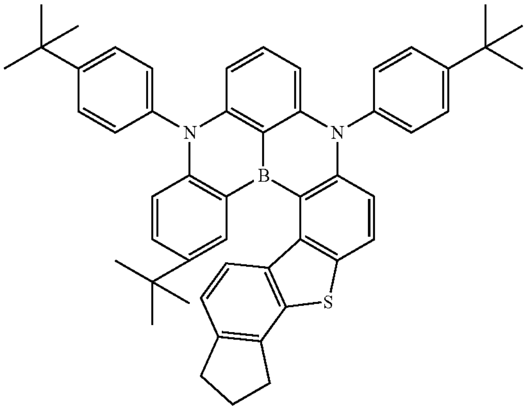
1-52
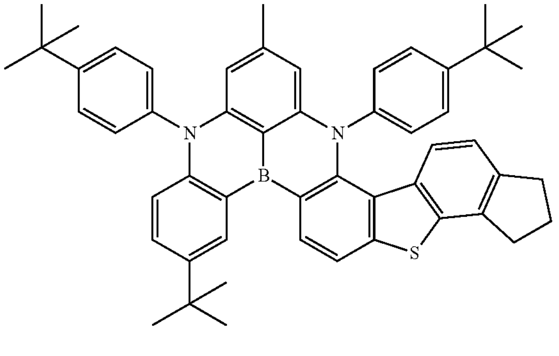
-continued
1-53
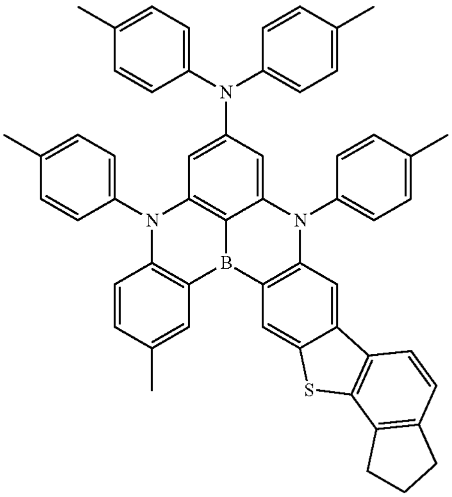
1-54
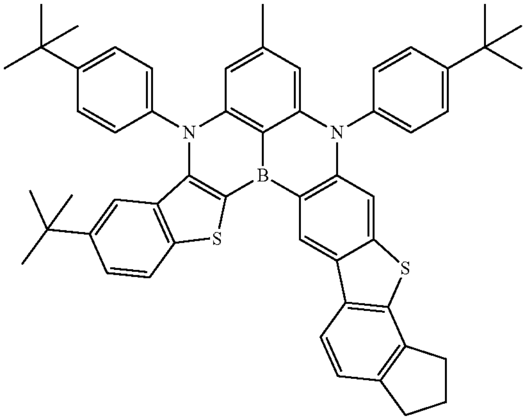
1-55
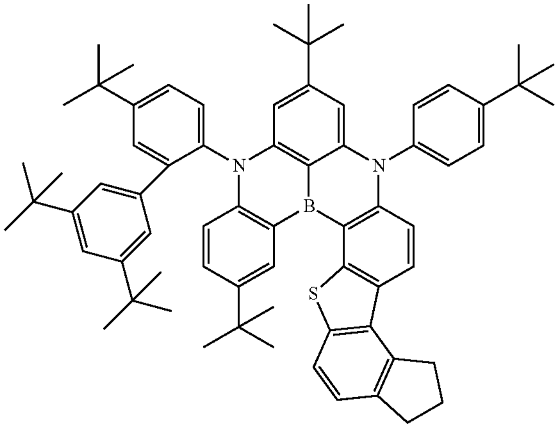

-continued
1-56
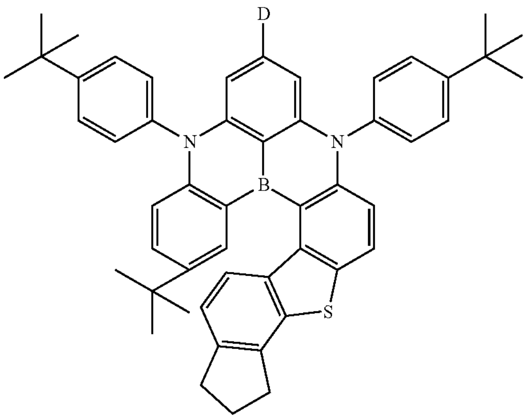
1-57
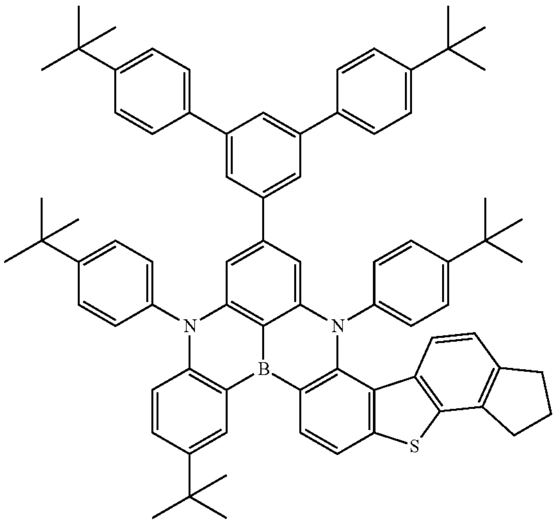
1-58
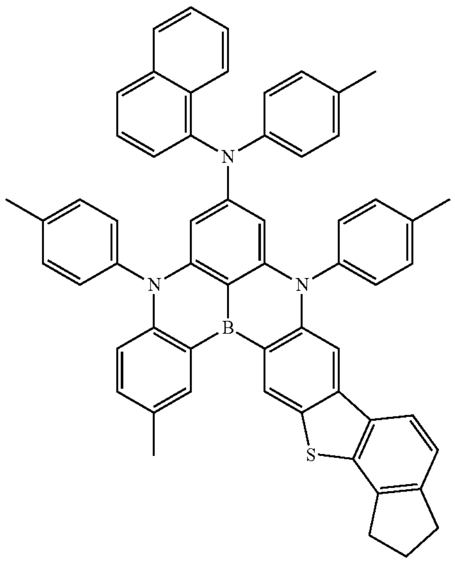
-continued
1-59
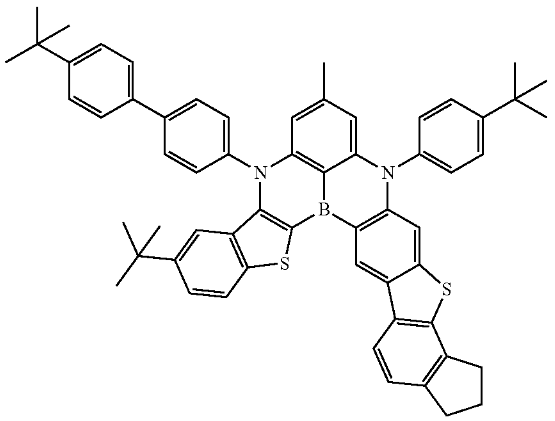
1-60
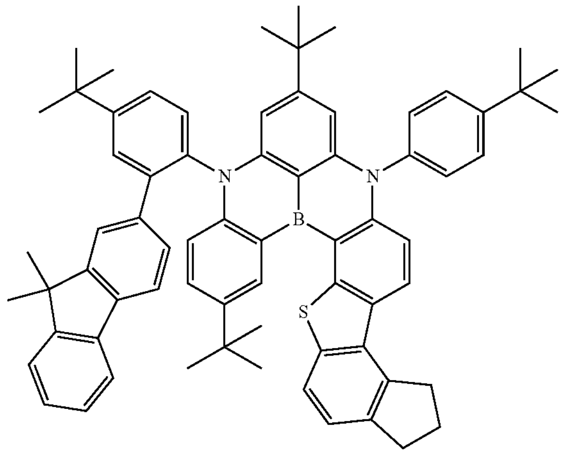
1-61
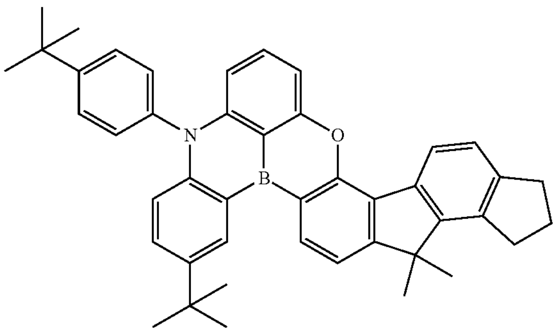
1-62
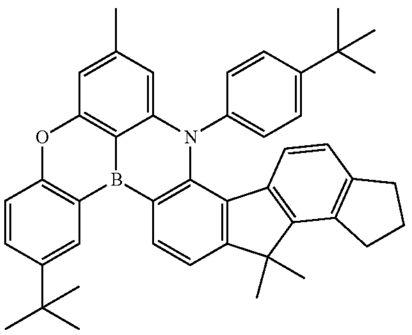

-continued
1-63
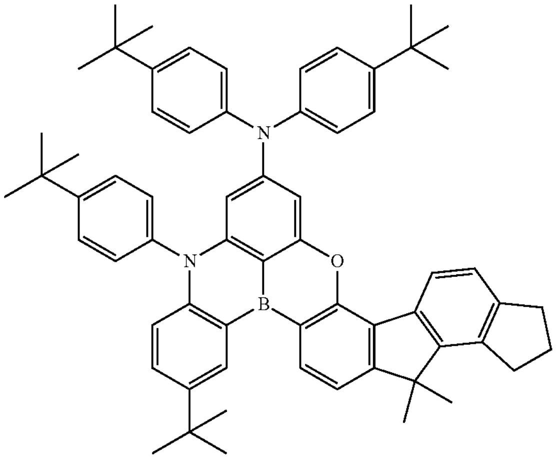
1-64
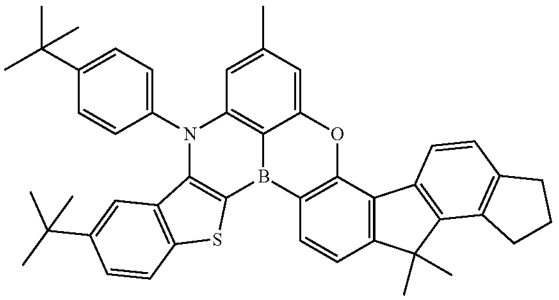
1-65
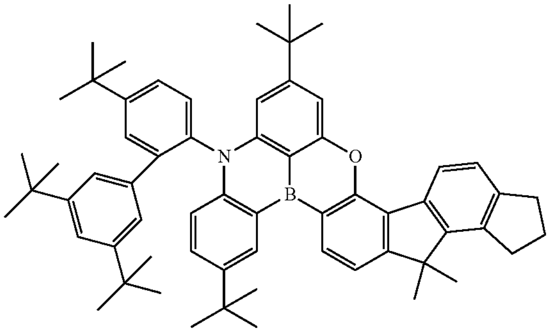
1-66
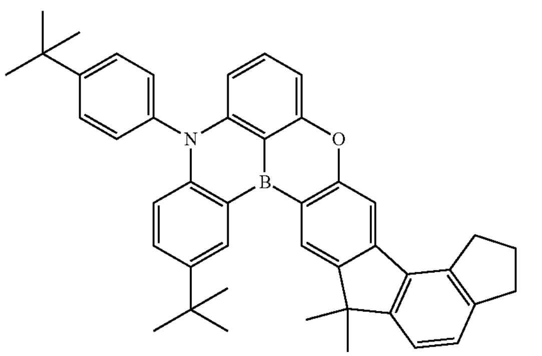
-continued
1-67
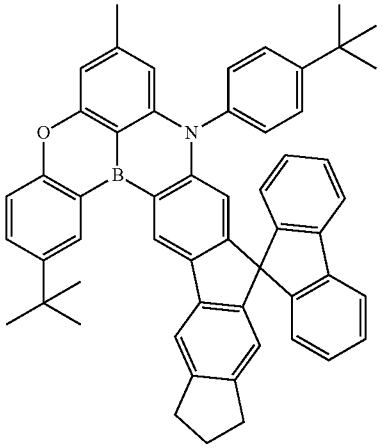
1-68
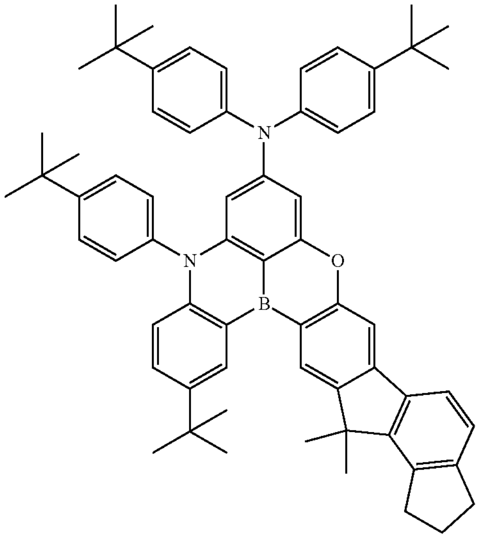
1-69
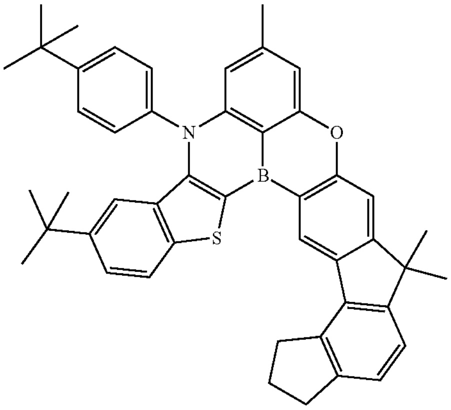

-continued
1-70
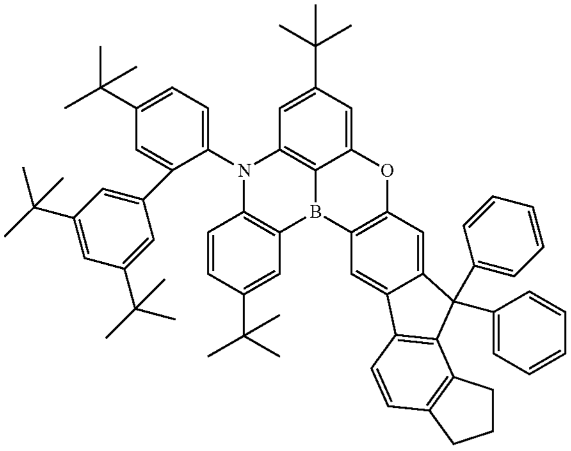
1-71
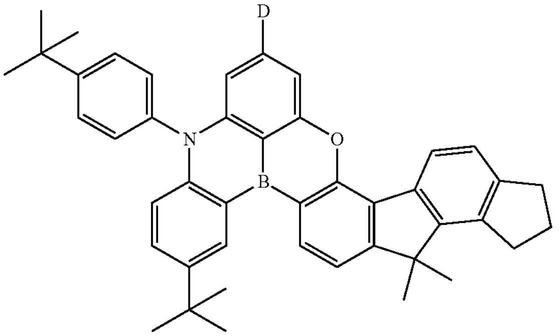
1-72
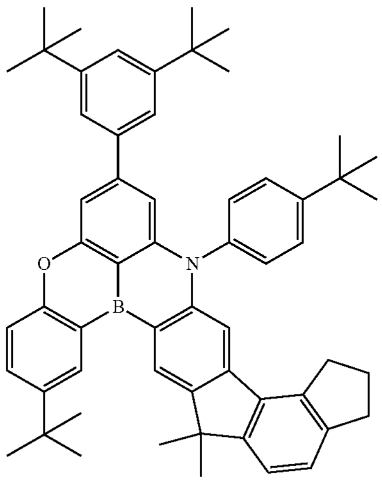
-continued
1-73
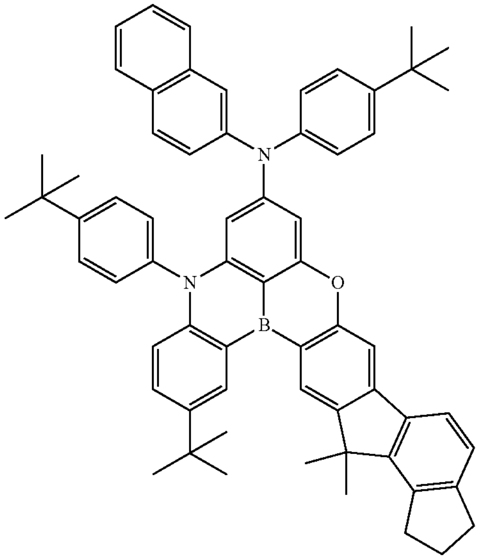
1-74
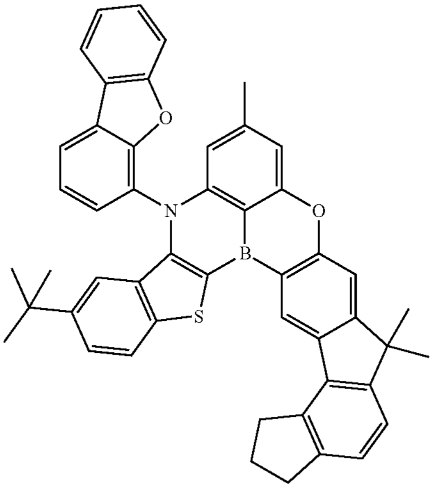
1-75
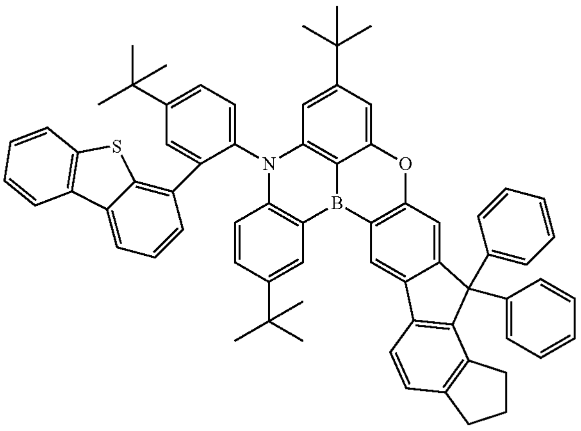

-continued
1-76
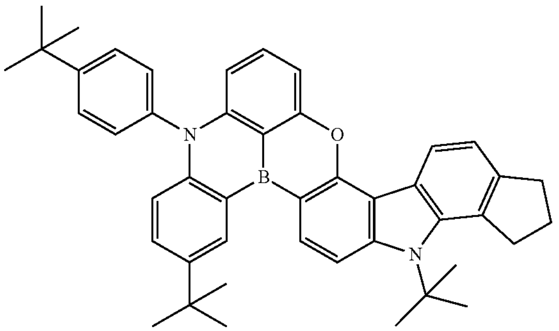
1-77
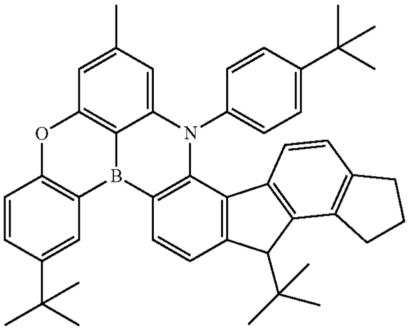
1-78
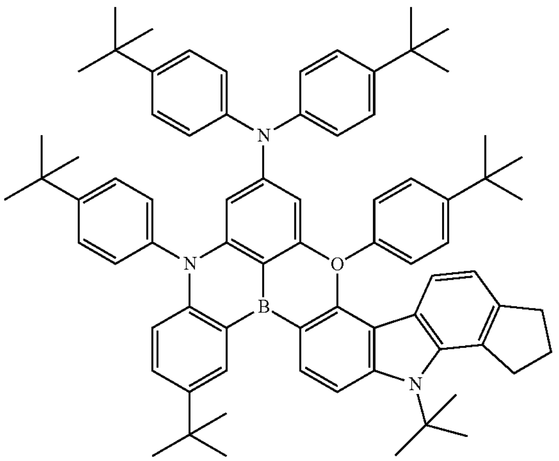
1-79
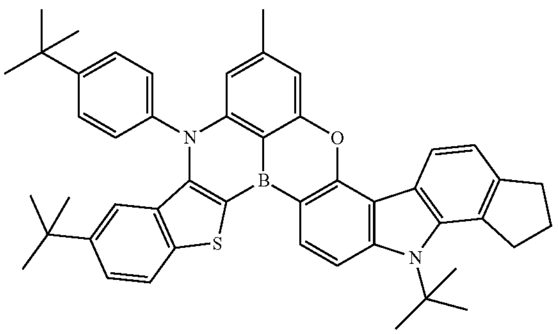
-continued
1-80
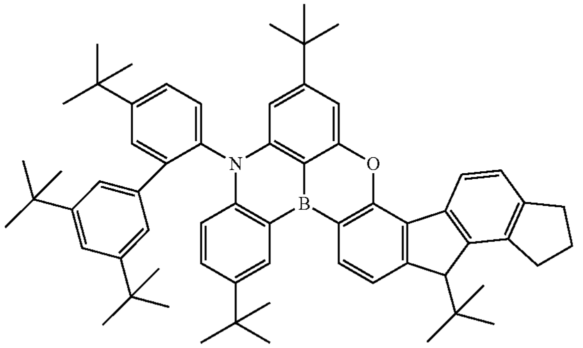
1-81
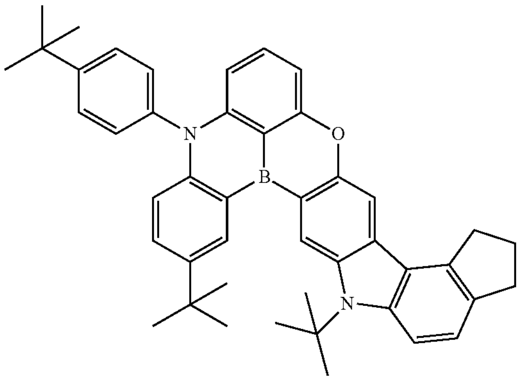
1-82
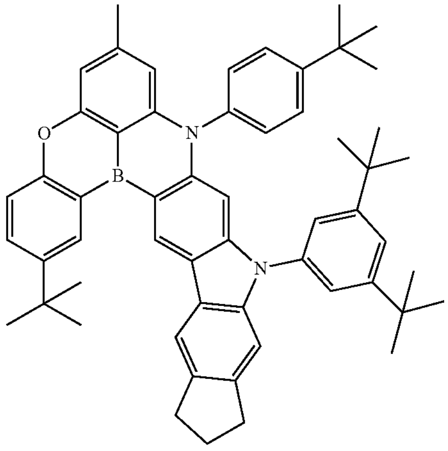

-continued
1-83
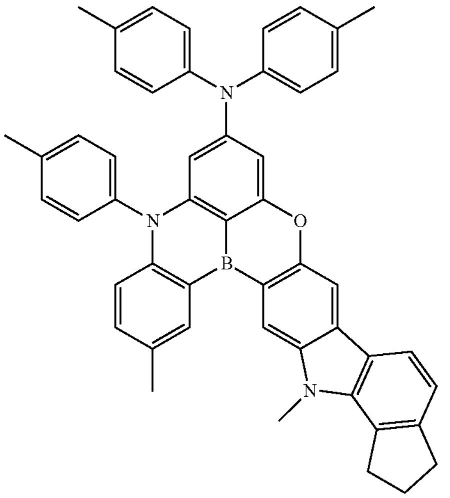
1-84
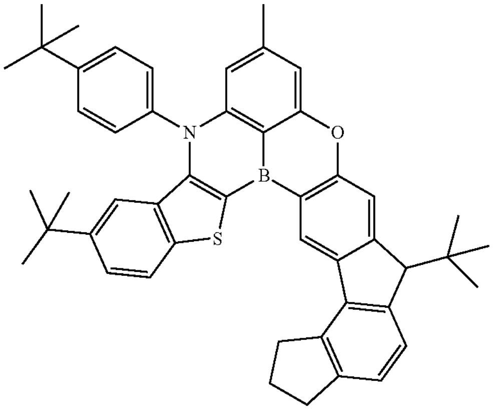
1-85
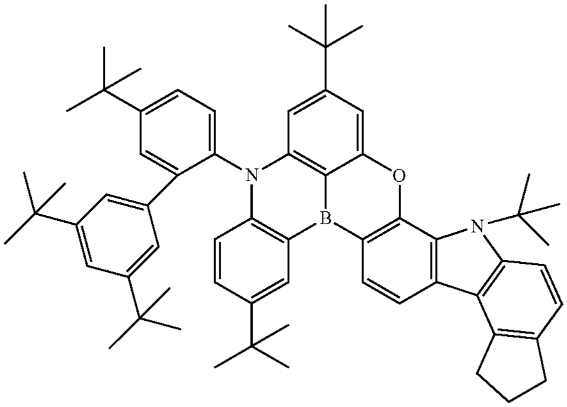
-continued
1-86
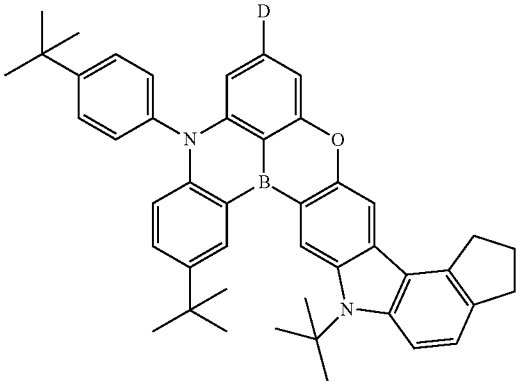
1-87
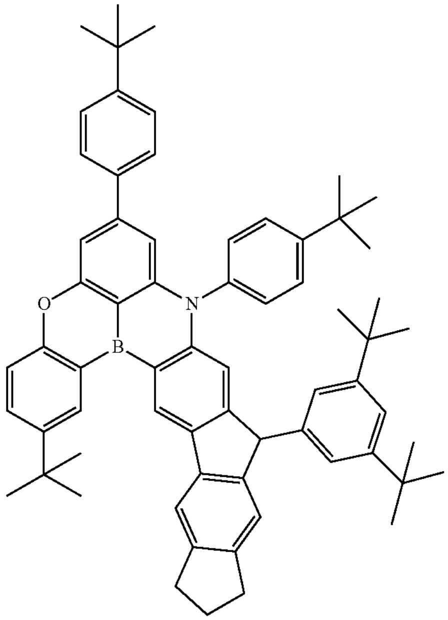
1-88
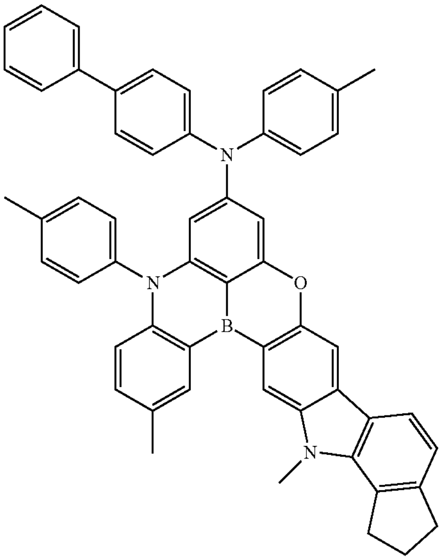

-continued
1-89
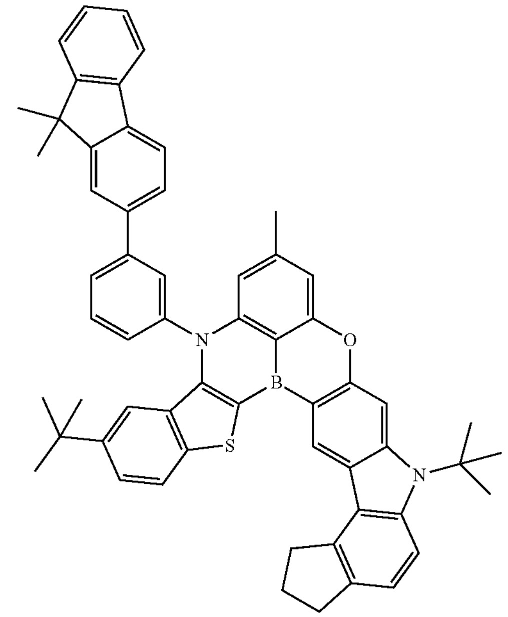
1-90
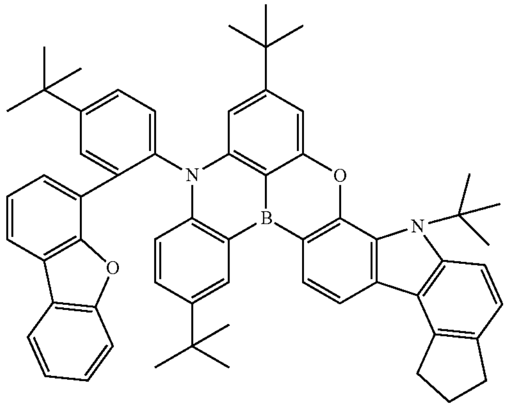
1-91
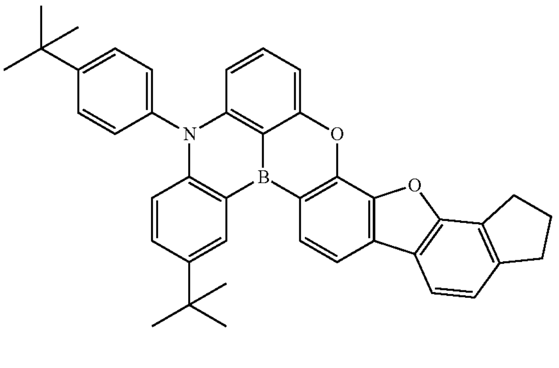
-continued
1-92
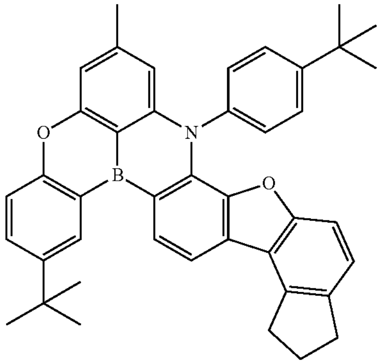
1-93
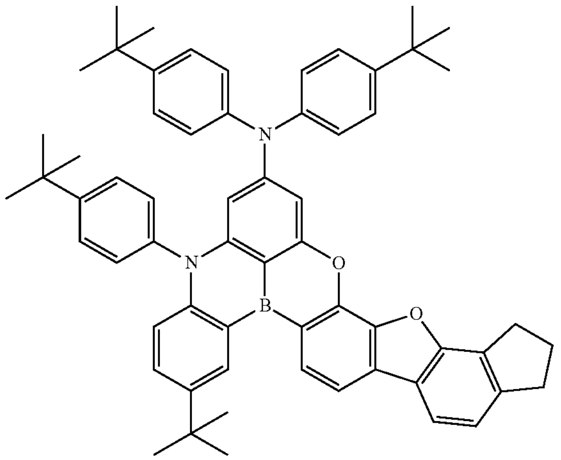
1-94
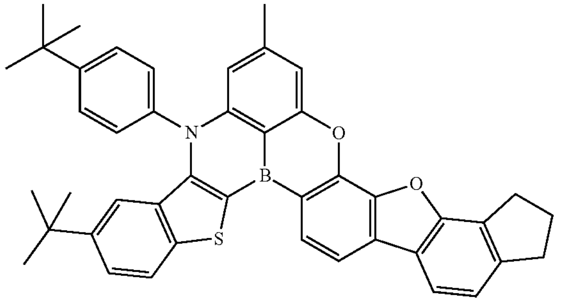
1-95
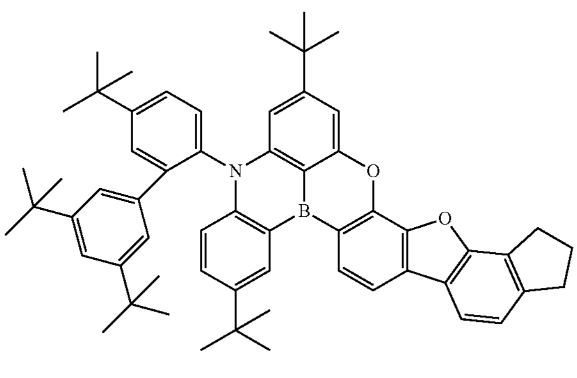

-continued
1-96
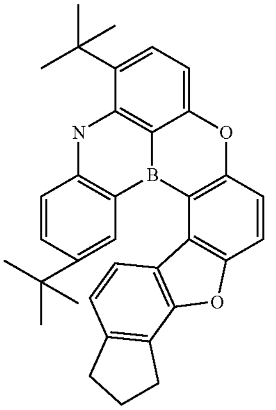
1-97
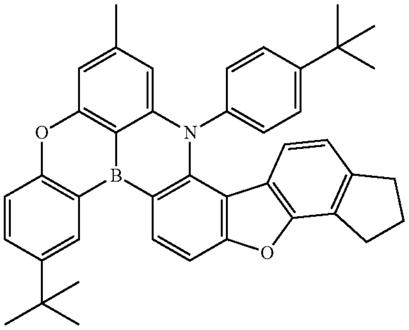
1-98
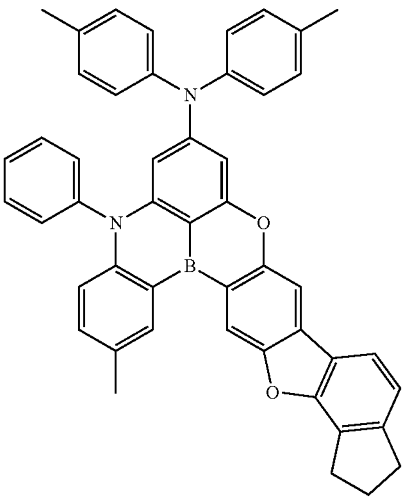
-continued
1-99
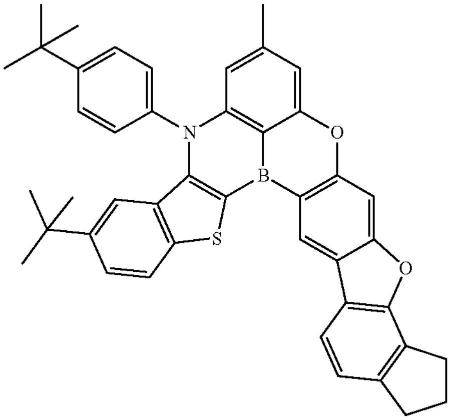
1-100
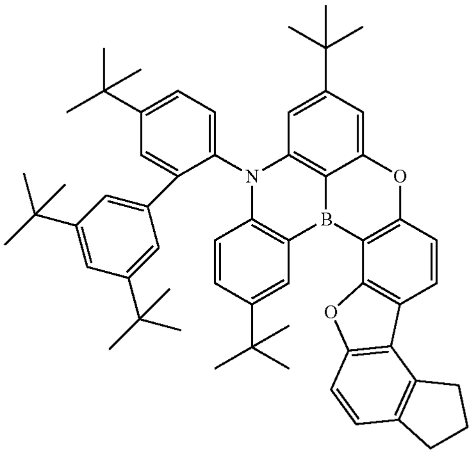
1-101
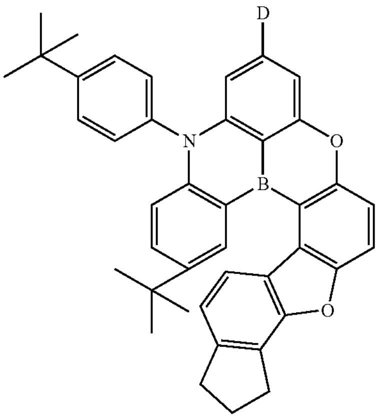

-continued
1-102
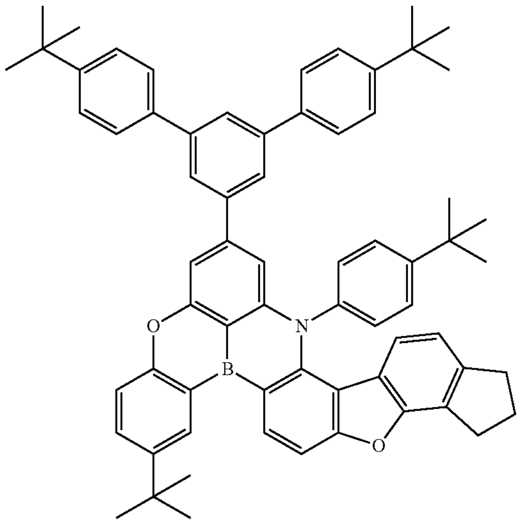
1-103
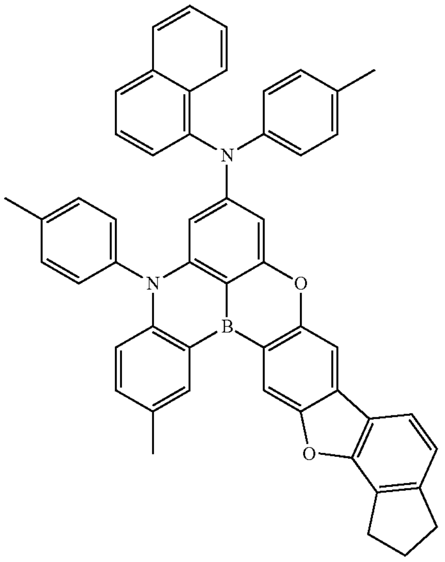
1-104
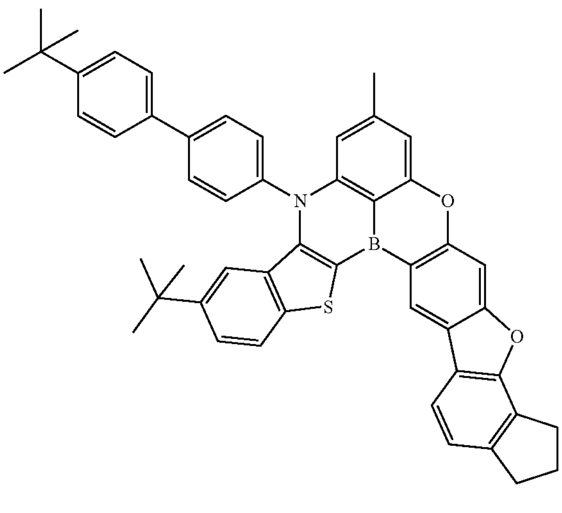
-continued
1-105
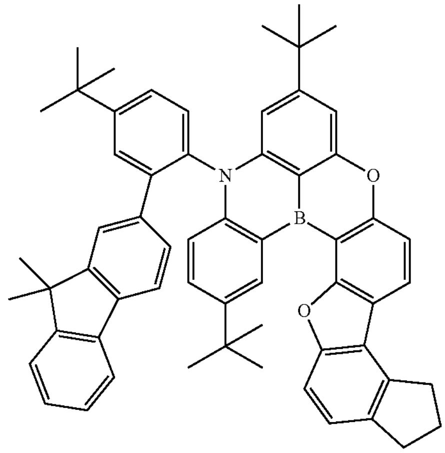
1-106
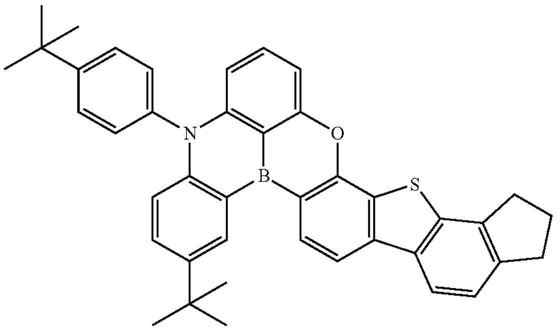
1-107
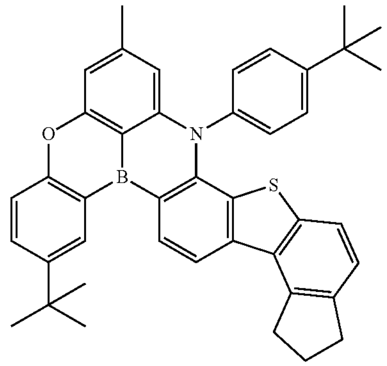
1-108
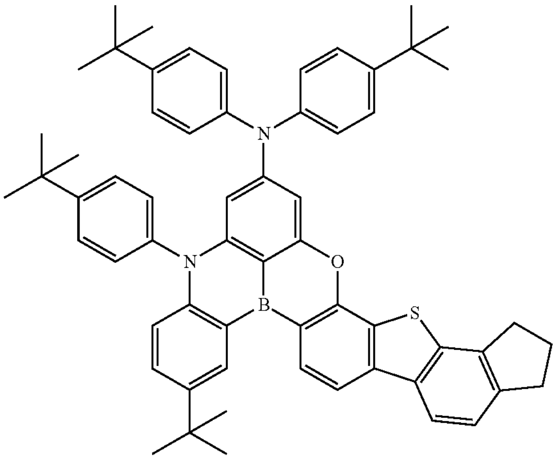

-continued
1-109
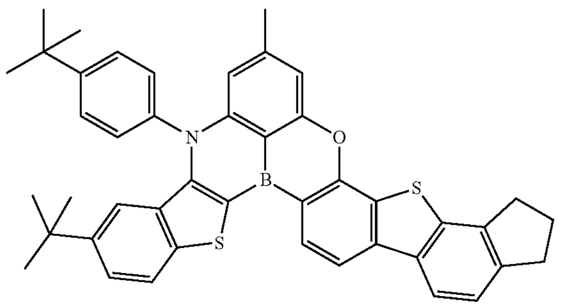
1-110
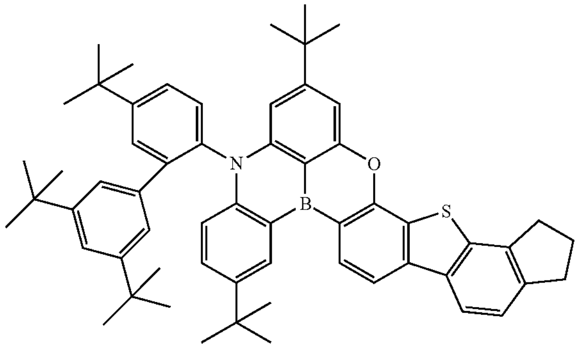
1-111
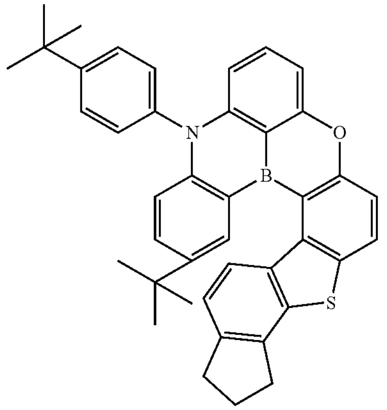
1-112
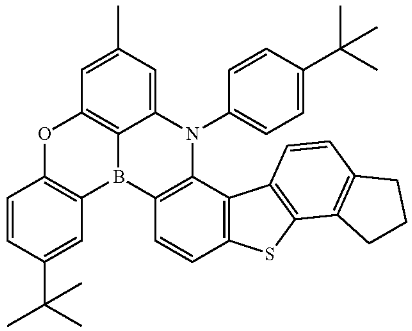
-continued
1-113
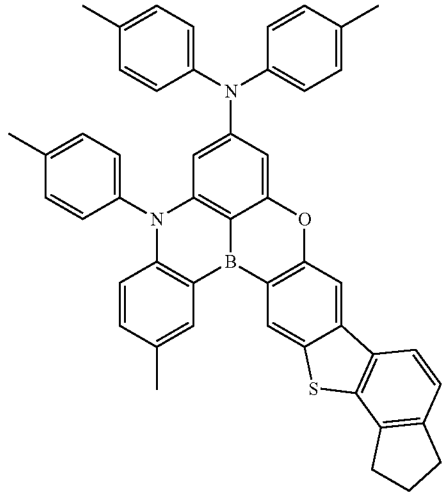
1-114
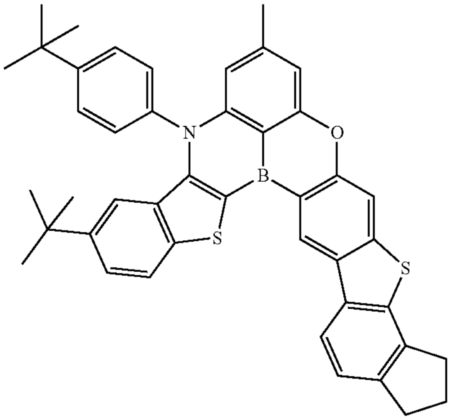
1-115
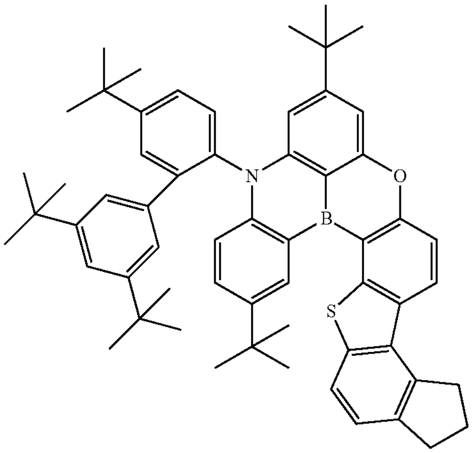

1-116
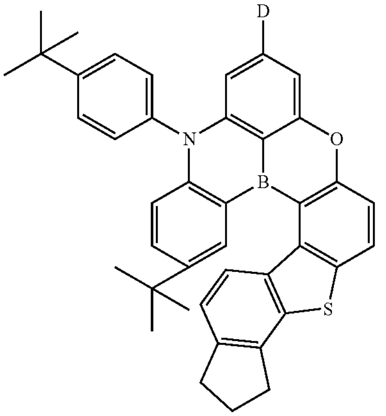
1-117
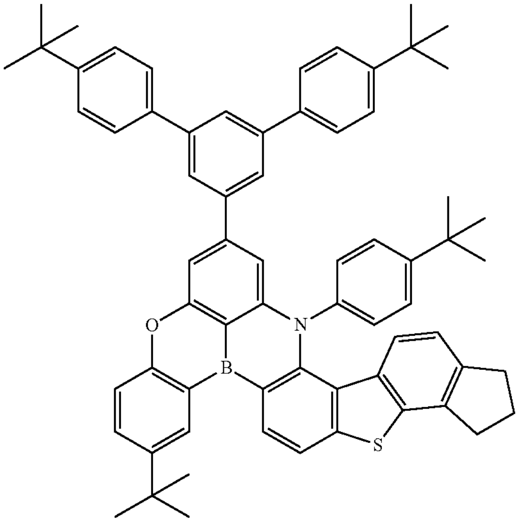
1-118
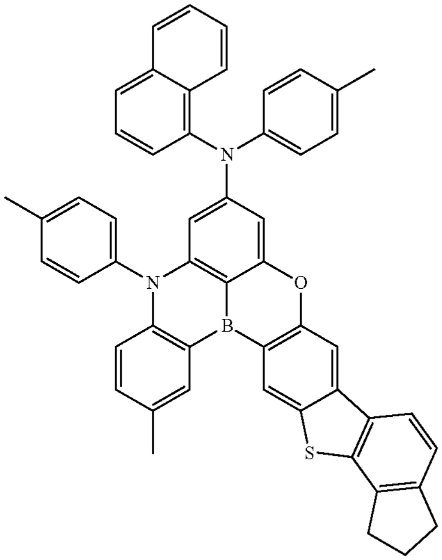
1-119
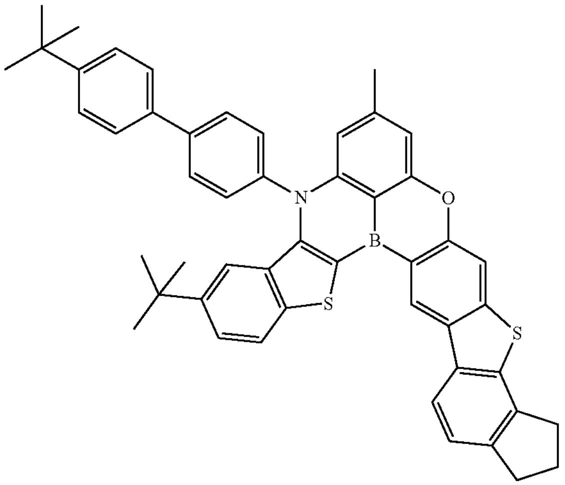
1-120
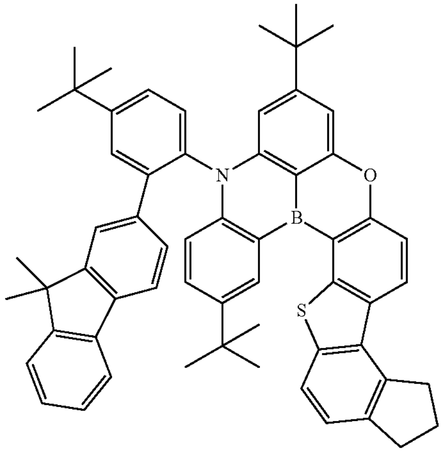
1-121
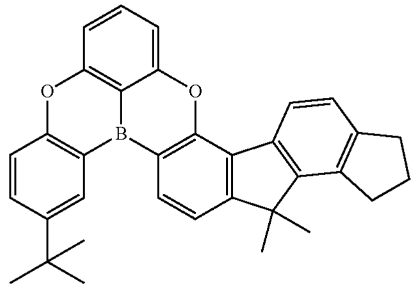
1-122
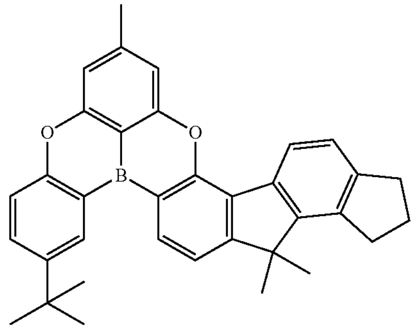

-continued
1-123
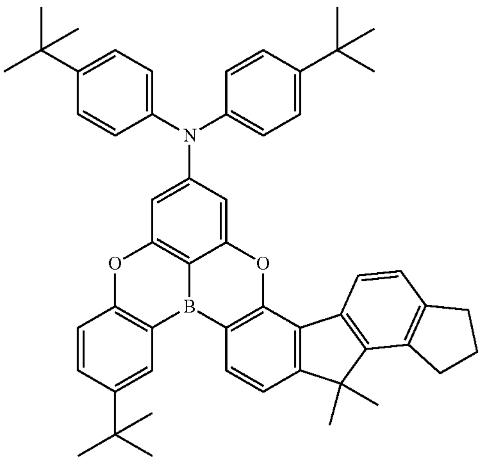
1-124
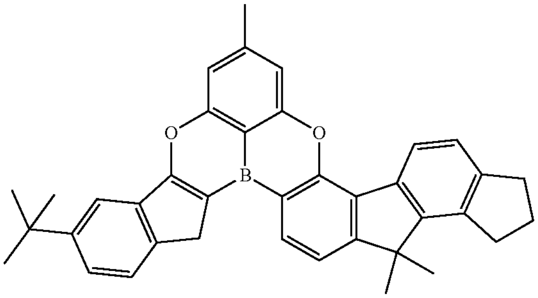
1-125
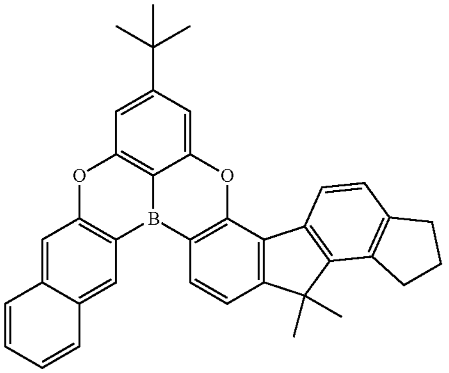
1-126
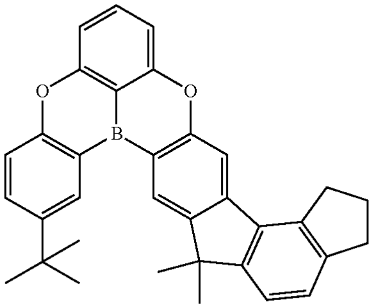
1-127
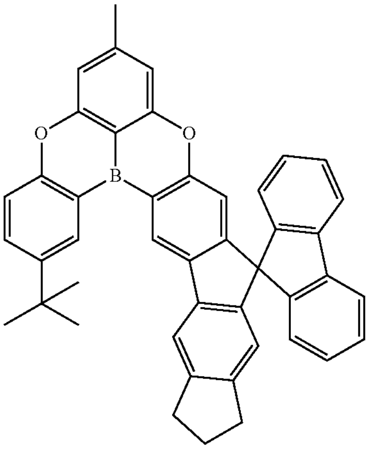
1-128
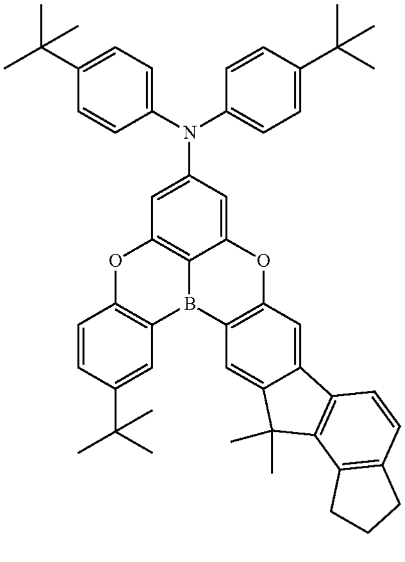
1-129
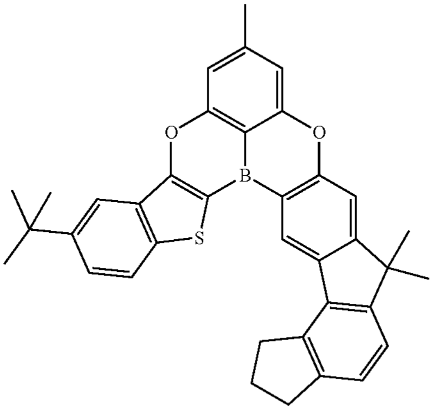

1-130
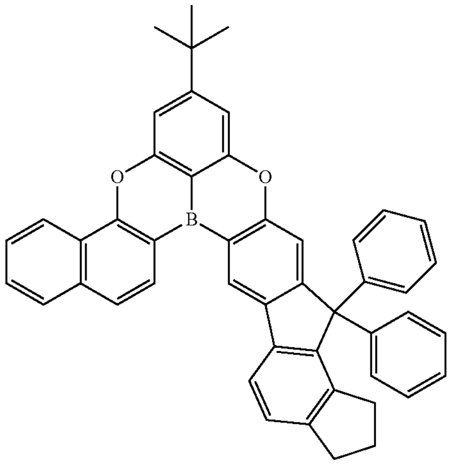
1-131
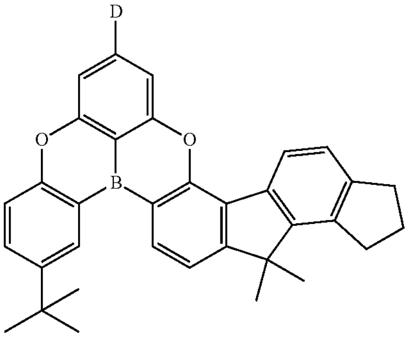
1-132
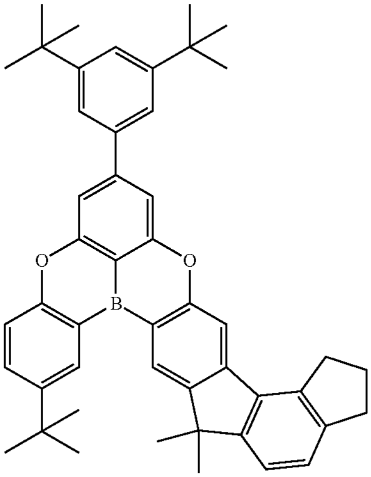
1-133
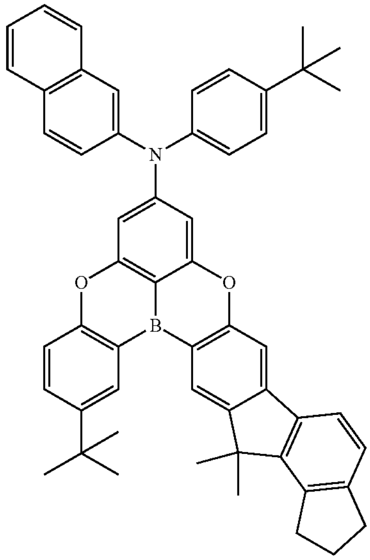
1-134
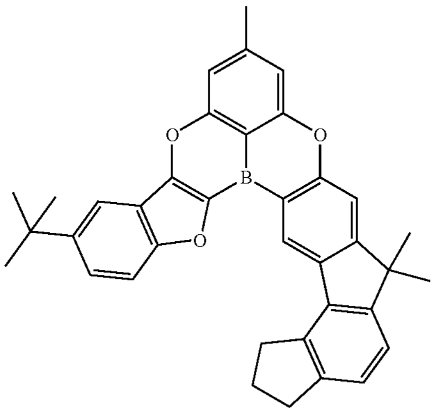
1-135
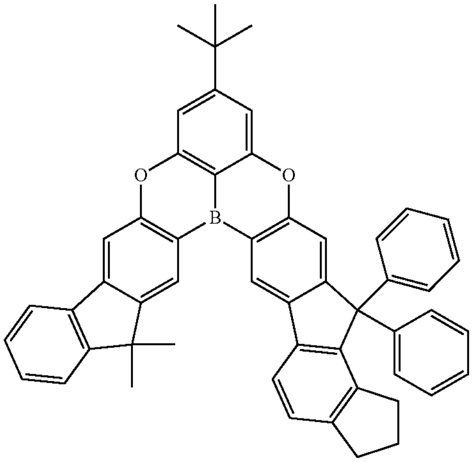

-continued
1-136
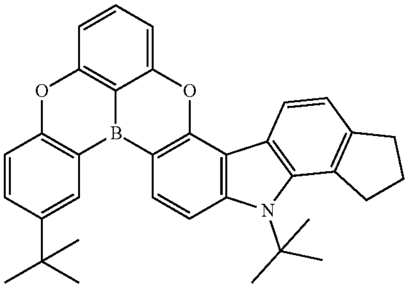
1-137
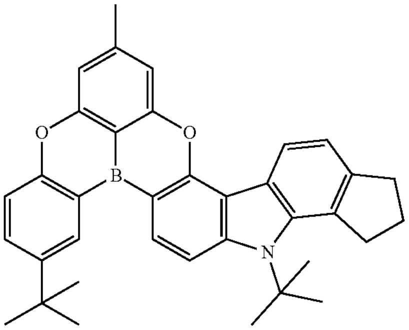
1-138
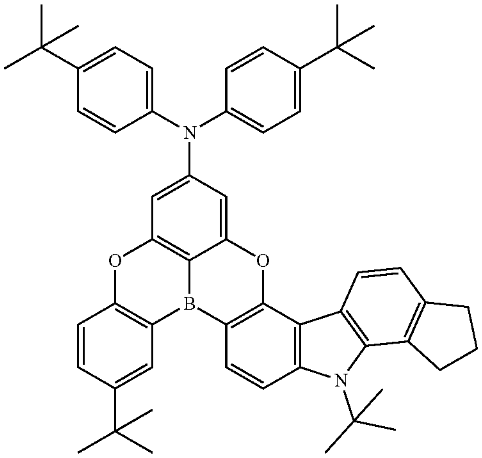
1-139
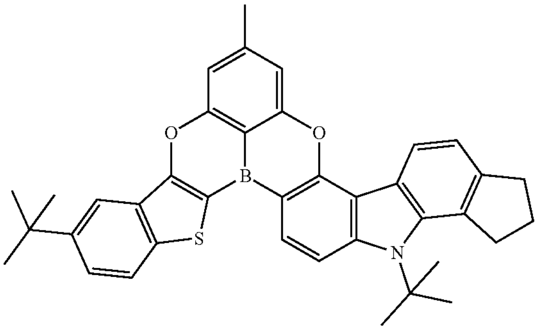
-continued
1-140
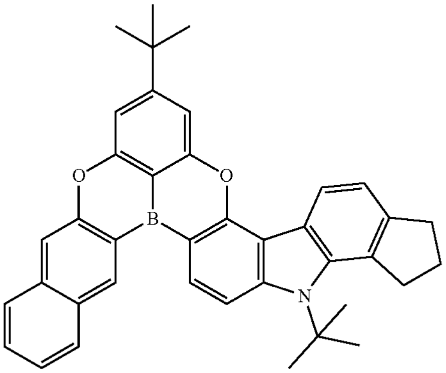
1-141
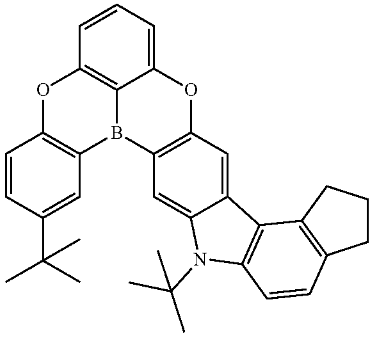
1-142
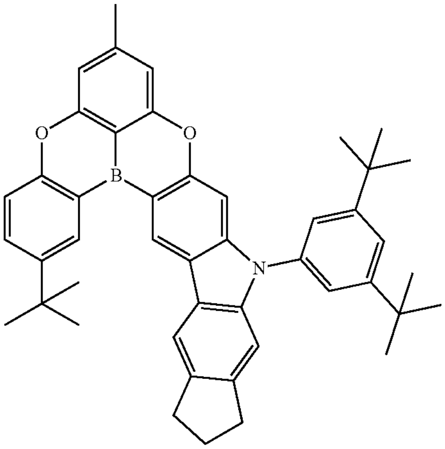

-continued
1-143
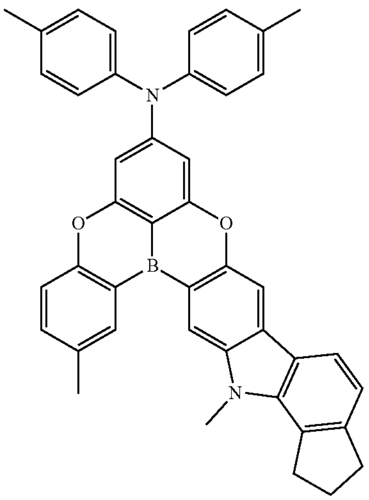
1-144
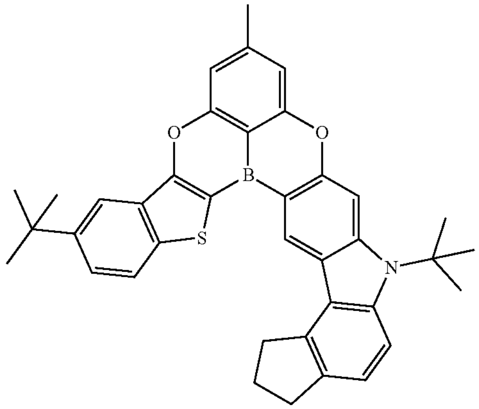
1-145
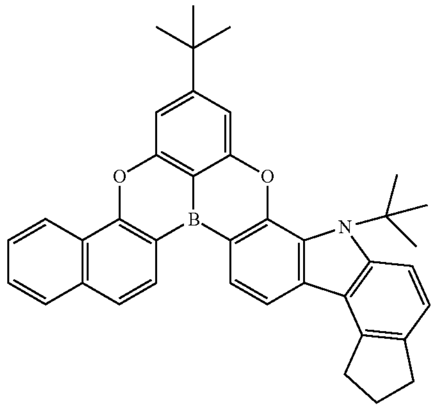
-continued
1-146
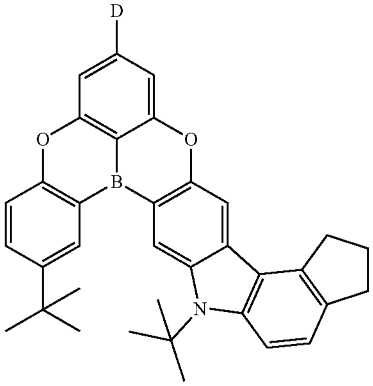
1-147
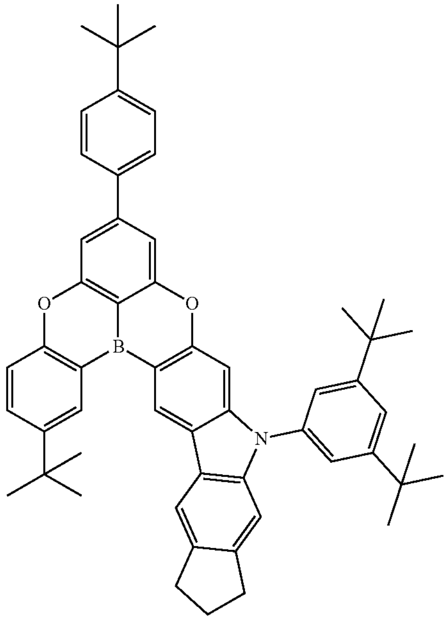
1-148
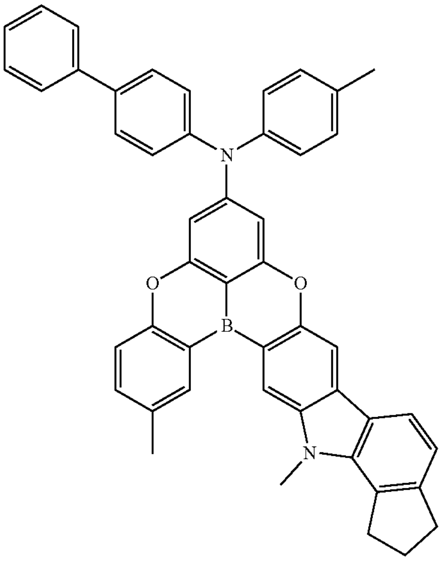

-continued
1-149
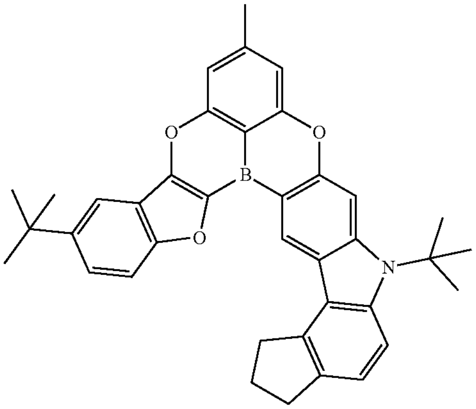
1-150
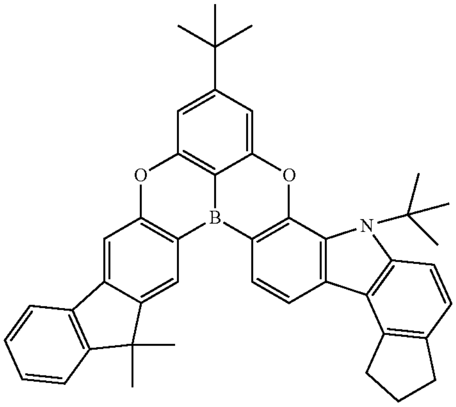
1-151
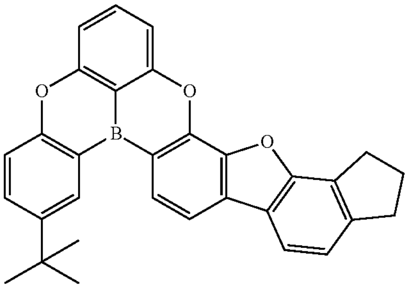
1-152
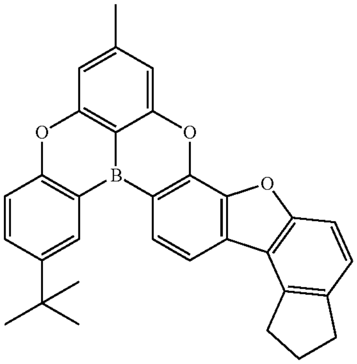
-continued
1-153
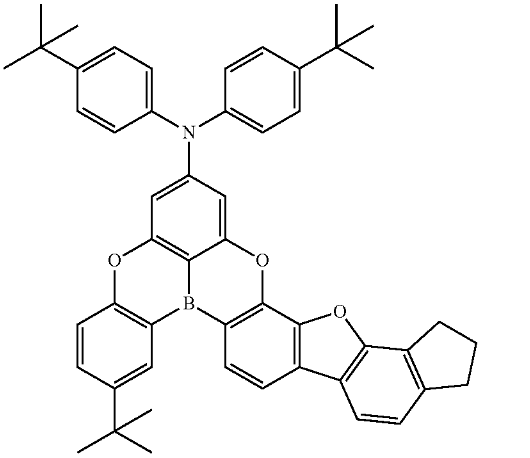
1-154
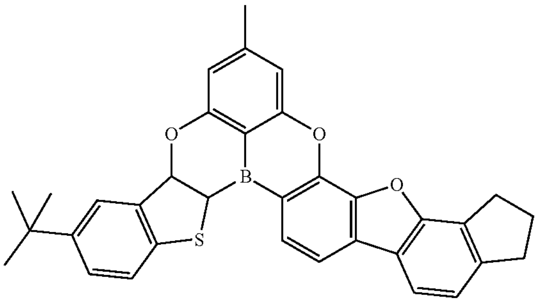
1-155
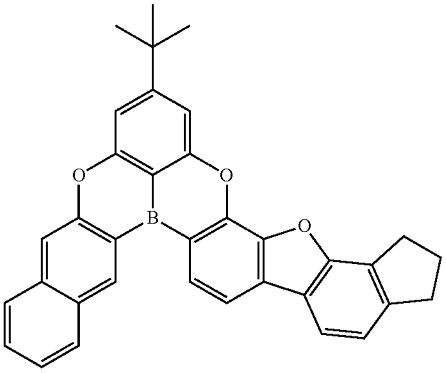
1-156
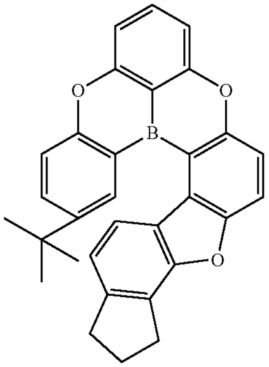

-continued
1-157
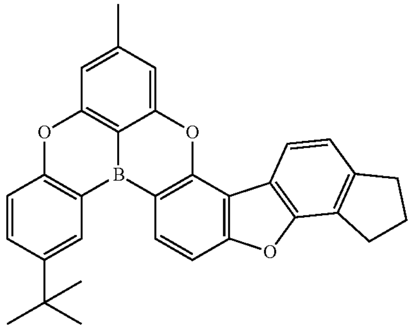
1-158
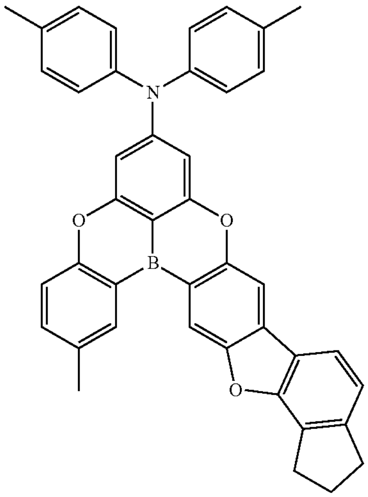
1-159
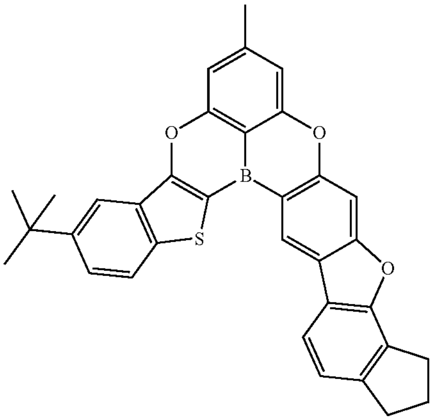
-continued
1-160
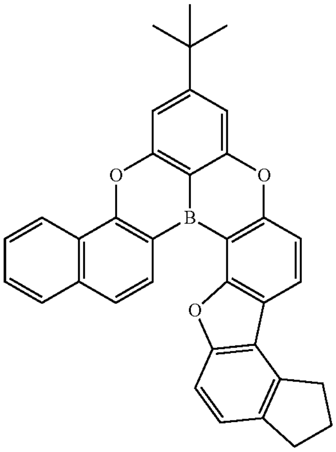
1-161
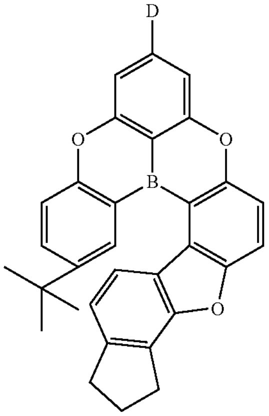
1-162
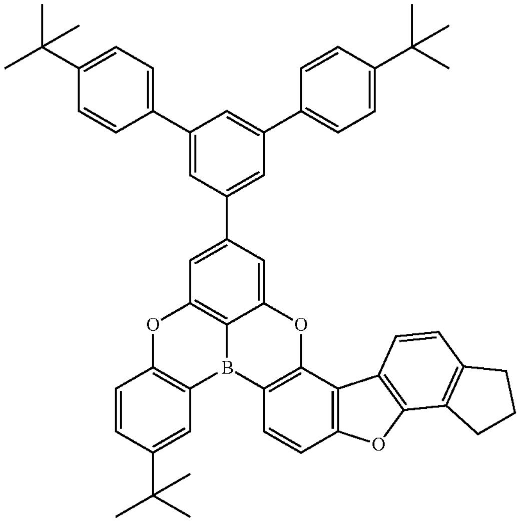

-continued
1-163
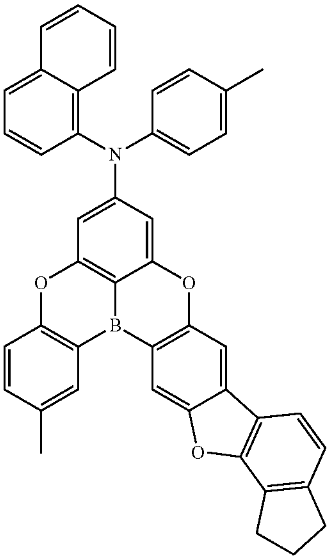
1-164
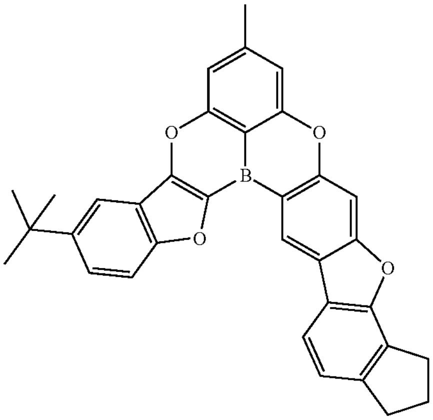
1-165
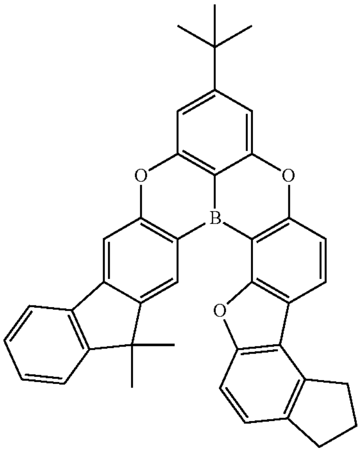
-continued
1-166
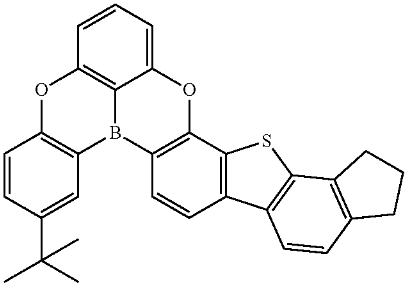
1-167
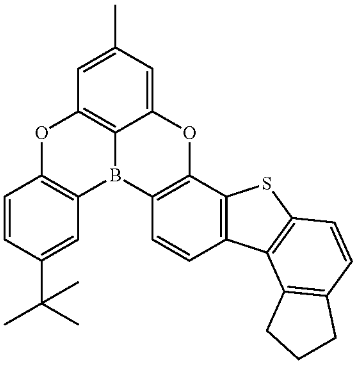
1-168
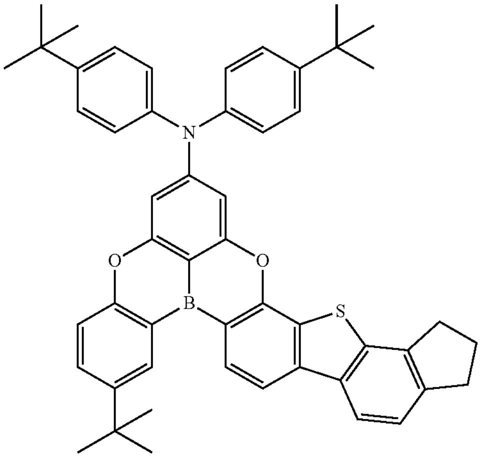
1-169
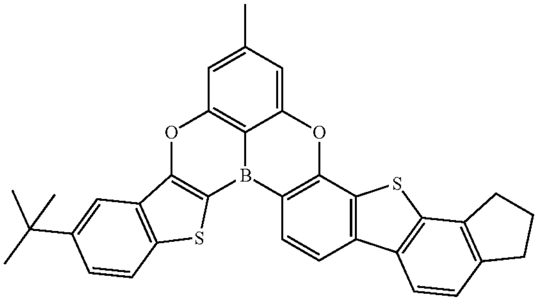

-continued
1-170
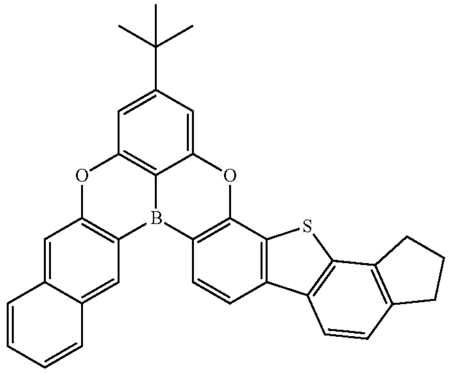
1-171
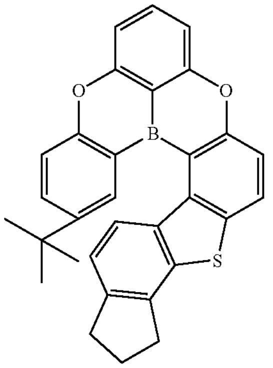
1-172
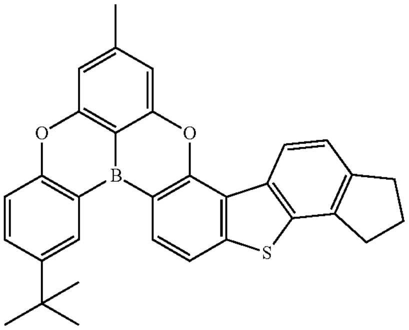
1-173
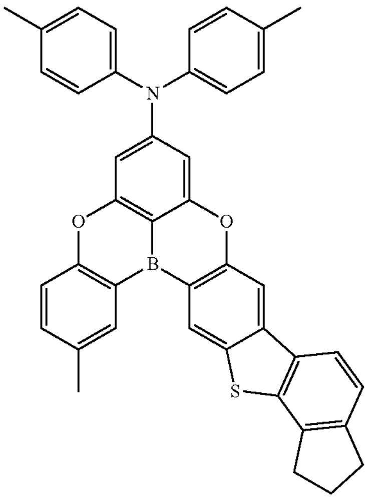
-continued
1-174
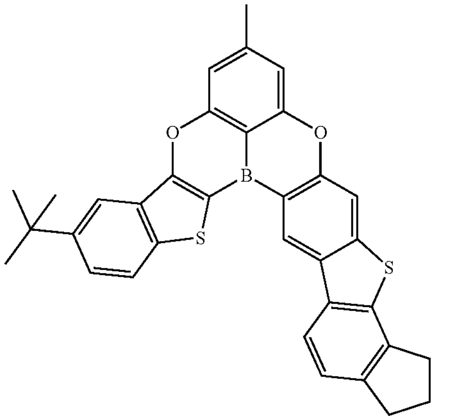
1-175
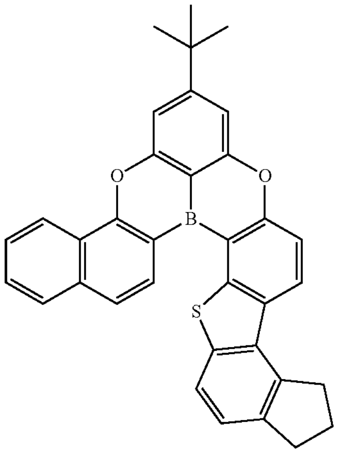
1-176
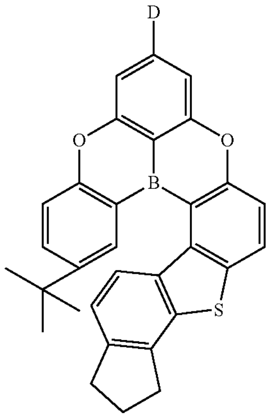

-continued
1-177
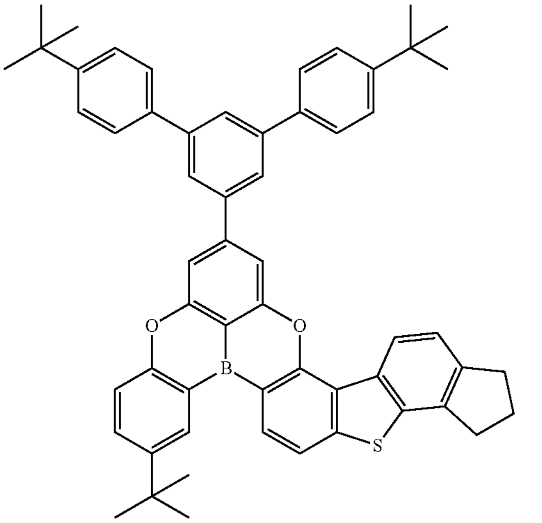
1-178
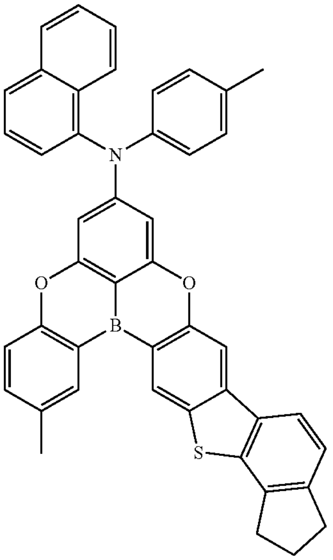
1-179
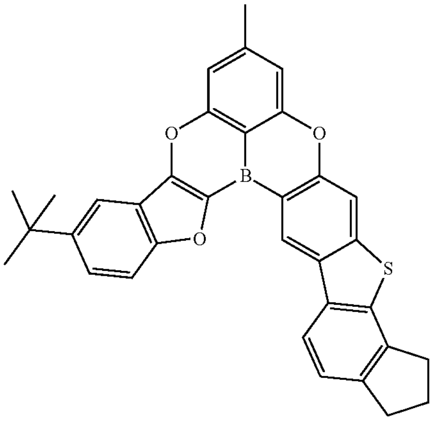
-continued
1-180
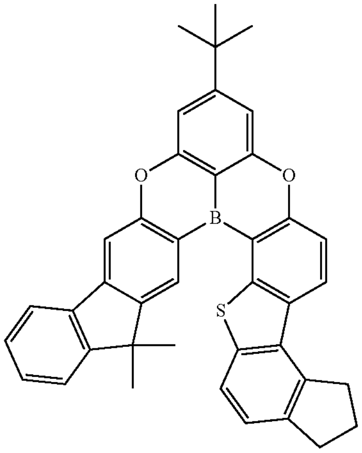
1-181
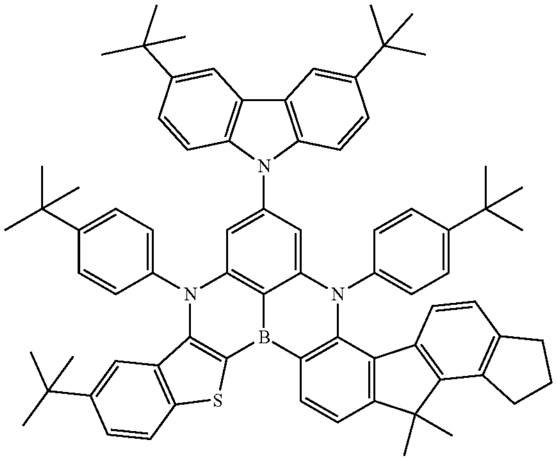
1-182
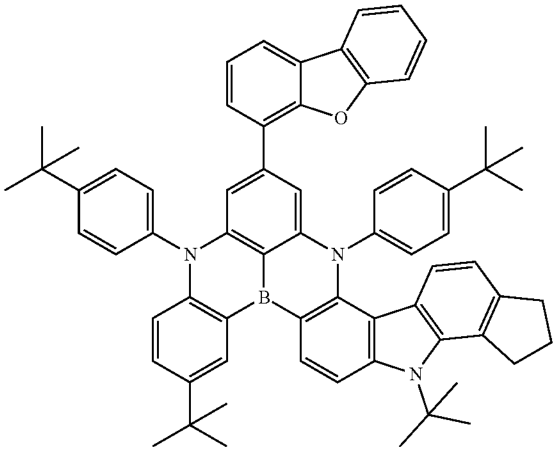

-continued
1-183
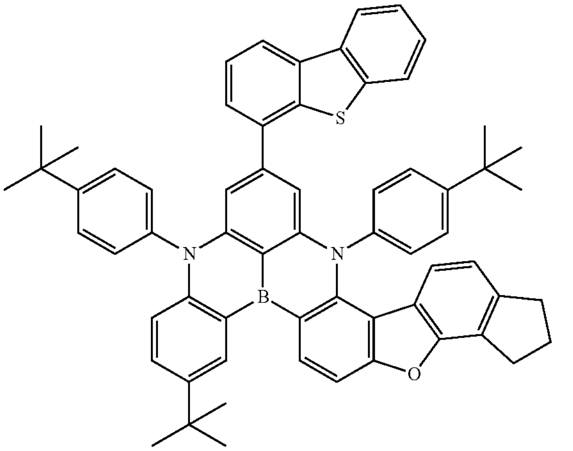
1-184
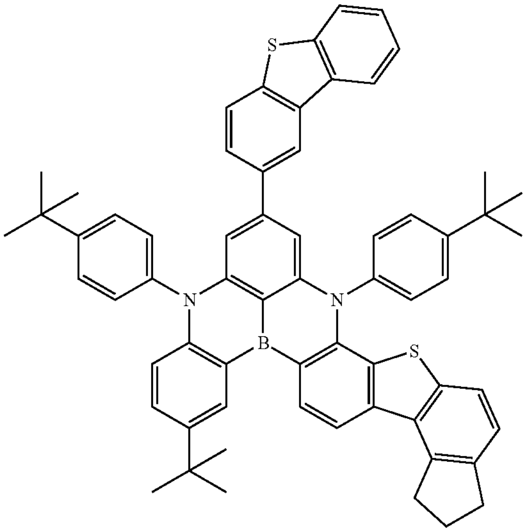
1-185
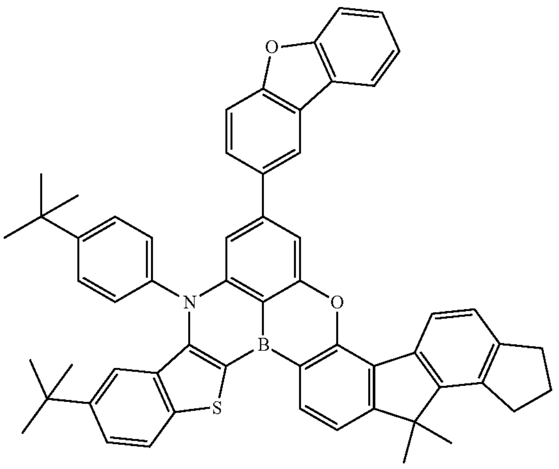
-continued
1-186
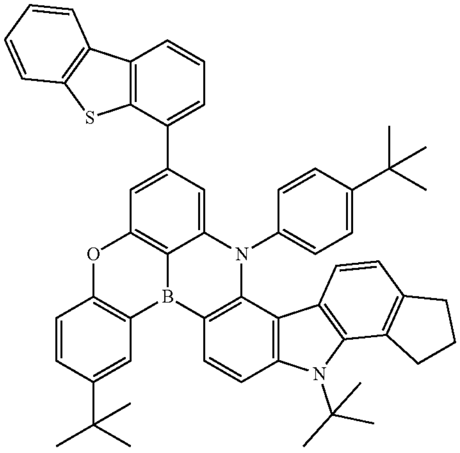
1-187
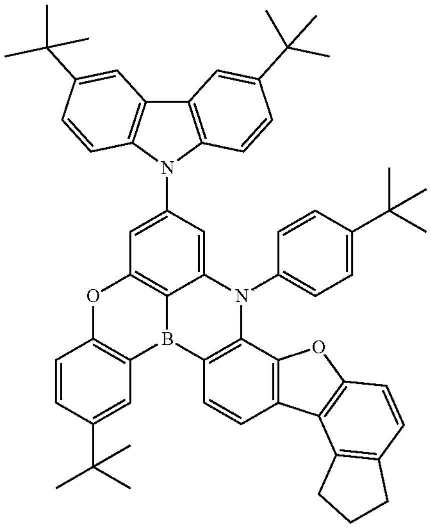
1-188
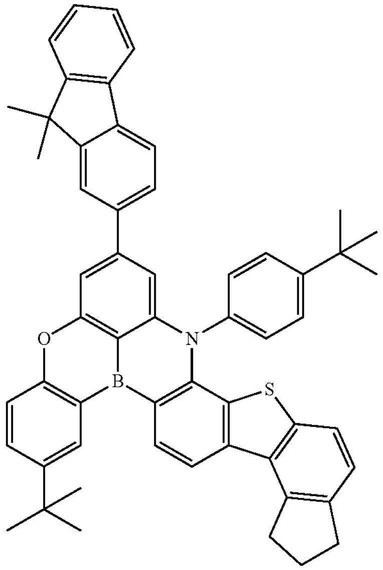

-continued
1-189
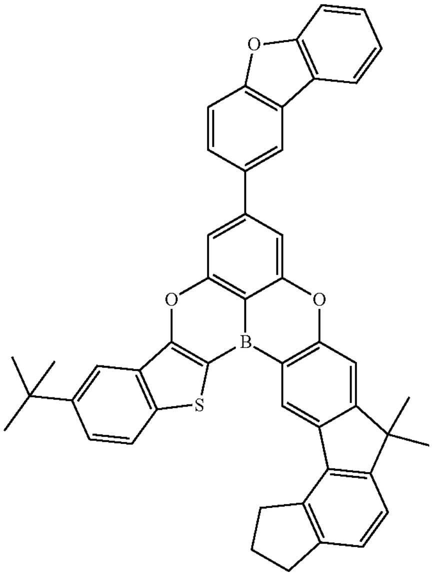
1-190
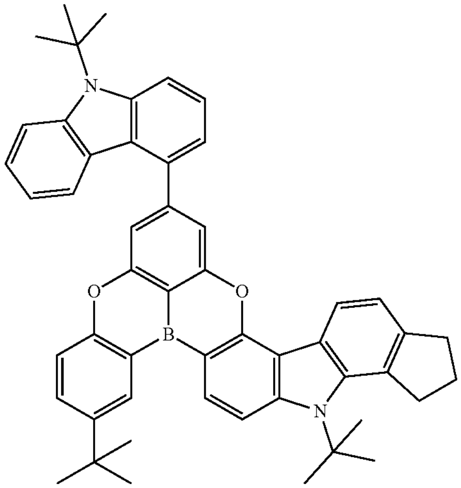
1-191
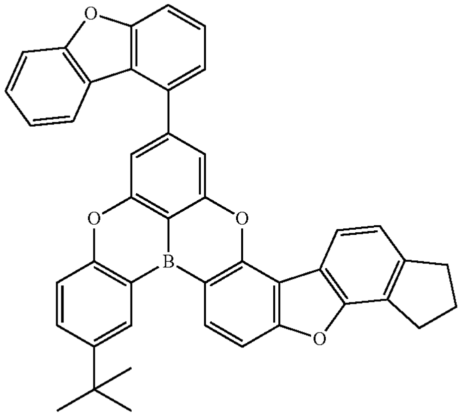
-continued
1-192
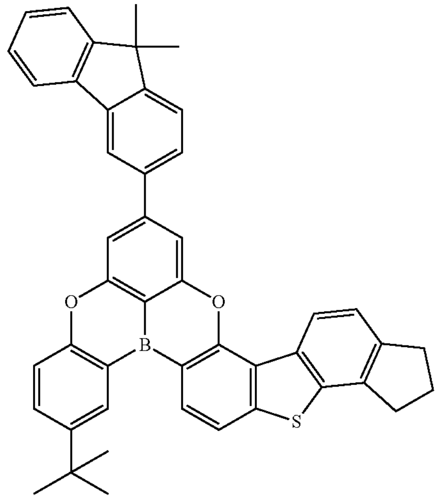
1-193
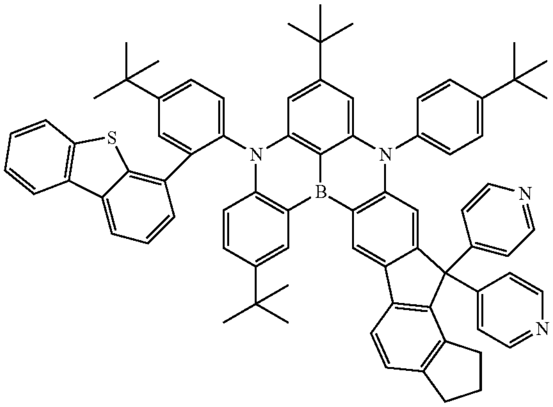
1-194
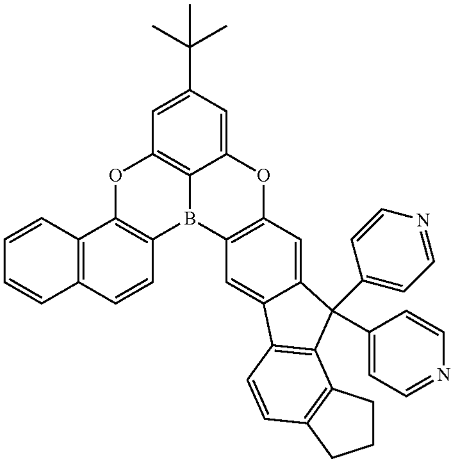

-continued 1-195

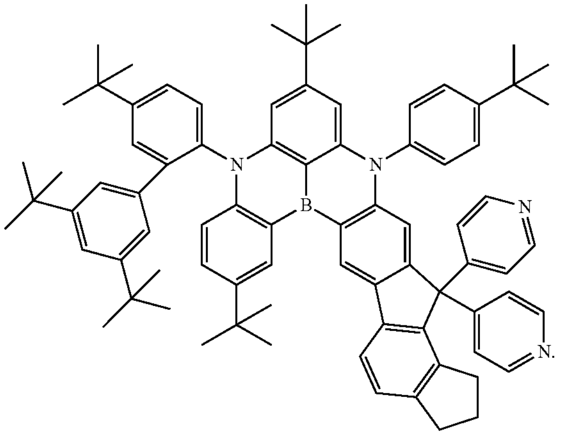

6. A mixture, comprising an organic compound H1 and an organic compound H2, wherein a mass ratio of the organic compound H1 to the organic compound H2 ranges from 99:1 to 70:30, the organic compound H1 is selected from the boron-containing organic compounds according to claim 1; the organic compound H2 comprises at least one organic functional material, and the organic functional material is selected from hole injection materials, hole transport materials, electron transport materials, electron injection materials, electron blocking materials, hole blocking materials, luminescent guest materials, luminescent host materials, or organic dyes.

7. A composition, comprising the boron-containing organic compound according to claim 1 and an organic solvent.

8. An organic electronic device, comprising the boron-containing organic compound according to claim 1.

9. A boron-containing organic compound as shown in general formula (I):

(I)

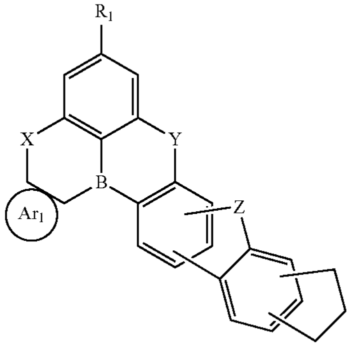

wherein $R_1$ is selected from H, D, $C_{1-4}$ alkyl group, an alkyl-substituted phenyl group, or an aryl-substituted amino group;

Z is independently selected from $NR_4$;

X and Y are independently selected from O or $NR_5$, and at least one of X and Y is selected from O;

$R_2$ and $R_3$ are each independently selected from methyl, phenyl or $R_2$ and $R_3$, together with carbon atoms connecting $R_2$ and $R_3$ form a ring consisting of 3-6 atoms;

$R_4$ is selected from $C_{1-4}$ alkyl group or an alkyl-substituted phenyl group;

$R_5$ is selected from phenyl, an alkyl-substituted phenyl, an alkyl-substituted biphenyl, or an alkyl-substituted fluorenyl; and $Ar_1$ is selected from an alkyl-substituted phenyl, dibenzothiophene, naphthalene, or an alkyl-substituted fluorenyl.

10. A boron-containing organic compound as shown in general formula (I):

(I)

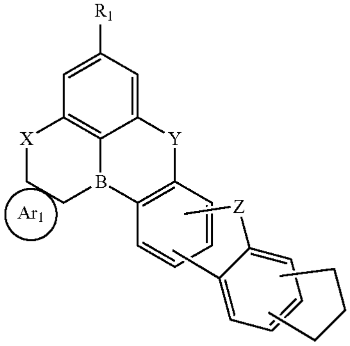

wherein $R_1$ is selected from H, D, methyl, tert-butyl, a substituted phenyl, or N-aryl substituted amino group; the substituted phenyl is selected from a mono-tert-butyl-substituted or a poly-tert-butyl-substituted phenyl group, and the N-aryl substituted amino group is N,N-p-tolyl substituted amino group;

Z is independently selected from $CR_2R_3$, $NR_4$, or S;

X and Y are independently selected from O or $NR_5$;

$R_2$ and $R_3$ are each independently selected from methyl or 9-fluorenyl;

$R_4$ is selected from methyl, tert-butyl, or 3,5-di-tert-butyl substituted phenyl;

$R_5$ is selected from tert-butyl-substituted phenyl, tert-butyl-substituted biphenyl, or 9,9-dimethyl-fluorenyl-substituted phenyl; and $Ar_1$ is selected from tert-butyl-substituted benzene, tert-butyl-substituted benzothiophene, methyl-substituted benzene, naphthalene, or 9,9-dimethylfluorene.

* * * * *